US008930869B2

United States Patent
Ohtsuka et al.

(10) Patent No.: US 8,930,869 B2
(45) Date of Patent: Jan. 6, 2015

(54) METHOD, PROGRAM, AND APPARATUS FOR AIDING WIRING DESIGN

(75) Inventors: Ikuo Ohtsuka, Kawasaki (JP); Eiichi Konno, Kawasaki (JP); Takahiko Orita, Kawasaki (JP); Yoshitaka Nishio, Kawasaki (JP); Toshiyasu Sakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 13/075,632

(22) Filed: Mar. 30, 2011

(65) Prior Publication Data

US 2011/0246955 A1    Oct. 6, 2011

(30) Foreign Application Priority Data

Mar. 31, 2010   (JP) .................................. 2010-083262

(51) Int. Cl.
    *G06F 17/50*        (2006.01)
(52) U.S. Cl.
    CPC .................................. *G06F 17/5077* (2013.01)
    USPC ........... 716/126; 716/129; 716/130; 716/131; 716/137
(58) Field of Classification Search
    USPC .......................................... 716/126–131, 137
    See application file for complete search history.

(56) References Cited

U.S. PATENT DOCUMENTS

| 6,662,250 | B1 * | 12/2003 | Peterson ....................... 710/100 |
| 7,362,135 | B1 * | 4/2008 | Chang .............................. 326/47 |
| 7,533,360 | B1 * | 5/2009 | Ren et al. ...................... 716/126 |
| 7,536,665 | B1 | 5/2009 | Horlick et al. |
| 7,793,249 | B1 * | 9/2010 | Wadland et al. ............... 716/129 |
| 2005/0235243 | A1 * | 10/2005 | Hachiya et al. ................. 716/15 |
| 2006/0242614 | A1 * | 10/2006 | Wadland et al. ................ 716/12 |
| 2008/0034342 | A1 * | 2/2008 | Petunin et al. .................. 716/15 |
| 2009/0217230 | A1 * | 8/2009 | He et al. .......................... 716/13 |

FOREIGN PATENT DOCUMENTS

JP    2009-301351    12/2009

OTHER PUBLICATIONS

"Automatic Bus Planner for Dense PCBs", by Hui Kong, Tan Yan, Martin D.F. Wong, ACM, @2009.*
"New Strategies for High Performance VLSI Physical Design", by Hua Xiang, @2004.*

* cited by examiner

*Primary Examiner* — Nha Nguyen
(74) *Attorney, Agent, or Firm* — Staas & Halsey LLP

(57) ABSTRACT

A wiring-design aiding method for causing a computer to execute generating paths for buses so that the buses do not cross each other with respect to a wiring area including at least one wiring layer, the paths being represented by corresponding graphics The computer further executes verifying, for each bus, whether wires for nets belonging to the bus are successfully extracted from a component to which the bus is connected; and recording, in the wiring area, graphics representing the nets belonging to a bus for which it is determined in the verification that all the nets belonging to the bus are successfully extracted. The bus-path generation is re-executed with respect to the bus for which it is determined in the verification that at least one of the nets is not successfully extracted.

18 Claims, 103 Drawing Sheets

FIG. 5

| ORIGIN COORDINATES | WIRING-AREA DIMENSIONS (ACTUAL MEASUREMENT) | | NUMBER OF LAYERS |
|---|---|---|---|
| | X DIRECTION | Y DIRECTION | |
| (0,0) | Xmax | Ymax | 6 |

| ID | START COORDINATES S[x,y] | END COORDINATES E[x,y] | LAYER L |
|---|---|---|---|
| 0 | (0,0) | (xa,yb) | 1 |
| 1 | (0,ya) | (xa,Ymax) | 1 |
| 2 | (0,0) | (xa,ya) | 2 |
| ⋮ | ⋮ | ⋮ | ⋮ |

BUS INFORMATION B

| | BUS-NET GROUP netG | CONNECTION-TARGET COMPONENT GROUP parts | PRIORITY prio | BUS-PATH RECTANGLE LIST sP | LAYER L | EXTRACTION-LINE-SEGMENT LIST escS | NUMBER "nEsc" OF EXTRACTION SUCCESSES | PATH DEFINITE FLAG acc | PATH FIX FLAG fix | NUMBER "n" OF NETS |
|---|---|---|---|---|---|---|---|---|---|---|
| B[0] | {0,1···} | {0,1} | 3 | {BR[0],BR[1],BR[2]} | 1 | {seg[0],seg[1]···} | 0 | F | F | 20 |
| B[1] | {20,21···} | {0,1} | 0 | {BR[3],BR[4]} | 1 | | 0 | F | F | 20 |
| ·· | ·· | ·· | ·· | ·· | ·· | ·· | ·· | ·· | ·· | ·· |

NET INFORMATION NInfo

| | BELONGING BUS b | SOURCE PIN sPin | | TARGET PIN tPin | | WIRE WIDTH w |
|---|---|---|---|---|---|---|
| | | COMPONENT pid | PIN tid | COMPONENT pid | PIN tid | |
| NInfo[0] | 0 | 0 | 0 | 1 | 0 | 0 |
| NInfo[1] | 0 | 0 | 1 | 1 | 1 | 0 |
| .. | .. | .. | .. | .. | .. | .. |

WIRE-WIDTH INFORMATION WRule          ~D7

| ID | LINE WIDTH (ACTUAL MEASUREMENT SYSTEM) | | |
|----|-----------|-----------|-----|
|    | 1ST LAYER | 2ND LAYER | ... |
| 0  | W1        | W2        | ... |
| :  | :         | :         | :   |

FIG. 12

BUS-PATH RECTANGLE INFORMATION BR ~D9

| | BELONGING BUS owner | START-POINT COORDINATES (ACTUAL MEASUREMENT SYSTEM) | | END-POINT COORDINATES (ACTUAL MEASUREMENT SYSTEM) | | LAYER L | FIX FLAG fixF | NEXT RECTANGLE next |
|---|---|---|---|---|---|---|---|---|
| | | sX | sY | eX | eY | | | |
| BR[0] | 0 | bsx1 | bsy1 | bex1 | bey1 | 1 | F | &BR[1] |
| BR[1] | 0 | bsx2 | bsy2 | bex2 | bey2 | 1 | F | &BR[2] |
| BR[2] | 0 | bsx3 | bsy3 | bex3 | bey3 | 1 | F | null |
| BR[3] | 1 | ... | ... | ... | ... | 1 | F | &BR[4] |
| BR[4] | 1 | ... | ... | ... | ... | 1 | F | null |
| ... | ... | ... | ... | ... | ... | ... | ... | ... |

FIG. 14

| EDGE ID | START POINT | END POINT |
|---------|-------------|-----------|
| E1 | B[a] | B[c] |
| E2 | B[a] | B[d] |
| E3 | B[b] | B[c] |
| E4 | B[b] | B[d] |
| E5 | B[c] | B[d] | t1

FIG. 16

| BUS PATH | LAYER |
|----------|-------|
| B[a]     | 1     |
| B[b]     | 1     |
| B[c]     | 2     |
| B[d]     | 2     |

```
CELL DATA {
attr;      //CELL ATTRIBUTE [S||D||EP||V||H||SB]
netID;     //NET ID
exitF;     //EGRESS FLAG [true||false]
x;         //x COORDINATE
y;         //y COORDINATE
iN;        //NODE ID OF INGRESS NODE
oN;        //NODE ID OF EGRESS NODE
cap;       //CAPACITY
cap2;      //INITIAL CAPACITY
r;         //ROW NUMBER
c;         //COLUMN NUMBER
flavor;    //PROTECTION-WALL COLOR
pinCapCheckedF;   //CAPACITY-CHECKED FLAG
rLink;     //ADJACENT RIGHT CELL POINTER
lLink;     //ADJACENT LEFT CELL POINTER
cE;        //ADJACENT EAST CELL POINTER
cW;        //ADJACENT WEST CELL POINTER
cN;        //ADJACENT NORTH CELL POINTER
cS;        //ADJACENT SOUTH CELL POINTER
parentDir;        //LABEL-PROPAGATION-SOURCE DIRECTION
sFlag;     //SEARCH SOURCE FLAG
tFlag;     //SEARCH TARGET FLAG
label;     //COURSE
treeID;    //PROTECTION-WALL TREE ID
segList;   //PROTECTION-WALL TREE LINE-SEGMENT LIST
segNum;    //NUMBER OF PROTECTION-WALL TREE LINE-SEGMENTS
cellNum;   //NUMBER OF PROTECTION-WALL TREE CELLS
patternNum;       //NUMBER OF PROTECTION-WALL TREE LINE-SEGMENT PASSAGES
```

FIG. 26

```
NODE DATA {
pID;         //LABEL-PROPAGATION-SOURCE NODE ID
dist;        //SHORTEST-PATH LENGTH
cellID;      //CELL ID OF OWNER CELL
attr;        //NODE ATTRIBUTE [in||out]
bros;        //BROTHER NODE ID
sFlag;       //SEARCH SOURCE FLAG [true||flase]
tFlag;       //SEARCH TARGET FLAG [true||flase]
eBros;       //DIRECTED EDGE CONNECTED TO BROTHER NODE
eE;          //DIRECTED EDGE CONNECTED TO NODE OF ADJACENT EAST CELL
eW;          //DIRECTED EDGE CONNECTED TO NODE OF ADJACENT WEST CELL
eS;          //DIRECTED EDGE CONNECTED TO NODE OF ADJACENT SOUTH CELL
eN;          //DIRECTED EDGE CONNECTED TO NODE OF ADJACENT NORTH CELL
eNE;         //DIRECTED EDGE CONNECTED TO NODE OF NORTHEAST CELL
eNW;         //DIRECTED EDGE CONNECTED TO NODE OF NORTHWEST CELL
eSE;         //DIRECTED EDGE CONNECTED TO NODE OF SOUTHEAST CELL
eSW;         //DIRECTED EDGE CONNECTED TO NODE OF SOUTHWEST CELL
sourceEdgeList;    //LIST OF DIRECTED EDGES FROM SOURCE NODE S
targetEdgeList;    //LIST OF DIRECTED EDGES TO TARGET NODE T
lFrontF;     //LABEL FRONT FLAG [true||flase]
}
```

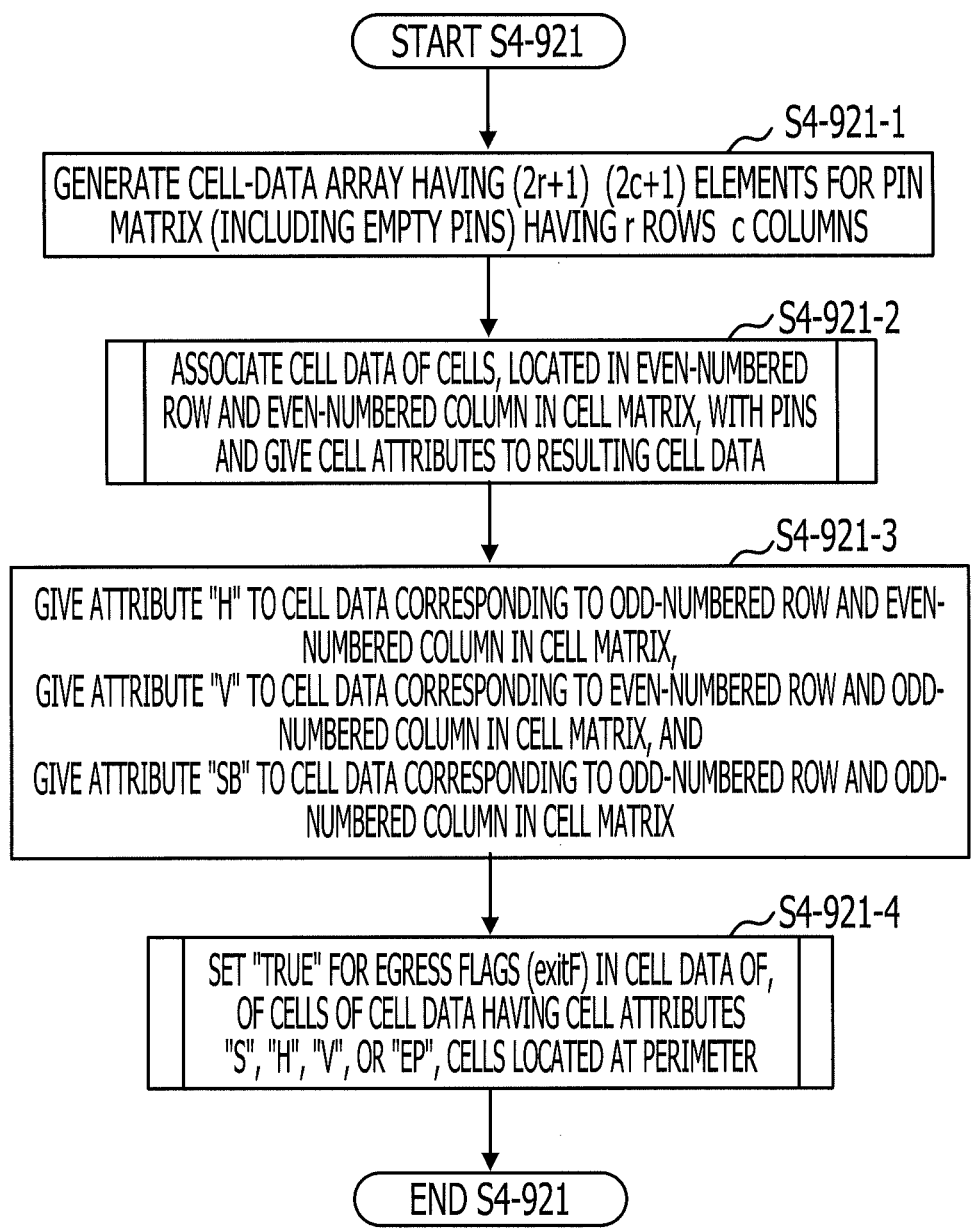

FIG. 29

PIN INFORMATION TInfo

| CENTER COORDINATES | | CONNECTION net | SHAPE shape | RADIUS r (ACTUAL MEASUREMENT SYSTEM) | |
|---|---|---|---|---|---|
| ROW H | COLUMN V | | [RECTANGLE\|CIRCLE\|EMPTY\|...] | x | y |
| 1 | 1 | 0 | CIRCLE | rx | ry |
| 1 | 2 | 1 | CIRCLE | rx | ry |
| 1 | 3 | nil | CIRCLE | rx | ry |
| ... | ... | ... | ... | ... | ... |

GAP RULE INFORMATION CRule    D8

| LAYER | GAP VALUES (ACTUAL MEASUREMENT SYSTEM) | | |
|---|---|---|---|
| | WIRE : PIN | WIRE : WIRE | ... |
| 1 | c1 | c2 | ... |
| ... | ... | ... | ... |

FIG. 41

```
EDGE DATA {
sN;        //START-POINT NODE ID
eN;        //END-POINT ID
eLen;  //EDGE LENGTH
cap;       //CAPACITY
flow;  //flow
res;       //RESIDUE
}
```

FIG. 43
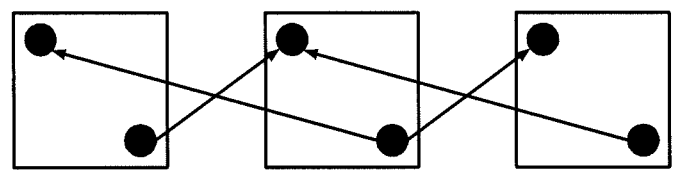
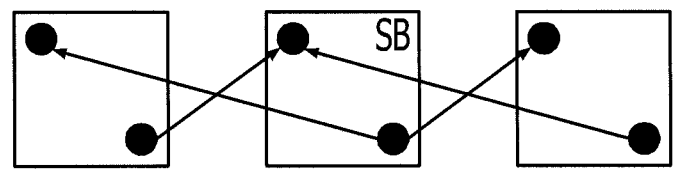
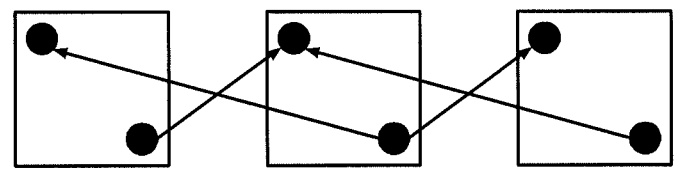

FIG. 70

```
PROTECTION-WALL LINE-SEGMENT DATA {
x1; //START-POINT x COORDINATE (COLUMN
NUMBER IN CELL MATRIX)
y1; //START-POINT y COORDINATE (ROW
NUMBER IN CELL MATRIX)
x2; //END-POINT x COORDINATE (COLUMN
NUMBER IN CELL MATRIX)
y2; //END-POINT y COORDINATE (ROW NUMBER
IN CELL MATRIX)
treeID; //PROTECTION-WALL TREE ID
next; //NEXT POINTER
}
```

FIG. 83

```
EXTRACTION ORDER DATA {
        netID; //NET ID
        order; //EXTRACTION ORDER
}
```

FIG. 86

```
LINE SEGMENT DATA {
sN; //START-POINT NODE ID
eN; //END-POINT NODE
netID; //NET ID
order; //EXTRACTION ORDER
}
```

FIG. 92

```
CELL-SYSTEM LINE-SEGMENT DATA {
x1; //START-POINT COLUMN NUMBER
y1; //START-POINT ROW NUMBER
x2; //END-POINT COLUMN NUMBER
y2; //END-POINT ROW NUMBER
layer; //LAYER NUMBER
netID; //NET ID
next; //NEXT DATA
}
```

FIG. 93

```
EXTRACTION-PATH DATA ePath {
bus; //BUS ID
part; //COMPONENT ID
layer; //LAYER NUMBER
segList; //PATH LINE-SEGMENT LIST
}
```

FIG. 100A

```
FOR ( segP=seqlist; segP != NULL; segP=segP->next ) {
  //OBTAIN LINE WIDTH W AND SET HALF THE WIDTH AS W2
  W←WRule[NInfo[segP->netID].w][segP->layer];
  W2←W/2;
  IF ( segP->x1 == segP->x2 ) { //VERTICAL LINE
    blockage←GENERATE ONE RECORD IN BLOCKAGE-INFORMATION STORAGE SECTION;
    x←orgCellX+ (segP->x1-1)*pitX;
    blockage.S.x ← x-W2;   blockage.E.x ← x+W2;
    blockage.S.y ← orgCellY+ (min(segP->y1, segP->y2) -1)*pitY -W2;
    blockage.E.y ← orgCellY+ (max(segP->y1, segP->y2) -1)*pitY +W2;
    blockage.L←layer;
  } ELSE IF ( segP->y1 == segP->y2 ) { //HORIZONTAL LINE
    blockage←GENERATE ONE RECORD IN BLOCKAGE-INFORMATION STORAGE SECTION;
    y←orgCellY+ (segP->y1-1)*pitY;
    blockage.S.y ← y-W2;   blockage.E.y ← y+W2;
    blockage.S.x ← orgCellX+ (min(segP->x1, segP->x2) -1)*pitX -W2;
    blockage.E.x ← orgCellX+ (max(segP->x1, segP->x2) -1)*pitX +W2;
    blockage.L←layer;
  } ELSE { //FOR OBLIQUE LINE, GENERATE DIVIDED PIECE FOR EACH AREA BETWEEN
ADJACENT CELL CENTERS
    xMin←min(segP->x1, segP->x2);   xMax←max(segP->x1, segP->x2);
    yMin←min(segP->y1, segP->y2);   yMax←max(segP->y1, segP->y2);
    //CORRECT INCLINATION IN COORDINATE SYSTEM BY USING UPPER-LEFT ORIGIN
    IF ( (segP->x1 < segP->x2 AND segP->y1 < segP->y2) OR
         (segP->x2 < segP->x1 AND segP->y2 < segP->y1) ) {
      y←yMin;
```

FIG. 100B

```
      FOR ( x=xMin; x<xMax; x++ ) {
        blockage←GENERATE ONE RECORD IN BLOCKAGE-INFORMATION STORAGE SECTION;
        blockage.S.x←orgCellX+ (x-1)*pitX -W2;   blockage.E.x←orgCellX+ x*pitX +W2;
        blockage.S.y←orgCellY+ (y-1)*pitY -W2;   blockage.E.y←orgCellY+ y*pitY +W2;
        blockage.L←layer;
        y←y+1;
        IF ( y >= yMax )
          break;
        END IF
      }
    } ELSE
    IF ( (segP->x1 < segP->x2 AND segP->y1 > segP->y2) OR
         (segP->x2 < segP->x1 AND segP->y2 > segP->y1) ) {
      y←yMax;
      FOR ( x=xMin; x<xMax; x++ ) {
        blockage←GENERATE ONE RECORD IN BLOCKAGE-INFORMATION STORAGE SECTION;
        blockage.S.x←orgCellX+ (x-1)*pitX -W2;   blockage.E.x←orgCellX+ x*pitX +W2;
        blockage.S.y←orgCellY+ (y-2)*pitY -W2;   blockage.E.y←orgCellY+ (y-1)*pitY +W2;
        blockage.L←layer;
        y←y-1;
        IF ( y<=yMin )
          break;
        END IF
      }
    } ELSE {
      ;// DOES NOT GENERATE BLOCKAGE (DO NOTHING), SINCE CONDITIONS ARE NOT MET
    }
    END IF
  }
  END IF
}
```

FIG. 102

```
ACTUAL-MEASUREMENT-SYSTEM LINE-SEGMENT DATA {
x1; //START-POINT x COORDINATE
y1; //START-POINT y COORDINATE
x2; //END-POINT x COORDINATE
y2; //END-POINT y COORDINATE
layer; //LAYER NUMBER
bus; //BUS ID
part; //COMPONENT ID
netID; //NET ID
next; //NEXT DATA
}
```

METHOD, PROGRAM, AND APPARATUS FOR AIDING WIRING DESIGN

CROSS-REFERENCE TO RELATED APPLICATIONS

This application is based upon and claims the benefit of priority of the prior Japanese Patent Application No. 2010-83262, filed on Mar. 31, 2010, the entire contents of which are incorporated herein by reference.

FIELD

An embodiment discussed herein relates to wiring design for an integrated circuit and printed circuit board.

BACKGROUND

Work for wiring between integrated circuit packages, such as BGAs (ball grid arrays), on printed circuit boards (PCBs) and work for wiring inside integrated circuit packages are broadly divided into global routing and detailed routing. In global routing, between which pins each wire passes through and relative positional relationship of wires, and so on are determined. In detailed routing, actual wiring paths are determined based on the result of the global routing. Wiring paths created in the global routing are hereinafter referred to as "global paths".

In wiring design in recent years, in order to achieve high-speed operations, nets for circuit devices having the same timing restriction are in many cases grouped into a single-layer bus (a bundle of nets) for connection therebetween. In terms of manufacturing costs, nets between components may be wired by a bus in order to efficiently use the wiring space and to suppress the number of layers needed for the wiring. Bus wiring is often applied to most of sections to be wired and it is increasingly becoming important to accurately estimate, at the stage of global routing, accommodation of bus wires.

One bus (a net group) typically has a few to about 64 nets or more. Global paths for bus wiring are not generally determined for individual nets belonging to a bus. In stead, for example, the width given by "the number of all bus nets"× ("wire width"+"wire spacing") is generally used to determine a global path for a consolidated group, for example, with its start and end points being represented by the barycenter of a plurality of pins.

With the increased scales and increased densities of integrated circuits in recent years, a larger number of wiring layers is also needed for wiring design. An increase in the number of wires leads to an increase in the manufacturing cost. In order to minimize the number of wiring layers, it is necessary to optimize assignment of a global path of each bus to a layer, while considering a global path for another bus. For example, Japanese Laid-open Patent Publication No. 2009-301351 discloses a technology for determining, at the stage of the global routing, global paths and wiring layers for all buses while suppressing an increase in the number of layers used.

In the technology disclosed in Japanese Laid-open Patent Publication No. 2009-301351, however, there is a possibility that an appropriate result is not obtained unless the estimation accuracy of the area occupied by a net group (i.e., the bus) is appropriate. When an appropriate result is not obtained, the result affects the detailed design.

A major difficulty in the detailed routing lies in a portion where wires of the net group are extracted from a group of pins to the perimeter of a component. In that portion, the area that is usable for wires is very small, for example, for a few wires, and thus, if the area to be occupied by the net group is underestimated in the global routing, an unwired portion can remain. On the other hand, if the area to be occupied is overestimated, one or some net groups are crowded out to another layer that would otherwise be unnecessary.

SUMMARY

A wiring-design aiding method for causing a computer to execute: generating paths for buses so that the buses do not cross each other with respect to a wiring area including at least one wiring layer, the paths being represented by corresponding graphics; verifying, for each bus, whether or not wires for nets belonging to the bus are successfully extracted from a component to which the bus is connected; and recording, in the wiring area, graphics representing the nets belonging to the bus for which it is determined in the verification that all the nets belonging thereto are successfully extracted; wherein the bus-path generation is re-executed with respect to the bus for which it is determined in the verification that at least one of the nets is not successfully extracted.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 5 illustrates one example of the structure of a wiring-area information storage section;

FIG. 6 illustrates one example of the structure of a blockage-information storage section;

FIG. 8 illustrates one example of the structure of a bus-information storage section;

FIG. 9 illustrates one example of the structure of a net-information storage section;

FIG. 10 illustrates one example of the structure of a wire-width information storage section;

FIG. 12 illustrates one example of the structure of a bus-path rectangle-information storage section;

FIG. 14 illustrates one example of a cross-information table;

FIG. 16 illustrates one example of a result of assignment of layers to the bus paths;

FIG. 23 illustrates a state in which cells are generated at bottleneck portions;

FIG. 24 illustrates one example of the structure of cell data;

FIG. 26 illustrates one example of the structure of node data;

FIG. 27 is a flowchart of a procedure of cell generation processing;

FIG. 29 illustrates one example of the structure of a pin-information storage section;

FIG. 32 illustrates one example of the structure of a gap-rule-information storage section;

FIG. 41 illustrates one example of the structure of edge data;

FIG. 43 illustrates directed edges from egress nodes to ingress nodes in cells adjacent in the east-and-west directions;

FIG. 70 illustrates one example of the structure of protection-wall line-segment data;

FIG. 83 illustrates one example of the structure of extraction-order data;

FIG. 86 illustrates one example of the structure of line-segment data;

FIG. 92 illustrates one example of the structure of cell-system line-segment data;

FIG. 93 illustrates one example of the structure of extraction-path data;

FIGS. 100A and 100B illustrate processing of operation S5-9-8 in FIG. 99.

FIG. 102 illustrates one example of the structure of the actual-measurement-system line-segment data.

DESCRIPTION OF EMBODIMENTS

Figure 1:
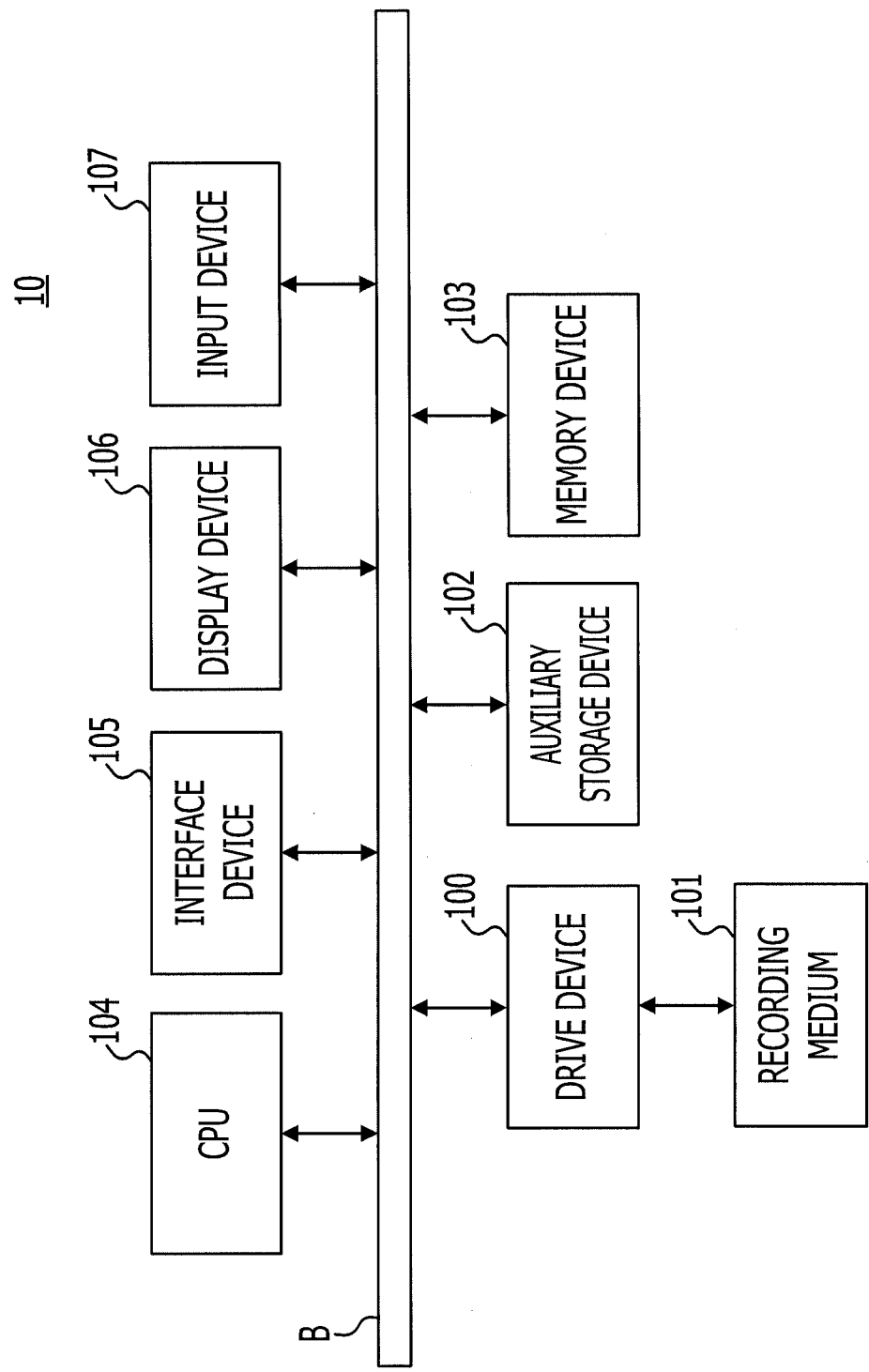
FIG. 1 illustrates one example of the hardware configuration of a wiring-design aiding apparatus according to an embodiment.

Embodiments will be described below with reference to the accompanying drawings. FIG. 1 illustrates one example of the hardware configuration of a wiring-design aiding apparatus according to an embodiment. A wiring-design aiding apparatus 10 in FIG. 1 includes a drive device 100, an auxiliary storage device 102, a memory device 103, a CPU (central processing unit) 104, an interface device 105, a display device 106, and an input device 107, which are interconnected through a bus B.

A program for realizing processing of the wiring-design aiding apparatus 10 is supplied via a recording medium 101, such as a CD-ROM (compact disc-read only memory). When the recording medium 101 on which the program is recorded is loaded into the drive device 100, the program is installed from the recording medium 101 to the auxiliary storage device 102 via the drive device 100. However, the program does not necessarily have to be installed from the recording medium 101, and may be downloaded from, for example, another computer through a network. The auxiliary storage device 102 stores the installed program as well as necessary files, data, and so on.

In response to an instruction for launching the program, the memory device 103 reads the program from the auxiliary storage device 102 and stores the program. The CPU 104 realizes functions for the wiring-design aiding apparatus 10 in accordance with the program stored in the memory device 103. The interface device 105 is used as an interface for connection to the network. The display device 106 is implemented by a CRT (cathode ray tube) display, a liquid crystal display, or the like. The input device 107 includes a keyboard, a mouse, and so on and is used to input various operation instructions.

Figure 2:
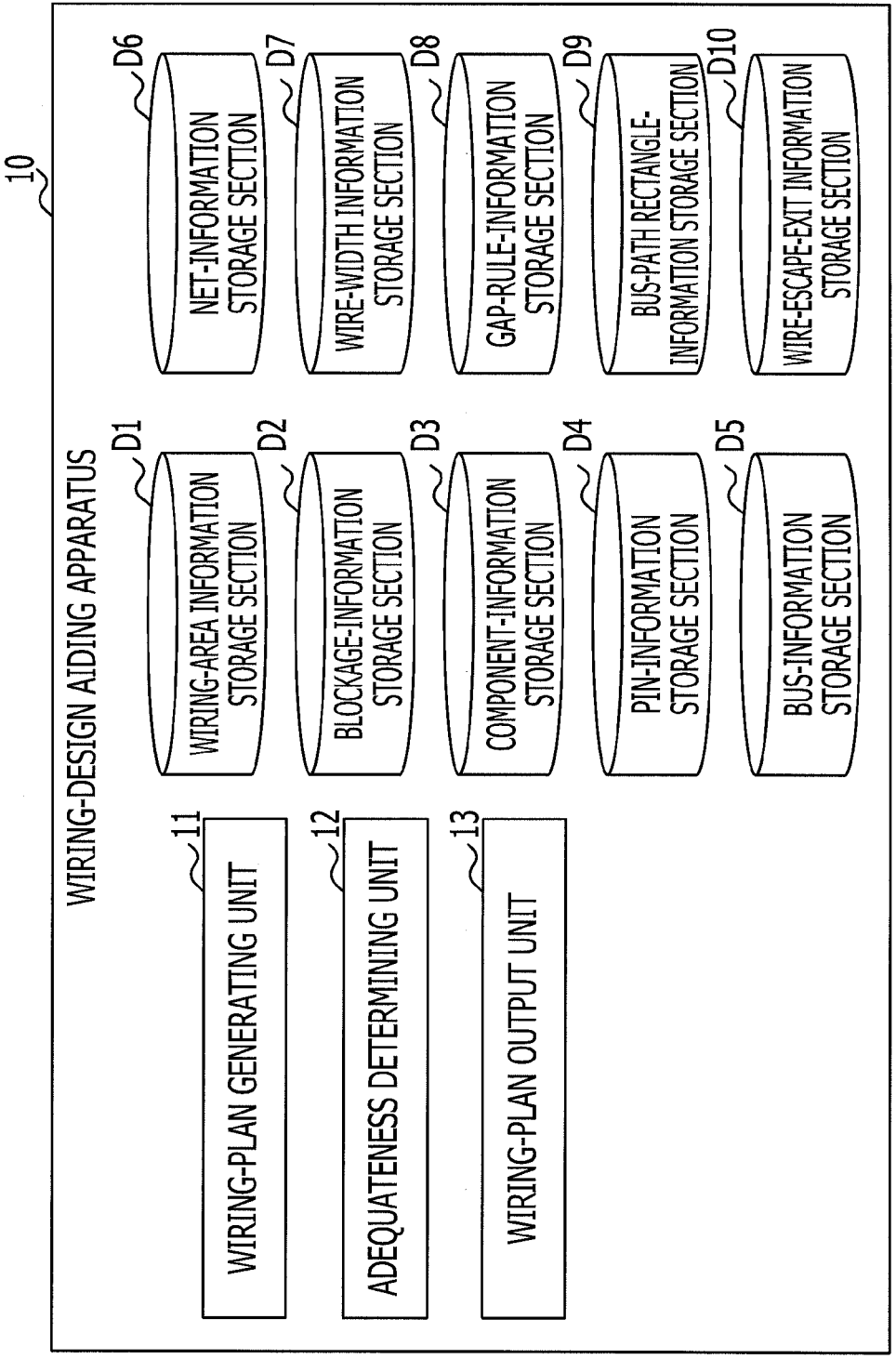
FIG. 2 illustrates an example of a functional configuration of the wiring-design aiding apparatus according to the embodiment.

FIG. 2 illustrates an example of a functional configuration of the wiring-design aiding apparatus according to the embodiment. The wiring-design aiding apparatus 10 serves as an apparatus for aiding global routing between integrated circuit packages, such as BGAs (ball grid arrays), on a printed circuit board (PCB). To aid such global routing, the wiring-design aiding apparatus 10 includes a wiring-plan generating unit 11, an adequateness determining unit 12, a wiring-plan output unit 13, a wiring-area information storage section D1, a blockage-information storage section D2, a component-information storage section D3, a pin-information storage section D4, a bus-information storage section D5, a net-information storage section D6, a wire-width information storage section D7, a gap-rule-information storage section D8, a bus-path rectangle-information storage section D9, a wire-escape-exit information storage section D10, and so on. The program installed on the wiring-design aiding apparatus 10 causes the CPU 104 to execute processing to thereby realize the above-described sections.

The wiring-plan generating unit 11 generates a wiring plan with respect to each bus (a bundle of nets) connecting components, such as BGAs (ball grid arrays), disposed on a substrate. In the present embodiment, the wiring plan refers to information indicating assignment of bus wiring paths and wiring layers.

The adequateness determining unit 12 determines adequateness of the wiring plan generated by the wiring-plan generating unit 11. More specifically, with respect to each bus interconnecting two components, the adequateness determining unit 12 determines whether or not nets belonging to the bus can be extracted from pins in the components. Adequateness of a wiring plan for a bus from which all nets belonging thereto are successfully extracted from the corresponding two components is affirmed. Adequateness of a wiring plan for a bus from which at least one of the nets belonging thereto is not successfully extracted from at least either of the two components is denied. With respect to a bus associated with a wiring plan whose adequateness was denied, the wiring-plan generating unit 11 re-generates a wiring plan.

The wiring-plan output unit 13 outputs a wiring plan whose adequateness was affirmed by the adequateness determining unit 12.

Descriptions of the storage sections are given below.

Figure 3:
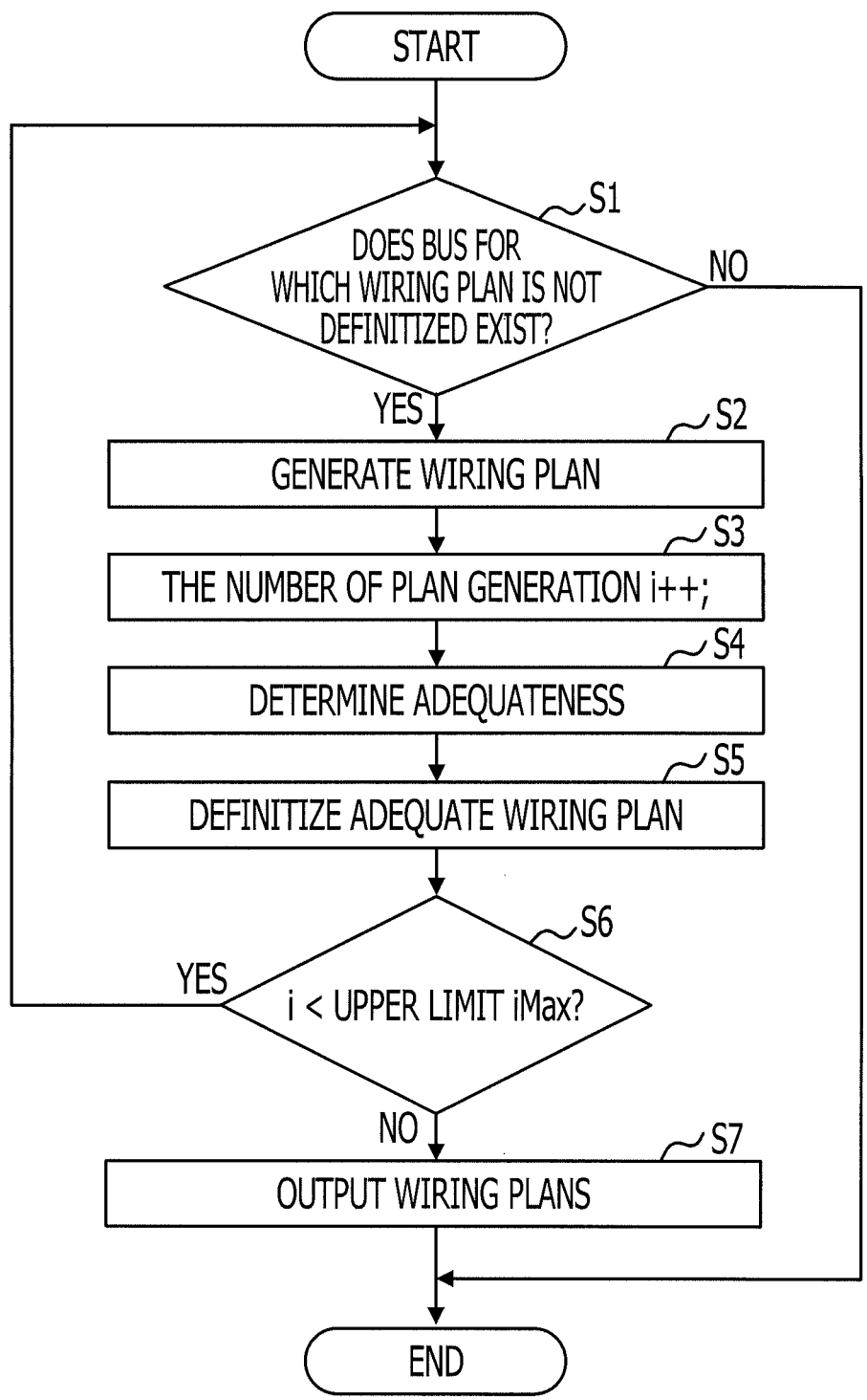
FIG. 3 is a flowchart of an overview of a procedure of processing performed by the wiring-design aiding apparatus.

A procedure of processing of the wiring-design aiding apparatus 10 will be described below. FIG. 3 is a flowchart of an overview of a procedure of processing performed by the wiring-design aiding apparatus.

In operation S1, with respect to buses to be wired, the wiring-plan generating unit 11 determines whether or not a bus for which a wiring plan is not definitized exists. Each wiring plan is definitized when the adequateness thereof is affirmed by the adequateness determining unit 12, as described below. Thus, when operation S1 is executed for the first time, no wiring plans for buses to be wired are definitized.

When a bus for which a wiring plan is not definitized exists (Yes in operation S1), the process proceeds to operation S2 in which the wiring-plan generating unit 11 generates a wiring plan for the bus. A known technology may be used as a method for generating the wiring plan. A method disclosed in Japanese Laid-open Patent Publication No. 2009-301351 may be used in the present embodiment. In the present embodiment, however, in operation S2, the area occupied by the bus is underestimated. This is to avoid inconvenience resulting from overestimating the area occupied by the bus. In the present embodiment, inconvenience caused by the underestimating is eliminated by processing performed by the adequateness determining unit 12 and so on. A "net group" in Japanese Laid-open Patent Publication No. 2009-301351 corresponds to a bus in the present embodiment.

In operation S3, the wiring-plan generating unit 11 adds 1 to the number "i" of generated wiring plans. The initial value of the number "i" of generated wiring plans is 0. In operation S4, the adequateness determining unit 12 determines whether or not the bus wiring plan generated by the wiring-plan generating unit 11 is adequate. Subsequently, in operation S5, the wiring-plan generating unit 11 definitizes the wiring plan whose adequateness was affirmed by the adequateness determining unit 12. Subsequently, in operation S6, the wiring-plan generating unit 11 determines whether or not the number "i" of generated wiring plans is smaller than a preset upper limit.

When the number "i" of generated wiring plans is smaller than the preset upper limit (Yes in S6), operation S1 and the subsequent operations are repeated. In this case, operation S2 and the subsequent operations are executed on a bus for which a wiring plan is not definitized.

When the number "i" of generated wiring plans reaches the preset upper limit (No in S6) or a bus for which a wiring plan is not definitized does not exist (No in S1), the wiring-plan output unit 13 outputs the definitized wiring plans in operation S7.

As described above, in the present embodiment, the wiring plans are generated with the areas occupied by the buses being underestimated. Thus, it is possible to eliminate the problems deriving from the overestimating the areas occupied by the buses. When adequateness of the generated wiring plans (i.e., the possibility of extracting nets from the component) is evaluated and a wiring plan whose adequateness is denied is re-generated. Thus, it is possible to prevent occurrence of adverse effects caused by the underestimating of the areas occupied by the buses.

Figure 4:
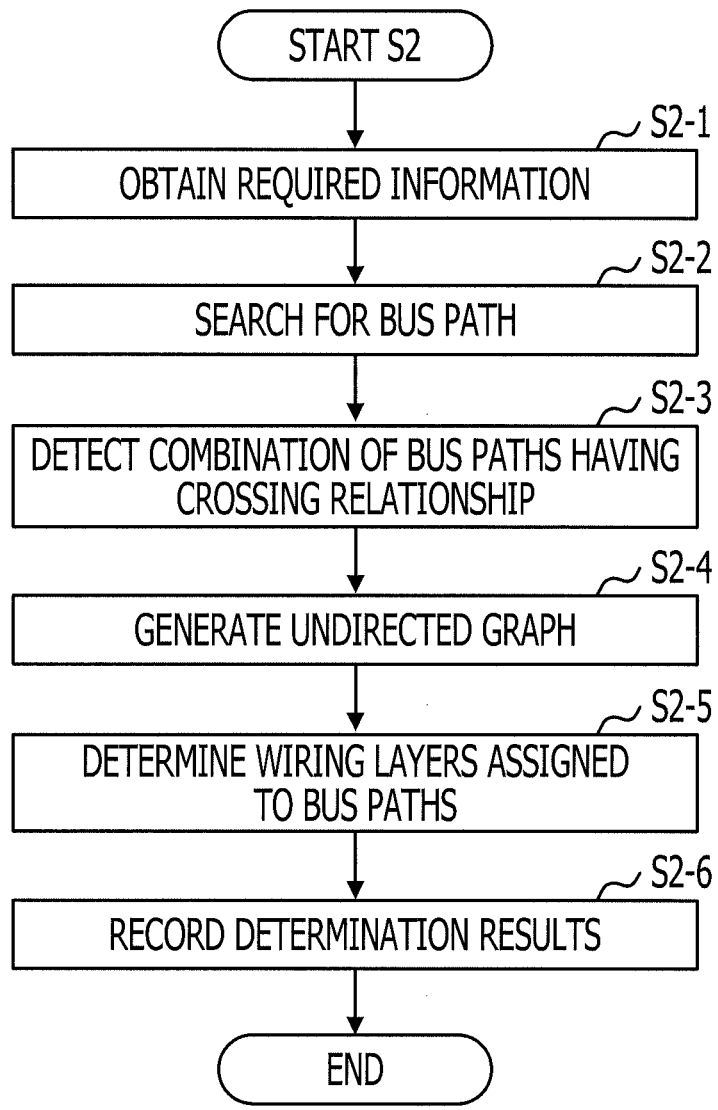
FIG. 4 is a flowchart of one example of a procedure of processing for generating wiring plans.

Details of operation S2 will now be described. FIG. 4 is a flowchart of one example of a procedure of processing for generating wiring plans.

In operation S2-1, the wiring-plan generating unit 11 obtains information, required for generating wiring plans, from the wiring-area information storage section D1, the blockage-information storage section D2, the component-information storage section D3, the bus-information storage section D5, the net-information storage section D6, and the wire-width information storage section D7.

FIG. 5 illustrates one example of the structure of the wiring-area information storage section. As illustrated, wiring-area information, such as origin coordinates, wiring-area dimensions, and the number of layers, is recorded in the wiring-area information storage section D1. The wiring area information is preset as input information for wiring design.

The origin coordinates represent coordinate values of the origin of the wiring area. The wiring area refers to a wirable area in a substrate at which wiring is performed between components. The wiring area dimensions represent the sizes (actual measurement) in an X direction (a width direction) and a Y direction (a height direction) of the wiring area. The number of layers represents the number of wiring layers in the wiring area.

FIG. 6 illustrates one example of the structure of the blockage-information storage section. As illustrated, blockage information, such as an ID, start coordinates S, end coordinates E, and a layer L, for each blockage in the wiring area is recorded in the blockage-information storage section D2. The blockage information is preset as input information for wiring design. Examples of the blockages include transistors, wires, and vias.

The ID is an identifier for each blockage. The start coordinates S represent coordinate values of an upper-left vertex of each blockage when it is expressed as a rectangular area. The end coordinates E represent coordinate values of a lower-right vertex of the rectangular area. Coordinate values of the blockages are pursuant to a wiring-area coordinate system (hereinafter referred to as an "actual-measurement system"). The layer L represents an identifier of a layer in which the blockage exists. In the present embodiment, each layer is identified by a number (a layer number).

Figure 7:
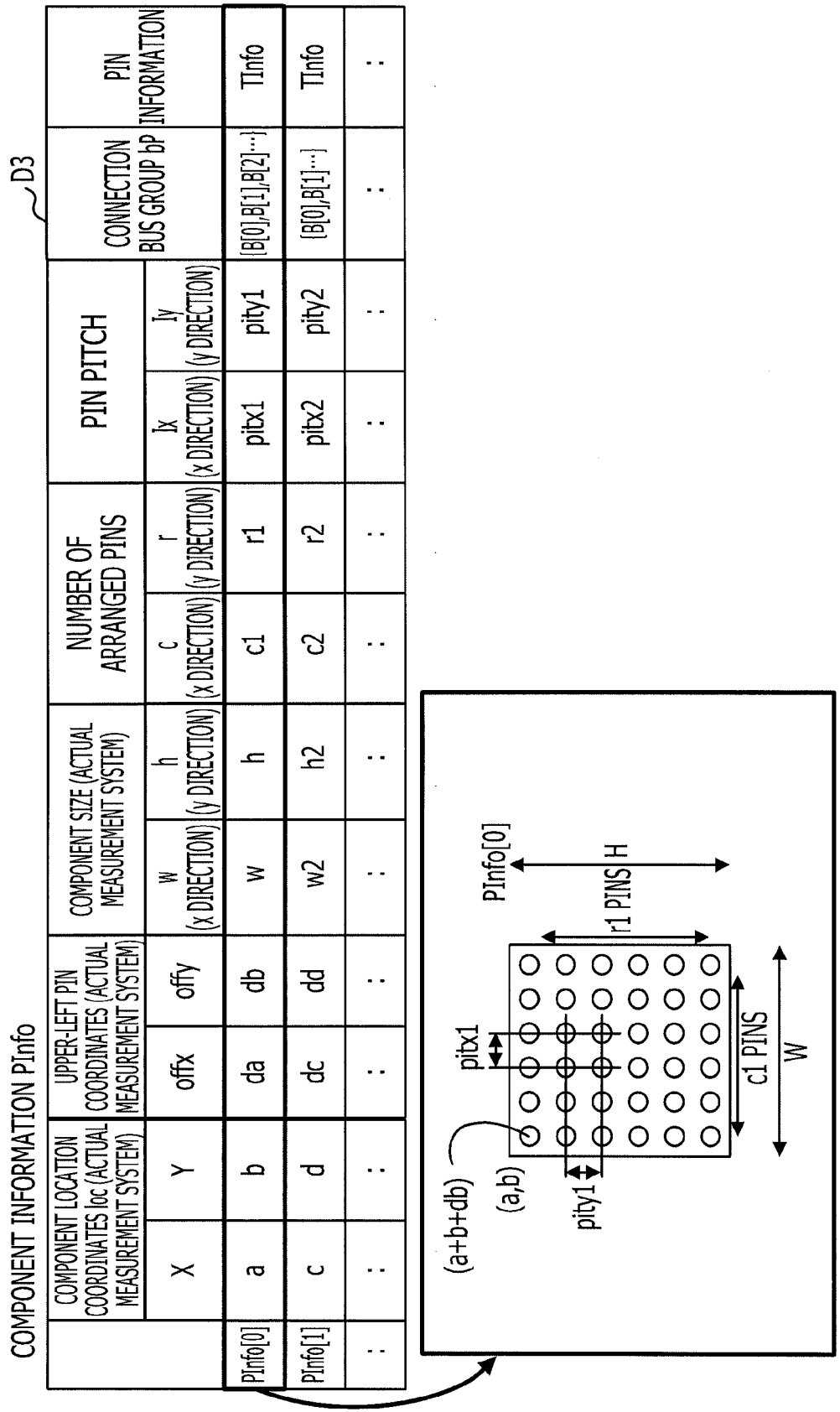
FIG. 7 illustrates one example of the structure of a component-information storage section.

FIG. 7 illustrates one example of the structure of the component-information storage section. As illustrated, component information PInfo, such as component location coordinates "loc", upper-left pin coordinates, a component size, the number of arranged pins, a pin pitch, a connection bus group bP, and pin information, for each component in the wiring layer, is recorded in the component-information storage section D3. The component information PInfo is preset as input information for wiring design. For ease of understanding of the meaning of the items, a graphical image represented by component information PInfo[0], which is a first record (row), is depicted below the table in FIG. 7. The record name of each of the records in the component-information storage section D3 is indicated by PInfo[index number]. The index number is a value indicating the order of a record and starts at 0 (0 origin).

The component location coordinates "loc" are coordinate values of the upper-left vertex of a component in the wiring area. The upper-left pin coordinates are values of an upper-left pin (i.e., a pin in the first row and first column) of the component, the values being offset from the component location coordinates "loc". The offset values are pursuant to the actual-measurement system. The component size indicates the width (W) and the height (H) of the component. The values of the component size are pursuant to the actual-measurement system. The number of arranged pins indicates the number of pins arranged in the width (x) direction and the number of pins arranged in the height (y) direction. The pin pitch indicates an inter-pin distance in the width (x) direction and an inter-pin distance in the height (y) direction. The distances are pursuant to the actual-measurement system. The connection bus group indicates links to bus information of buses connected to the component. The bus information is recorded in the bus-information storage section D5. The pin information indicates a link to information (pin information) of the pins in the component. The pin information is recorded in the pin-information storage section D4.

In operation S2-1 in FIG. 4, the component location information "loc", the component size, and the connection bus group are referred to.

FIG. 8 illustrates one example of the structure of the bus-information storage section. As illustrated, bus information B, such as a bus-net group "netG", a connection-target component group "parts", a priority "prio", a bus-path rectangle list "sP", a layer "L", an extraction-line-segment list "escS", the number "nEsc" of extraction successes, a path definite flag "acc", a path fix flag "fix", and the number "n" of nets, for each bus is recorded in the bus-information storage section D5. The record name of each record in the bus-information storage section D5 is indicated by B [index number].

The bus-net group "netG" is a collection of IDs of nets belonging to a bus (hereinafter, the nets may be referred to as "bus nets"). The IDs of the bus nets correspond to index numbers in the net-information storage section D6 described below. The connection-target component group "parts" indicates the IDs of components interconnected by the corresponding bus. One bus interconnects two components. Thus, the IDs of two components are recorded. The IDs of the components correspond to index numbers in the component-information storage section D3. The priority "prio" indicates a priority in bus wiring. The larger the value is, the higher the priority is. The bus-path rectangle list "sP" contains links to information of a group of rectangles when a bus wiring path (a bus path) is expressed by the rectangles. The information of the rectangles is recorded in the bus-path rectangle-information storage section D9. The layer "L" indicates a layer number assigned to the bus. The extraction-line-segment list "escS" is a list of line-segment data indicating extraction paths for the bus nets with respect to a portion related to bus paths in the component. The extraction-line-segment list "escS" is generated by the wiring-plan output unit 13. The number "nEsc" of extraction successes is the number of times the adequateness determining unit 12 determines that all belongings nets of the bus are successfully extracted from the component. Since one bus is connected to two components, the initial value of the number "nEsc" of extraction successes is 0 and the maximum value thereof is 2. The path definite flag "acc" is a flag indicating whether a bus path (i.e., a wiring plan for the bus) is definitized ("T") or not ("F"). The initial value of the path definite flag "acc" is "F". The path fix flag "fix" is a flag indicating whether the bus path is fixed ("T") or not ("F"). The number "n" of nets indicates the number of nets belonging to the bus.

In the bus-information storage section D5, the bus-net group "netG", the connection-target component group "parts", the priority "prio", the path fix flag "fix", and the number "n" of nets are preset as input information for wiring design. The items surrounded by the thick lines (i.e., the bus-path rectangle list "sP", the layer "L", the extraction-line-segment list "escS", the number "nEsc" of extraction successes, and the path definite flag "acc") are recorded as a result of processing. However, with respect to buses whose values of the path fix flag "fix" are "T", values of all the items are preset.

FIG. 9 illustrates one example of the structure of the net-information storage section. As illustrated, net information NInfo, such as a belonging bus "b", a source pin "sPin", a target pin "tPin", and a wire width "w", for each net belonging to a bus is recorded in the net-information storage section D6. The net information NInfo is preset as input information for wiring design. The record name of each record in the net-information storage section D6 is indicated by NInfo [index number].

The belonging bus "b" indicates an ID (a bus ID) of a bus to which nets belong. The bus ID is an index number in the bus-information storage section D5. The source pin "sPin" and the target pin "tPin" are two pins interconnected by the net. Each pin is specified by a component "pid" and a pin "tid". The component "pid" is the ID of a component in which the corresponding pin is disposed. The pin "tid" is the ID of the pin. The ID of the pin is an index for the pin information for the component having the component "pid". The wire width "w" is a link to a record in the wire-width information storage section D7. The value of the wire width "w" is recorded in the record.

FIG. 10 illustrates one example of the structure of the wire-width information storage section. As illustrated, wire-width information WRule, such as an ID and a line width, is recorded in the wire-width information storage section D7. The ID is an ID of each record. The line width indicates a width required for one wire in each layer. The values of the widths are pursuant to the actual-measurement system.

Figure 11:
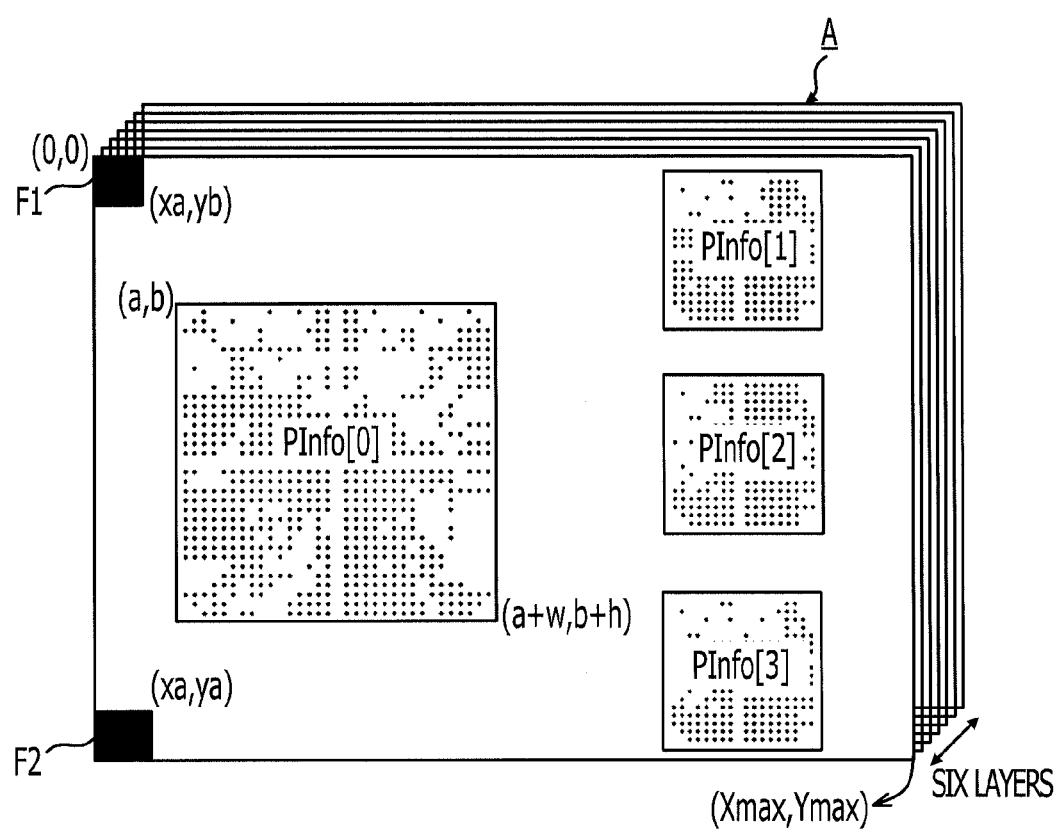
FIG. 11 illustrates an example of a wiring area in the present embodiment.

On the basis of the wiring-area information, the blockage information, and the component information PInfo, for example, a state illustrated in FIG. 11 is specified with respect to a wiring area. FIG. 11 illustrates an example of a wiring area in the present embodiment.

As illustrated, a wiring area A in the present embodiment has six layers, with the upper-left vertex coordinates being (0, 0) and the lower-right vertex coordinates being (Xmax, Ymax). The information is specified based on the wiring area information (in FIG. 5). Components disposed in the wiring area A are given, as reference numbers, component information PInfo (i.e., PInfo[0] to PInfo[3]) corresponding to the components. That is, the positions and the sizes of the individual components are specified based on the component information PInfo (FIG. 7) given as the reference numbers. In addition, the wiring area A has blockages F1 and F2 and so on, which are specified based on the blockage information (FIG. 6).

Referring back to FIG. 4, in operation S2-2, for each bus, the wiring-plan generating unit 11 searches for, in the first to sixth layers in the wiring area A, a wiring path (a bus path) from the start-point coordinates of the bus to the end-point coordinates thereof by using an area other than the areas of blockages F1 and F2 as a wirable area.

More specifically, for example, the wiring-plan generating unit 11 searches for, in the wirable area, a wiring path from the unique start-point coordinates of each bus to the end-point coordinates thereof, allowing for a single bend. When no wiring path is found, the wiring-plan generating unit 11 searches for a wiring path allowing for two bends. When any wiring path is not still found, the wiring-plan generating unit 11 regards that wiring is not possible and ends the search processing.

The bus information of a bus for which wiring-path searching is to be performed is already recorded in the bus-information storage section D5. The start-point coordinates and the end-point coordinates of each bus may be the coordinates of arbitrary points of components included in the connection-target component group "parts" of the bus. The width of each bus is determined based on the number "n" of nets×the width of each net. The value of the width may be obtained from the wire-width information storage section D7. Since a layer in which the bus nets are wired is not determined yet at this stage, the minimum value of the line width for each layer may be obtained. In the component, the nets belonging to the bus need to be split via pins. As a result of the splitting, the width of the entire bus becomes larger than the value given by the number "n" of nets×the width of each net. Thus, it can be said that the bus width given by the number "n" of nets×the width of each net is an underestimated one. The order of wiring-path searching is determined based on the priority "prio" recorded in the bus-information storage section D5.

With respect to a bus for which the bus path was successfully found, the wiring-plan generating unit 11 records, in the bus-path rectangle-information storage section D9, information of a group of rectangles constituting the bus path.

FIG. 12 illustrates one example of the structure of the bus-path rectangle-information storage section. As illustrated, bus-path rectangle information BR, such as a belonging bus "owner", start-point coordinates, end-point coordinates, a layer "L", a fix flag "fixF", and a next rectangle "next", for each of rectangles constituting a bus path, is recorded in the bus-path rectangle-information storage section D9. The record name of each record in the bus-path rectangle-information storage section D9 is indicated by BR [index number].

The belonging bus "owner" is the ID of a bus to which a rectangle belongs. The start-point coordinates are coordinate values (in the actual-measurement system) of the upper-left vertex of the rectangle. The end-point coordinates are coordinate values (in the actual-measurement system) of the lower-right vertex of the rectangle. The layer "L" indicates the number of a layer assigned to the rectangle (i.e., a layer assigned to the bus to which the rectangle belongs). The fix flag "fixF" is a flag indicating whether the bus path to which the rectangle belongs is fixed ("T") or not ("F"). The next rectangle "next" indicates a link to a next one of the rectangles belonging to the same bus path. The link provides a reference to a record of a next rectangle. Absence of a next rectangle is indicated by "null".

With respect to each bus for which the bus path was successfully found, the wiring-plan generating unit 11 records, in the bus-path rectangle list "sP" (FIG. 8) in the bus-information storage section D5, links to the bus-path rectangle information BR of rectangles belonging to the bus path. For example, in the example of FIG. 8, links to the bus-path rectangle information BR[0], BR[1], and BR[2] are recorded in the bus rectangle list "sP" of the bus information B[0].

Figure 13:
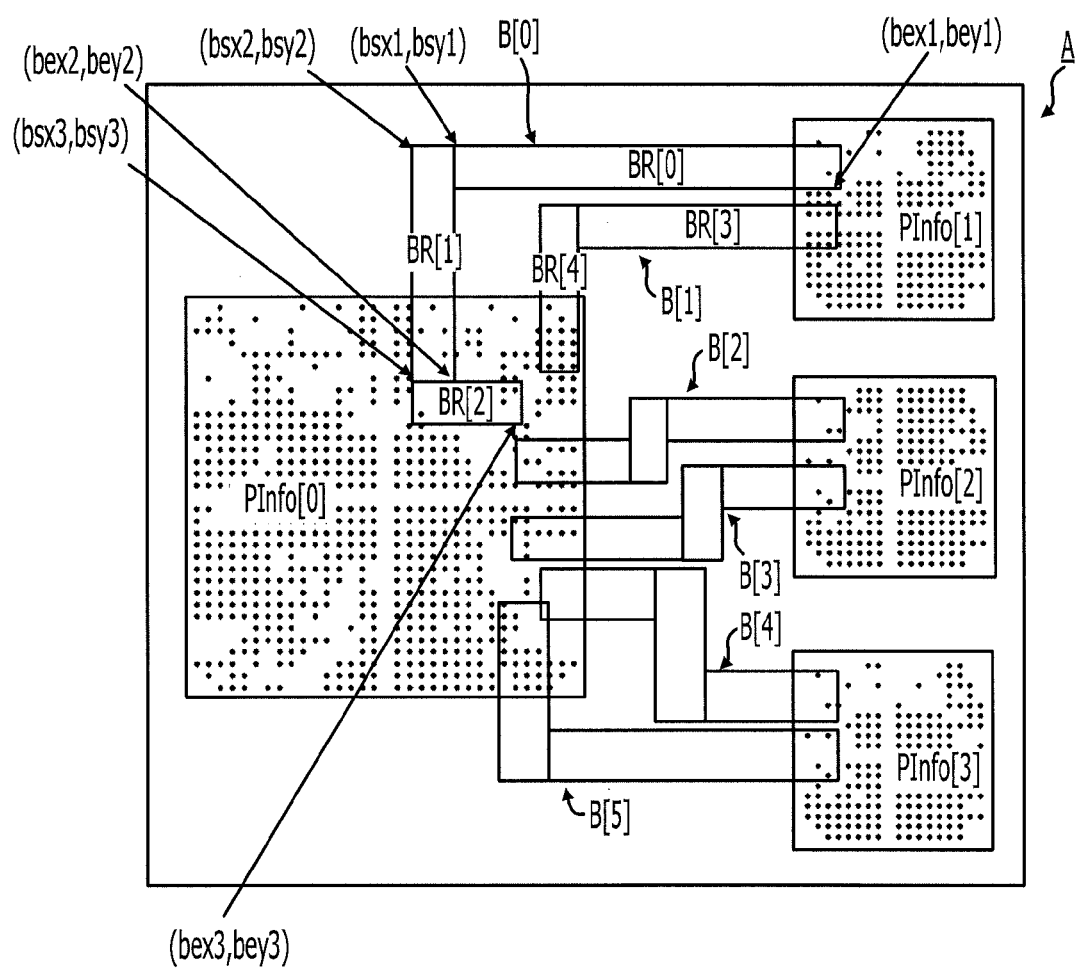
FIG. 13 illustrates one example of the state of a wiring area after bus-path searching.

As a result of the bus-path searching and recording of the bus-path rectangle information BR and the bus-path rectangle list "sP" of the bus information B with respect to the bus paths, the wiring area A turns into a state as conceptually illustrated in FIG. 13.

FIG. 13 illustrates one example of the state of the wiring area after the bus-path searching. In FIG. 13, buses for which bus paths are found are given, as reference numbers, record names B[0] to B[5] of bus information corresponding to the buses. Rectangles belonging to the bus paths for the buses are also given, as reference numbers, record names corresponding to the rectangles. It can be seen from FIG. 13 that the rectangles BR[0], BR[1], and BR[2] constitute the bus B[0], as indicated by the bus rectangle list "sP" in FIG. 8. Similarly, it can be seen that the rectangles BR[3] and BR[4] constitute the bus B[1].

In operation S2-3, the wiring-plan generating unit 11 detects, in the found bus paths, a combination of bus paths having a mutually crossing relationship. A result of the detection is recorded in, for example, a cross-information table implemented by the memory device 103.

FIG. 14 illustrates one example of the cross-information table. The contents of a cross-information table t1 illustrated in FIG. 14 do not correspond to the state illustrated in FIG. 13, for convenience of description.

Each record in the cross-information table t1 contains information regarding an edge ID, a start point, and an end point. The edge ID is an identifier for identifying, in an undirected graph described below, an edge that inter-couples nodes of bus paths having a cross relationship. The start point is indicated by a record name corresponding to one bus path of the bus-path combination having a cross relationship and the end point is indicated by a record name corresponding to the other bus path. Although the suffixes for the record names in the present embodiment are supposed to be numeric values (i.e., the bus IDs), they are abstractly represented by alphabets (a to d) in FIG. 14.

Thus, the cross-information table t1 is an example of a case in which crosses between a total of five pairs of bus paths, including a crossing between the bus paths B[a] and B[c], are detected.

In operation S2-4, the wiring-plan generating unit 11 represents the bus paths, registered in the cross-information table t1, by nodes and generates an undirected graph in which the nodes representing the bus paths having the cross relationships are interconnected by the edges. More specifically, the wiring-plan generating unit 11 represents the bus paths B[a] to B[d] by nodes, on the basis of the cross-information table t1. The wiring-plan generating unit 11 then uses the edges E1 to E5 for the records, recorded in the cross-information table t1, to interconnect the nodes.

Figure 15:
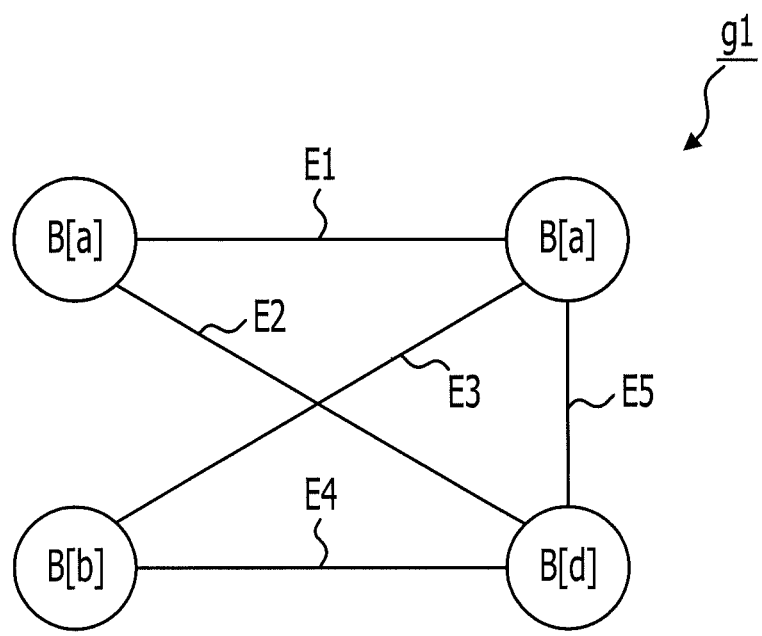
FIG. 15 illustrates one example of an undirected graph indicating the cross relationships of bus paths.

FIG. 15 illustrates one example of an undirected graph indicating the cross relationships of the bus paths. An undirected graph g1 illustrated in FIG. 15 has nodes B[a] to B[d] corresponding to the bus paths B[a] to B[d]. The nodes corresponding to the bus paths having the cross relationships are interconnected by the corresponding edges E1 to E5.

In operation S2-5, the wiring-plan generating unit 11 solves coloring problems in the undirected graph g1 and determines layers to be assigned to the bus paths B[a] to B[d] so that the layers assigned are different from each other between directly connected nodes in the undirected graph g1. More specifically, for example, by using SEQ (SEQuential heuristic), the wiring-plan generating unit 11 sequentially assigns, to the nodes B[a] to B[d] in the undirected graph g1, a color that has not been assigned to the adjacent nodes. Consequently, layers to be assigned to the bus paths are determined, for example, as illustrated in FIG. 16.

Figure 16:
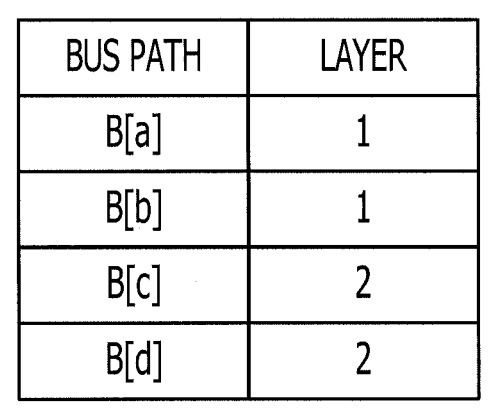

FIG. 16 illustrates one example of a result of assignment of layers to the bus paths. In FIG. 16, the bus paths B[a] and B[b] are assigned to a first layer. The bus paths B[c] and B[d] are assigned to a second layer.

In operation S2-6, the wiring-plan generating unit 11 records determination results (as illustrated in FIG. 16) into the bus-information storage section D5 and the bus-path rectangle-information storage section D9. More specifically, the number of the layer is recorded in the layer "L" in the bus information B of the bus path to which the layer is assigned. The number of the layer is also recorded in the layer "L" in the bus-path rectangle information BR of the rectangle belonging to the bus path to which the layer is assigned.

Detailed description of operation S2 is finished at this point. The above-described method for searching for bus paths and the above-described method for assigning layers to bus paths are merely examples. For example, another modification disclosed in Japanese Laid-open Patent Publication No. 2009-301351 may be used or another known technology may be used.

Figure 17:
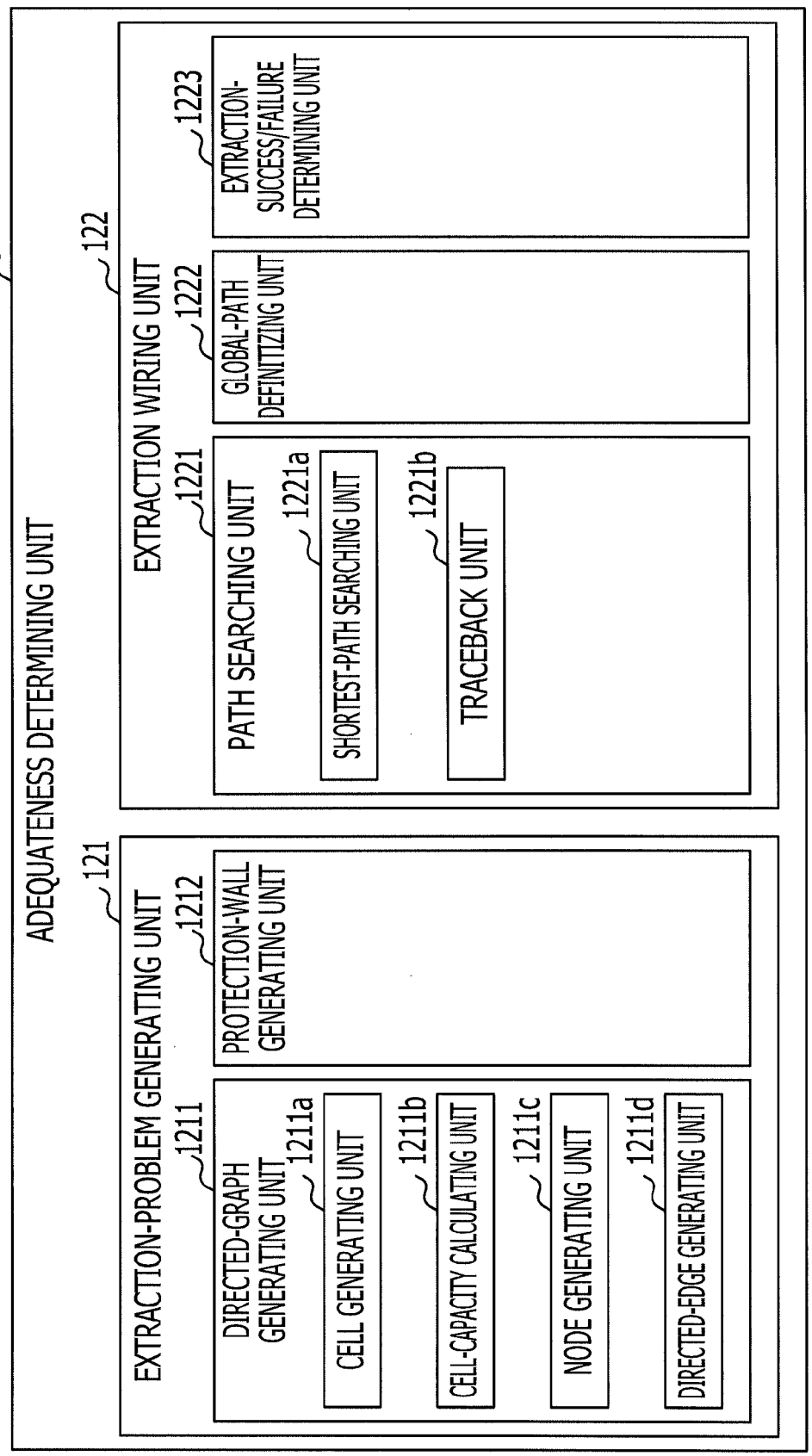
FIG. 17 illustrates an example of a functional configuration of an adequateness determining unit.

Next, a description will be given of details of the processing, performed by the adequateness determining unit 12, in operation S4 in FIG. 3. FIG. 17 illustrates an example of a functional configuration of the adequateness determining unit. As illustrated in FIG. 17, the adequateness determining unit 12 includes an extraction-problem generating unit 121 and an extraction wiring unit 122.

With respect to nets belonging to each bus, the extraction-problem generating unit 121 generates extraction problems for searching for a wiring path from a component to be connected (i.e., extraction problems for extracting nets). The extraction wiring unit 122 generates an extraction path by solving the extraction problems generated by the extraction-problem generating unit 121.

The extraction-problem generating unit 121 includes a directed-graph generating unit 1211, a protection-wall generating unit 1212, and so on. The directed-graph generating unit 1211 generates a network-flow-modeled directed graph for performing global routing. That is, the extraction-problem generating unit 121 applies a network flow model to the problems of extracting wires from a component, such as a BAG (ball grid array). In order to apply the network flow model to the wiring extraction problems, the directed-graph generating unit 1211 places bottlenecks for limiting the number of wires (i.e., restrictions in the number of wires) passing in regions in a component to be wired. The bottlenecks are applied to, at least, pins (which may also be referred to as "terminals"), an inter-horizontal-pin region (a region between two horizontally adjacent pins, including empty pins), an inter-vertical-pin region (a region between two vertically adjacent two pins, including empty pins), and an inter-diagonal-pin region (a region surrounded by four pins, including empty pins). In addition, the bottlenecks are placed on empty pins (i.e., portions where no pins are placed), if any. The bottlenecks are modeled as illustrated in FIG. 18.

Figure 18:
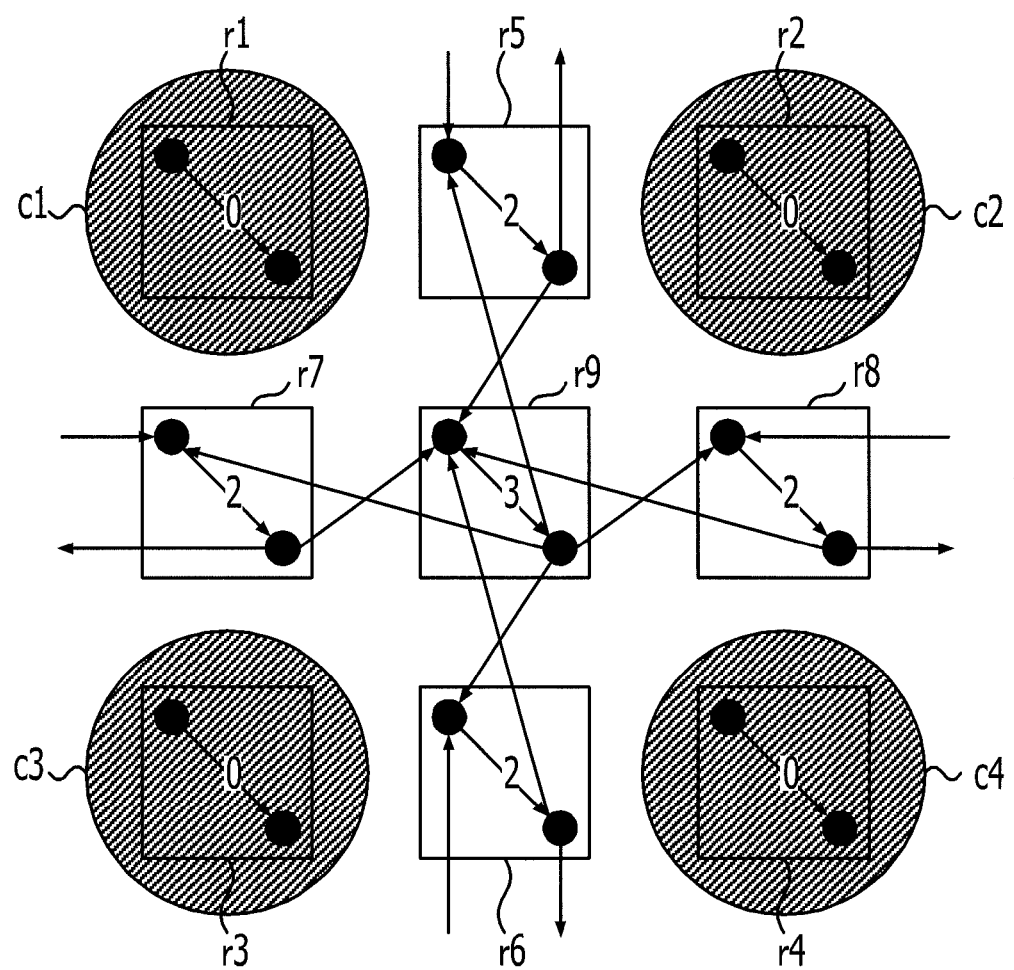
FIG. 18 illustrates an example of a model of bottlenecks placed on components.

FIG. 18 illustrates an example of a model of bottlenecks placed on components. FIG. 18 illustrates only a portion of one component in the wiring area A.

Circles c1 to c4 in FIG. 18 represent pins of a component. Rectangles r1 to r4 placed at the pins, rectangles r5 and r6 placed between the horizontal pins, and rectangles r7 and r8 placed between the vertical pins, and a rectangle r9 placed between the diagonal pins are depicted to represent bottleneck portions. In the present embodiment, each of the rectangles is referred to as a "cell". Each cell is given a capacity (i.e., an allowable number of wire passages). In FIG. 18, the numeric value in each cell indicates the capacity given thereto. That is, in processing performed by the adequateness determining unit 12, the rows and columns of the cells are mapped with respect to each component. A coordinate system in one component which is specified by the row numbers and the column numbers of the cells is referred to as a "cell coordinate system".

Each cell has two nodes. The upper left node is an ingress node and the lower right node is an egress node. In accordance with predetermined rules, the directed-graph generating unit 1211 generates a directed edge that connects the nodes. In FIG. 18, arrows interconnecting the nodes represent directed edges. As a result of generation of the directed edges, a directed graph used for performing global routing is generated.

As illustrated in FIG. 17, the directed-graph generating unit 1211 includes a cell generating unit 1211a, a cell-capacity calculating unit 1211b, a node generating unit 1211c, and a directed-edge generating unit 1211d. Functions of the units are described below.

The protection-wall generating unit 1212 generates a protection wall in the cell coordinate system. The protection wall is a virtual wall for protecting, during sequential search for extraction paths (global paths) for buses, extraction areas for other buses that are not extraction sources. Details of the protection wall are described below.

As illustrated in FIG. 17, the extraction wiring unit 122 includes a path searching unit 1221, a global-path definitizing unit 1222, and an extraction-success/failure determining unit 1223 (which is described below). With respect to each of nets belonging to a bus, the path searching unit 1221 searches for, in the directed graph generated by the directed-graph generating unit 1211, a shortest path for extracting a wire from a component. The path searching unit 1221 includes a shortest-path searching unit 1221a, a traceback unit 1221b, and so on. Functions of the units are described below.

The global-path definitizing unit 1222 definitizes the global-routing extraction paths (the global paths) by assigning the paths, found by the path searching unit 1221, to the corresponding wires.

Figure 19:
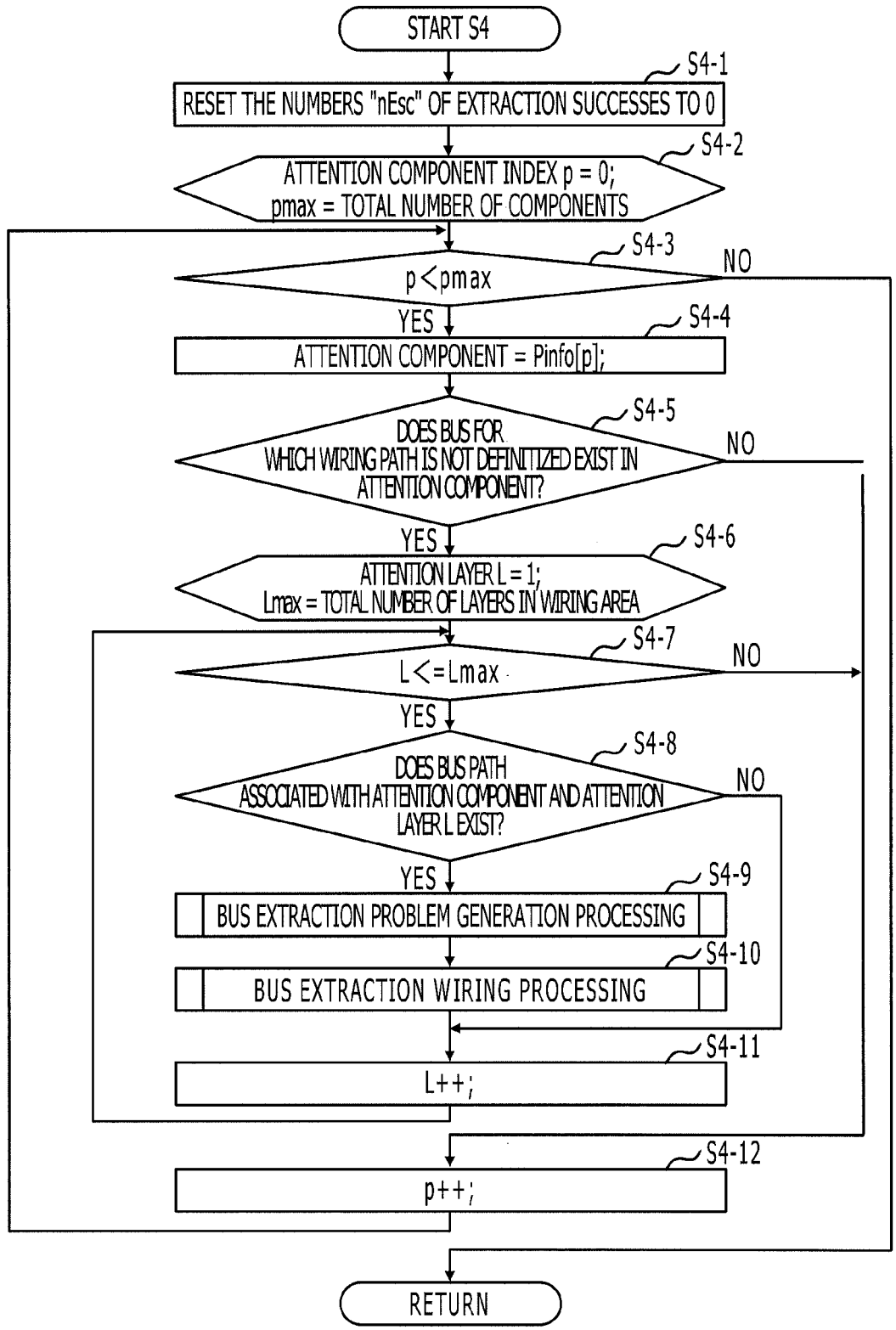
FIG. 19 is a flowchart of a procedure of processing for determining adequateness of a wiring plan.

Details of a procedure for the processing in operation S4 will be described below. FIG. 19 is a flowchart of a procedure of processing for determining adequateness of a wiring plan.

In operation S4-1, the adequateness determining unit 12 resets (initializes), in all records in the bus-information storage section D5, the numbers "nEsc" of extraction successes to 0. In operation S4-2, the adequateness determining unit 12 assigns 0 to a variable p indicating the index of a component to which attention is given as a component to be processed (the component may hereinafter be referred to as an "attention component"). The adequateness determining unit 12 also assigns the total number of components disposed in the wiring area A to a variable pmax. The total number of components corresponds to the total number of records in the component-information storage section D3.

In operation S4-3, the adequateness determining unit 12 determines whether or not the value of the variable p reaches the variable pmax, i.e., whether or not the processing has been completed on all components. When any unprocessed component exists (Yes in S4-3), the process proceeds to operation S4-4 in which the adequateness determining unit 12 selects, as the attention component, a component associated with the p-th component information (the component information PInfo[p], see in FIG. 7). Subsequently, in operation S4-5, the adequateness determining unit 12 determines whether or not a bus for which a wiring path is not definitized exists in the buses connected to the attention component. More specifically, buses connected to the attention component are specified on the basis of the connection bus group bP in the component information PInfo[p]. Whether or not the wiring path for the bus is definitized is determined based on the path definite flag "acc" in the bus information B (see FIG. 8) of the bus.

When a bus for which a wiring path is not definitized exists (Yes in S4-5), the process proceeds to operation S4-6 in which the adequateness determining unit 12 sets the layer to which attention is given as a layer to be processed (which may hereinafter be referred to as the "attention layer") to 1. The adequateness determining unit 12 also assigns the total number of layers in the wiring area to a variable Lmax. The number of layers in the wiring area is obtained from the wiring-area information storage section D1 (see FIG. 5).

In operation S4-7, the adequateness determining unit 12 determines whether or not the attention layer L is smaller than the variable Lmax. When the attention layer L is smaller than the variable Lmax (Yes in S4-7), the process proceeds to operation S4-8 in which the adequateness determining unit 12 determines whether or not a bus path associated with the attention component PInfo[p] and the attention layer L exists. More specifically, a determination is made as to whether or not any record in which the value of the layer L in the bus information B matches the value of the attention layer L exists in the buses included in the connection bus group bP in the attention component PInfo[p].

When a bus associated with the attention component PInfo[p] and the attention layer L exists (Yes in S4-8), the process proceeds to operation S4-9 in which the extraction-problem generating unit 121 generates extraction problems in the attention component with respect to nets belonging to, of bus(es) connected to the attention component, each bus whose wiring path is assigned to the attention layer L. Subsequently, in operation S4-10, by solving the extraction problems generated by the extraction-problem generating unit 121, the extraction wiring unit 122 generates an extraction path for the nets belonging to each bus associated with the attention component PInfo[p] and the attention layer L.

Through operations S4-8 to S4-11, operations S4-8 to S4-10 are executed on all layers with respect to the attention component. However, with respect to a layer determined (in operation S4-8) not to have any bus path associated with the attention component PInfo[p], operations S4-9 and S4-10 are not executed. That is, this arrangement is aimed for a state in which pins of one component penetrate multiple layers thereof.

When the processing on all layers has been completed with respect to the attention component PInfo[p] (No in S4-7), the adequateness determining unit 12 adds 1 to the value of the variable p in operation S4-12. Thus, a next component in the component-information storage section D3 is set as the attention component. When processing on all components is completed (No in S4-3), the processing in FIG. 19 ends.

Figure 20:
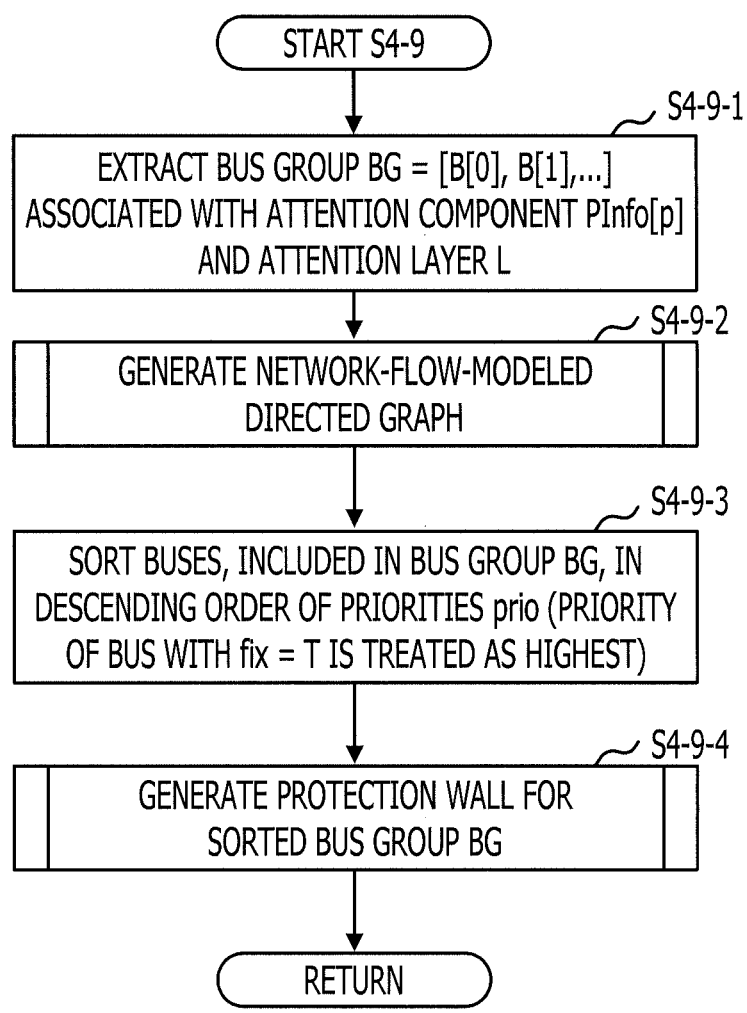
FIG. 20 is a flowchart of processing for generating problems in extracting buses associated with an attention component and an attention layer.

Details of operation S4-9 will be described next. FIG. 20 is a flowchart of the processing for generating problems in extracting buses associated with an attention component and an attention layer.

In operation S4-9-1, the extraction-problem generating unit 121 extracts buses associated with the attention component PInfo[p] and the attention layer L, on the basis of the component-information storage section D3 and the bus-information storage section D5, and registers the extracted buses into the bus group BG. Subsequently, in operation S4-9-2, with respect to nets belonging to the buses registered in the bus group BG, the directed-graph generating unit 1211 generates a network-flow-modeled directed graph for performing global routing for the attention component PInfo[p] and the attention layer L.

In operation S4-9-3, the extraction-problem generating unit 121 sorts the buses, included in the bus group BG, in descending order of the priorities "prio" in the bus information B of the buses. In this case, the priority of a bus for which a path is fixed is treated as the highest priority. The "bus for which a path is fixed" refers to, in the bus-information storage section D5, a bus whose value of the path fix flag "fix" is "T". In operation S4-9-4, the protection-wall generating unit 1212 executes, in the sorted order, protection-wall generation processing on the buses belonging to the bus group BG.

Details of operation S4-9-2 will be described next. First, a description will be given of a directed graph resulting from the processing in operation S4-9-2.

Figure 21:
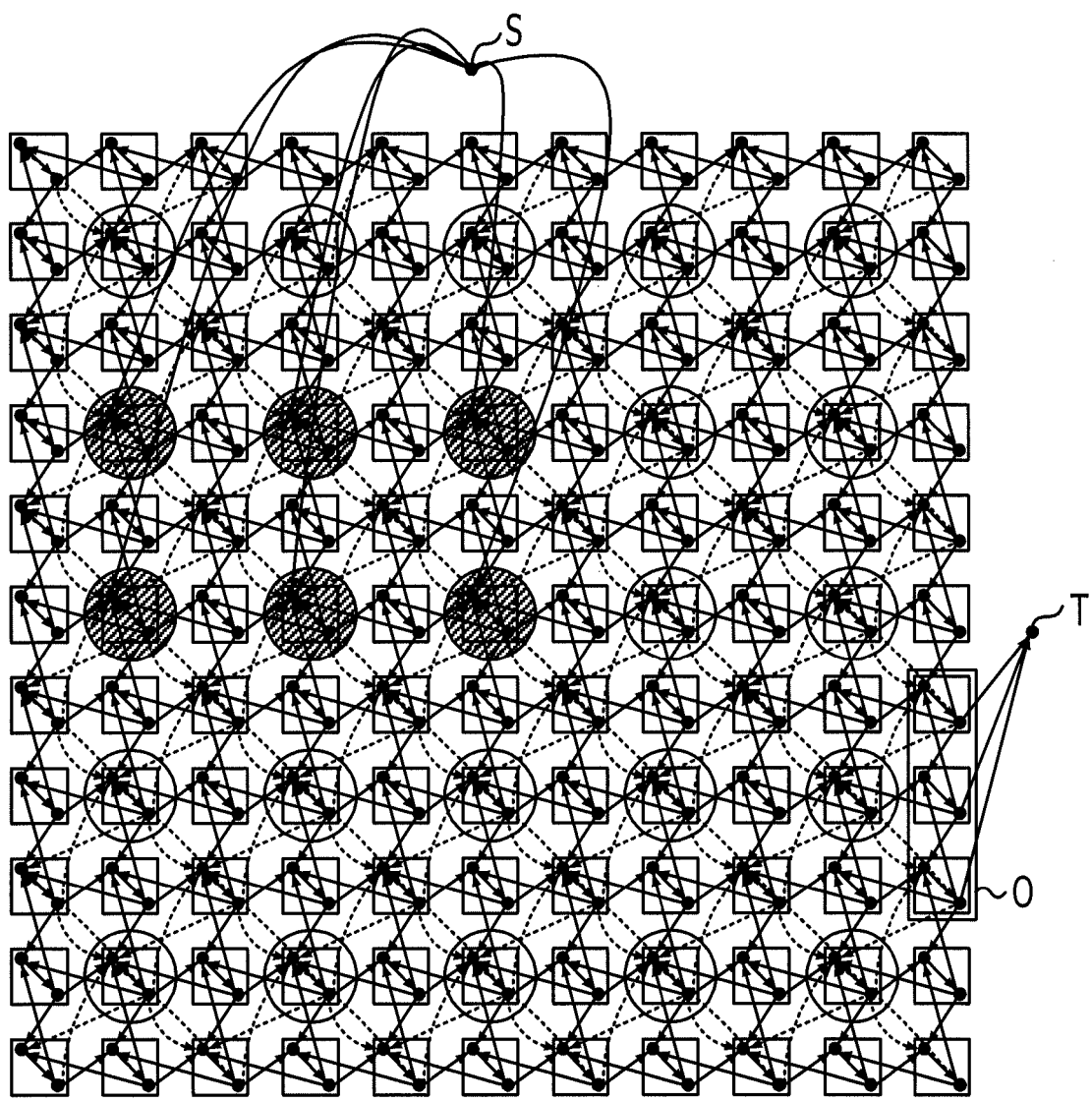
FIG. 21 illustrates an example of a directed graph generated by a directed-graph generating unit.

FIG. 21 illustrates an example of a directed graph generated by the directed-graph generating unit.

In FIG. 21, circles indicated by solid lines represent pins. Circles colored gray represent pins from which wires are to be extracted (the pins are hereinafter referred to as "extraction-source pins"). Circles indicated by dotted lines represent empty pins. Rectangles represent cells. The directed graph illustrated in FIG. 21 is one generated when the positions of exits of wring lines are limited to an exit position O surrounded by a dotted line. Cells included in the exit position O are referred to as "egress cells". Thus, as a result of generation of a directed edge having a direction from an ingress node in a cell to an egress node therein and a directed edge having a direction from the egress node to an ingress node in another adjacent cell, a directed graph is generated. In FIG. 21, a source node S is a node placed as a start point of the directed graph. A target node T is a node located as an end point of the directed graph. Each directed edge has a capacity corresponding to the capacity of the cell to which a node to which the directed edge is connected belongs.

Figure 22:
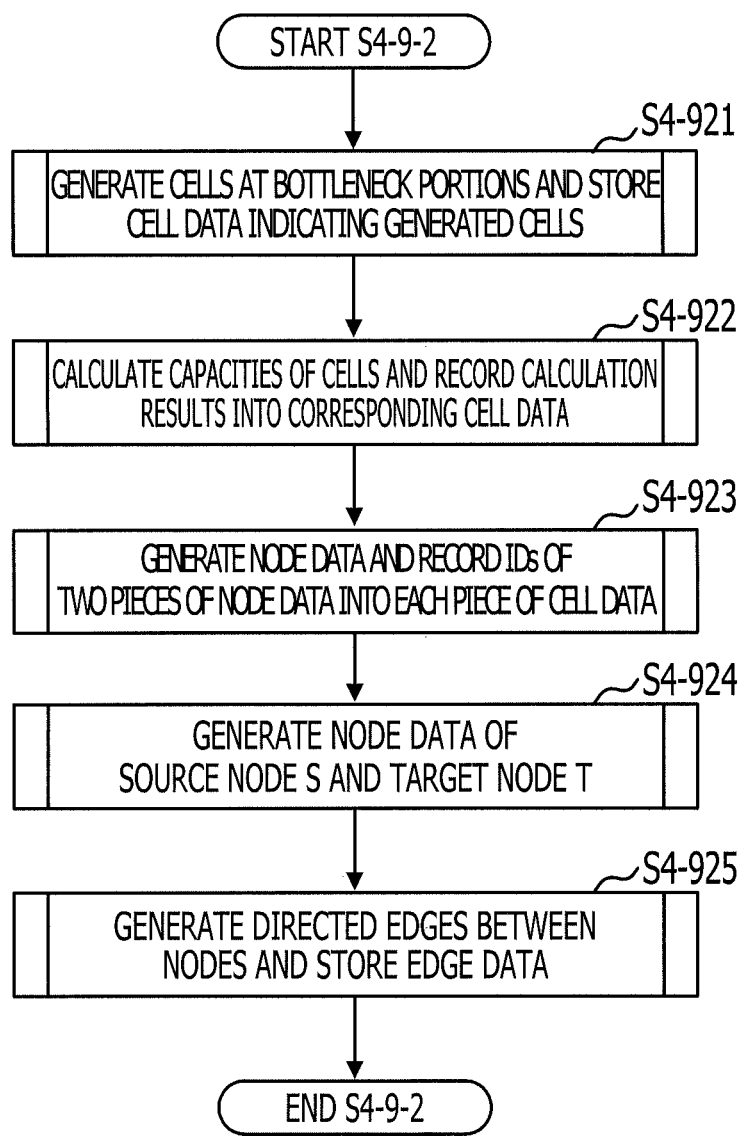
FIG. 22 is a flowchart of a procedure of directed-graph generation processing performed by the directed-graph generating unit.

A description will be given of details of processing for generating a directed graph as illustrated in FIG. 21. FIG. 22 is a flowchart of a procedure of directed-graph generation processing performed by the directed-graph generating unit. The term "component" in the description below refers to the attention component PInfo[p] in the attention layer L.

In operation S4-921, the cell generating unit 1211a generates cells at bottleneck portions of the component and stores, in the auxiliary storage device 102, data (cell data) indicating the generated cells. In the present embodiment, the bottleneck portions are pins, inter-horizontal-pin portions, inter-vertical-pin portions, inter-diagonal-pin portions, and empty pins. Thus, cell data corresponding to the positions of those portions are generated.

Figure 23:
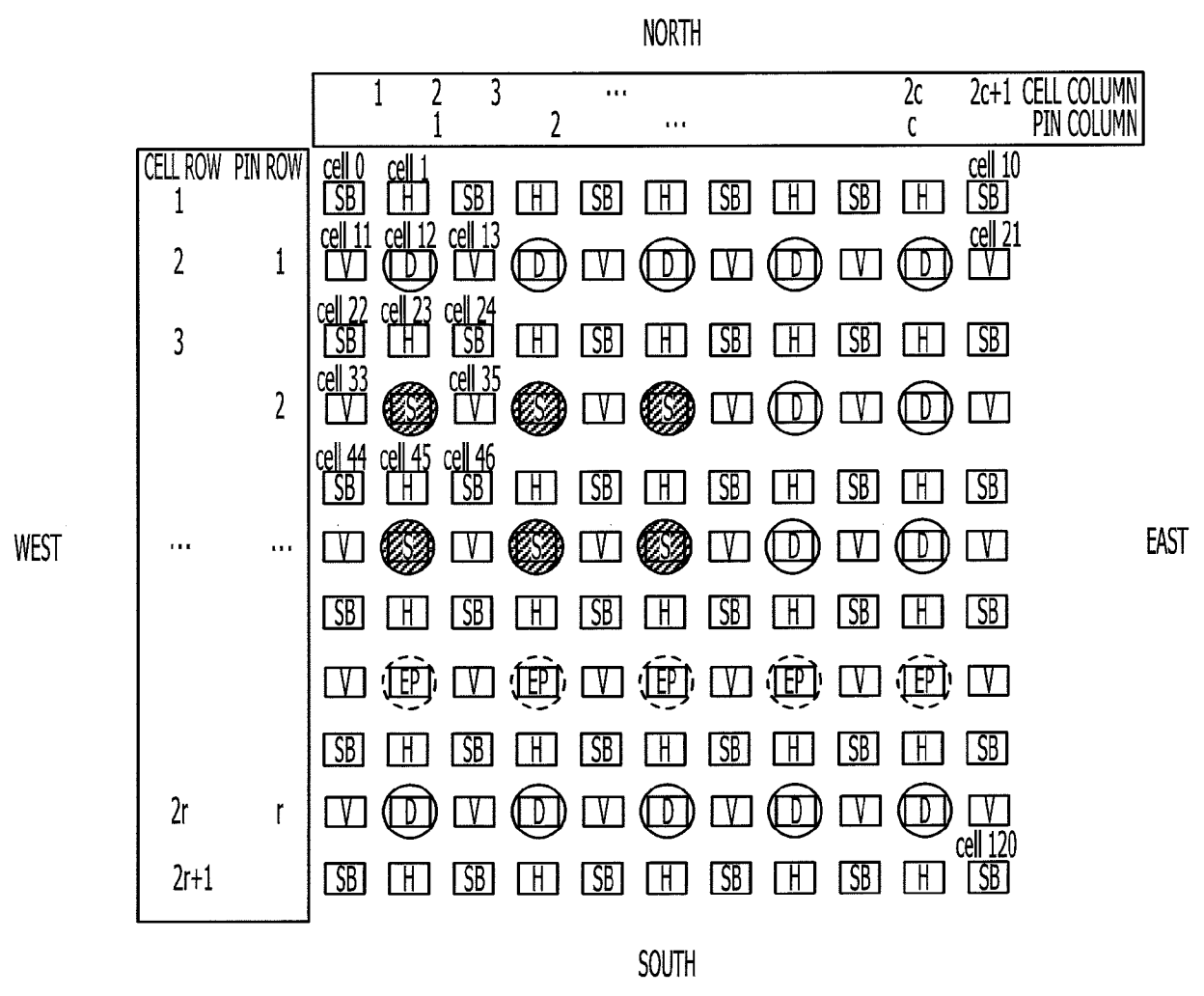

FIG. 23 illustrates a state in which cells are generated at the bottleneck portions. In other words, FIG. 23 illustrates an entire cell coordinate system of one component. The notations in FIG. 23 are the same as those in FIG. 21. In FIG. 23, row numbers and column numbers of cell rows and cell columns (a cell matrix) and of pin rows and pin columns (a pin matrix) are further depicted. Thus, the position of each cell is managed by the row number of the cell row and the column number of the cell column. The position of each pin is managed by the row number of the pin row and the column number of the pin column. In the present embodiment, a direction in the cell matrix or the pin matrix is distinguished by north, south, east, and west. It is assumed that, in the drawings, the upper side is north, the lower side is south, the right side is east, and the left side is west. Such direction, however, is for comparative and illustrative purposes, and north, south, east, and west may be assigned to any directions.

FIG. 24 illustrates one example of the structure of cell data. In FIG. 24, the cell data is illustrated in the form of data structure. In what form the cell data and other data described below are realized may be selected as appropriate.

As illustrated in FIG. 24, the cell data has member variables (data items), such as a cell attribute (attr), a net ID (netID), an egress flag (exitF), an x coordinate (x), a y coordinate (y), a node ID (iN) of an ingress node, a node ID (oN) of an egress node, a capacity (cap), an initial capacity (cap2), a row number (r), a column number (c), a protection-wall color (flavor), a capacity-checked flag (pinCapCheckedF), an adjacent right cell pointer (rLink), an adjacent left cell pointer (lLink), an adjacent east cell pointer (cE), an adjacent west cell pointer (cW), an adjacent north cell pointer (cN), an adjacent south cell pointer (cS), a label-propagation-source direction (parentDir), a search source flag (sFlag), a search target flag (tFlag), a course (label), a protection-wall tree ID (treeID), a protection-wall tree line-segment list (segList), the number (segNum) of protection-wall tree line-segments, the number (cellNum) of protection-wall tree cells, and the number (patternNum) of protection-wall tree line-segment passages, where characters in the parentheses represent the names of the member variables.

The cell attribute (attr) indicates to which bottleneck portion the cell corresponds. "S" indicates that the cell is located at an extraction-source pin. "EP" indicates that the cell is located at an empty pin. "D" indicates that the cell is located at a normal pin (i.e., a pin other than an extraction-source pin or an empty pin). "V" indicates that the cell is located between horizontal pins. "H" indicates that the cell is located between vertical pins. "SB" indicates that the cell is located between diagonal pins. The values of the cell attributes are indicated in the cells in FIG. 23. As can be seen from FIG. 23, in the present embodiment, portions (cells) adjacent to the east of the pins in the east-end column and portions (cells) adjacent to the west of the pins in the west-end column are also set as inter-horizontal-pin portions (V). Portions (cells) adjacent to the north of the pins in the north-end row and portions (cells) adjacent to the south of the pins in the south-end row are set as inter-vertical-pin portions (H). Portions (cells) that are located at the periphery side of the component and that obliquely adjoin (that are obliquely adjacent to) the pins in the east-end column, the pins in the west-end column, the pins in the north-end row, or the pins in the south-end row are also set as inter-diagonal-pin portions (SB). In the present embodiment, the reason why the inter-horizontal-pin portions are indicated by "V" and the inter-vertical-pin portions are indicated by "H" is that the cells between the horizontal pins are vertically arranged and the cells between the vertical pins are horizontally arranged.

The net ID (netID) is a member variable that is valid for a cell located at an extraction-source pin. The identifier (the net ID) of a net (a wire) to be extracted from the extraction-source pin is registered as the net ID (netID). The egress flag (exitF) is a member variable indicating whether or not the cell is an egress cell in the cell matrix in FIG. 23. Also, "true" is registered with respect to an egress cell and "false" is registered with respect to a non-egress cell. The x coordinate (x) represents, in an on-component relative-coordinate system, an x coordinate value of a representative position (e.g., an upper-left vertex) of the cell. The y coordinate (y) represents, in the on-component relative-coordinate system, a y coordinate value of the predetermined position of the cell. The term "on-component relative-coordinate system" refers to, for example, a coordinate system having its origin at the upper-left vertex of a component and employing actual measurements (e.g., millimeter) as its unit. The node ID (iN) of the ingress node is the identifier (the node ID) of the ingress node of the cell. The node ID (oN) of the egress node is the identifier (the node ID) of the egress node of the cell. The capability (cap) is the capacity of the cell, i.e., the number of allowable wire passages. The initial capacity (cap2) is a member variable for saving (holding) the value of the capacity (cap). The initial capacity (cap2) is used since the value of the capacity (cap) may be temporarily varied for convenience of processing. The row number (r) is a row number of the cell row in which the cell is located. The column number (c) is a column number of the cell column in which the cell is located.

The capacity-checked flag (pinCapCheckedF), the adjacent right cell pointer (rLink), the adjacent left cell pointer (lLink), the adjacent east cell pointer (cE), the adjacent west cell pointer (cW), the adjacent north cell pointer (cN), the adjacent south cell pointer (cS), the label-propagation-source direction (parentDir), the search source flag (sFlag), the search target flag (tFlag), the course (label), the protection-wall tree ID (treeID), the protection-wall tree line-segment list (segList), the number (segNum) of protection-wall tree line-segments, the number (cellNum) of protection-wall tree cells, and the number (patternNum) of protection-wall tree line-segment passages are described below in the process of description of the procedure.

One piece of cell data corresponds to a single cell. Thus, in operation S4-921, pieces of cell data corresponding to the number of cells are generated.

Subsequently, in S4-922, the cell-capacity calculating unit 1211b calculates the capacities of the cells by using the wiring-area information storage section D1, the component-information storage section D3, the gap-rule-information storage section D8, and so on, and records the calculation results into the corresponding cell data capacities (cap) and the initial capacities (cap2).

In operation S4-923, the node generating unit 1211c generates, in the auxiliary storage device 102, data (node data) indicating nodes for respective cells and records the node IDs of the pieces of node data into the node IDs of the ingress nodes and the node IDs of the egress nodes in the respective piece of cell data. In operation S4-924, the node generating unit 1211c generates node data of a source node S and node data of a target node T.

Figure 25:
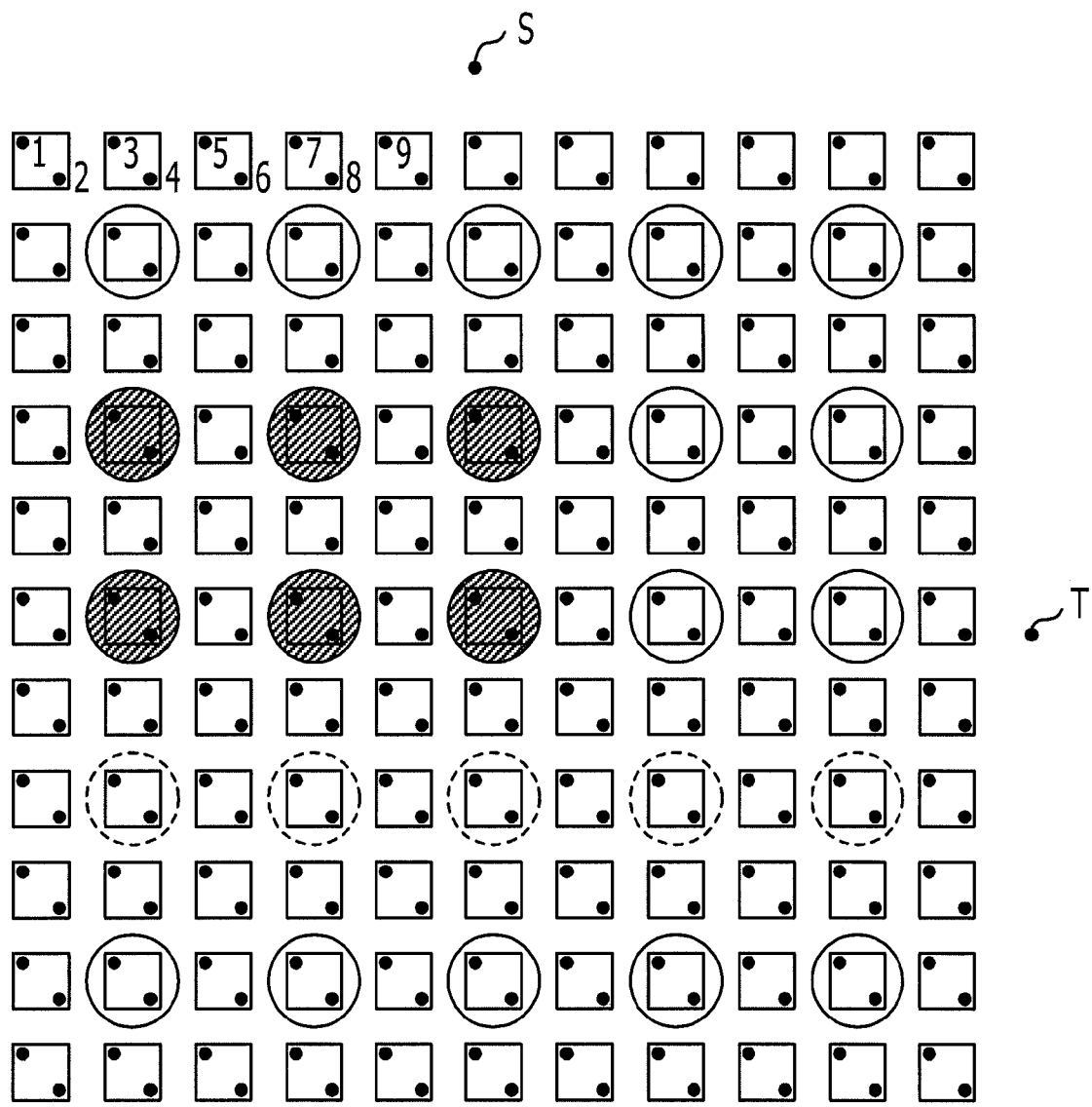
FIG. 25 illustrates a state in which nodes are generated.

FIG. 25 illustrates a state in which nodes are generated. In FIG. 25, dots representing the ingress node and egress nodes of cells are illustrated. A dot representing the source node S and a dot representing the target node T are also illustrated.

FIG. 26 illustrates one example of the structure of the node data. As illustrated in FIG. 26, the node data has member variables (data items), such as a label-propagation-source node ID (pID), a shortest-path length (dist), a cell ID (cellID) of an owner cell, a node attribute (attr), a brother node ID (bros), a search source flag (sFlag), a search target flag (tFlag), a directed edge (eBros) connected to a brother node [the directed edge is hereinafter referred to as "brother-node directed edge (eBros)"], a directed edge (eE) connected to a node of an adjacent east cell [hereinafter, "adjacent-east-cell node directed edge (eE)"], a directed edge (eW) connected to a node of an adjacent west cell [hereinafter, "adjacent-west-cell node directed edge (eW)"], a directed edge (eS) connected to a node of an adjacent south cell [hereinafter, "adjacent-south-cell node directed edge (eS)"], a directed edge (eN) connected to a node of an adjacent north cell [hereinafter, "adjacent-north-cell node directed edge (eN)"], a directed edge (eNE) connected to a node of a northeast cell [hereinafter, "adjacent-northeast-cell node directed edge (eNE)"], a directed edge (eNW) connected to a node of a northwest cell [hereinafter, "adjacent-northwest-cell node directed edge (eNW)"], a directed edge (eSE) connected to a node of a southeast cell [hereinafter, "adjacent-southeast-cell node directed edge (eSE)"], a directed edge (eSW) connected to a node of a southwest cell [hereinafter, "adjacent-southwest-cell node directed edge (eSW)"], a list (sourceEdgeList) of directed edges from the source node S [hereinafter, "source-node-S directed-edge list (sourceEdgeList)"], a list (target-EdgeList) of directed edges to the target node T [hereinafter, "target-node-T directed-edge list (targetEdgeList)"], and a label front flag (lFrontF).

The label-propagation-source node ID (pID) is the node ID of a node (a parent node) that serves as a label propagation source for path searching for an extraction path for a wire. The shortest path length (dist) denotes a shortest path length from the ingress node in the extraction-source cell to a node of interest. The cell ID (cellID) of an owner cell is the identifier (the cell ID) of a cell (an owner cell) to which the node of interest belongs. The node attribute (attr) is an attribute indicating whether the node of interest is an ingress node or an egress node. Character "in" represents an ingress node and "out" represents an egress node. The brother node ID (bros) is the node ID of another node (a brother node) in the same cell. The search source flag (sFlag) is a member variable indicating whether the node of interest is a source node S or the ingress node in an extraction-source cell (true) or not (false). The search target flag (tFlag) is a member variable indicating whether the node of interest is a target node T or the egress node in an egress cell (true) or not (false).

The brother-node directed edge (eBros) is data (edge data) of a directed edge generated between the node of interest and the brother node. The adjacent-east-cell node directed edge (eE) is edge data of a directed edge generated between the node of interest and a node of a cell adjacent at the east side (i.e., an east adjacent cell). The adjacent-west-cell node directed edge (eW) is edge data of a directed edge generated between the node of interest and a node of a cell adjacent at the west side (i.e., an adjacent west cell). The adjacent-south-cell node directed edge (eS) is edge data of a directed edge generated between the node of interest and a node of a cell adjacent at the south side (i.e., an adjacent south cell). The adjacent-north-cell node directed edge (eN) is edge data of a directed edge generated between the node of interest and a node of a cell adjacent at the north side (i.e., an adjacent north cell). The adjacent-northeast-cell node directed edge (eNE) is edge data of a directed edge generated between the node of interest and a node of a cell adjacent at the northeast side (i.e., a northeast cell). The adjacent-northwest-cell node directed edge (eNW) is edge data of a directed edge generated between the node of interest and a node of a cell adjacent at the northwest side (i.e., a northwest cell). The adjacent-southeast-cell node directed edge (eSE) is edge data of a directed edge generated between the node of interest and a node of a cell adjacent at the southeast side (i.e., a southeast cell). The adjacent-southwest-cell node directed edge (eSW) is edge data of a directed edge generated between the node of interest and a node of a cell adjacent at the southwest side (i.e., a southwest cell).

The source-node-S directed-edge list (sourceEdgeList) is a list of edge data of directed edges from the source node S to the ingress nodes of extraction-source cells, and is valid for the node data of the source node S. The target-node-T directed-edge list (targetEdgeList) is a list of edge data of directed edges from the egress nodes of egress cells to the target node T, and is valid for the node data of the target node T. The label front flag (lFrontF) is a flag indicating whether or not the node of interest is a node at a forefront (a label front) of path searching.

In operation S4-925 in FIG. 22, the directed-edge generating unit 1211d generates directed edges between the nodes and stores, in the auxiliary storage device 102, edge data indicating the generated directed edges. Upon completion of operation S4-925, a state illustrated in FIG. 21 is obtained. At this point, however, directed edges from the source node S and directed edges to the target node T are not generated. This is because the directed edges differ depending on a bus subjected to searching for paths for extracting wires for belonging nets.

Details of operation S4-921 in FIG. 22 will be described next. FIG. 27 is a flowchart of a procedure of cell generation processing.

In operation S4-921-1, the cell generating unit 1211a generates a cell-data array (a cell-data array "cell") in the auxiliary storage device 102. When the number of pin rows is r and the number of pin columns is c, the number of elements of the cell-data array "cell" is $(2r+1) \times (2c+1)$. The number of pin rows and the number of pin columns may be obtained from, in the component-information storage section D3, values recorded in the pin arrangement size registered in the component information Pinfo corresponding to the attention component. The cell generating unit 1211a records the row numbers (r) and column numbers (c) of the cells into the elements of the cell data included in the cell-data array "cell". Although the cell-data array "cell" may be a one-dimensional or three-dimensional array, it is assumed to be a two-dimensional array in the present embodiment. For convenience of description, cell data in processing described below refer to the cell data generated in the auxiliary storage device 102. However, considering the performance of processing, the arrangement may also be such that cell data are generated in the memory device 103 and the generated data are subjected to the processing.

In operation S4-921-2, the cell generating unit 1211a associates the cell data of cells, located in the even-numbered row and even-numbered column in the cell matrix, with the pins (including the empty pins) and gives cell attributes to the resulting cell data.

In operation S4-921-3, the cell generating unit 1211a gives the attribute "H", the attribute "V", and the attribute "SB" to the cell data of the cells located in the odd-numbered row and even-numbered column, the even-numbered row and odd-numbered column, and the odd-numbered row and odd-numbered column, respectively, in the cell matrix. That is, "H (inter-vertical-pin portion)" is recorded in the cell attributes in the cell data of the cells in the odd-numbered rows and the even-numbered columns. "V (inter-horizontal-pin portion)" is recorded in the cell attributes in the cell data of the cells in the even-numbered rows and the odd-numbered columns. In addition, "SB (inter-diagonal-pin portion)" is recorded in the cell attributes in the cell data of the cells in the odd-numbered rows and the odd-numbered columns.

In operation S4-921-4, of the cells of the cell data in which the values of the cell attributes are "S", "H", "V", or "EP", the cell generating unit 1211a sets "true" for the values of the egress flags (exitF) in the cell data of the cells located at the perimeter of the cell matrix and sets "false" for the values of the egress flags (exitF) in the cell data of the cells that are not located at the perimeter.

Figure 28:
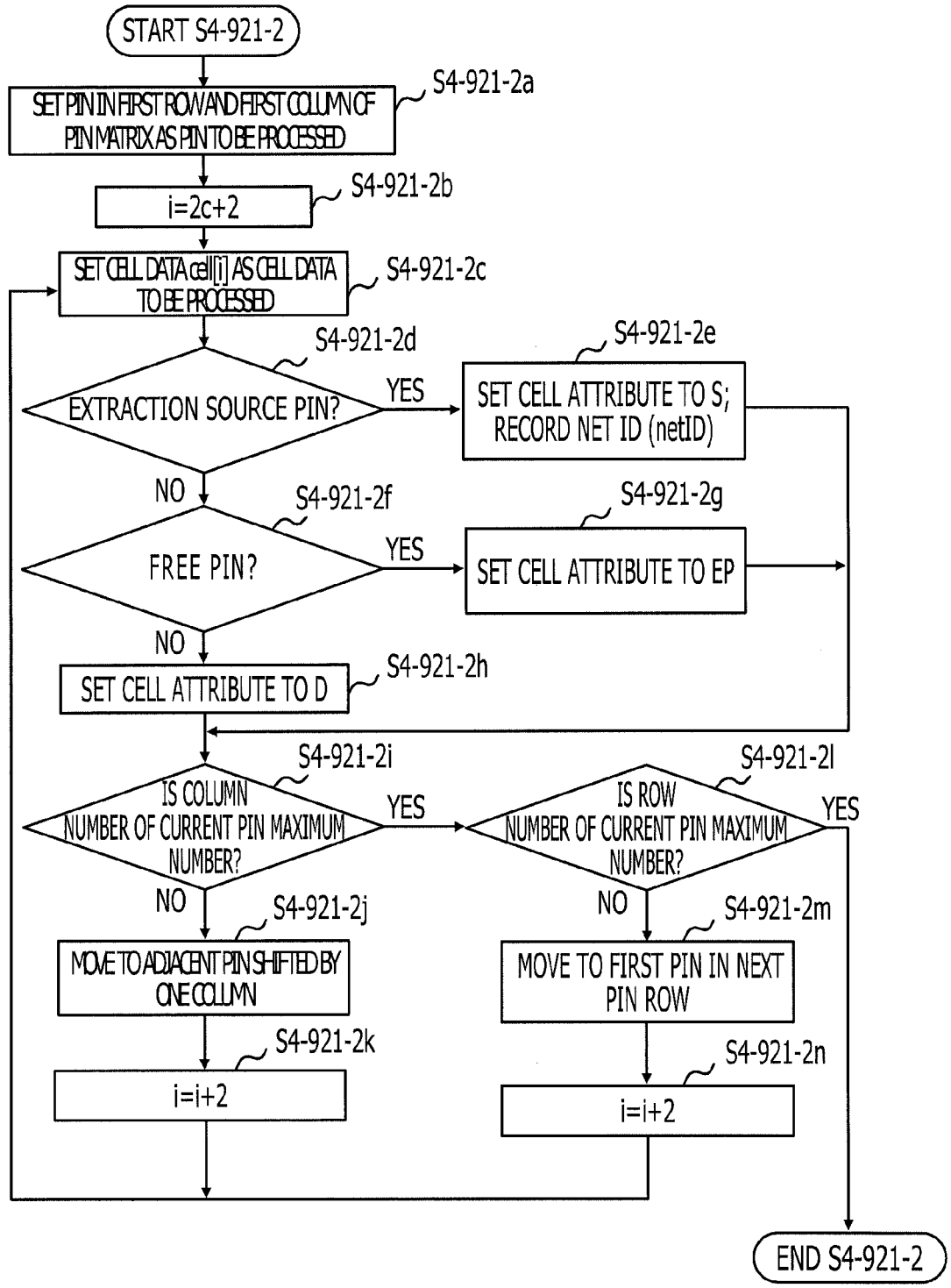
FIG. 28 is a flowchart of a procedure of processing performed on cell data of cells located in even-numbered rows and even-numbered columns.

Details of operation S4-921-2 will be described next. FIG. 28 is a flowchart of a procedure of processing performed on cell data of cells located in even-numbered rows and even-numbered columns.

In operation S4-921-2a, the cell generating unit 1211a obtains, from the pin-information storage section D4, pin information corresponding to the pin in the first row and the first column of the pin matrix, and sets the pin information as information to be processed.

FIG. 29 illustrates one example of the configuration of the pin-information storage unit. As illustrated in FIG. 29, pin information TInfo, such as center coordinates, a connection "net", a shape "shape", and a radius "r", for each pin is recorded in the pin-information storage section D4. The pin information TInfo is preset as input information for wiring design. In the example in FIG. 29, tables are distinguished between components. That is, the pin information TInfo of all pins in one component is recorded in one table. The pin information in the component-information storage unit D3 (FIG. 7) is a link to each table.

The center coordinates in the pin information TInfo represent the position of a pin by using the pin row H and the pin column V. The connection "net" is the ID of a net connected to the pin. The connection "net" is valid for an extraction-source pin. The ID of the net is the index number in the net-information storage unit D6 (in FIG. 9). The value of the connection "net" for a pin that is not connected to a net is indicated by "nil". The shape "shape" is the shape of the pin. The shape of the pin indicates rectangle, circle, or empty, or the like. The character "empty" indicates that the pin is an empty pin. The radius "r" is the radius (actual measurement) of the pin. The radius "r" includes parameters x and y, considering a case in which the shape of the pin is rectangular.

In operation S4-921-2a, a record in which the row H of the center coordinates is 1 and the column V thereof is 1 is obtained from the table for the attention component.

Subsequently, in operation S4-921-2b, the cell generating unit 1211a initializes the value of a variable i to 2c+2. In this case, c indicates the number of pin columns. Thus, 2c+1 is the number of cell columns. Hence, 2c+2 is a suffix for the element (cell data) in the second row and the second column in the cell-data array "cell". The origin of the suffix is 0 (i.e., origin 0). In operation S4-921-2c, the cell generating unit 1211a sets, as cell data to be processed, an element (cell data) in which the suffix in the cell-data array "cell" is i.

In operation S4-921-2d, on the basis of the pin information TInfo associated with the cell data to be processed, the cell generating unit 1211a determines whether or not the pin associated with the pin information TInfo (the pin may hereinafter be referred to as an "attention pin") is an extraction-source pin. That is, a determination is made as to whether or not the value of the connection "net" in the pin information TInfo is a value other than "nil".

When the attention pin is an extraction-source pin (Yes in S4-921-2d), the process proceeds to operation S4-921-2e in which the cell generating unit 1211a records S (extraction-source pin) into the cell attribute (attr) in the cell data to be processed and records, into the net ID (netID), the value of the connection "net" registered in the pin information TInfo to be processed. When the pin (i.e., the attention pin) associated with the pin information TInfo to be processed is not an extraction-source pin (No in S4-921-2d), the process proceeds to operation S4-921-2f. In this operation, on the basis of the pin information TInfo, the cell generating unit 1211a determines whether or not the attention pin is an empty pin. That is, a determination is made as to whether or not the shape "shape" in the pin information TInfo indicates "empty". When the attention pin is an empty pin (Yes in S4-921-2f), the process proceeds to operation S4-921-2g in which the cell generating unit 1211a records EP (empty pin) into the cell attribute (attr) in the cell data to be processed. When the attention pin associated with the pin information TInfo to be processed is not an empty pin (No in S4-921-2f), the process proceeds to operation S4-921-2h in which the cell generating unit 1211a records D (pin) into the cell attribute (attr) in the cell data to be processed.

Subsequent to operation S4-429-e, S4-921-2g, or S4-921-2h, in operation S4-921-2i, the cell generating unit 1211a determines whether or not the column number in the pin information TInfo to be processed reaches the maximum value (i.e., the number of pin columns). The number of pin columns is specified by the value of the number "c" of arranged pins which is recorded in the component information PInfo (FIG. 7) of the attention component. When the column number in the pin information TInfo is not the maximum number (No in S4-921-2i), the process proceeds to operation S4-921-2j in which the cell generating unit 1211a sets, as the pin information to be processed, the pin information TInfo for the pin in the pin column shifted eastward by one column (i.e., the pin information TInfo in which the value of the column V of the center coordinates is increased by 1). In operation S4-921-2k, the cell generating unit 1211a adds 2 to the variable i. That is, the cell data to be processed is shifted eastward by two columns in the cell column.

On the other hand, when the column number in the pin information TInfo is the maximum value (Yes in S4-921-2i), the process proceeds to operation S4-921-2l in which the cell generating unit 1211a determines whether or not the row number in the pin information TInfo reaches the maximum number (i.e., the number of pin rows). The number of pin rows is specified by the value of the number (r) of arranged pins which is recorded in the component information PInfo (FIG. 7) of the attention component. When the row number in the pin information TInfo is not the maximum value (No in S4-921-2l), the process proceeds to operation S4-921-2m in which the cell generating unit 1211a sets, as the pin information to be processed, the pin information TInfo for the first pin in a next pin row (i.e., a row at the south side). In operation S4-921-2n, the cell generating unit 1211a adds 2c+4 to the variable i. That is, cell data for the cell located in the next south-side column but one (i.e., the next even-numbered row) and in the second column in the cell matrix.

Subsequent to operation S4-921-2k or S4-921-2n, processing in operation S4-921-2c and the subsequent processing is repeatedly performed on a next cell (cell data) in the even-numbered row and even-numbered column. When the processing on all pins is completed (Yes in S4-921-2l), the processing in FIG. 28 ends.

Figure 30:
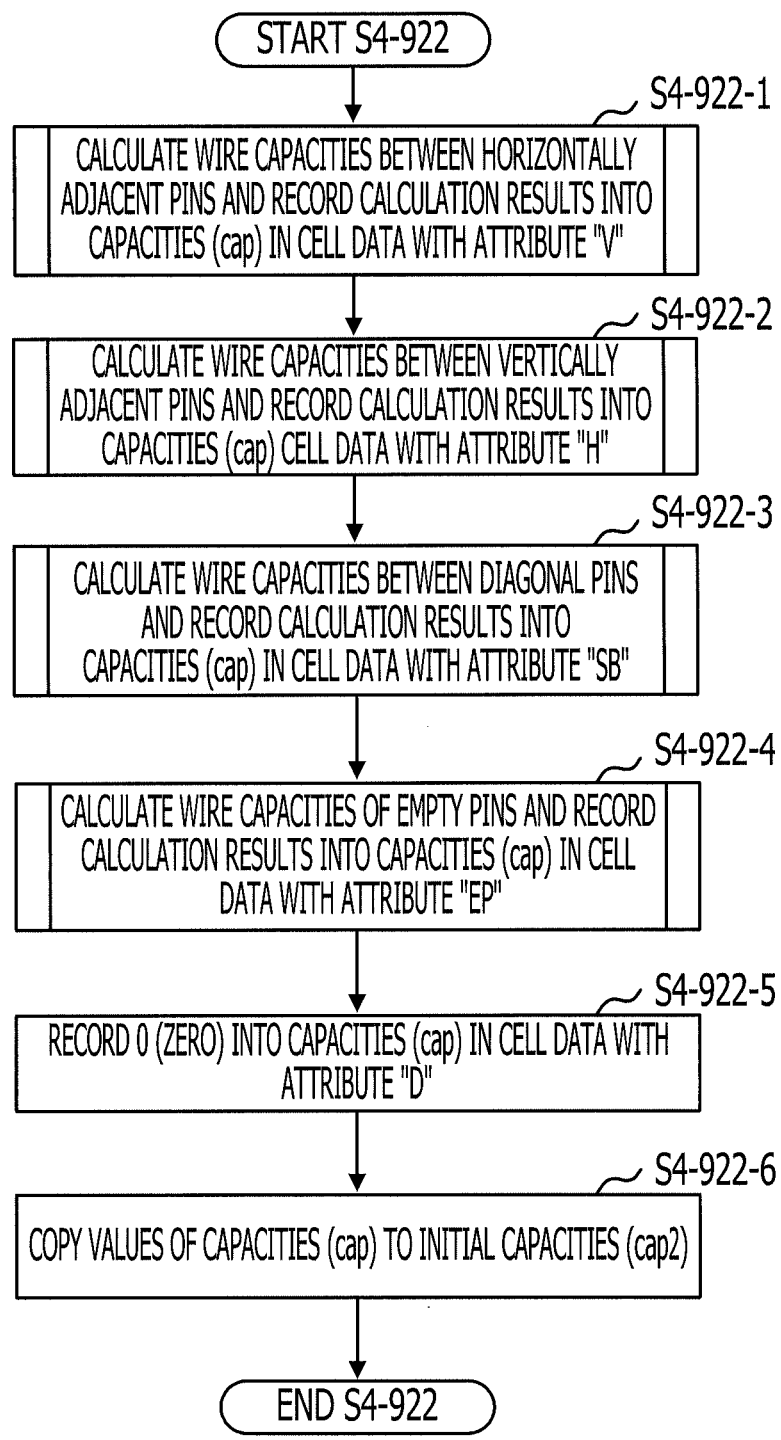
FIG. 30 is a flowchart of a procedure of cell-capacity calculation processing.

Description of operation S4-921 in FIG. 22 is finished at this point. Details of operation S4-922 in FIG. 22 will be described next. FIG. 30 is a flowchart of a procedure of cell-capacity calculation processing.

In operation S4-922-1, the cell-capacity calculating unit 1211b calculates wire capacities between horizontally adjacent pins (i.e., adjacent pins in the east-and-west directions) and records calculation results into the capacities (cap) in the cell data with the attribute "V" (i.e., cell data in which the values of the cell attribute are "V"). In operation S4-922-2, the cell-capacity calculating unit 1211b calculates wire capacities between vertically adjacent pins (i.e., adjacent pins in the north-and-south directions) and records calculation results into the capacities (cap) in the cell data with the attribute "H". In operation S4-922-3, the cell-capacity calculating unit 1211b calculates wire capacities between diagonal pins and records calculation results into the capacities (cap) in the cell data with the attribute "SB". In operation S4-922-4, the cell-capacity calculating unit 1211b calculates wire capacities of the empty pins and records calculation results into the capacities (cap) in the cell data with the attribute "EP". In operation S4-922-5, the cell-capacity calculating unit 1211b records 0 (zero) into the capacities (cap) in the cell data with the attribute "D". In operation S4-922-6, the cell-capacity calculating unit 1211b transcribes (saves) the values of the capacities (cap) in all cell data to the initial capacities (cap2).

Figure 31:
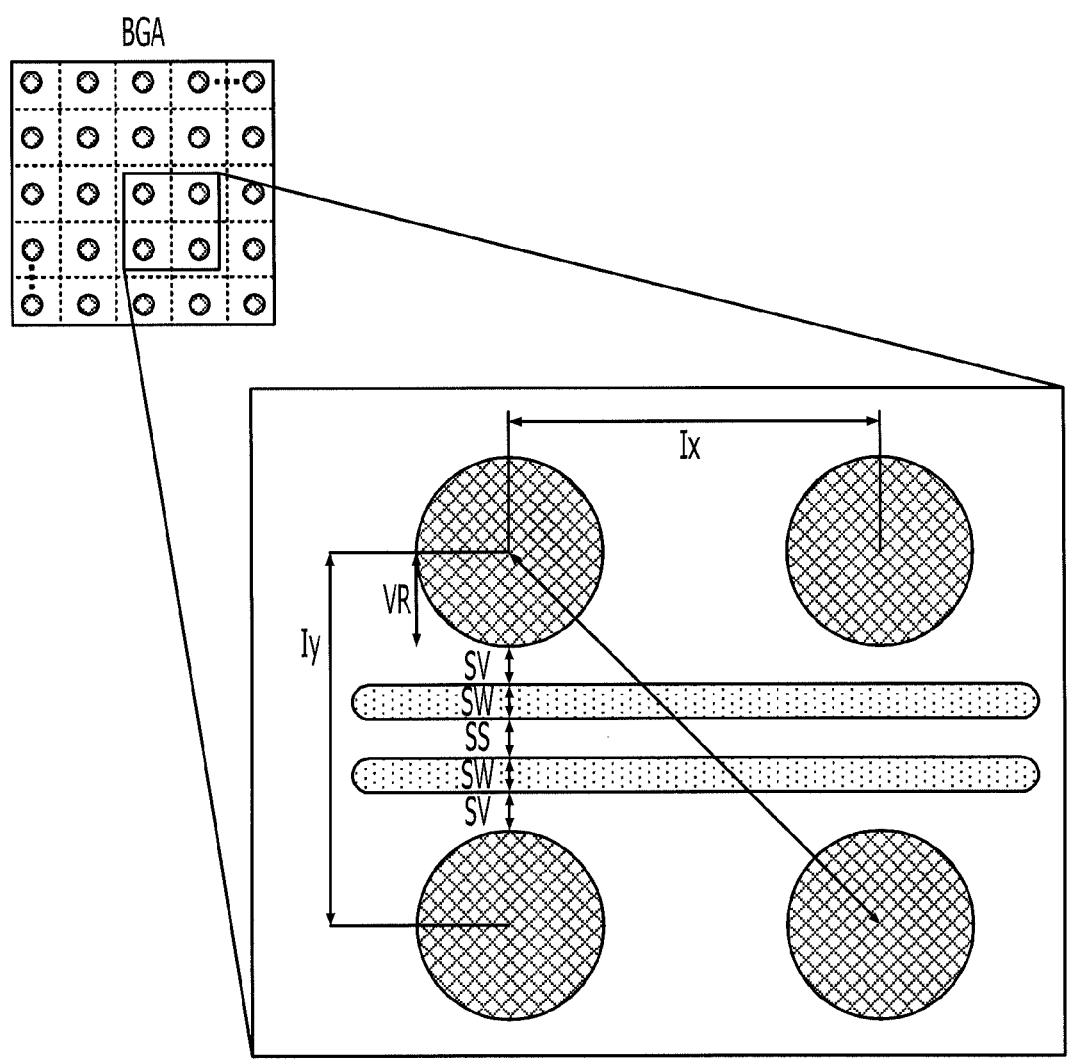
FIG. 31 illustrates parameters defining wiring rules.

Calculation of the capacities of the cells employs wiring rules as illustrated in FIG. 31. The wiring rules are defined by parameters as illustrated in FIG. 31.

FIG. 31 illustrates parameters defining the wiring rules. In FIG. 31, circles represent pins. Two horizontal lines represent wires. As illustrated, the parameters defining the wiring rules include, lx, ly, VR, SV, SW, and SS.

The parameter lx represents a horizontal distance between the centers of the pins. The parameter ly represents a vertical distance between the centers of the pins. VR represents the radius of each pin. SV represents a gap between the wire (the net) and the pin. SW represents the width (thickness) of each wire. SS represents a gap between the wires.

The values of the pin pitch (lx, ly) in the component information PInfo (FIG. 7) of the attention component are used as lx and ly. The value of the radius "r" in the pin information TInfo (FIG. 29) for the attention component is used as VR. In the present embodiment, all the values of the radii "r" of all pins in one component are assumed to be the same, for convenience of description. The line width for the attention layer L, the line width being recorded in the wire-width information WRule (FIG. 10), is used as SW. In the present embodiment, all line widths in one layer are assumed to be the same, for convenience of description. Values recorded in the gap-rule-information storage section D8 are used as SV and SS.

FIG. 32 illustrates one example of the structure of the gap-rule-information storage section. As illustrated in FIG. 32, gap rule information CRule, i.e., gap values (actual measurement values), for each layer is recorded in the gap-rule-information storage unit D8. The gap values include the value of a gap between the wire and the pin and the value of a gap between the wires. The value of the gap between the wire and the pin, the value being recorded in the gap rule information CRule for the attention layer L, is used as SV in FIG. 31. The value of the gap between the wires is used as SS in FIG. 31.

Details of operations in FIG. 30 are described in conjunction with the parameters illustrated in FIG. 31. The processing in FIG. 30 may be executed in advance. In this case, values resulting from execution of the processing (i.e., the capacities corresponding to the bottleneck portions) may be recorded as the wiring rules.

Figure 33:
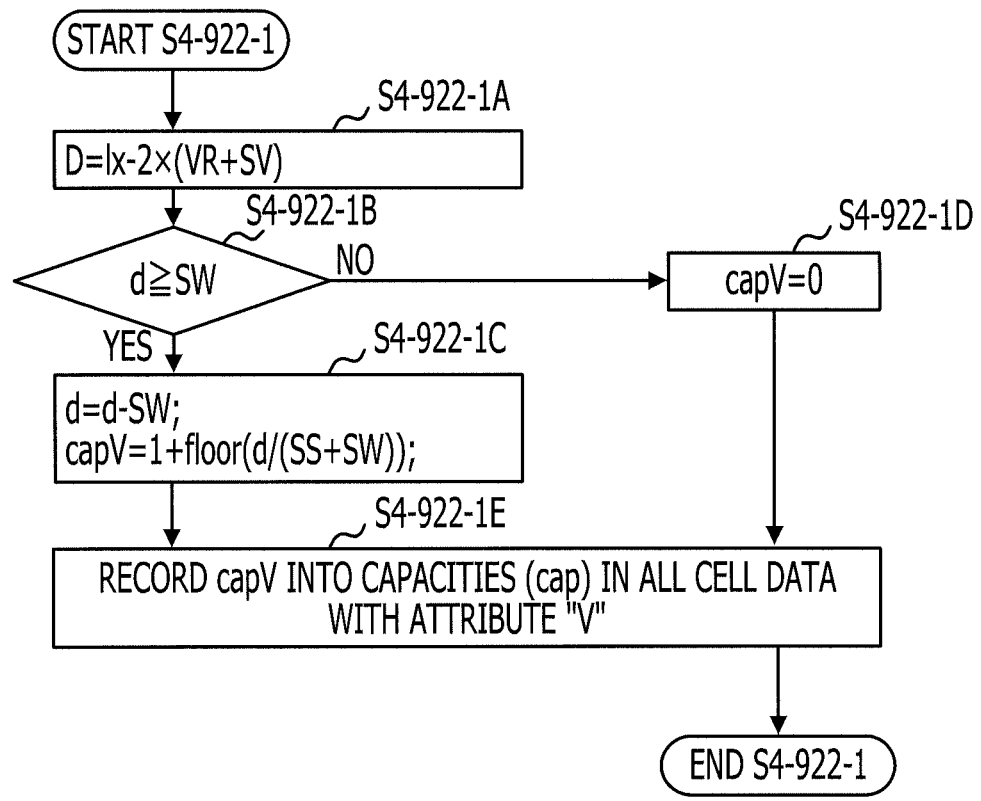
FIG. 33 is a flowchart of a procedure of processing for calculating wire capacities between horizontally adjacent pins.

Details of operation S4-922-1 will be described first. FIG. 33 is a flowchart of a procedure of processing for calculating wire capacities between horizontally adjacent pins.

In operation S4-922-1A, the cell-capacity calculating unit 1211b calculates d=lx−2×(VR+SV). The calculation result d indicates a maximum distance that can be used for wiring between horizontal pins. In operation S4-922-1B, the cell-capacity calculating unit 1211b determines whether or not d is larger than or equal to the wire width SW. When d is larger than or equal to the wire width SW (Yes in S4-922-1B), the process proceeds to operation S4-922-1C in which cell-capacity calculating unit 1211b calculates d=d−SW and then calculates capV=1+floor(d/(SS+SW)). The calculation result d of d=d−SW indicates a distance that remains after one wire is disposed. The calculation result capV of capV=1+floor(d/(SS+SW)) indicates the number of wirable lines between the horizontal pins. The "floor" function is a function for calculating a maximum integer value of a numeric value set as an argument.

On the other hand, when d is smaller than the wire width SW (No in S4-922-1B), the cell-capacity calculating unit 1211b sets the value of capV to 0 in operation S4-922-1D. Subsequent to operation S4-922-1C or S4-922-1D, the cell-capacity calculating unit 1211b records the value of capV into the capacities (cap) in all cell data with the attribute "V" in operation S4-922-1E.

Since operation S4-922-2 in FIG. 30 is apparent from FIG. 33, a description thereof is not given hereinafter. That is, the arrangement may be such that lx in FIG. 33 is replaced with ly and the value of capV is recorded in the capacity in the cell data with the attribute "H".

Figure 34:
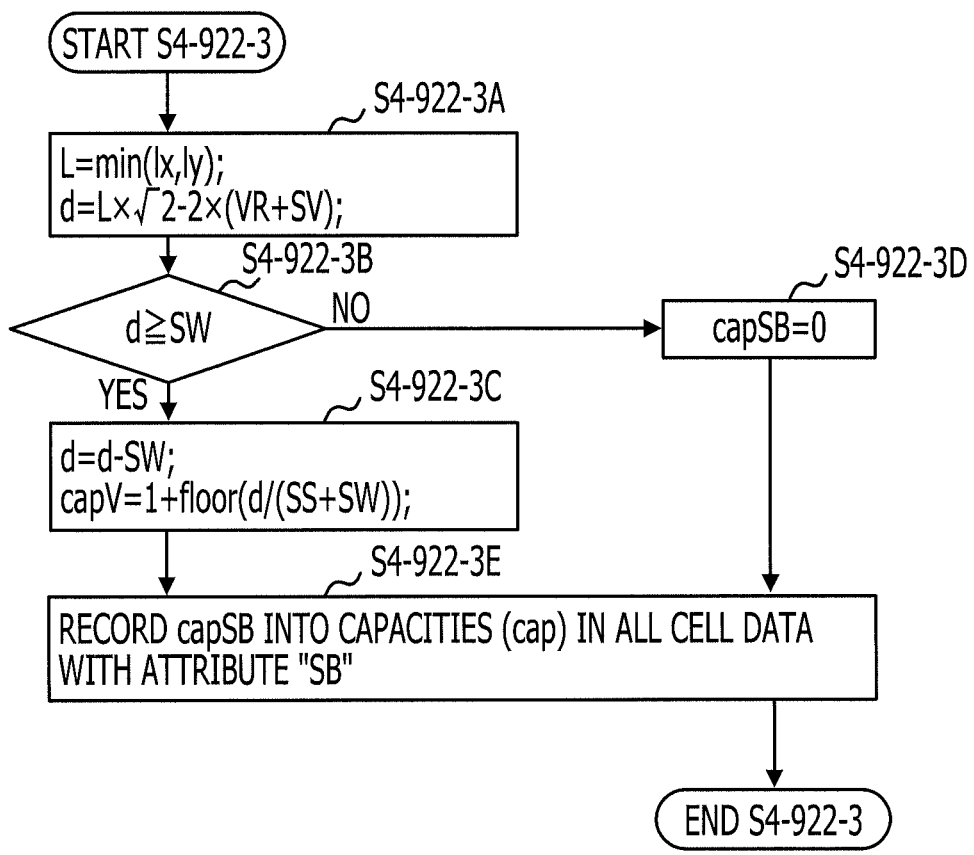
FIG. 34 is a flowchart of a procedure of processing for calculating wire capacities between diagonal pins.

Details of operation S4-922-3 will be described next. FIG. 34 is a flowchart of a procedure of processing for calculating wire capacities between the diagonal pins.

In operation S4-922-3A, the cell-capacity calculating unit 1211b calculates L=min(lx, ly) and then calculates d=L×√2−2×(VR+SV). The calculation result L of L=min(lx, ly) is a minimum value of lx and ly. The calculation result of d=L×√2−2×(VR+SV) is a maximum distance that can be used for wiring between the diagonal pins.

In operation S4-922-3B, the cell-capacity calculating unit 1211b determines whether or not d is larger than or equal to the wire width SW. When d is larger than or equal to the wire width SW (Yes in S4-922-3B), the process proceeds to operation S4-922-3C in which the cell-capacity calculating unit 1211b calculates d=d−SW and then calculates capSB=1+floor(d/(SS+SW)). The calculation result d of d=d−SW indicates a distance that remains after one wire is disposed. The calculation result capSB of capSB=1+floor(d/(SS+SW)) indicates the number of wirable lines between the diagonal pins.

On the other hand, when d is smaller than the wire width SW (No in S4-922-3B), the cell-capacity calculating unit 1211b sets the value of capSB to 0 in operation S4-922-3D. Subsequent to operation S4-922-3C or S4-922-3D, the cell-capacity calculating unit 1211b records the value of capSB into the capacities (cap) in all cell data with the attribute "SB" in operation S4-922-3E.

Figure 35:
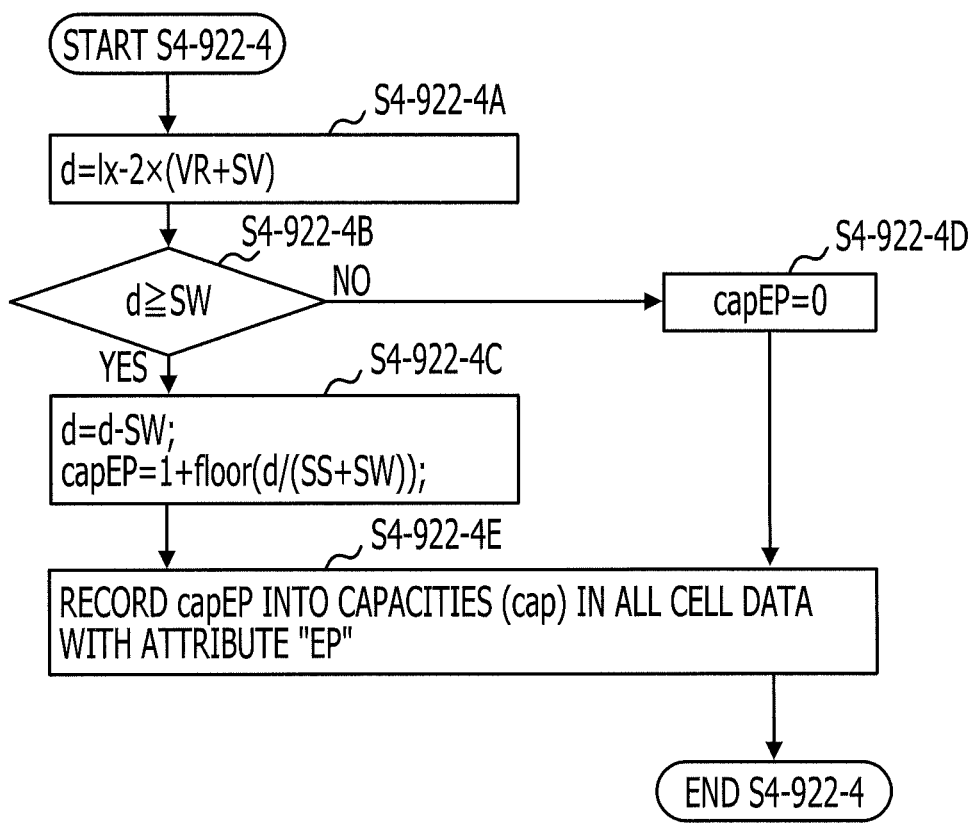
FIG. 35 is a flowchart of a procedure of processing for calculating wire capacities for empty pins.

Details of operation S4-922-4 will be described next. FIG. 35 is a flowchart of a procedure of processing for calculating wire capacities for empty pins.

In operation S4-922-4A, the cell-capacity calculating unit 1211b calculates d=2×VR. The calculation result d of d=2×VR is the diameter of the pin. In operation S4-922-4B, the cell-capacity calculating unit 1211b determines whether or not d is larger than or equal to the wire width SW. When d is larger than or equal to the wire width SW (Yes in S4-922-4B), the process proceeds to operation S4-922-4C in which the cell-capacity calculating unit 1211b calculates d=d−SW and then calculates capEP=1+floor(d/(SS+SW)). The calculation result d of d=d−SW indicates a distance that remains after one wire is disposed. The calculation result capEP of capEP=1+floor(d/(SS+SW)) indicates the number of wirable lines for the empty pins.

On the other hand, when d is smaller than the wire width SW (No in S4-922-4B), the cell-capacity calculating unit 1211b sets the value of capEP to 0 in operation S4-922-4D. Subsequent to operation S4-922-4C or S4-922-4D, the cell-capacity calculating unit 1211b records the value of capEP into the capacities (cap) in all cell data with the attribute "EP" in operation S4-922-4E.

When the shapes (the diameter, etc.) of pins of one component are not uniform, processing in FIG. 33, 34, 35 or the like may be executed on each cell in the processing in FIG. 33 or 34 through the use of the shape of the pin related to the cell.

Figure 36:
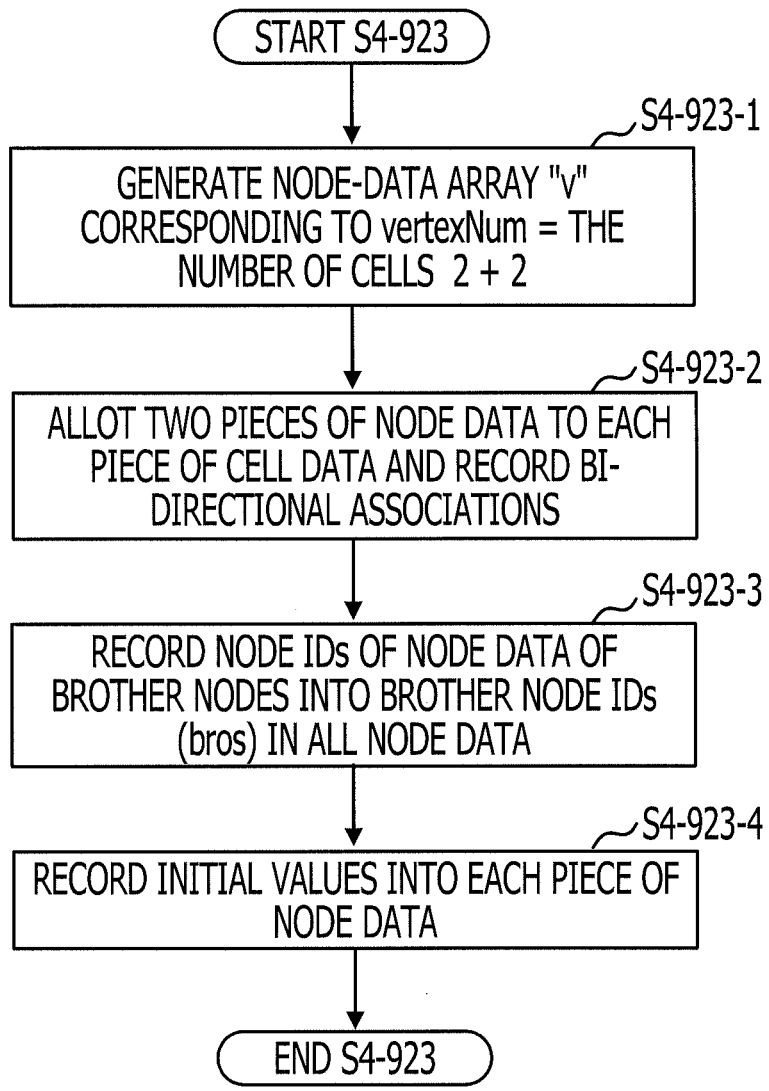
FIG. 36 is a flowchart of a procedure of node generation processing.

Description of operation S4-922 in FIG. 22 is finished at this point. Details of operation S4-923 in FIG. 22 will be described next. FIG. 36 is a flowchart of a procedure of node generation processing.

In operation S4-923-1, the node generating unit 1211c generates, in the auxiliary storage device 102, an array (a node-data array "v") of node data having a number of elements which is given by the number of cells×2+2. The node-data array "v" is an array for storing pieces of node data for cells (specifically, two pieces for each cell), a piece of node data of the source node S, and a piece of node data of the target node T. A first element (v[0]) in the node-data array "v" corresponds to the source node S. A last element (v[vertexNum−1]) corresponds to the target node T, where vertexNum denotes the number of elements of the node-data array.

In operation S4-923-2, the node generating unit 1211c sequentially assign all pieces of node data except the first element and the last element in the node-data array to corresponding pieces of cell data (specifically, two pieces of node data to each piece of cell data), and records bi-directional associations between the pieces of node data and the pieces of cell data. That is, one node ID and the other node ID of two pieces of node data assigned to each piece of cell data are respectively recorded in the node ID (iN) of the ingress node and the node ID (oN) of the egress node of the cell data. The cell ID of the cell data is recorded in the owner-cell cell ID (cellID) in the node data assigned to the cell data. The node ID is a suffix in the node-data array "v". The cell ID is a suffix in the cell-data array "cell".

In operation S4-923-3, the node generating unit 1211c records the node IDs of the node data of brother nodes (i.e., the other nodes assigned to the same cell) into the brother node IDs "bros" in all node data except the first element and the last element in the node-data array "v".

In operation S4-923-4, the node generating unit 1211c records initial values into the member variables in each piece of node data. Specifically, NULL ID is recorded in the label-propagation-source node ID (pID). The NULL ID indicates that no data exists. Also, 0 is recorded in the shortest path length (dist). Further, "in" is recorded in the node attribute (attr) in the node data assigned as the ingress node and "out" is recorded in the node attribute (attr) in the node data assigned to the egress node. Further, "false" is recorded in the search source flag (sFlag) and the search target flag (tFlag).

Figure 37:
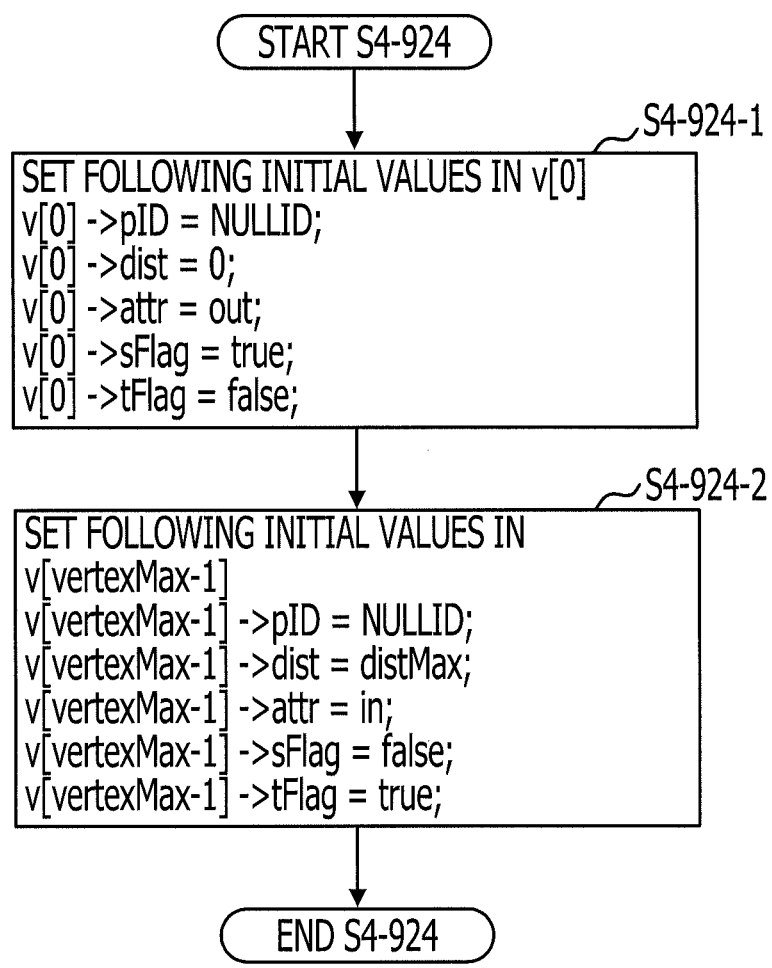
FIG. 37 is a flowchart of a procedure of generating a source node and a target node.

Description of operation S4-923 in FIG. 22 is finished at this point. Details of operation S4-924 in FIG. 22 will be described next. FIG. 37 is a flowchart of a procedure of generating a source node and a target node.

In operation S4-924-1, the node generating unit 1211c records initial values into the member variables in the node data (node-data array "v[0]") for the source node S. Specifically, NULL ID is recorded in the label-propagation-source node ID (pID). Also, 0 is recorded in the shortest path length (dist). Also, "out" is recorded in the node attribute (attr). Further, "true" is recorded in the search source flag (sFlag) and "false" is recorded in the search target flag (tFlag).

In operation S4-924-2, the node generating unit 1211c records initial values into the member variables in the node data (node-data array "v[vertexNum-1]") for the target node T. Specifically, NULL ID is recorded in the label-propagation-source node ID (pID). Also, distMax, which is the maximum value of the route length in the route searching, is recorded in the shortest route length (dist). Also, "in" is recorded in the node attribute (attr). Further, "false" is recorded in the search source flag (sFlag) and "true" is recorded in the search target flag (tFlag).

Figure 38:
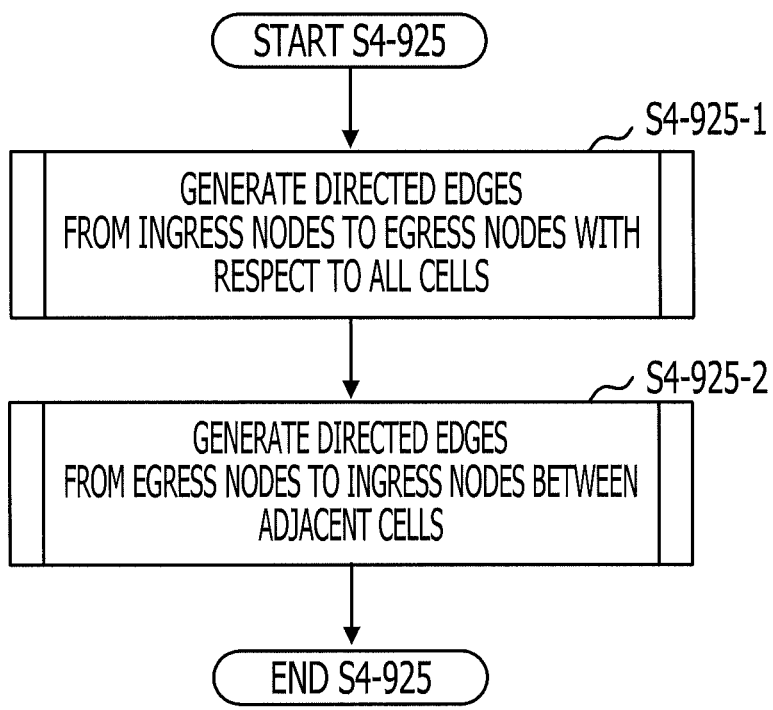
FIG. 38 is a flowchart of a procedure of directed-edge generation processing.

Description of operation S4-924 in FIG. 22 is finished at this point. Details of operation S4-925 in FIG. 22 will be described next. FIG. 38 is a flowchart of a procedure of directed-edge generation processing.

In operation S4-925-1, with respect to all cells, the directed-edge generating unit 1211d generates directed edges from the ingress nodes to the egress nodes.

Figure 39:
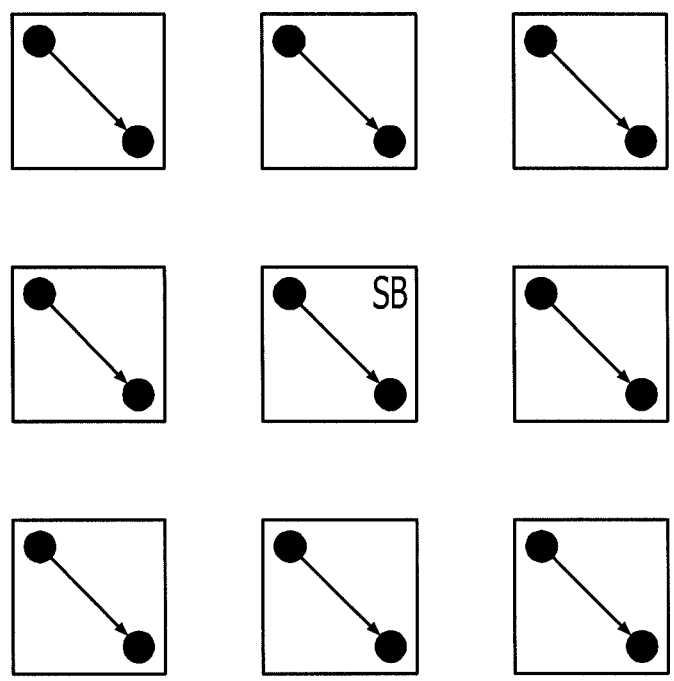
FIG. 39 illustrates directed edges from ingress nodes of cells to egress nodes of the cells.

FIG. 39 illustrates directed edges from ingress nodes of cells to egress nodes of the cells. In FIG. 39, nine cells are illustrated for convenience of description. In each cell, an arrow from a dot representing the ingress node to a dot representing the egress node is depicted. The arrow represents the directed edge from the ingress node to the egress node.

In operation S4-925-2, the directed-edge generating unit 1211d bi-directionally generates a directed edge from the egress node to the ingress node between the adjacent cells (i.e., across the cells).

Figure 40:
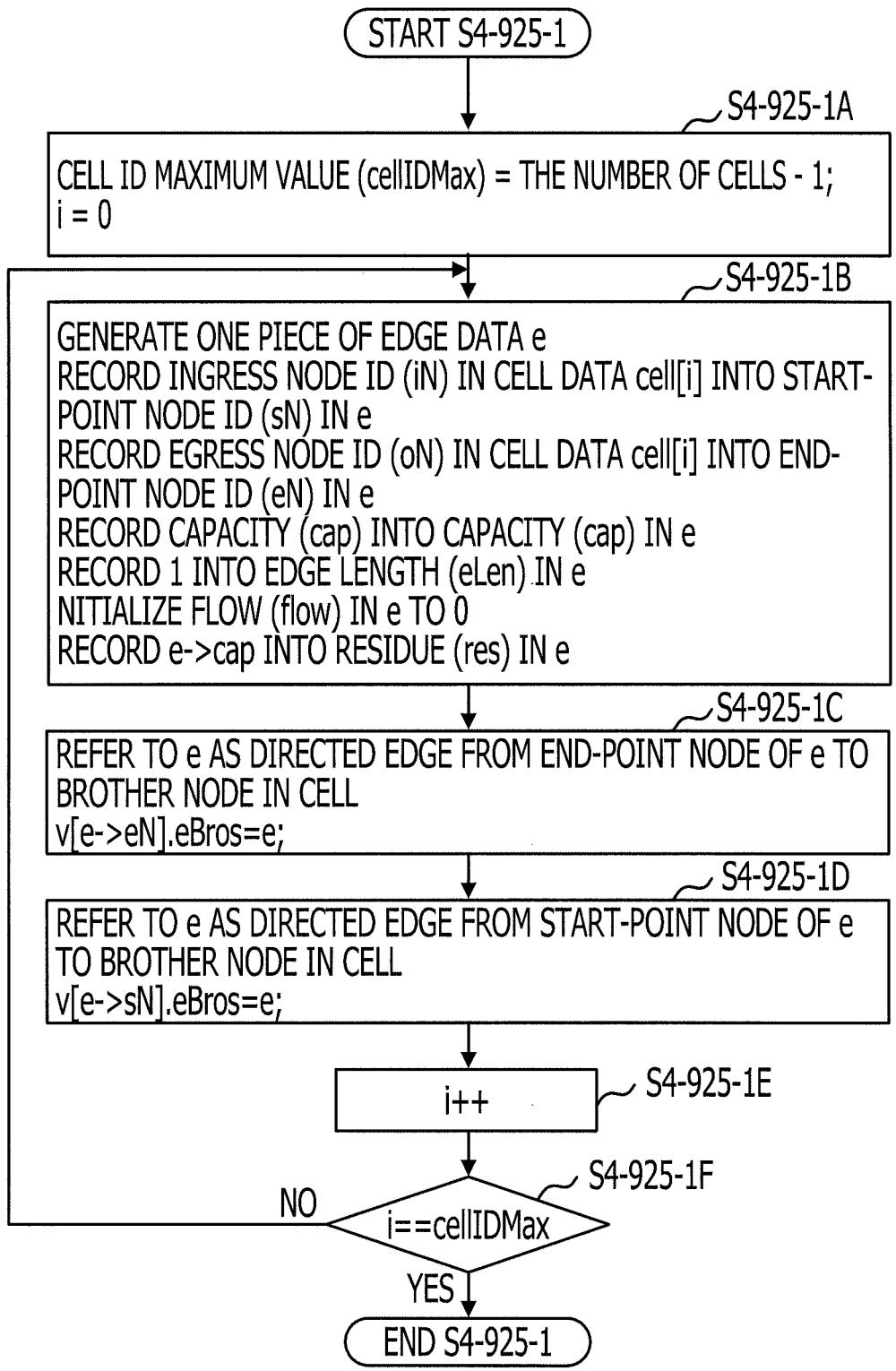
FIG. 40 is a flowchart of a procedure of processing for generating directed edges from the ingress nodes of cells to the egress nodes.

Details of operation S4-925-1 in FIG. 38 will be described next. FIG. 40 is a flowchart of a procedure of processing for generating directed edges from the ingress nodes of cells to the egress nodes.

In operation S4-925-1A, the directed-edge generating unit 1211d assigns "the number of cells"−1 to a variable cellID-Max. The directed-edge generating unit 1211d also initializes the variable i to 0. Herein, cellDMax denotes a maximum value of the cell ID (i.e., a maximum value of the suffix for the cell-data array "cell"). The variable i is also used as a suffix for, in the cell-data array "cell", an element (cell data) to be processed.

In operation S4-925-1B, the directed-edge generating unit 1211d generates one piece of edge data e in the memory device 103 and records initial values into the member variables in the edge data e.

FIG. 41 illustrates one example of the structure of the edge data. In FIG. 41, the edge data has member variables (data items) such as a start-point node ID (sN), an end-point ID (eN), an edge length (eLen), a capacity (cap), a flow (flow), and a residue (res).

The start-point node ID (sN) is the node ID of a node located at the start point of a directed edge with which the edge data is associated. The end-point node ID (eN) is the node ID of a node located at the end point of the directed edge with which the edge data is associated. The edge length (eLen) is the length of the directed edge. In the present embodiment, all directed edges have the same length (1). The capacitor (cap) is the capacity of the directed edge. The capacity of the directed edge indicates the maximum value of the number of times the directed edge can be assigned to paths during path searching. The flow (flow) indicates the number of times the directed edge was assigned to paths (i.e., was used for paths). The residue (res) indicates the remaining number of times the directed edge can be assigned to paths. That is, the relationship of res=cap−flow is satisfied.

In operation S4-925-1B, the ingress node ID (iN) in the cell data "cell[i]" to be processed is recorded in the start-point node ID (sN) in the generated edge data e. The egress node ID (oN) in the cell data to be processed is recorded in the end-point node ID (eN) in the edge data e. As a result, the edge data e becomes edge data associated with the directed edge from the ingress node of the cell to be processed to the egress node thereof. The capacity (cap) in the cell data to be processed is recorded in the capacity (cap) in the edge data e. Thus, the capacity of the directed edge from the ingress node of the cell to the egress node thereof is made equal to the capacity of the cell. Also, 1 is recorded in the edge length (eLen) in the edge data e. An initial value 0 is recorded in the flow (flow) in the edge data e. The value of the capacity (cap) in the edge data e is recorded in the residue (res) in the edge data e.

In operation S4-925-1C, the directed-edge generating unit 1211d records the edge data e into the brother-node directed edge (eBros) in the node data (node-data array "v[e–>eN]") of the end-point node in the edge data e. In operation S4-925-1D, the directed-edge generating unit 1211d records the edge data e into the brother-node directed edge (eBros) in the node data (node-data array "v[e–>sN]") of the start-point node in the edge data e. That is, as a result of operations S4-925-1C and S4-925-1D, the edge data of the directed edges connected to the other nodes (the brother nodes) are registered in the corresponding node data of the two nodes belonging to the cell to be processed.

Subsequently, in operation S4-925-1E, the directed-edge generating unit 1211*d* increments the value of i. In operation S4-925-1F, the directed-edge generating unit 1211*d* determines whether or not the value of i reaches cellMax, i.e., whether or not the processing is completed on all the cell data. When the value of i does not reach cellMax (No in S4-925-1F), the directed-edge generating unit 1211*d* repeatedly performs the processing in operation S4-925-1B and the subsequent operations on next cell data. When the value of i reaches cellMax (Yes in S4-925-1F), the directed-edge generating unit 1211*d* ends the processing in FIG. 40. Consequently, directed edges from the ingress nodes to the egress nodes in all cells are generated (see FIG. 39).

Figure 42:
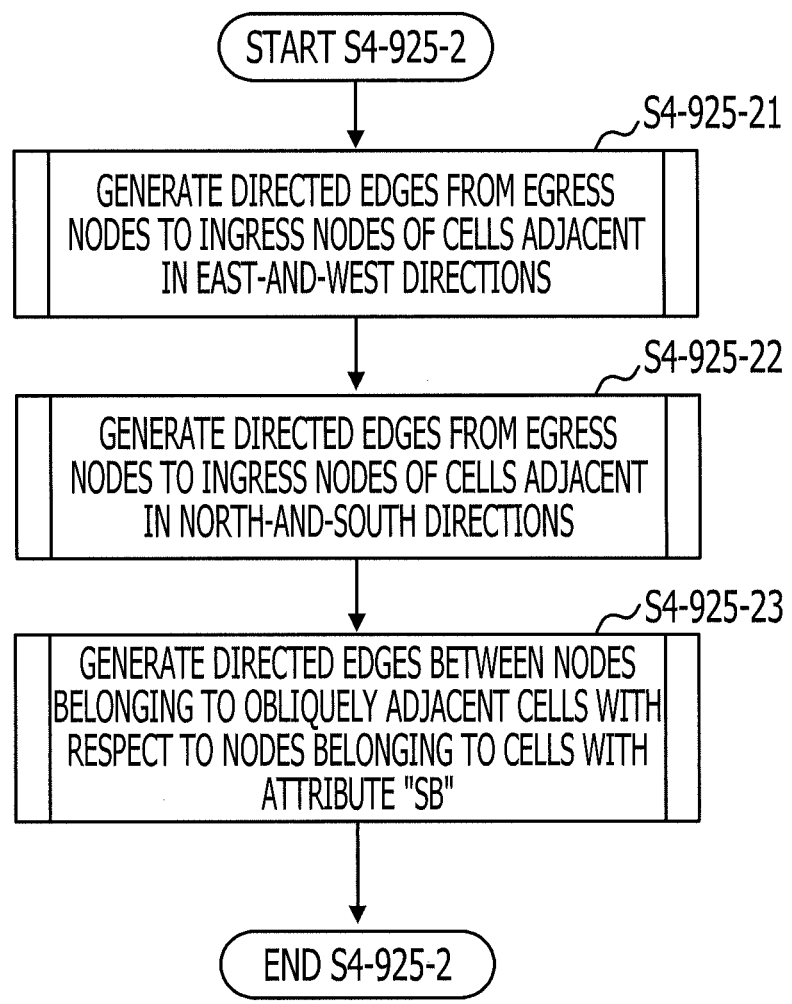
FIG. 42 is a flowchart of a procedure of processing for generating directed edges from egress nodes to ingress nodes between adjacent cells.

Details of operation S4-925-2 in FIG. 38 will be described next. FIG. 42 is a flowchart of a procedure of processing for generating directed edges from the egress nodes to the ingress nodes between adjacent cells.

In operation S4-925-21, the directed-edge generating unit 1211*d* bi-directionally generates directed edges from the egress nodes to the ingress nodes of cells that are adjacent in the east-and-west directions.

FIG. 43 illustrates directed edges from egress nodes to ingress nodes in cells adjacent in the east-and-west directions. As illustrated, in operation S4-925-21, directed edges from the egress nodes of the cells at the east side to the ingress nodes of the cells at the west side and directed edges from the egress nodes of the cells at the west side to the ingress nodes of the cells at the east side are generated.

In operation S4-925-22, the directed-edge generating unit 1211*d* bi-directionally generates directed edges from the egress nodes to the ingress nodes of the cells that are adjacent in the north-and-south directions.

Figure 44:
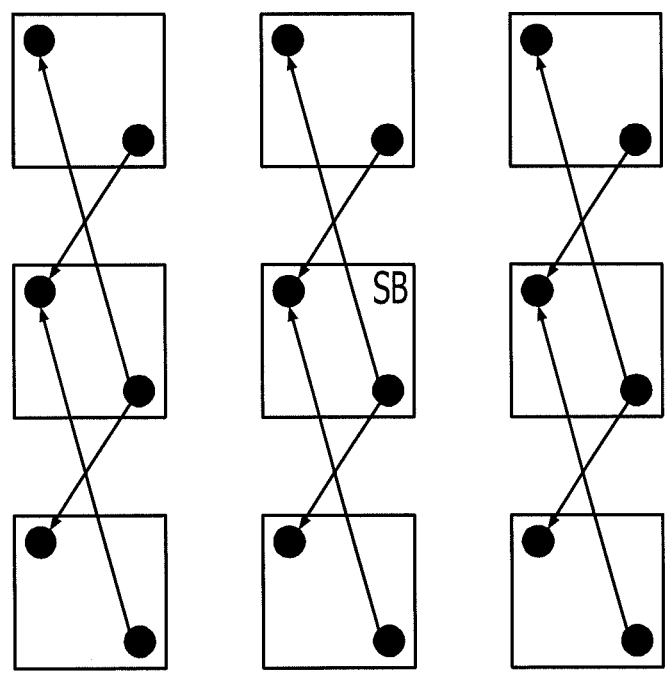
FIG. 44 illustrates directed edges from egress nodes to ingress nodes in cells adjacent in the north-and-south directions.

FIG. 44 illustrates directed edges from egress nodes to ingress nodes in cells adjacent in the north-and-south directions. As illustrated, in operation S4-925-22, directed edges from the egress nodes of the cells at the south side to the ingress nodes of the cells at the north side and directed edges from the egress nodes of the cells at the north side to the ingress nodes of the cells at the south side are generated.

Subsequently, in operation S4-925-23, with respect to the nodes belonging to the cells with the attribute "SB" (i.e., cells between the diagonal pins), the directed-edge generating unit 1211*d* bi-directionally generates directed edges between the nodes belonging to the obliquely adjacent cells (i.e., the cells adjacent in the northeast direction, the northwest direction, the southeast direction, or the southwest direction).

Figure 45:
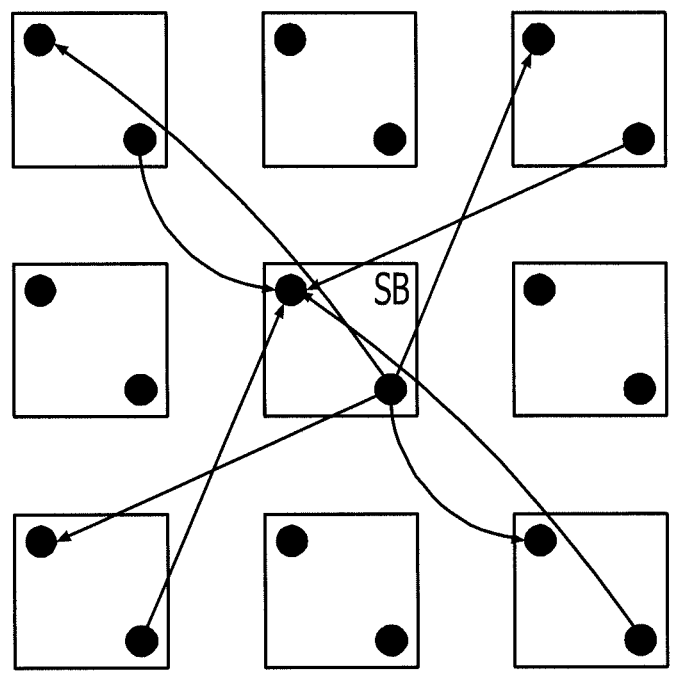
FIG. 45 illustrates directed edges between the nodes of obliquely adjacent cells.

FIG. 45 illustrates directed edges between the nodes of obliquely adjacent cells. As illustrated, in operation S4-925-23, directed edges from the egress node of a cell SB to the ingress nodes of all obliquely adjacent cells and directed edges from the egress nodes of all the obliquely adjacent cells to the ingress node of the cell SB are generated.

Figure 46:
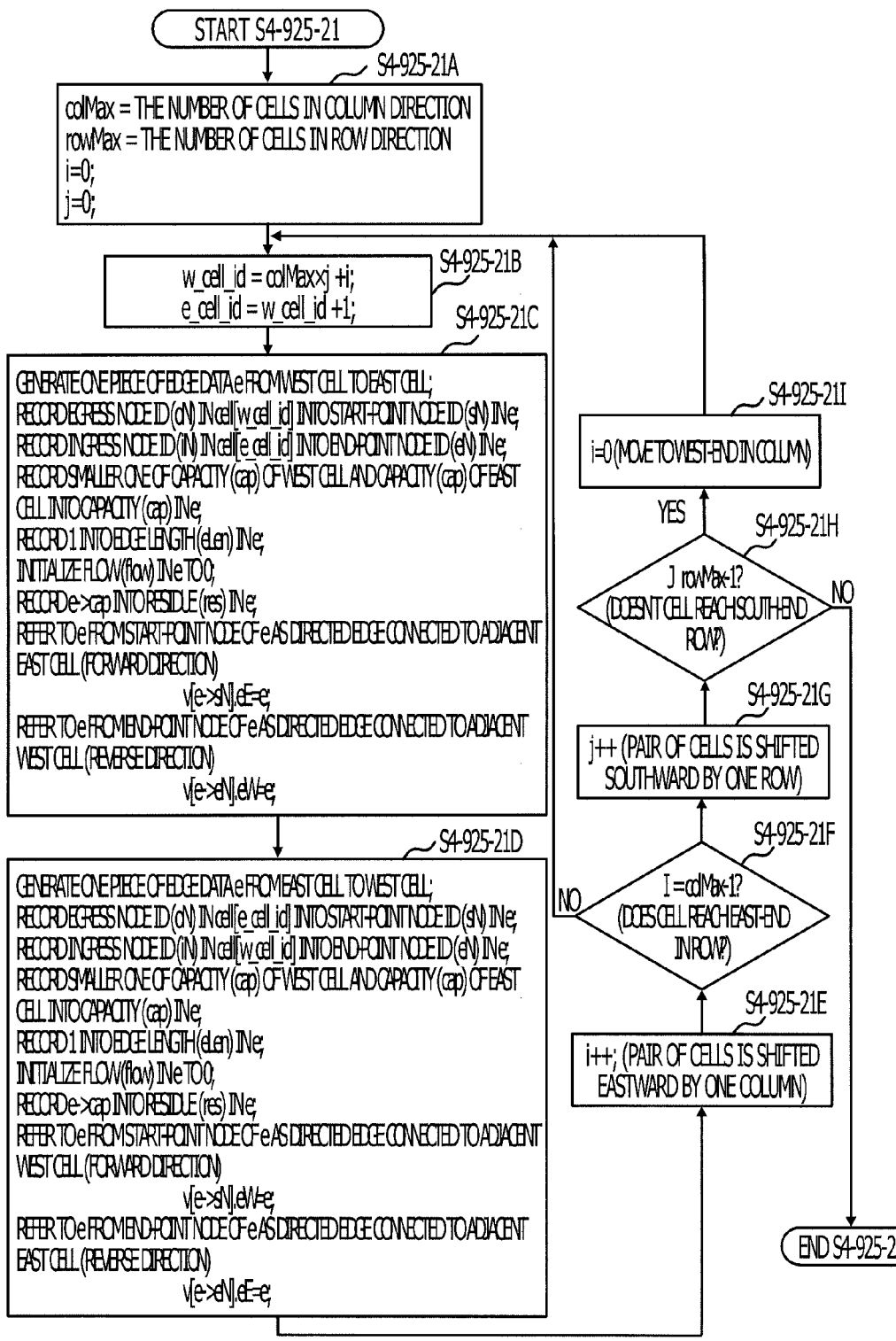
FIG. 46 is a flowchart of a procedure of processing for generating directed edges from the egress nodes to the ingress nodes of cells adjacent in the east-and-west directions.

Details of operation S4-925-21 in FIG. 42 will be described next. FIG. 46 is a flowchart of a procedure of processing for generating directed edges from the egress nodes to the ingress nodes of the cells adjacent in the east-and-west directions.

In operation S4-925-21A, the directed-edge generating unit 1211*d* assigns the number of cells in the column direction to a variable colMax and assigns the number of cells in the row direction to a variable rowMax. The directed-edge generating unit 1211*d* initializes the variables i and j to 0. The variable i is used as the value of column-wise offset of the west-side cell of two adjacent east-and-west cells to be processed. The variable j is used as the value of row-wise offset of two adjacent east-and-west cells to be processed.

In operation S4-925-21B, the directed-edge generating unit 1211*d* calculates w_cell_id=colMax×j+i and further calculates e_cell_id=w_cell_id+1. In the cell-data array "cell", w_cell_id is a suffix for an element (cell data) corresponding to a west-side cell (a west cell) to be processed. Also, e_cell_id is a suffix for an element (cell data) corresponding to an east-side cell (an east cell) to be processed. Initially, the west cell is the cell in the first row and the first column and the east cell is the cell in the first row and the second column.

In operation S4-925-21C, the directed-edge generating unit 1211*d* generates, in the memory device 103, one piece of edge data e to be associated with the directed edge from the egress node of the west cell to the ingress node of the east cell and records values into the member variables in the edge data e. Specifically, the egress node ID (oN) in the cell data (cell-data array "cell[w_cell_id]") of the west cell is recorded in the start-point node ID (sN) in the edge data e. The ingress node ID (iN) in the cell data (cell-data array "cell[e_cell_id]") of the east cell is recorded in the end-point node ID (eN) in the edge data e. As a result, the edge data e becomes edge data associated with the directed edge from the egress node of the west cell to the ingress node of the east cell. A smaller one of the value of the capacity (cap) in the cell data of the west cell and the value of the capacity (cap) in the cell data of the east cell is recorded in the capacity (cap) in the edge data e. That is, the capacity of the directed edge from the egress node of one cell to the ingress node of another cell, the cells being adjacent in the east-and-west directions, is made equal to the smallest value of the capacities of the adjacent cells. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the adjacent-east-cell node directed edge (eE) in the node data (node-data array "v[e->sN]") of the start-point node in the edge data e. The directed-edge generating unit 1211*d* records the edge data e into the adjacent-west-cell node directed edge (eW) in the node data (node-data array "v[e->eN]") of the end-point node in the edge data e. Consequently, the edge data of the directed edges connected to the other nodes are registered in the node data of the egress node of the east cell and the node data of the ingress node of the west cell.

In operation S4-925-21D, the directed-edge generating unit 1211*d* generates, in the memory device 103, one piece of edge data e to be associated with the directed edge from the egress node of the east cell to the ingress node of the west cell and records values into the member variables in the edge data e. Specifically, the egress node ID (oN) in the cell data (cell-data array "cell[e_cell_id]") of the east cell is recorded in the start-point node ID (sN) in the edge data e. The ingress node ID (iN) in the cell data (cell-data array "cell[w_cell_id]") of the west cell is recorded in the end-point node ID (eN) in the edge data e. As a result, the edge data e becomes edge data associated with the directed edge from the egress node of the east cell to the ingress node of the west cell. A smaller one of the value of the capacity (cap) in the cell data of the east cell and the value of the capacity (cap) in the cell data of the west cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the adjacent-west-cell node directed edge (eW) in the node data (node-data array "v[e->sN]") of the start-point node in the edge data e. The directed-edge generating unit 1211*d* records the edge data e into the adjacent-east-cell node directed edge (eE) in the node data (node-data array "v[e–>eN]") of the end-point node in the edge data e. Consequently, the edge data of the directed edges connected to the other nodes are registered in the node data of the egress node of the west cell and the node data of the ingress node of the east cell.

Subsequently, in operation S4-925-21E, the directed-edge generating unit 1211d increments the variable i. That is, the two cells to be processed, the cells being adjacent in the east-and-west directions, are shifted eastward by one column in the cell matrix. In operation S4-925-21F, the directed-edge generating unit 1211d determines whether or not the value of i reaches colMax−1, i.e., whether or not the west cell to be processed reaches the east end in the cell matrix. When the value of i does not reach colMax−1 (No in S4-925-21F), the directed-edge generating unit 1211d executes the processing in operation S4-925-21B and the subsequent operations on the adjacent east-and-west cells shifted eastward by one column.

When the value of i reaches colMax−1 (Yes in S4-925-21F), the directed-edge generating unit 1211d increments the value of the variable j in operation S4-925-21G. That is, the two cells to be processed, the cells being adjacent in the east-and-west directions, are shifted southward by one row in the cell matrix. In operation S4-925-21H, the directed-edge generating unit 1211d determines whether or not the value of j is smaller than or equal to rowMax−1, i.e., whether the cells to be processed do not reach the south end in the cell matrix. When the value of the variable j is smaller than or equal to rowMax−1 (Yes in S4-925-21H), the directed-edge generating unit 1211d sets the value of the variable i to 0 in operation S4-925-21I and repeatedly performs the processing in operation S4-925-21B and the subsequent operations. Setting the value of the variable i to 0 causes the west cell to be processed to move to the west end in the cell matrix. On the other hand, when the value of the variable j exceeds rowMax−1 (No in S4-925-21H), the directed-edge generating unit 1211d ends the processing in FIG. 46. A result of the processing in FIG. 46 is equivalent to the result illustrated in FIG. 43.

Figure 47:
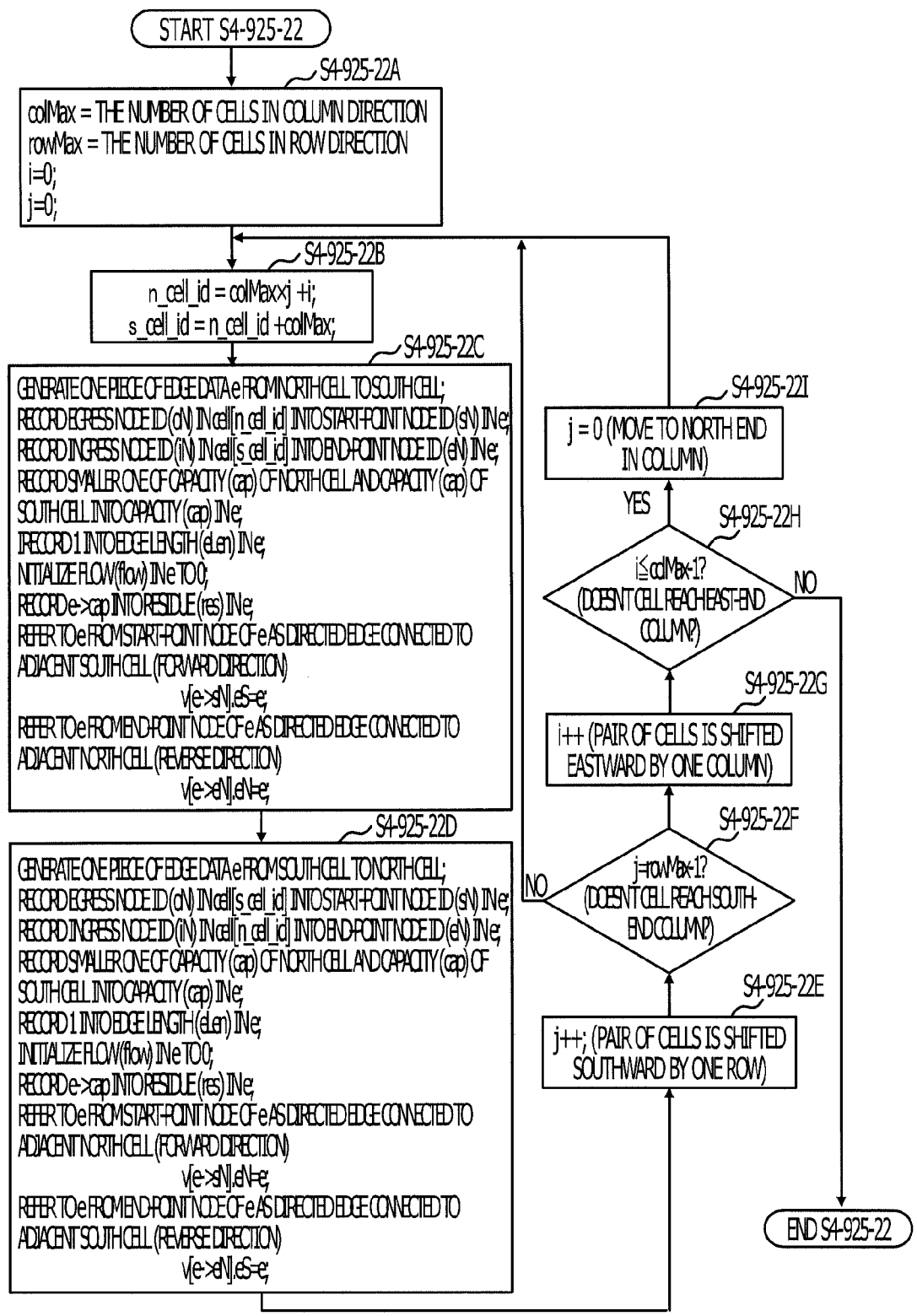
FIG. 47 is a flowchart of a procedure of processing for generating directed edges from the egress nodes to the ingress nodes of cells adjacent in the north-and-south directions.

Details of operation S4-925-22 in FIG. 42 will be described next. FIG. 47 is a flowchart of a procedure of processing for generating directed edges from the egress nodes to the ingress nodes of the cells adjacent in the north-and-south directions.

In operation S4-925-22A, the directed-edge generating unit 1211d assigns the number of cells in the column direction to the variable colMax and assigns the number of cells in the row direction to the variable rowMax. The directed-edge generating unit 1211d initializes the variables i and j to 0. The variable i is used as the value of column-wise offset of two adjacent north-and-south cells to be processed. The variable j is used as the value of row-wise offset of the north-side cell of two adjacent north-and-south cells to be processed.

In operation S4-925-22B, the directed-edge generating unit 1211d calculates n_cell_id=colMax×j+i and further calculates s_cell_id=n_cell_id+colMax. In the cell-data array "cell", n_cell_id is a suffix for an element (cell data) corresponding to a north-side cell (a north cell) to be processed. Also, s_cell_id is a suffix for an element (cell data) corresponding to a south-side cell (a south cell) to be processed. Initially, the north cell is the cell in the first row and the first column and the south cell is the cell in the second row and the first column.

In operation S4-925-22C, the directed-edge generating unit 1211d generates, in the memory device 103, one piece of edge data e to be associated with the directed edge from the egress node of the north cell to the ingress node of the south cell and records values into the member variables in the edge data e. Specifically, the egress node ID (oN) in the cell data (cell-data array "cell[n_cell_id]") of the north cell is recorded in the start-point node ID (sN) in the edge data e. The ingress node ID (iN) in the cell data (cell-data array "cell[s_cell_id]") of the south cell is recorded in the end-point node ID (eN) in the edge data e. As a result, the edge data e becomes edge data associated with the directed edge from the egress node of the north cell to the ingress node of the south cell. A smaller one of the value of the capacity (cap) in the cell data of the north cell and the value of the capacity (cap) in the cell data of the south cell is recorded in the capacity (cap) in the edge data e. That is, the capacity of the directed edge from the egress node of one cell to the ingress node of another cell, the cells being adjacent in the north-and-south directions, is made equal to the smallest value of the capacities of the adjacent cells. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the adjacent-south-cell node directed edge (eS) in the node data (node data array "v[e–>sN]") of the start-point node in the edge data e. The directed-edge generating unit 1211d records the edge data e into the adjacent-north-cell node directed edge (eN) in the node data (node-data array "v[e–>eN]") of the end-point node in the edge data e. Consequently, the edge data of the directed edges connected to the other nodes are registered in the node data of the egress node of the north cell and the node data of the ingress node of the south cell.

In operation S4-925-22D, the directed-edge generating unit 1211d generates, in the memory device 103, one piece of edge data e to be associated with the directed edge from the egress node of the south cell to the ingress node of the north cell and records values into the member variables in the edge data e. Specifically, the egress node ID (oN) in the cell data (cell-data array "cell[s_cell_id]") of the south cell is recorded in the start-point node ID (sN) in the edge data e. The ingress node ID (iN) in the cell data (cell-data array "cell[n_cell_id]") of the north cell is recorded in the end-point node ID (eN) in the edge data e. As a result, the edge data e becomes edge data associated with the directed edge from the egress node of the south cell to the ingress node of the north cell. A smaller one of the value of the capacity (cap) in the cell data of the south cell and the value of the capacity (cap) in the cell data of the north cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the adjacent-north-cell node directed edge (eN) in the node data (node-data array "v[e–>sN]") of the start-point node in the edge data e. The directed-edge generating unit 1211d records the edge data e into the adjacent-south-cell node directed edge (eS) in the node data (node-data array "v[e–>eN]") of the end-point node in the edge data e. Consequently, the edge data of the directed edges connected to the other nodes are registered in the node data of the egress node of the south cell and the node data of the ingress node of the north cell.

Subsequently, in operation S4-925-22E, the directed-edge generating unit 1211d increments the variable j. That is, the two cells to be processed, the cells being adjacent in the north-and-south directions, are shifted southward by one row in the cell matrix. In operation S4-925-22F, the directed-edge generating unit 1211d determines whether or not the value of j reaches rowMax−1, i.e., whether or not the north cell to be processed reaches the south end in the cell matrix. When the value of j does not reach rowMax−1 (No in S4-925-22F), the directed-edge generating unit 1211d executes the processing in operation S4-925-22B and the subsequent operations on, in the north and south directions, adjacent cells shifted southward by one row.

When the value of j reaches rowMax−1 (Yes in S4-925-22F), the directed-edge generating unit 1211d increments the value of the variable i in operation S4-925-22G. That is, the two cells to be processed, the cells being adjacent in the north-and-south directions, are shifted eastward by one column in the cell matrix. Subsequently, in operation S4-925-22H, the directed-edge generating unit 1211d determines whether or not the value of the variable i is smaller than or equal to colMax−1, i.e., whether or not the cells to be processed reach the east end in the cell matrix. When the value of the variable i is smaller than or equal to colMax−1 (Yes in S4-925-22H), the directed-edge generating unit 1211d sets the value of the variable j to 0 in operation S4-925-22I and repeatedly performs the processing in operation S4-925-22B and the subsequent operations. Setting the value of the variable j to 0 causes the north cell to be processed to move to the north end in the cell matrix. On the other hand, when the value of the variable i exceeds colMax−1 (No in S4-925-22H), the directed-edge generating unit 1211d ends the processing in FIG. 47. A result of the processing in FIG. 47 is equivalent to the result illustrated in FIG. 44.

Figure 48:
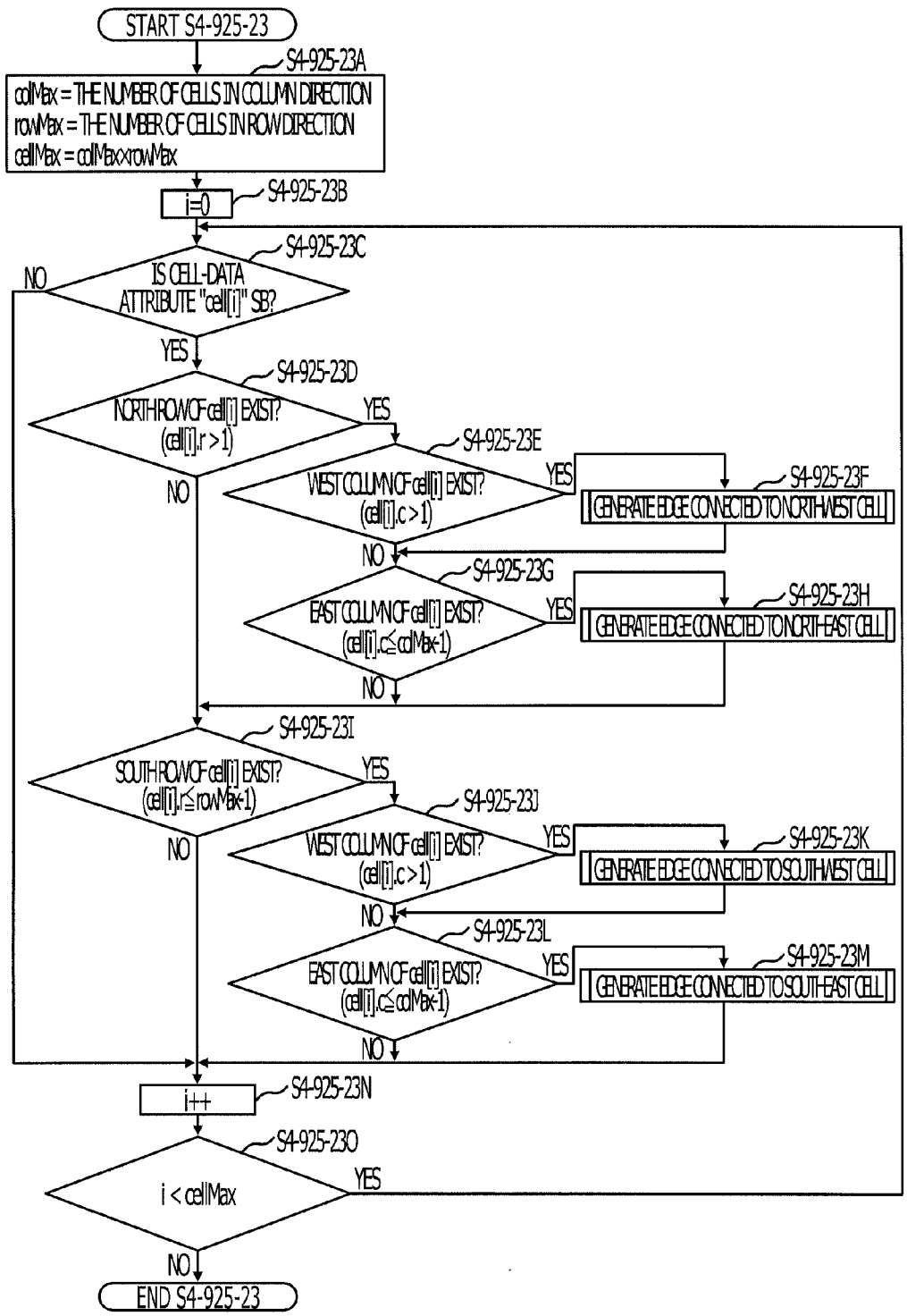
FIG. 48 is a flowchart of a procedure for generating directed edges between nodes of obliquely adjacent cells.

Details of operation S4-925-23 in FIG. 42 will be described next. FIG. 48 is a flowchart of a procedure for generating directed edges between nodes of obliquely adjacent cells.

In operation S4-925-23A, the directed-edge generating unit 1211d assigns the number of cells in the column direction to the variable colMax, assigns the number of cells in the row direction to the variable rowMax, and assigns the total number of cells (colMax×rowMax) to the variable cellMax. Subsequently, in operation S4-925-23B, the directed-edge generating unit 1211d assigns an initial value 0 to the variable i. The variable i is also used as a suffix for, in the cell-data array "cell", an element (cell data) to be processed.

In operation S4-925-23C, the directed-edge generating unit 1211d determines whether or not the value of the cell attribute (attr) in the cell data (cell-data array "cell[i]") to be processed is SB (inter-diagonal-pin portion). When the value of the cell attribute of the cell data to be processed is SB (Yes in S4-925-23C), the process proceeds to operation S4-925-23D. In this operation, the directed-edge generating unit 1211d determines whether or not the row number (r) in the cell data is larger than 1, to thereby determine whether or not a cell row exists at the north side of the cell corresponding to the cell data.

When a cell row exists at the north side of the cell corresponding to the cell data (Yes in S4-925-23D), the process proceeds to operation S4-925-23E. In this operation, the directed-edge generating unit 1211d determines whether or not the column number (c) in the cell data is larger than 1, to thereby determine whether or not a cell column exists at the west side of the cell corresponding to the cell data. When a cell column exists at the west side of the cell corresponding to the cell data (Yes in S4-925-23E), the directed-edge generating unit 1211d generates a directed edge between the cell and the northwest cell in operation S4-925-23F.

When operation S4-925-23F is finished or the result in operation in S4-925-23E is No, the process proceeds to operation S4-925-23G in which the directed-edge generating unit 1211d determines whether or not the column number (c) in the cell data to be processed is smaller than or equal to colMax−1, to thereby determine whether or not a cell column exists at the east side of the cell corresponding to the cell data. When a cell column exists at the east side of the cell corresponding to the cell data (Yes in S4-925-23G), the directed-edge generating unit 1211d generates a directed edge between the cell and the northeast cell in operation S4-925-23H.

When operation S4-925-23H is finished, the result in operation in S4-925-23G is No, or the result in operation S4-925-23D is No, the process proceeds to operation S4-925-23I in which the directed-edge generating unit 1211d determines whether or not the row number (r) in the cell data to be processed is smaller than or equal to rowMax−1, to thereby determine whether or not a cell row exists at the south side of the cell corresponding to the cell data. When a cell row exists at the south side of the cell corresponding to the cell data (Yes in S4-925-23I), the process proceeds to operation S4-925-23J. In this operation, the directed-edge generating unit 1211d determines whether or not the column number (c) in the cell data is larger than 1, to thereby determine whether or not a cell column exists at the west side of the cell corresponding to the cell data. When a cell column exists at the west side of the cell corresponding to the cell data (Yes in S4-925-23J), the directed-edge generating unit 1211d generates a directed edge between the cell and the southwest cell in operation S4-925-23K.

When operation S4-925-23K is finished or the result in operation in S4-925-23J is No, the process proceeds to operation S4-925-23L in which the directed-edge generating unit 1211d determines whether or not the column number (c) in the cell data to be processed is smaller than or equal to colMax−1, to thereby determine whether or not a cell column exists at the east side of the cell corresponding to the cell data. When a cell column exists at the east side of the cell corresponding to the cell data (Yes in S4-925-23L), the directed-edge generating unit 1211d generates a directed edge between the cell and the southeast cell in operation S4-925-23M.

When operation S4-925-23M is finished, the result in operation S4-925-23L is No, the result in operation in S4-925-23I is No, or the result in operation S4-925-23C is No, the directed-edge generating unit 1211d increments the variable i in operation S4-925-23N. Subsequently, in operation S4-925-23O, the directed-edge generating unit 1211d determines whether or not the value of the variable i is smaller than cellMax (the total number of cells), to thereby determine whether or not unprocessed cell data remains. When unprocessed cell data remains (Yes in S4-925-23O), the directed-edge generating unit 1211d repeatedly performs the processing in operation S4-925-23B and the subsequent operations on next cell data. When no unprocessed cell data remains (No in S4-925-23O), the directed-edge generating unit 1211d ends the processing in FIG. 48. A result of the processing in FIG. 48 is equivalent to the result illustrated in FIG. 45.

Figure 49:
FIG. 49 is a flowchart of a procedure of processing for generating directed edges connected to the northwest cells.

Details of operation S4-925-23F in FIG. 48 will be described next. FIG. 49 is a flowchart of a procedure of processing for generating directed edges connected to the northwest cells.

In operation S23F-1, the directed-edge generating unit 1211d calculates nw_cell_id=i−colMax−1. The values of the variable i and colMax are values used when operation S4-925-23F was called in the processing in FIG. 48. Thus, the calculation result nw_cell_id is a suffix for the cell data of the northwest cell (i.e., the cell in the northwest) of the cell corresponding to the cell data to be processed in the processing in FIG. 48.

In operation S23F-2, the directed-edge generating unit 1211*d* generates, in the memory device 103, one piece of edge data e to be associated with the directed edge from the egress node of the cell to be processed to the ingress node of the northwest cell and records values into the member variables in the edge data e. Specifically, the egress node ID (oN) in the cell data (cell-data array "cell[i]") of the cell to be processed is recorded in the start-point node ID (sN) in the edge data e. The ingress node ID (iN) in the cell data (cell-data array "cell[nw_cell_id]") of the northwest cell is recorded in the end-point node ID (eN) in the edge data e. As a result, the edge data e becomes edge data associated with the directed edge from the egress node of the cell to be processed to the ingress node of the northwest cell. A smaller one of the value of the capacity (cap) in the cell data of the cell to be processed and the value of the capacity (cap) in the cell data of the northwest cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the northwest-cell node directed edge (eNW) in the node data (node-data array "v[e->sN]") of the start-point node in the edge data e. The directed-edge generating unit 1211*d* records the edge data e into the southeast-cell node directed edge (eSE) in the node data (node-data array "v[e->eN]") of the end-point node in the edge data e. Consequently, the edge data of the directed edges connected to the other nodes are registered in the node data of the egress node of the cell to be processed and the node data of the ingress node of the northwest cell.

In operation S23F-3, the directed-edge generating unit 1211*d* generates, in the memory device 103, one piece of edge data e to be associated with the directed edge from the egress node of the northwest cell to the ingress node of the cell to be processed and records values into the member variables in the edge data e. Specifically, the egress node ID (oN) in the cell data (cell-data array "cell[nw_cell_id]") of the northwest cell is recorded in the start-point node ID (sN) in the edge data e. The ingress node ID (iN) in the cell data (cell-data array "cell[i]") of the cell to be processed is also recorded in the end-point node ID (eN) in the edge data e. As a result, the edge data e becomes edge data associated with the directed edge from the egress node of the northwest cell to the ingress node of the cell to be processed. A smaller one of the value of the capacity (cap) in the cell data of the northwest cell and the value of the capacity (cap) in the cell data of the cell to be processed is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the southeast-cell node directed edge (eSE) in the node data (node-data array "v[e->sN]") of the start-point node in the edge data e. The directed-edge generating unit 1211*d* records the edge data e into the northwest-cell node directed edge (eNW) in the node data (node-data array "v[e->eN]") of the end-point node in the edge data e. Consequently, the edge data of the directed edges connected to the other nodes are registered in the node data of the egress node of the northwest cell and the node data of the ingress node of the cell to be processed.

Figure 50:
FIG. 50 is a flowchart of a procedure of processing for generating directed edges connected to the northeast cells.

Details of operation S4-925-23H in FIG. 48 will be described next. FIG. 50 is a flowchart of a procedure of processing for generating directed edges connected to the northeast cells.

In operation S23H-1, the directed-edge generating unit 1211*d* calculates ne_cell_id=i−colMax+1. The values of the variable i and colMax are the values used when operation S4-925-23H was called in the processing in FIG. 48. Thus, the calculation result ne_cell_id is a suffix for the cell data of the northeast cell (i.e., the cell in the northeast) of the cell corresponding to the cell data to be processed in the processing in FIG. 48.

In operation S23H-2, the directed-edge generating unit 1211*d* generates, in the memory device 103, one piece of edge data e to be associated with the directed edge from the egress node of the cell to be processed to the ingress node of the northeast cell and records values into the member variables in the edge data e. Specifically, the egress node ID (oN) in the cell data (cell-data array "cell[i]") of the cell to be processed is recorded in the start-point node ID (sN) in the edge data e. The ingress node ID (iN) in the cell data (cell-data array "cell[ne_cell_id]") of the northeast cell is recorded in the end-point node ID (eN) in the edge data e. As a result, the edge data e becomes edge data associated with the directed edge from the egress node of the cell to be processed to the ingress node of the northeast cell. A smaller one of the value of the capacity (cap) in the cell data of the cell to be processed and the value of the capacity (cap) in the cell data of the northeast cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the northeast-cell node directed edge (eNE) in the node data (node-data array "v[e->sN]") of the start-point node in the edge data e. The directed-edge generating unit 1211*d* records the edge data e into the southwest-cell node directed edge (eSW) in the node data (node-data array "v[e->eN]") of the end-point node in the edge data e. Consequently, the edge data of the directed edges connected to the other nodes are registered in the node data of the egress node of the cell to be processed and the node data of the ingress node of the northeast cell.

In operation S23H-3, the directed-edge generating unit 1211*d* generates, in the memory device 103, one piece of edge data e to be associated with the directed edge from the egress node of the northeast cell to the ingress node of the cell to be processed and records values into the member variables in the edge data e. Specifically, the egress node ID (oN) in the cell data (cell-data array "cell[ne_cell_id]") of the northeast cell is recorded in the start-point node ID (sN) in the edge data e. The ingress node ID (iN) in the cell data (cell-data array "cell[i]") of the cell to be processed is also recorded in the end-point node ID (eN) in the edge data e. As a result, the edge data e becomes edge data associated with the directed edge from the egress node of the northeast cell to the ingress node of the cell to be processed. A smaller one of the value of the capacity (cap) in the cell data of the northeast cell and the value of the capacity (cap) in the cell data of the cell to be processed is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211*d* records the edge data e into the southwest-cell node directed edge (eSW) in the node data (node-data array "v[e–>sN]") of the start-point node in the edge data e. The directed-edge generating unit 1211d records the edge data e into the northeast-cell node directed edge (eNE) in the node data (node-data array "v[e–>eN]") of the end-point node in the edge data e. Consequently, the edge data of the directed edges connected to the other nodes are registered in the node data of the egress node of the northeast cell and the node data of the ingress node of the cell to be processed.

Figure 51:
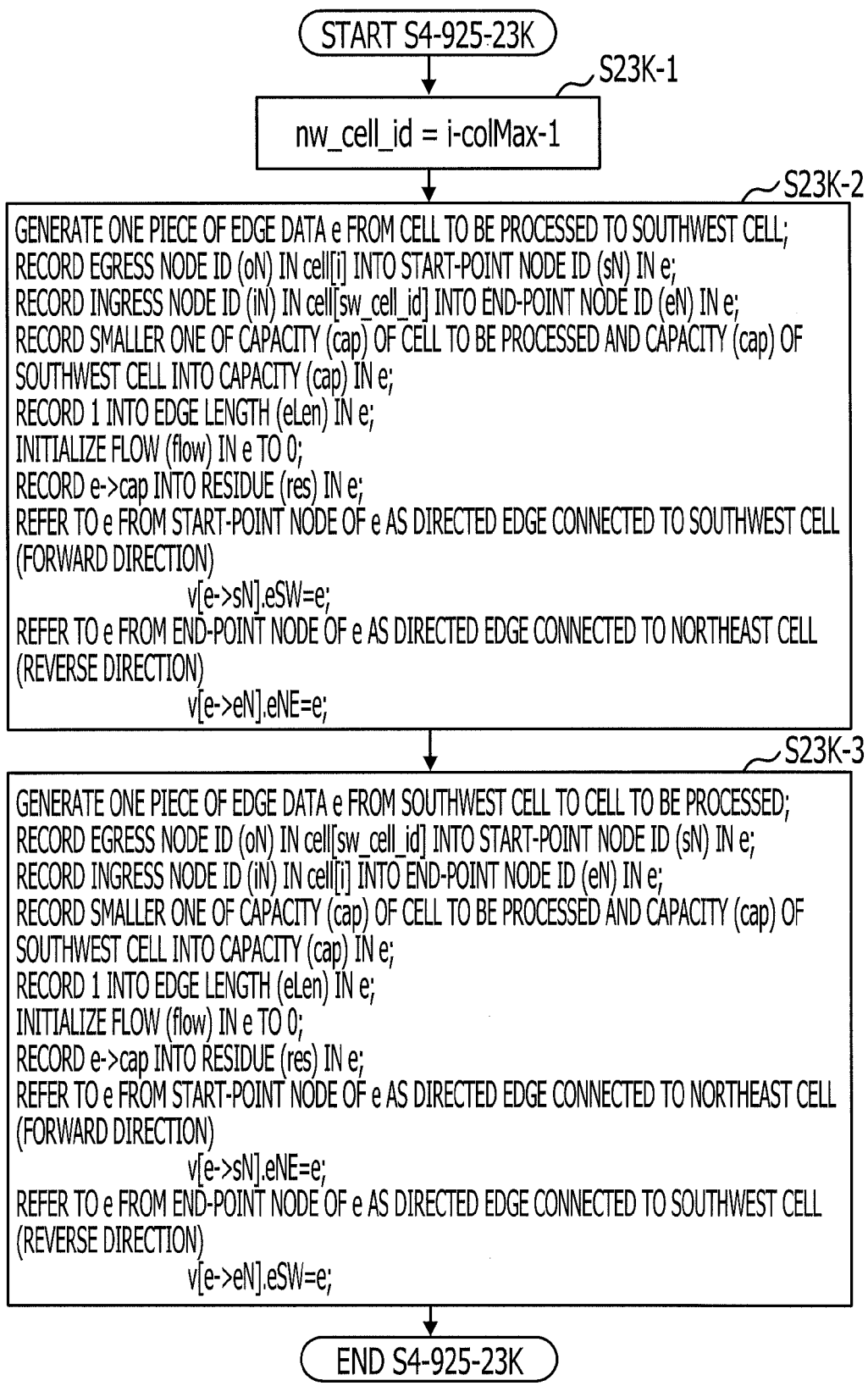
FIG. 51 is a flowchart of a procedure of processing for generating directed edges connected to the southwest cells.

Details of operation S4-925-23K in FIG. 48 will be described next. FIG. 51 is a flowchart of a procedure of processing for generating directed edges connected to the southwest cells.

In operation S23K-1, the directed-edge generating unit 1211d calculates sw_cell_id=i+colMax−1. The values of the variable i and colMax are values used when operation S4-925-23K was called in the processing in FIG. 48. Thus, the calculation result sw_cell_id is a suffix for the cell data of the southwest cell (i.e., the cell in the southwest) of the cell corresponding to the cell data to be processed in the processing in FIG. 48.

In operation S23K-2, the directed-edge generating unit 1211d generates, in the memory device 103, one piece of edge data e to be associated with the directed edge from the egress node of the cell to be processed to the ingress node of the southwest cell and records values into the member variables in the edge data e. Specifically, the egress node ID (oN) in the cell data (cell-data array "cell[i]") of the cell to be processed is recorded in the start-point node ID (sN) in the edge data e. The ingress node ID (iN) in the cell data (cell-data array "cell[sw_cell_id]") of the southwest cell is recorded in the end-point node ID (eN) in the edge data e. As a result, the edge data e becomes edge data associated with the directed edge from the egress node of the cell to be processed to the ingress node of the southwest cell. A smaller one of the value of the capacity (cap) in the cell data of the cell to be processed and the value of the capacity (cap) in the cell data of the southwest cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the southwest-cell node directed edge (eSW) in the node data (node-data array "v[e–>sN]") of the start-point node in the edge data e. The directed-edge generating unit 1211d records the edge data e into the northeast-cell node directed edge (eNE) in the node data (node-data array "v[e–>eN]") of the end-point node in the edge data e. Consequently, the edge data of the directed edges connected to the other nodes are registered in the node data of the egress node of the cell to be processed and the node data of the ingress node of the southwest cell.

In operation S23K-3, the directed-edge generating unit 1211d generates, in the memory device 103, one piece of edge data e to be associated with the directed edge from the egress node of the southwest cell to the ingress node of the cell to be processed and records values into the member variables in the edge data e. Specifically, the egress node ID (oN) in the cell data (cell-data array "cell[sw_cell_id]") of the southwest cell is recorded in the start-point node ID (sN) in the edge data e. The ingress node ID (IN) in the cell data (cell-data array "cell[i]") of the cell to be processed is also recorded in the end-point node ID (eN) in the edge data e. As a result, the edge data e becomes edge data associated with the directed edge from the egress node of the southwest cell to the ingress node of the cell to be processed. A smaller one of the value of the capacity (cap) in the cell data of the southwest cell and the value of the capacity (cap) in the cell data of the cell to be processed is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the northeast-cell node directed edge (eNE) in the node data (node-data array "v[e–>sN]") of the start-point node in the edge data e. The directed-edge generating unit 1211d records the edge data e into the southwest-cell node directed edge (eSW) in the node data (node-data array "v[e–>eN]") of the end-point node in the edge data e. Consequently, the edge data of the directed edges connected to the other nodes are registered in the node data of the egress node of the southwest cell and the node data of the ingress node of the cell to be processed.

Figure 52:
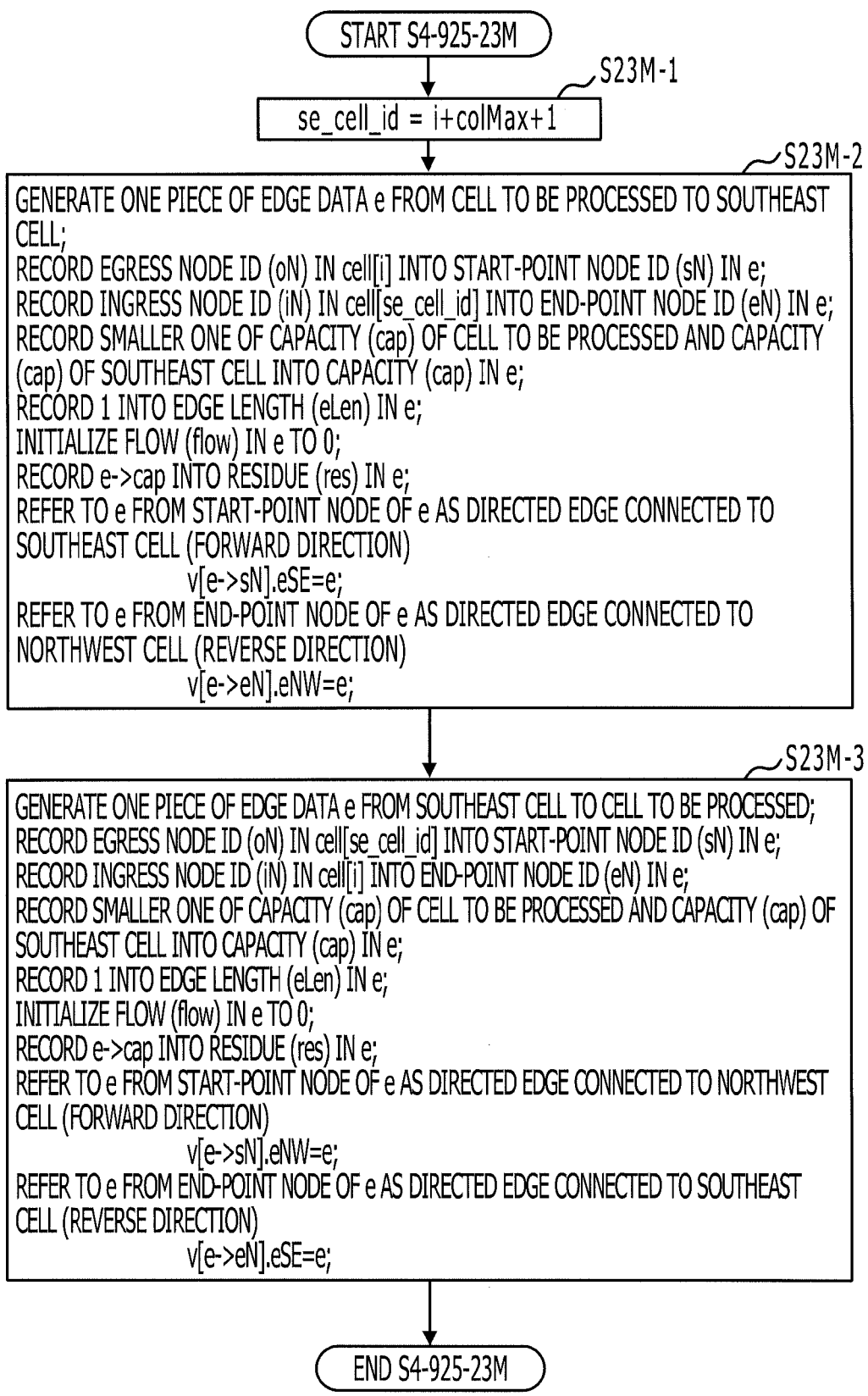
FIG. 52 is a flowchart of a procedure of processing for generating directed edges connected to the southeast cells.

Details of operation S4-925-23M in FIG. 48 will be described next. FIG. 52 is a flowchart of a procedure of processing for generating directed edges connected to the southeast cells.

In operation S23M-1, the directed-edge generating unit 1211d calculates se_cell_id=i+colMax+1. The values of the variable i and colMax are values used when operation S4-925-23M was called in the processing in FIG. 48. Thus, the calculation result se_cell_id is a suffix for the cell data of the southeast cell (i.e., the cell in the southeast) of the cell corresponding to the cell data to be processed in the processing in FIG. 48.

In operation S23M-2, the directed-edge generating unit 1211d generates, in the memory device 103, one piece of edge data e to be associated with the directed edge from the egress node of the cell to be processed to the ingress node of the southeast cell and records values into the member variables in the edge data e. Specifically, the egress node ID (oN) in the cell data (cell-data array "cell[i]") of the cell to be processed is recorded in the start-point node ID (sN) in the edge data e. The ingress node ID (iN) in the cell data (cell-data array "cell[se_cell_id]") of the southeast cell is recorded in the end-point node ID (eN) in the edge data e. As a result, the edge data e becomes edge data associated with the directed edge from the egress node of the cell to be processed to the ingress node of the southeast cell. A smaller one of the value of the capacity (cap) in the cell data of the cell to be processed and the value of the capacity (cap) in the cell data of the southeast cell is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the southeast-cell node directed edge (eSE) in the node data (node-data array "v[e–>sN]") of the start-point node in the edge data e. The directed-edge generating unit 1211d records the edge data e into the northwest-cell node directed edge (eNW) in the node data (node-data array "v[e–>eN]") of the end-point node in the edge data e. Consequently, the edge data of the directed edges connected to the other nodes are registered in the node data of the egress node of the cell to be processed and the node data of the ingress node of the southeast cell.

In operation S23M-3, the directed-edge generating unit 1211d generates, in the memory device 103, one piece of edge data e to be associated with the directed edge from the egress node of the southeast cell to the ingress node of the cell to be processed and records values into the member variables in the edge data e. Specifically, the egress node ID (oN) in the cell data (cell-data array "cell[se_cell_id]") of the southeast cell is recorded in the start-point node ID (sN) in the edge data e. The ingress node ID (iN) in the cell data (cell-data array "cell[i]") of the cell to be processed is also recorded in the end-point node ID (eN) in the edge data e. As a result, the edge data e becomes edge data associated with the directed edge from the egress node of the southeast cell to the ingress node of the cell to be processed. A smaller one of the value of the capacity (cap) in the cell data of the southeast cell and the value of the capacity (cap) in the cell data of the cell to be processed is recorded in the capacity (cap) in the edge data e. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The directed-edge generating unit 1211d records the edge data e into the northwest-cell node directed edge (eNW) in the node data (node-data array "v[e–>sN]") of the start-point node in the edge data e. The directed-edge generating unit 1211d records the edge data e into the southeast-cell node directed edge (eSE) in the node data (node-data array "v[e–>eN]") of the end-point node in the edge data e. Consequently, the edge data of the directed edges connected to the other nodes are registered in the node data of the egress node of the southeast cell and the node data of the ingress node of the cell to be processed.

Description of operation S4-925 in FIG. 22 is finished at this point. That is, description of operation S4-9-2 in FIG. 20 is finished at this point. One example of a processing result in the cell coordinate system at this point is illustrated FIG. 21. However, directed edges from the source node S and directed edges to the target node T are not generated.

Figure 53:
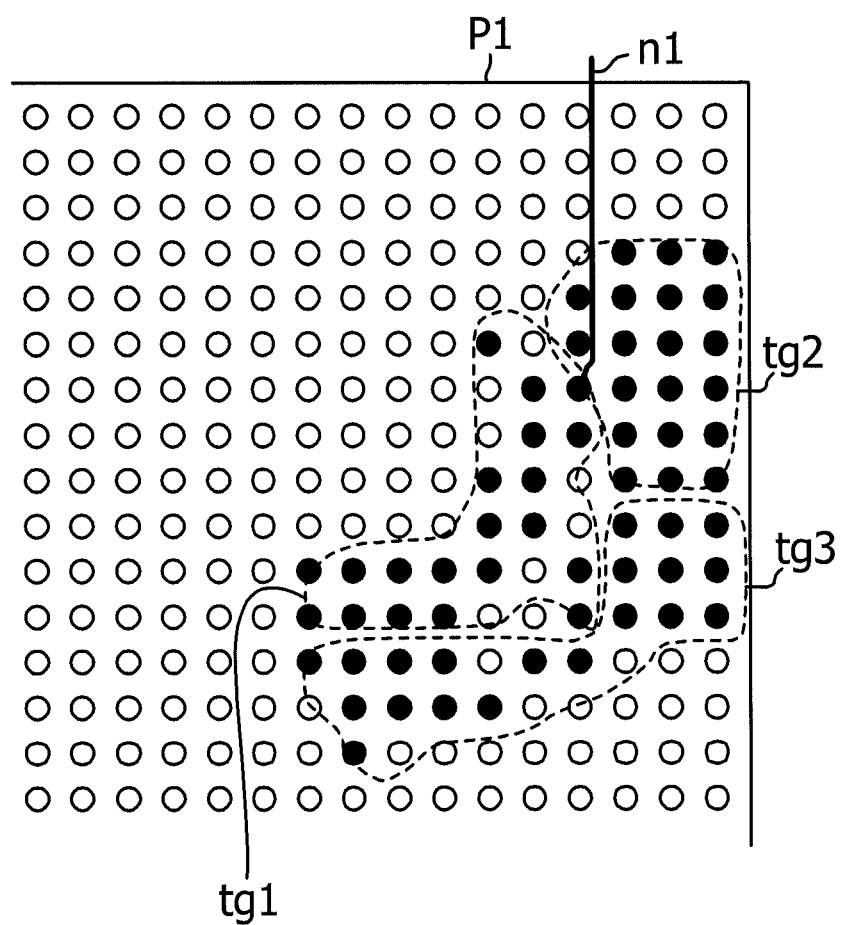
FIG. 53 illustrates a significance of a protection wall.

Details of operation S4-9-4 (i.e., generation of a protection wall) in FIG. 20 will be described next. FIG. 53 illustrates a significance of a protection wall. In FIG. 53, P1 represents one portion (including an upper-right vertex) of a component. Circles represent pins disposed on the component. Areas tg1, tg2, and tg3 (surrounded by dotted lines) including pins (colored black) each represent a group of pins from which nets belonging to the same bus are to be extracted. Thus, FIG. 53 illustrates groups of extraction-source pins for nets belonging to three buses.

During searching for paths for extracting wires for nets belonging to each bus through use of the directed graph generated in the processing described above, when a path that passes through between pins to which nets belonging to another bus are connected is permitted, a discontinuity between the pins occurs. For example, in FIG. 53, an extraction path for a net n1 extracted from one pin in the pin group tg1 passes through the pin group tg2 to thereby cause a discontinuity between some of the pins in the pin group tg2. As a result, extraction of wires from the pins between which the discontinuity occurs fails. Thus, it is necessary to take measures for preventing the discontinuity between the pins. Accordingly, for each group of pins connected to the same bus, the protection-wall generating unit 1212 generates a protection wall for closing regions between pins. In order to prevent a portion where the periphery of the component and the bus path for the bus intersect each other from being used for extraction of another bus, the protection-wall generating unit 1212 reserves, at the portion, wire-escape exits corresponding to the number of nets belonging to the bus and generates, at the portion, a protection wall integrated with the inter-pin protection wall. That is, one protection wall contains a portion (hereinafter be referred to as an "inter-pin closing portion") that close regions between extraction-source pins, a portion (hereinafter be referred to as a "wire-escape-exit portion") that reserves wire-escape exits, and a portion (hereinafter referred to as a "coupling portion") that couples the inter-pin closing portion and the wire-escape-exit portion.

During searching for paths for extracting wires for nets belonging to a certain bus, the protection walls for buses other than the certain bus are activated. This can prevent the extraction path for the certain bus from causing a discontinuity between the pins for the other buses.

Figure 54:
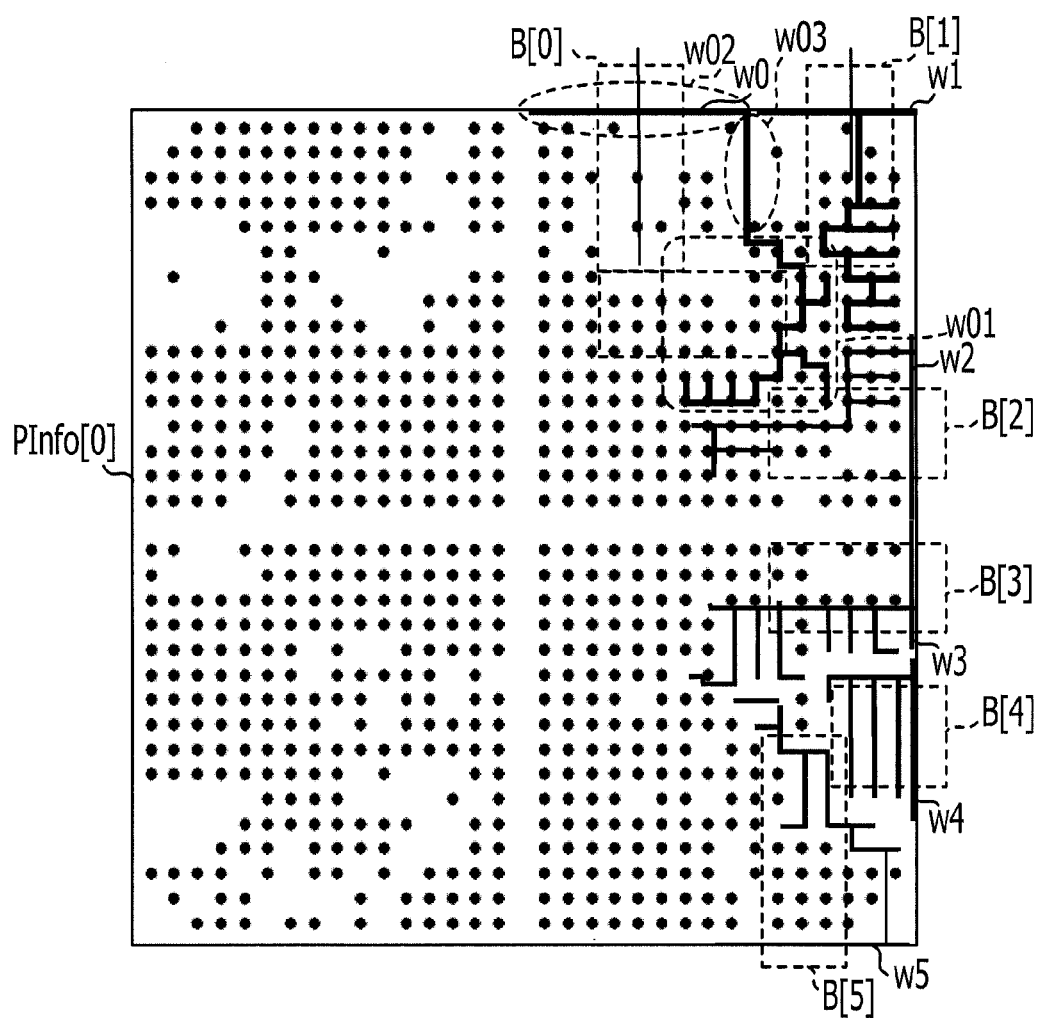
FIG. 54 illustrates one example of a protection wall.

The protection wall has a shape, for example, as illustrated in FIG. 54. FIG. 54 illustrates one example of a protection wall. The component PInfo[0] extracted from FIG. 13 is illustrated in FIG. 54. FIG. 54 also illustrates portions of bus paths for buses B[0] to B[5], the bus paths being connected to the component PInfo[0]. A protection wall w0 is a protection wall for the bus B[0]. A protection wall w1 is a protection wall for the bus B[1]. A protection wall w2 is a protection wall for the bus B[2]. A protection wall w3 is a protection wall for the bus B[3]. A protection wall w4 is a protection wall for the bus B[4]. A protection wall w5 is a protection wall for the bus B[5]. An inter-pin closing portion w01, a wire-escape-exit portion w02, and a coupling portion w03 is illustrated with respect to the protection wall w0. For example, a maze method may be used to form each protection wall by making connections between the extraction-source pins and so on. Processing for generating such a protection wall will be described below.

Figure 55:
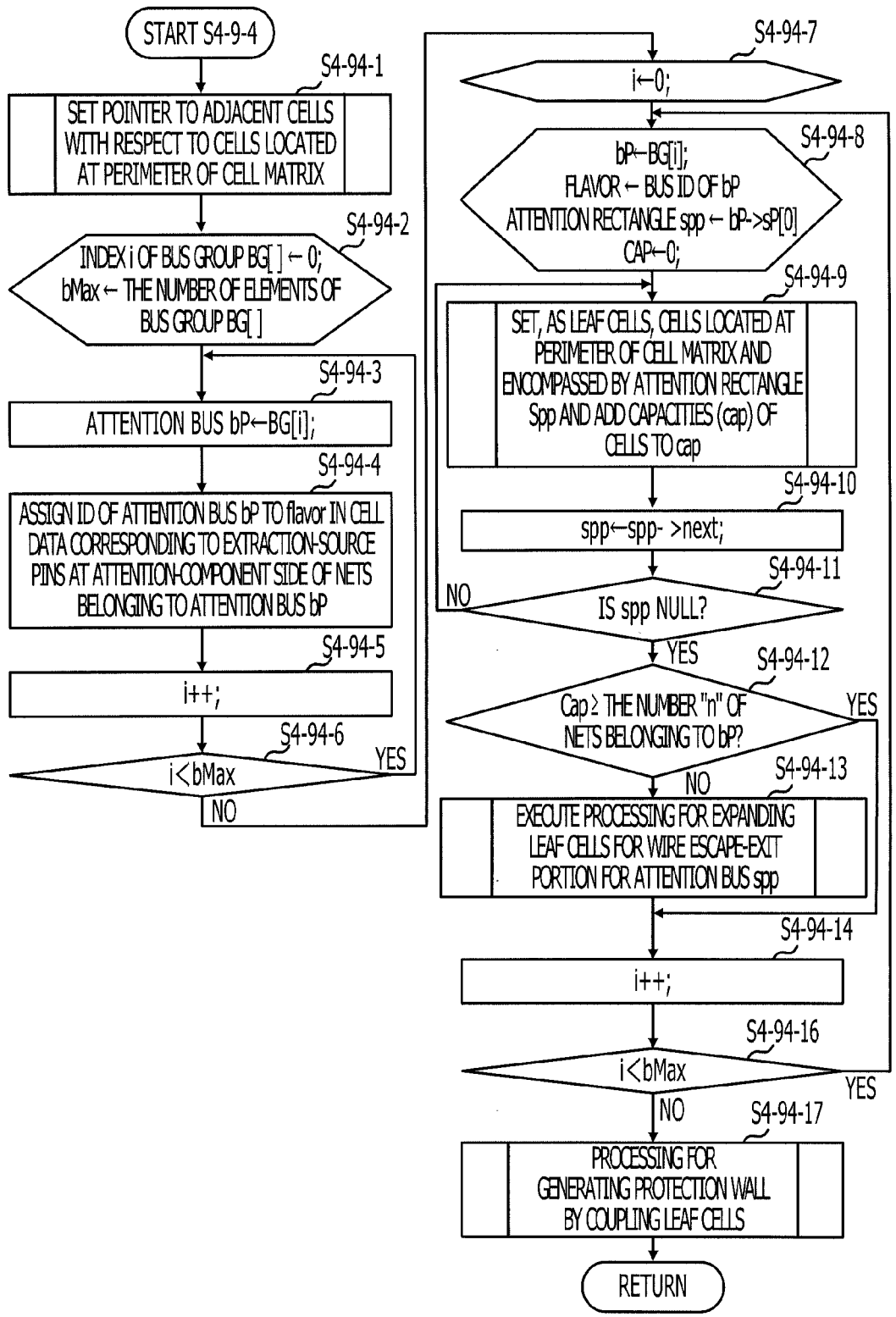
FIG. 55 is a flowchart of processing for generating a protection wall.

FIG. 55 is a flowchart of processing for generating a protection wall.

In operation S4-94-1, with respect to the cell data of cells located at the perimeter of the cell matrix in the cell coordinate system, the protection-wall generating unit 1212 sets a pointer to the cell data of the cells adjacent in the perimeter direction.

Figure 56:
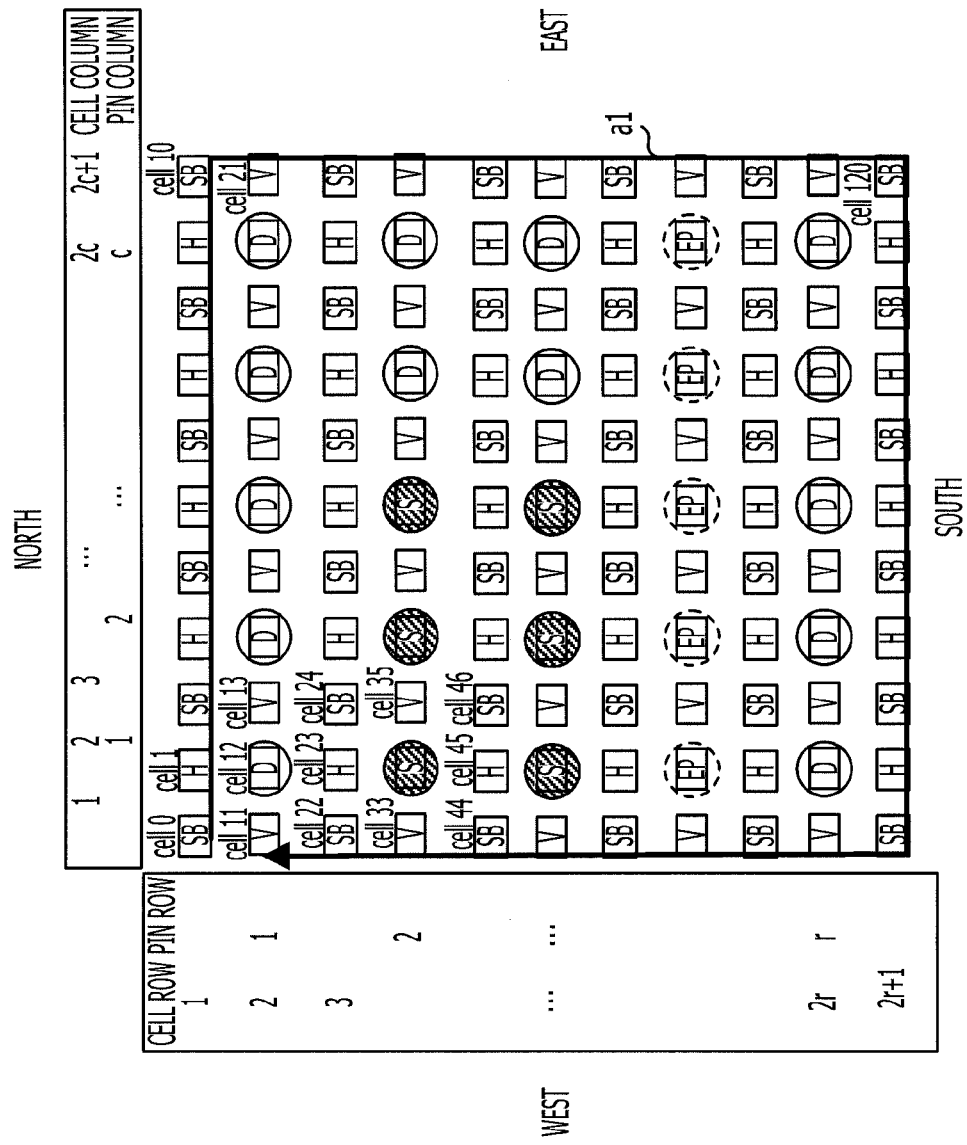
FIG. 56 illustrates cells that are adjacent to, in the perimeter direction, cells located at the perimeter of a cell matrix.

FIG. 56 illustrates cells that are adjacent to, in the perimeter direction, cells located at the perimeter of the cell matrix. In FIG. 56, an arrow a1 indicates the perimeter direction of the cell matrix. In operation S4-94-1, with respect to the cell data of cells located at the periphery of the cell matrix, a pointer of the cell data of a left-side cell and a pointer of the cell data of a right-side cell in the direction of the arrow a1 (i.e., clockwise) are set to the right-side cell and the left-side cell, respectively.

Subsequently, the protection-wall generating unit 1212 initializes a variable i to 0. The variable i is an index for the bus group BG extracted in operation S4-9-1 in FIG. 20. In operation S4-94-2, the protection-wall generating unit 1212 assigns the number of elements of the bus group BG (i.e., the number of buses associated with the attention component and the attention layers L) to a variable bMax.

In operation S4-94-3, the protection-wall generating unit 1212 sets the i-th bus (BG[i]) in the bus group BG as an attention bus bP. Subsequently, in operation S4-94-4, the protection-wall generating unit 1212 assigns the bus ID of the attention bus bP to the protection-wall colors (flavor) in the cell data of the cells corresponding to extraction-source pins at the attention-component side of the nets belonging to the attention bus bP. More specifically, the IDs of the nets belonging to the attention bus bP are specified based on the bus-net group "netG" in the bus information B (FIG. 8) of the attention bus bP. The table (FIG. 29) corresponding to the pin information PInfo of the attention component is then specified based on the pin information in the component information PInfo of the attention component. Subsequently, records (pin information TInfo) in which the values of the connection net match any of the IDs of the nets belonging to the attention bus bP are extracted from the table. On the basis of the rows H and the columns V of the extracted records, cell data corresponding to the records are specified in the cell-data array "cell". The row H and the column V indicate the row number and the column number, respectively, in the pin matrix. The row H and the column V in the pin matrix are converted into a row number and a column number in the cell matrix, and then the cell data corresponding to the respective records are specified. The cell data specified as described are intended cell data. Thus, the bus ID of the attention bus bP is assigned to the value of the protection-wall colors (flavor) in the cell data. Cells having cell data in which the bus ID of any bus is assigned to the protection-wall colors (flavor) are hereinafter referred to as "leaf cells". The leaf cells are cells that serve as bases for a protection wall. In operation S4-94-4, with respect to the inter-pin closing portion of a protection wall for the attention bus bP, cells corresponding to extraction-source pins of the nets belonging to the attention bus bP are set as leaf cells.

Figure 57:
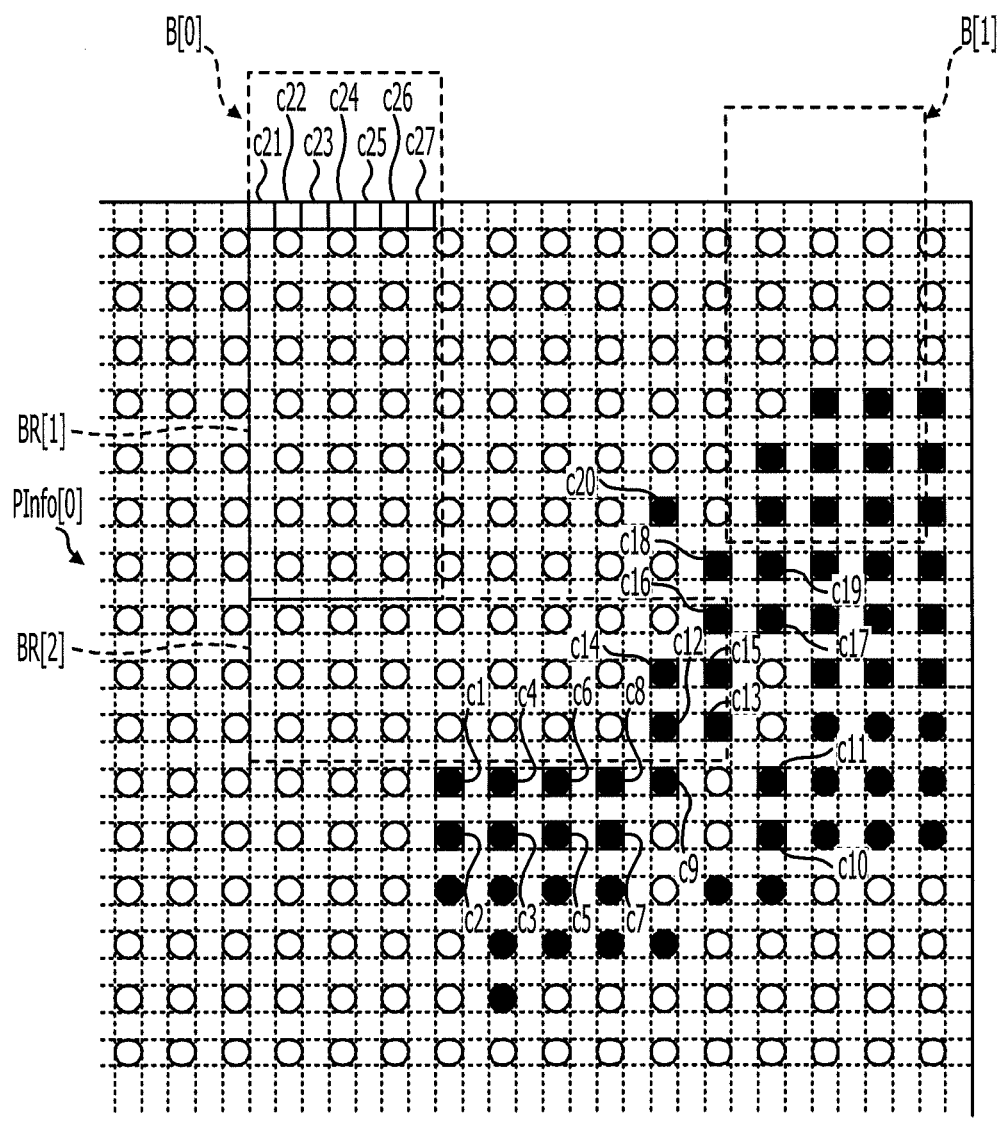
FIG. 57 illustrates leaf cells.

FIG. 57 illustrates leaf cells. In FIG. 57, a cell matrix for the component PInfo[0] for the attention component is illustrated. Cells in which circles are depicted represent cells corresponding to pins. In FIG. 57, portions of a bus B[0] and a bus B[1] are also illustrated.

In FIG. 57, cells c1 to c20 correspond to extraction-source pins for 20 nets belonging to the bus B[0]. Thus, when the bus B[0] is the attention bus bP, the cells c1 to c20 are set as leaf cells for the bus B[0] in operation S4-94-4. That is, "0" which is the bus ID of the bus B[0] is assigned to the protection-wall colors (flavor) in the cell data of the cells c1 to c20.

In operation S4-94-5, the protection-wall generating unit 1212 increments the value of the variable i to set a next bus in the bus group BG as the attention bus bP. Through operation S4-94-6, operations S4-94-3 to S4-94-5 are executed on all buses included in the bus group BG.

When operations S4-94-3 to S4-94-5 are completed on all buses included in the bus group BG (No in S4-94-6), operations S4-94-7 to S4-94-15 are performed. In the operations, the protection-wall generating unit 1212 executes processing for setting, as leaf cells, a group of cells corresponding to a portion (i.e., a wire-escape-exit portion) at which each bus included in the bus group BG traverses the perimeter side of the attention component. That is, this processing is to set leaf cells at the wire-escape-exit portion of the protection wall.

First, in operation S4-94-7, the protection-wall generating unit 1212 initializes the value of the variable i to 0 again. The protection-wall generating unit 1212 then sets the i-th bus (BG[i]) in the bus group BG as the attention bus bP. The protection-wall generating unit 1212 assigns the bus ID of the attention bus bP to a variable FLAVOR. The protection-wall generating unit 1212 also sets, as an attention rectangle spp, the bus-path rectangle information BR (FIG. 12) of a first rectangle in the bus rectangle list sP of the attention bus bP. In addition, in operation S4-94-8, the protection-wall generating unit 1212 assigns 0 to a variable CAP. The variable CAP is a variable for storing the total sum of the capacities (wire capacities) of the cell group corresponding to the portion (the wire-escape-exit portion) at which the attention bus traverses the perimeter side of the attention component).

In operation S4-94-9, the protection-wall generating unit 1212 assigns the bus ID of the attention bus bP to the protection-wall colors (flavor) in the cell data of the cells located at the perimeter of the cell matrix in the cell coordinate system and encompassed by the attention rectangle spp, and also assigns the total sum of the capacities of the corresponding cells to the variable CAP. Consequently, the cells encompassed by the attention rectangle spp are set as leaf cells. Through operations S4-94-10 and S4-94-11, operation S4-94-9 is executed on all rectangles belonging to the attention bus bP. The processing in operations S4-94-9 to S4-94-11 is processing for adding a protection-wall mark to the cell group corresponding to the portion (the wire-escape-exit portion) at which one attention bus bP included in the bus group BG traverses the perimeter side of the attention component.

The processing will now be described in detail with reference to FIG. 57. Rectangles BR[1] and BR[2] illustrated in FIG. 57 are rectangles included in the bus B[0]. The rectangle BR[1] encompasses cells c21 to c27 located at the perimeter of the component PInfo[0]. Thus, when the attention bus bP is the bus B[0] and the attention rectangle spp is the rectangle BR[1], the cells c21 to c27 are set as leaf cells for the bus B[0]. Thus, the bus ID "0" of the bus B[0] is assigned to the protection-wall colors (flavor) in the cell data corresponding to the cells c21 to c27. The total sum of the capacities (cap) in the cell data for the cells c21 to c27 is recorded in the variable CAP.

When operation S4-94-9 is finished on all rectangles belonging to the attention bus bP (Yes in S4-94-11), the process proceeds to operation S4-94-12 in which the protection-wall generating unit 1212 determines whether or not the value of the variable CAP is larger than or equal to the total number of nets belonging to the attention bus bP. That is, a determination is made as to whether or not wires for all nets belonging to the attention bus bP can be extracted with respect to the wire-escape-exit portion for the attention bus bP. For example, in FIG. 57, when the attention bus bP is the bus B[0], the total number of bus nets is 20. Thus, a determination is made as to whether or not the value of the variable CAP is 20 or more.

When the value of the variable CAP is larger than or equal to the total number of nets belonging to the attention bus bP (Yes in S4-94-12), the process proceeds to operation S4-94-14 in which the protection-wall generating unit 1212 increments the number of the variable i to set a next bus in the bus group BG as the attention bus.

When the value of the variable CAP is smaller than the total number of nets belonging to the attention bus bP (No in S4-94-12), the nets belonging to the attention bus bP cannot be extracted through the wire-escape-exit portion under this situation. Accordingly, in operation S4-94-13, the protection-wall generating unit 1212 executes processing for expanding (adding) leaf cells for the wire-escape-exit portion so as to enable extraction of all nets belonging to the attention bus bP. Subsequently, in operation S4-94-14, the protection-wall generating unit 1212 increments the variable i.

Figure 58:
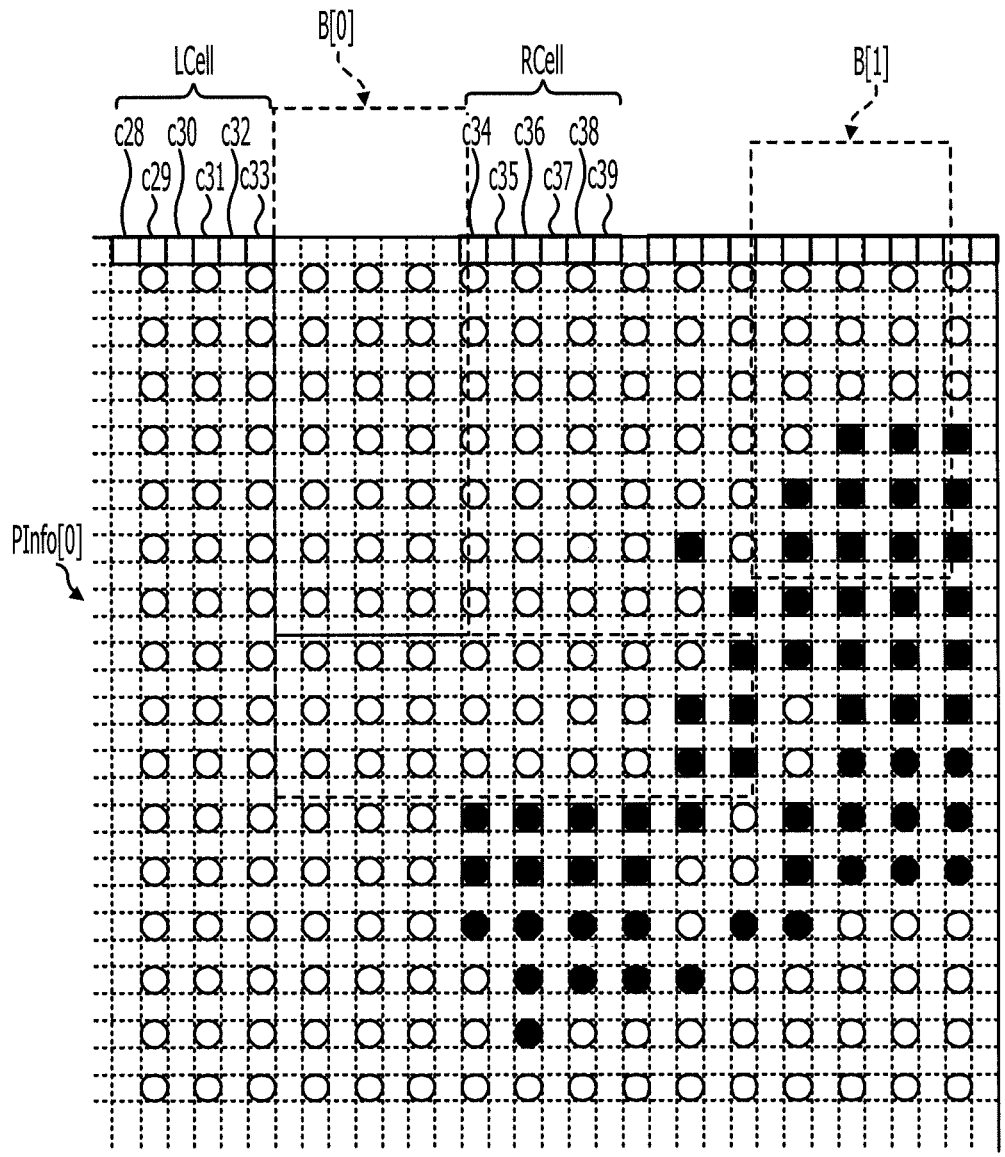
FIG. 58 illustrates expansion of leaf cells for a wire-escape-exit portion.

FIG. 58 illustrates expansion of leaf cells for the wire-escape-exit portion. More specifically, FIG. 58 illustrates a state in which the wire-escape-exit portion of the bus B[0] is expanded so that cells c28 to c33 included in a portion denoted by reference character LCell and cells c34 to c39 included in a portion denoted by reference character RCell are added as leaf cells for the bus B[0].

When operations S4-94-8 to S4-94-13 are completed on all buses included in the bus group BG (No in S4-94-15), the process proceeds to operation S4-94-17 in which the protection-wall generating unit 1212 searches for a path that couples leaf cells having the same protection-wall color (flavor) and generates a protection wall on the basis of the found path.

Figure 59:
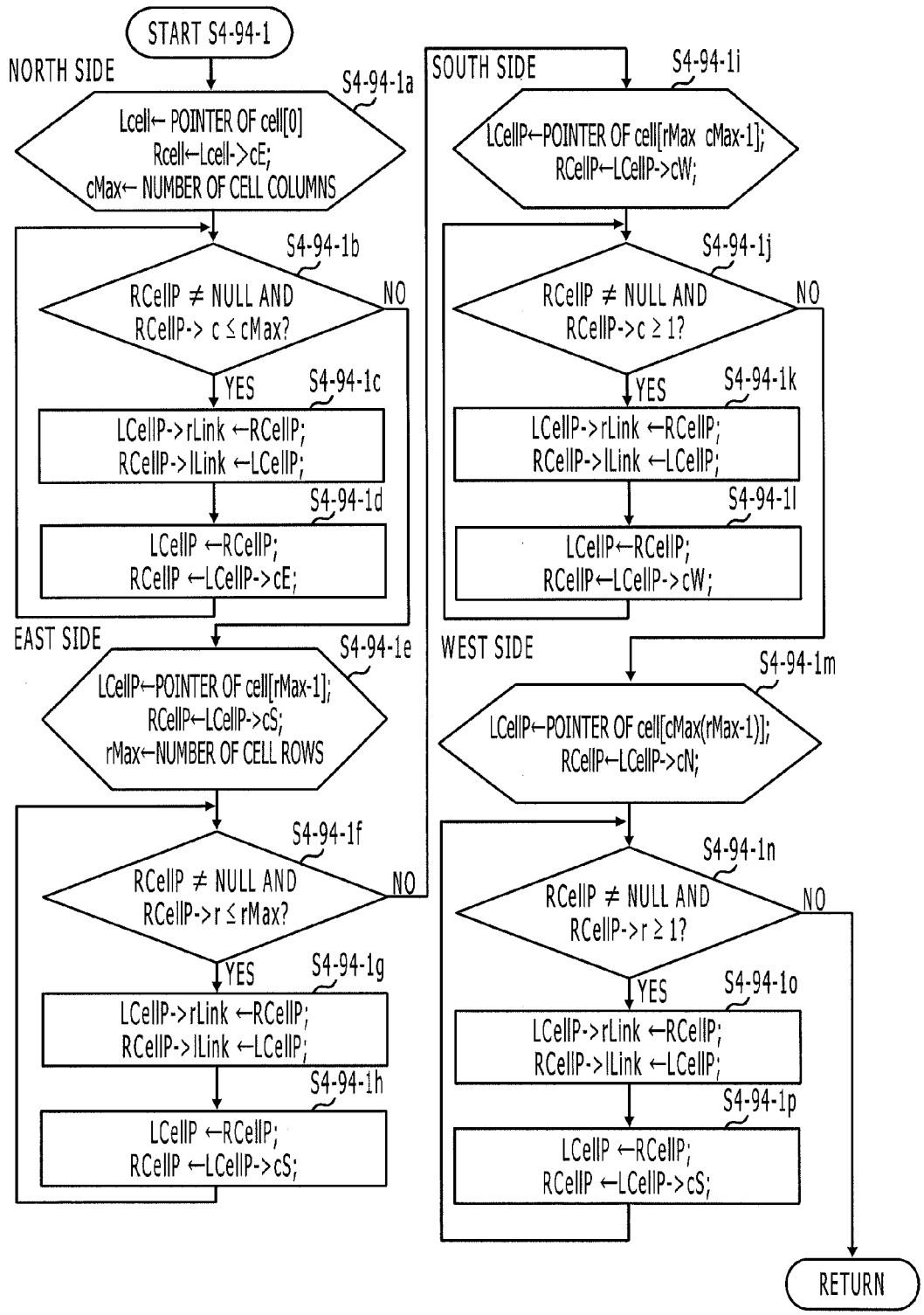
FIG. 59 is a flowchart of processing for setting a pointer to an adjacent cell clockwise or counterclockwise with respect to the cells located at the perimeter of the cell matrix.

Details of operation S4-94-1 will be described next. FIG. 59 is a flowchart of processing for setting a pointer to an adjacent cell clockwise or counterclockwise with respect to the cells located at the perimeter of the cell matrix. As is apparent from FIG. 56, the meaning of the "left" and "right" in the clockwise direction when viewed from one cell located at the perimeter of the cell matrix differs depending on at which of the north side, the east side, the south side, and the west side the cell is located. For example, when the cell is located at the north side or the south side, the left-and-right directions correspond to the east-and-west directions. For example, when the cell is located at the east side or the west side, the left-and-right directions correspond to the north-and-south directions. Thus, FIG. 59 illustrates a processing procedure for cells located at the north side, cells located at the east side, cells located at the south side, and cells located at the west side.

Processing in operations S4-94-1*a* to S4-94-1*d* is processing on cells located at the north side. In operation S4-94-1*a*, the protection-wall generating unit 1212 assigns the pointer of the cell data for a first element (cell[0]) in the cell-data array "cell" to a variable LCellP for holding the cell data of the cell at the left side in the clockwise direction. The cell data is the cell data of the cell located in the first row and the first column. The protection-wall generating unit 1212 also assigns the adjacent east cell pointer (cE) in the cell data of the cell corresponding to the variable LCell to the variable RCellP for holding the cell data of the cell at the right side in the clockwise direction. In addition, the protection-wall generating unit 1212 assigns the number of columns of the cell matrix to a variable cMax.

Subsequently, in operation S4-94-1*b*, the protection-wall generating unit 1212 determines whether or not the value of RCellP is not NULL and the column number (c) in the cell data RCellP is smaller than or equal to the variable cMax. That is, a determination is made as to whether or not the right-side cell does not reach the east end.

When the value of RCellP is not NULL and the column number (c) in the cell data RCellP is smaller than or equal to the variable cMax (Yes in S4-94-1*b*), the protection-wall generating unit 1212 associates the left-side cell and the right-side cell in operation S4-94-1*c*. That is, the pointer (RCellP) in the cell data of the right-side cell is assigned to the adjacent right cell pointer (rLink) in the cell data LCellP of the left-side cell. The pointer (LCellP) in the cell data of the left-side cell is also assigned to the adjacent left cell pointer (link) in the cell data RCellP of the right-side cell.

In operation S4-94-1*d*, the protection-wall generating unit 1212 shifts the cell corresponding to LCellP and the cell corresponding to RCellP eastward by one column. That is, the pointer (RCellP) in the cell data of the right-side cell is assigned to LCellP. The adjacent east cell pointer (cE) in the cell data LCellP of the left-side cell shifted eastward by one column is assigned to RCellP. Subsequently, operation S4-94-1*b* and the subsequent operations are repeated.

When it is determined in operation S4-94-1*b* that the value of RCellP is NULL or the column number of the cell data RCellP exceeds cMax (i.e., No), the process proceeds to processing for the cells at the east side (i.e., to operations S4-94-1*e* to S4-94-1*h*).

In operation S4-94-1*e*, the protection-wall generating unit 1212 assigns the pointer of the cell data (cell[cMax−1]) of the cell located at the east end in the first row to the variable LCellP. The protection-wall generating unit 1212 also assigns the adjacent south cell pointer (cS) in the cell data of the cell corresponding to the variable LCell to the variable RCellP. In addition, the protection-wall generating unit 1212 assigns the number of rows of the cell matrix to a variable rMax.

Subsequently, in operation S4-94-1*f*, the protection-wall generating unit 1212 determines whether or not the value of RCellP is not NULL and the row number (r) in the cell data RCellP is smaller than or equal to the variable rMax. That is, a determination is made as to whether or not the right-side cell does not reach the south end.

When the value of RCellP is not NULL and the row number (r) in the cell data RCellP is smaller than or equal to the variable rMax (Yes in S4-94-1*f*), the protection-wall generating unit 1212 associates the left-side cell and the right-side cell in operation S4-94-1*g*. That is, the pointer (RCellP) in the cell data of the right-side cell is assigned to the adjacent right cell pointer (rLink) in the cell data LCellP of the left-side cell. The pointer (LCellP) in the cell data of the left-side cell is also assigned to the adjacent left cell pointer (lLink) in the cell data RCellP of the right-side cell.

In operation S4-94-1*h*, the protection-wall generating unit 1212 shifts the cell corresponding to LCellP and the cell corresponding to RCellP southward by one row. That is, the pointer (RCellP) in the cell data of the right-side cell is assigned to LCellP. The adjacent south cell pointer (cS) in the cell data LCellP of the left-side cell shifted southward by one row is assigned to RCellP. Subsequently, operation S4-94-1*f* and the subsequent operations are repeated.

When it is determined in operation S4-94-1*f* that the value of RCellP is NULL or the column number of the cell data RCellP exceeds cMax (i.e., No), the process proceeds to processing for the cells at the south side (i.e., to operations S4-94-1*i* to S4-94-11).

In operation S4-94-1*i*, the protection-wall generating unit 1212 assigns, to the variable LCellP, the pointer of the cell data (cell[rMax×cMax−1]) of the cell located at the east end in the last row in the cell matrix. The protection-wall generating unit 1212 also assigns the adjacent west cell pointer (cW) in the cell data of the cell corresponding to the variable LCell to the variable RCellP.

Subsequently, in operation S4-94-1*j*, the protection-wall generating unit 1212 determines whether or not the value of RCellP is not NULL and the column number (c) in the cell data RCellP is larger than or equal to 1. That is, a determination is made as to whether or not the right-side cell does not reach the west end.

When the value of RCellP is not NULL and the column number (c) in the cell data RCellP is larger than or equal to 1 (Yes in S4-94-1*j*), the protection-wall generating unit 1212 associates the left-side cell and the right-side cell in operation S4-94-1*k*. That is, the pointer (RCellP) in the cell data of the right-side cell is assigned to the adjacent right cell pointer (rLink) in the cell data LCellP of the left-side cell. The pointer (LCellP) in the cell data of the left-side cell is also assigned to the adjacent left cell pointer (lLink) in the cell data RCellP of the right-side cell.

In operation S4-94-1I, the protection-wall generating unit 1212 shifts the cell corresponding to LCellP and the cell corresponding to RCellP westward by one column. That is, the pointer (RCellP) in the cell data of the right-side cell is assigned to LCellP. The adjacent west cell pointer (cW) in the cell data LCellP of the left-side cell shifted westward by one column is assigned to RCellP. Subsequently, operation S4-94-1*j* and the subsequent operations are repeated.

When it is determined in operation S4-94-1*j* that the value of RCellP is NULL or the column number of the cell data RCellP reaches 0 (i.e., No), the process proceeds to processing for the cells at the west side (i.e., to operations S4-94-1*m* to S4-94-1*p*).

In operation S4-94-1*m*, the protection-wall generating unit 1212 assigns, to the variable LCellP, the pointer of the cell data (cell[cMax×(rMax−1)]) of the cell located at the west end in the last row in the cell matrix. The protection-wall generating unit 1212 also assigns the adjacent north cell pointer (cN) in the cell data of the cell corresponding to the variable LCell to the variable RCellP.

Subsequently, in operation S4-94-1n, the protection-wall generating unit 1212 determines whether or not the value of RCellP is not NULL and the row number (r) in the cell data RCellP is larger than or equal to 1. That is, a determination is made as to whether or not the right-side cell does not reach the north end.

When the value of RCellP is not NULL and the row number (r) in the cell data RCellP is larger than or equal to 1 (Yes in S4-94-1n), the protection-wall generating unit 1212 associates the left-side cell and the right-side cell in operation S4-94-1o. That is, the pointer (RCellP) in the cell data of the right-side cell is assigned to the adjacent right cell pointer (rLink) in the cell data LCellP of the left-side cell. The pointer (LCellP) in the cell data of the left-side cell is also assigned to the adjacent left cell pointer (lLink) in the cell data RCellP of the right-side cell.

In operation S4-94-1p, the protection-wall generating unit 1212 shifts the cell corresponding to LCellP and the cell corresponding to RCellP northward by one row. That is, the pointer (RCellP) in the cell data of the right-side cell is assigned to LCellP. The adjacent north cell pointer (cN) in the cell data LCellP of the left-side cell shifted northward by one row is assigned to RCellP. Subsequently, operation S4-94-1n and the subsequent operations are repeated.

Figure 60:
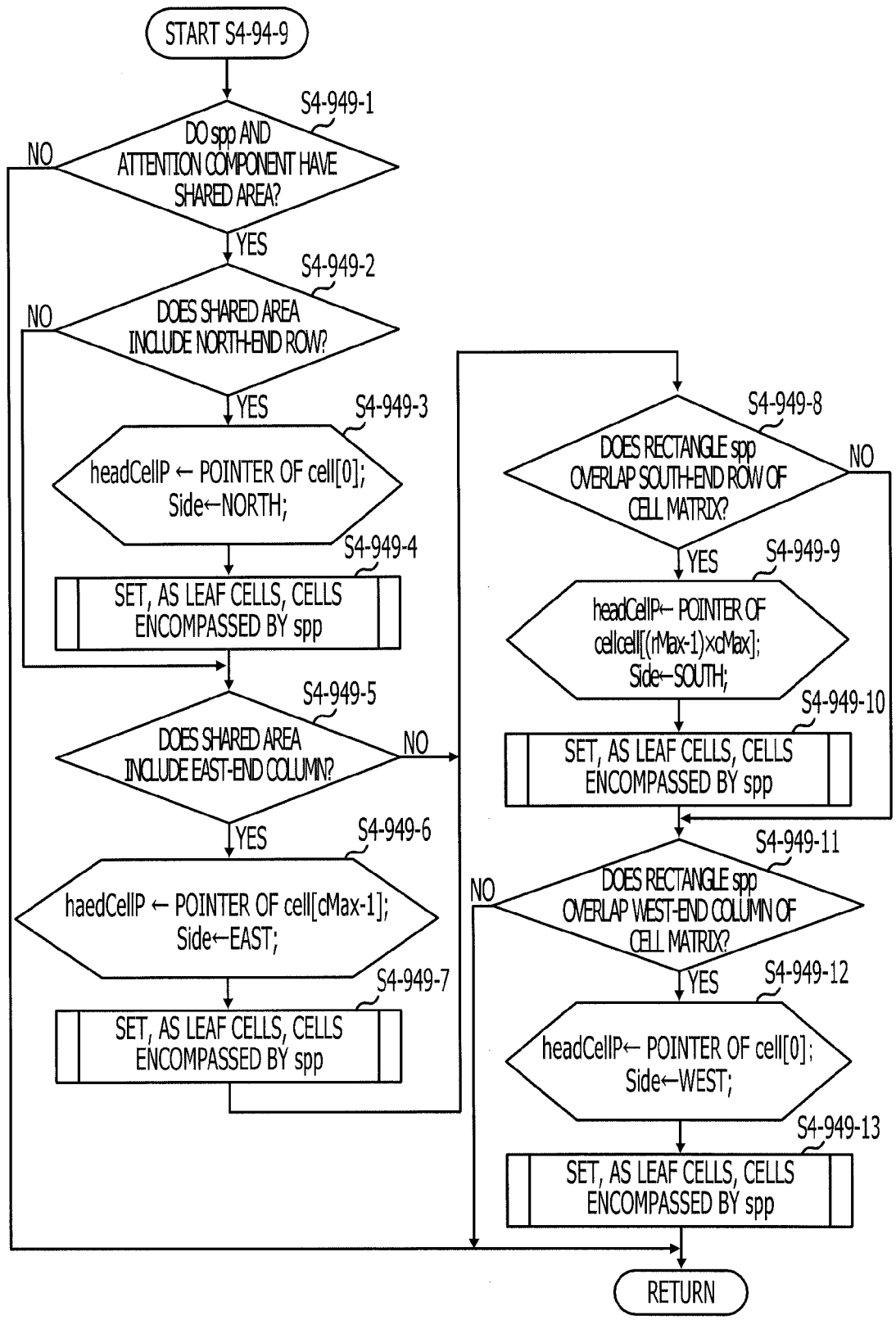
FIG. 60 is a flowchart of a procedure of processing for setting, as leaf cells, cells located at the perimeter of the cell matrix and encompassed by an attention rectangle.

Details of operation S4-94-9 in FIG. 55 will be described next. FIG. 60 is a flowchart of a procedure of processing for setting, as leaf cells, cells located at the perimeter of the cell matrix and encompassed by an attention rectangle.

In operation S4-949-1, the protection-wall generating unit 1212 determines whether or not the attention rectangle spp and the attention component have a shared area (an overlap portion). That is, a determination is made as to whether or not a rectangle specified based on the start-point coordinates and the end-point coordinates in the bus-path rectangle information BR (FIG. 12) of the attention rectangle spp and a rectangle specified based on the component location coordinates "loc" and the component size in the component information PInfo (FIG. 7) of the attention component have a shared area (an overlap portion). When the rectangles have no shared area (No in S4-949-1), the processing in FIG. 60 ends.

When the rectangles have a shared area (Yes in S4-949-1), the protection-wall generating unit 1212 searches for cells encompassed by the attention rectangle spp, with respect to the north-end row, east-end column, south-end row, and west-end column of the cell matrix.

When the shared area includes the north-end row (Yes in S4-949-2), the protection-wall generating unit 1212 sets the north-end row as a search target. First, in operation S4-949-3, the protection-wall generating unit 1212 assigns, to a variable headCell, the pointer of the cell data (cell[0]) of the cell located in the first column at the north end in the cell matrix. The variable headCell is a variable for identifying a first cell for the search. The protection-wall generating unit 1212 also assigns a constant NORTH to a variable Side. In operation S4-949-4, by using the variable headCell, the variable Side, and so on, the protection-wall generating unit 1212 executes processing for setting, as the leaf cells, cells encompassed by the attention rectangle spp.

When the shared area includes the east-end column (Yes in S4-949-5), the protection-wall generating unit 1212 sets the east-end column as the search target. First, in operation S4-949-6, the protection-wall generating unit 1212 assigns the pointer of the cell data (cell[cMax−1]) of the cell located at the east end in the first row in the cell matrix to the variable headCell, where cMax indicates the number of columns in the cell matrix. The protection-wall generating unit 1212 also assigns a constant EAST to the variable Side. In operation S4-949-7, by using the variable headCell, the variable Side, and so on, the protection-wall generating unit 1212 executes processing for setting, as leaf cells, the cells encompassed by the attention rectangle spp.

When the shared area includes the south-end row (Yes in S4-949-8), the protection-wall generating unit 1212 sets the south-end row as the search target. First, in operation S4-949-9, the protection-wall generating unit 1212 assigns the pointer of the cell data (cell[rMax−1×cMax]) of the cell located in the first column at the south end in the cell matrix to the variable headCell, where rMax indicates the number of rows in the cell matrix. The protection-wall generating unit 1212 also assigns a constant SOUTH to the variable Side. In operation S4-949-10, by using the variable headCell, the variable Side, and so on, the protection-wall generating unit 1212 executes processing for setting, as leaf cells, the cells encompassed by the attention rectangle spp.

When the shared area includes the west-end column (Yes in S4-949-11), the protection-wall generating unit 1212 sets the west-end column as the search target. First, in operation S4-949-12, the protection-wall generating unit 1212 assigns the pointer of the cell data (cell[0]) of the cell located in the first column at the north end in the cell matrix to the variable headCell. The protection-wall generating unit 1212 also assigns a constant WEST to the variable Side. In operation S4-949-13, by using the variable headCell, the variable Side, and so on, the protection-wall generating unit 1212 executes processing for setting, as leaf cells, the cells encompassed by the attention rectangle spp.

Next, a description will be given of the processing called in operations S4-949-4, S4-949-7, S4-949-10, or S4-949-13 in FIG. 60.

Figure 61:
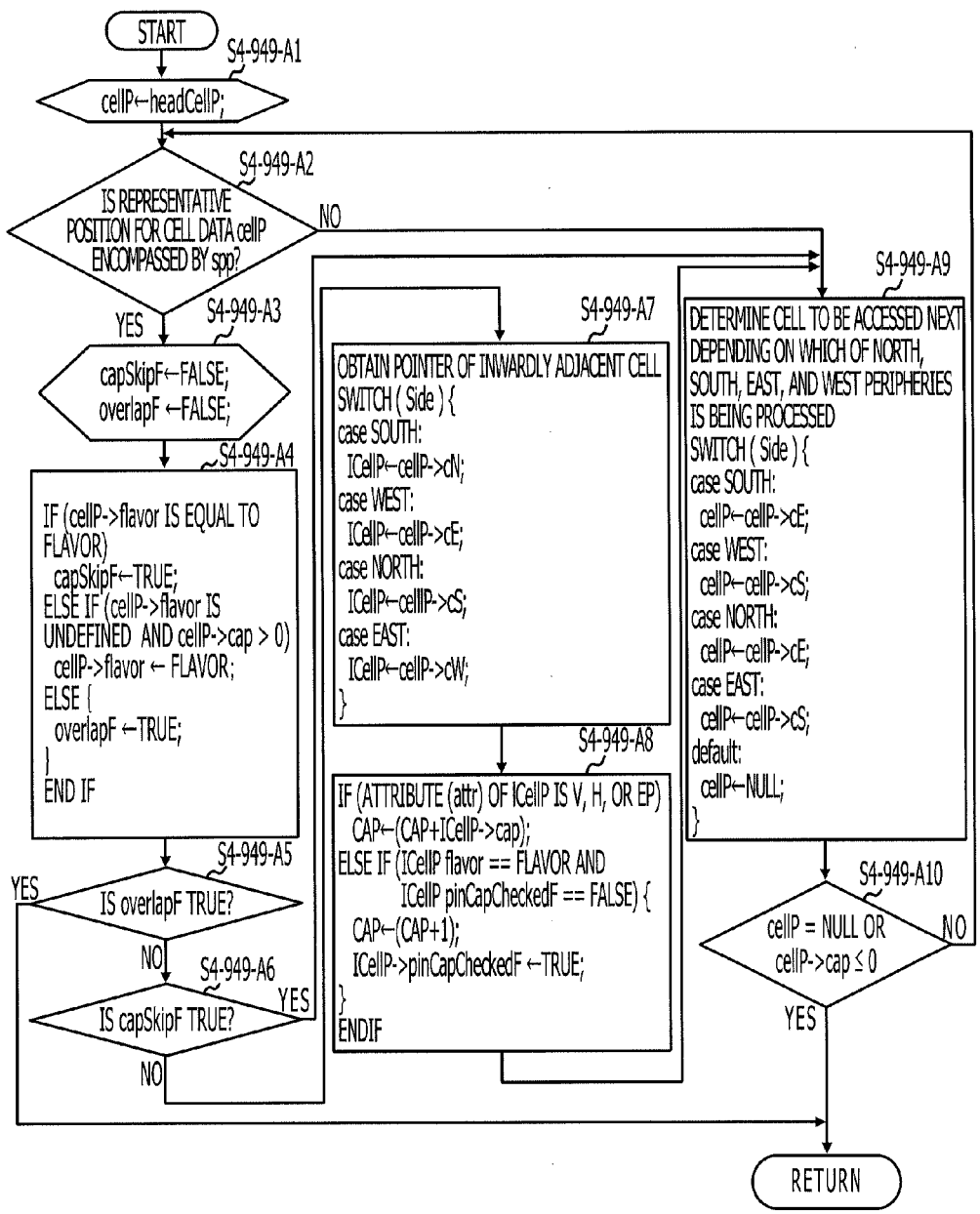
FIG. 61 is a flowchart of a procedure of processing for setting, as leaf cells, cells located in a certain row or column and encompassed by an attention rectangle.

FIG. 61 is a flowchart of a procedure of processing for setting, as leaf cells, cells located in a certain row or column and encompassed by an attention rectangle.

In operation S4-949-A1, the protection-wall generating unit 1212 assigns the value (the cell-data pointer) of the variable headCellP to a variable cellP for scanning a cell to be checked as to whether or not it is encompassed by the attention rectangle spp. The value of the variable headCellP is assigned in the processing illustrated in FIG. 60.

In operation S4-949-A2, the protection-wall generating unit 1212 determines whether or not the representative position (x coordinate, y coordinate) for the cell data cellP is encompassed by the attention rectangle spp. The coordinate values of the representative position are, in a relative coordinate system, coordinate values on the attention component. The start-point coordinates and the end-point coordinates of the attention rectangle are, in an actual-measurement coordinate system, values on a wiring area A. Thus, the coordinate values of the representative position may be converted into, in the actual-measurement coordinate system, coordinate values on the wiring area A on the basis of the component coordinate information "loc" in the component information PInfo of the attention component. Such conversion makes it possible to easily determine whether or not the representative position is encompassed by the attention rectangle spp.

When the representative position for the cell data cellP is encompassed by the attention rectangle spp (Yes in S4-949-A2), the process proceeds to operation S4-949-A3 in which the protection-wall generating unit 1212 initializes the value of a flag variable capSkipF to FALSE and initializes the value of a flag variable overlapF to FALSE. The flag variable capSkipF indicates whether or not addition of the capacity (the capacity (cap) in the cell data cellP) to the variable CAP is to be skipped. The variable CAP is the variable, defined in operation S4-94-8 in FIG. 55, for storing the capacity of the wire-escape-exit portion for the attention bus bP. The flag variable overlapF indicates whether or not the cell corresponding to the cell data cellP is a leaf cell of another bus.

In operation S4-949-A4, the protection-wall generating unit 1212 sets the values of the flag variables and so on, in accordance with the value of the protection-wall color (flavor) in the cell data cellP. More specifically, when the value of the protection-wall color (flavor) in the cell data cellP is equal to the variable FLAVOR, the protection-wall generating unit 1212 varies the value of capSkipF to TRUE. The value of the variable FLAVOR is the bus ID of the attention bus bP, as described in connection with operation S4-94-8 in FIG. 55. Thus, when the value of the protection-wall color (flavor) in the cell data cellP is the same as the variable FLAVOR, this means that the cell corresponding to the cell data cellP is already set as a leaf cell (a cell that serves as a basis for a protection wall) for the attention bus bP. Thus, the capacity (cap) in the cell data cellP is supposedly already added to the variable CAP. Hence, in order to prevent the capacity from being redundantly added to the variable CAP, the value of capSkipF is set to TRUE.

On the other hand, when the value of the protection-wall color (flavor) in the cell data cellP indicates "undefined (−1)" and the capacity (cap) in the cell data cellP is larger than 0, the protection-wall generating unit 1212 assigns the value of the variable FLAVOR to the protection-wall color (flavor) in the cell data cellP. That is, the cell corresponding to the cell data cellP is set as a leaf cell for the attention bus bP.

In a case other than the case described above, the protection-wall generating unit 1212 sets the value of overlapF to TRUE. This is because, in this case, the cell corresponding to the cell data cellP is already set as a leaf cell for a bus other than the attention bus bP.

In operation S4-949-A5, the protection-wall generating unit 1212 determines whether or not the value of overlapF is TRUE. When the value of overlapF is TRUE, the processing in FIG. 61 ends.

On the other hand, when the value of overlapF is FALSE (No in S4-949-A5) and the value of capSkipF is FALSE (No in S4-949-A6), the process proceeds to operation S4-949-A7 in which the protection-wall generating unit 1212 assigns, to a variable lCellP, the pointer of the cell data of the cell that is inwardly adjacent to the cell corresponding to the cell data cellP. The reason why the inwardly adjacent cell is set as the cell to be processed is that no pins are arranged at the perimeter of the cell matrix in the present embodiment. That is, if the capacity of a perimeter cell at the wire-escape-exit portion for the attention bus bP is added, the correct capacity of the entire wire-escape-exit cannot be obtained. This is because the pins corresponding to the group of inwardly adjacent cells restrict the wiring. Accordingly, the inwardly adjacent cell is set as a cell to be processed and the capacity of the inwardly adjacent cell is added up to obtain the entire capacity of the wire-escape-exit portion.

The "inward" direction differs depending on the position of the cell corresponding to the cell data cellP. Thus, the protection-wall generating unit 1212 varies the cell pointer to be assigned to lCellP, in accordance with the value of the variable Side set in the processing in FIG. 60. More specifically, when the value of the variable Side is SOUTH (i.e., when the cell to be processed is in the south-end row), the adjacent north cell pointer (cN) in the cell data cellP is assigned to lCellP. When the value of the variable Side is WEST (i.e., when the cell to be processed is in the west-end column), the adjacent east cell pointer (cE) in the cell data cellP is assigned to lCellP. When the value of the variable Side is NORTH (i.e., when the cell to be processed is in the north-end row), the adjacent south cell pointer (cS) in the cell data cellP is assigned to lCellP. When the value of the variable Side is EAST (i.e., when the cell to be processed is in the east-end column), the adjacent west cell pointer (cW) in the cell data cellP is assigned to lCellP.

Subsequently, in operation S4-949-A8, the protection-wall generating unit 1212 updates the value of the variable CAP in accordance with the contents of the cell data lCellP.

More specifically, when the value of the cell attribute (attr) in the cell data lCellP is V (inter-horizontal-pin portion), H (inter-vertical-pin portion), or EP (empty pin), the protection-wall generating unit 1212 adds the value of the capacity (cap) in the cell data lCellP to the variable CAP. That is, when the cell corresponding to the cell data lCellP is a wirable cell, the capacity of the cell is added to the variable CAP.

On the other hand, when the value of the protection-wall color (flavor) in the cell data lCellP matches the value of the variable FLAVOR and the value of the capacity-checked flag (pinCapCheckedF) in the cell data lCellP is FALSE, the protection-wall generating unit 1212 adds 1 to the variable CAP. In this case, the cell corresponding to the cell data lCellP corresponds to an extraction-source pin. Thus, one net is extracted from the extraction-source pin. Thus, 1 is added to the variable CAP. In this case, the protection-wall generating unit 1212 assigns TRUE to the capacity-checked flag (pinCapCheckedF) in the cell data lCellP. This is to prevent the capacity (cap) from being redundantly added with respect to the cell associated with the extraction-source pin.

In operation S4-949-A9, the protection-wall generating unit 1212 updates the value of the variable cellP to the pointer of the cell data of a next cell. More specifically, when the value of the variable Side is SOUTH, the adjacent east cell pointer (cE) in the cell data cellP is assigned to cellP. When the value of the variable Side is WEST, the adjacent south cell pointer (cS) in the cell data cellP is assigned to cellP. When the value of the variable Side is NORTH, the adjacent east cell pointer (cE) in the cell data cellP is assigned to cellP. When the value of the variable Side is EAST, the adjacent south cell pointer (cS) in the cell data cellP is assigned to cellP.

The above-described procedure is repeated until it is determined in operation S4-949-A10 that the value of the variable cellP is NULL or the value of the capacity (cap) in the cell data cellP is 0 or less. That is, the procedure is repeated until all cells in the row or column to be processed are scanned or a cell that cannot be wired (i.e., that cannot be used as a wire-escape exit) is detected.

On the other hand, when it is determined in operation S4-949-A2 that the representative position (x coordinate, y coordinate) in the cell data cellP is not encompassed by the attention rectangle spp (i.e., No), the process proceeds to operation S4-949-A9 in which the cell to be scanned is shifted, without execution of operations S4-949-A3 to S4-949-A8.

When it is determined in S4-949-A6 that the value of capSkipF is TRUE (i.e., Yes), the process proceeds to operation S4-949-A9 in which the cell to be scanned is shifted, without execution of operations S4-949-A7 and S4-949-A8.

Figure 62:
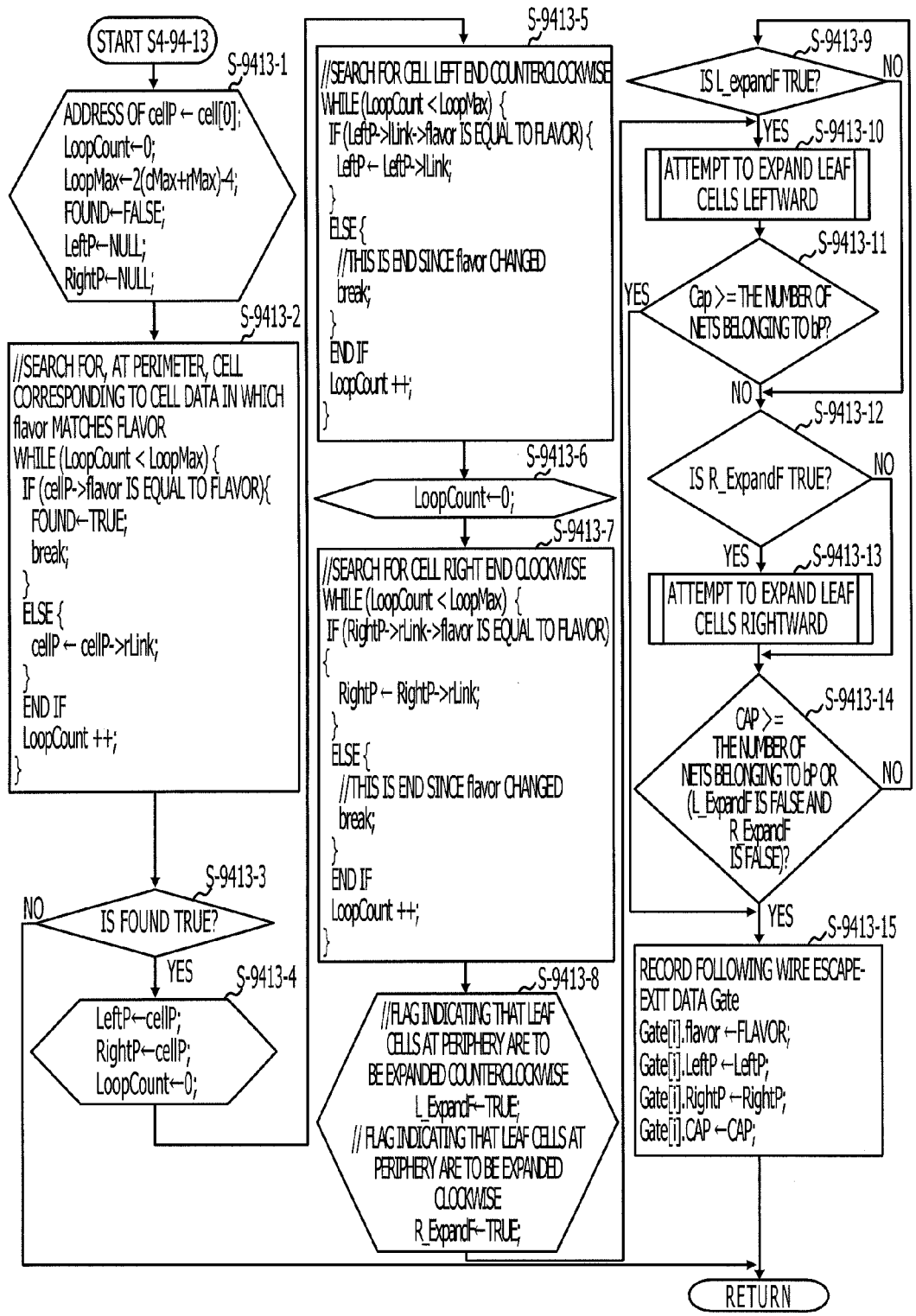
FIG. 62 is a flowchart of processing for expanding leaf cells at the wire-escape-exit portion for the attention bus.

Details of operation S4-94-13 in FIG. 55 will be described next. FIG. 62 is a flowchart of processing for expanding leaf cells at the wire-escape-exit portion for the attention bus.

In operation S4-9413-1, the protection-wall generating unit 1212 initializes the values of the variables. That is, the pointer of the first cell data (cell[0]) is assigned to the variable cellP for scanning the cell to be processed. A variable loopCount for storing the number of cell-data scans is initialized to 0. The total number of cells at the perimeter of the cell matrix is assigned to a variable LoopMax for storing the maximum value of the number of cell-data scans. FALSE is assigned to a variable FOUND for storing a value indicating whether or not a leaf cell for the attention bus bP is found. NULL is assigned to a variable LeftP and a variable RightP. The variable LeftP is a variable for storing the pointer to the cell data of the left-end leaf cell of the leaf cells for the attention bus bP (i.e., of the leaf cells for the wire-escape-exit portion for the attention bus bP). The variable RightP is a variable for storing the pointer to the cell data of the right-end leaf cell of the leaf cells for the wire-escape-exit portion for the attention bus bP.

In operation S4-9413-2, the protection-wall generating unit 1212 searches for, of the cells at the perimeter of the cell matrix, a cell corresponding to the cell data in which the value of the protection-wall color (flavor) matches the value of the variable FLAVOR (i.e., the bus ID of the attention bus bP). More specifically, when the value of the protection-wall color (flavor) in the cell data cellP matches the value of the variable FLAVOR, the protection-wall generating unit 1212 assigns TRUE to the variable FOUND. When the value of the protection-wall color (flavor) in the cell data cellP does not match the value of the variable FLAVOR, the protection-wall generating unit 1212 assigns the adjacent right cell pointer (rLink) in the cell data cellP to the variable cellP and increments the value of the variable LoopCount. Subsequently, the protection-wall generating unit 1212 compares the value of the protection-wall color (flavor) in the cell data cellP with the value of the variable FLAVOR again. When the value of the protection-wall color (flavor) in the cell data cellP matches the value of the variable FLAVOR or when the value of the variable LoopCount reaches the value of LoopMax, the process of the protection-wall generating unit 1212 proceeds to operation S4-9413-3. The case in which the value of the variable LoopCount reaches the value of LoopMax corresponds to a case in which the cell data of all cells at the perimeter are scanned.

In operation S4-9413-3, the protection-wall generating unit 1212 determines whether or not the value of the variable FOUND is TRUE. When the value of the variable FOUND is FALSE (No in S4-9413-3), the processing in FIG. 62 ends. This is because, when cell data in which the protection-wall color (flavor) matches the value of the variable FLAVOR does not exist, the intended leaf-cell expansion cannot be performed.

When the value of the variable FOUND is TRUE, i.e., when cell data in which the protection-wall color (flavor) matches the value of the variable FLAVOR is found (Yes in S4-9413-3), the protection-wall generating unit 1212 assigns the pointer (cellP) in the cell data to the variables LeftP and RightP in operation S4-9413-4. That is, the leaf cell initially found is set at the left end and the right end in the wire-escape-exit portion for the attention bus bP. The protection-wall generating unit 1212 also initializes the value of the variable LoopCount to 0.

Subsequently, in operation S4-9413-5, starting at the found leaf cell, the protection-wall generating unit 1212 searches for, counterclockwise along the perimeter of the cell matrix, the left end of the leaf cells in the wire-escape-exit portion for the attention bus bP. The expression "counterclockwise along the perimeter of the cell matrix" refers to a direction opposite to the arrow a1 illustrated in FIG. 56.

More specifically, the protection-wall generating unit 1212 updates the value of the variable LeftP with the adjacent left cell pointer (lLink) until the value of the protection-wall color (flavor) in the cell data corresponding to the adjacent left cell pointer (lLink) in the cell data LeftP becomes different from the value of the variable FLAVOR. The value of the variable LoopCount is also incremented. That is, the cell to be scanned is shifted leftward up to the left end of the leaf cells for the attention bus bP. When the value of the protection-wall color (flavor) in the cell data corresponding to the adjacent left cell pointer (lLink) in the cell data LeftP becomes different from the value of the variable FLAVOR or when the value of the variable LoopCount reaches the value of the variable LoopMax, the process of the protection-wall generating unit 1212 leaves the processing of operation S4-9413-5. The case in which the value of the variable LoopCount reaches the value of the variable LoopMax corresponds to a case in which all cells at the perimeter of the cell matrix are scanned.

In operation S4-9413-6, the protection-wall generating unit 1212 initializes the value of the variable LoopCount to 0. Subsequently, in operation S4-9413-7, starting at the leaf cell found in operation S4-9413-2, the protection-wall generating unit 1212 searches for, clockwise along the perimeter of the cell matrix, the right end of the leaf cells in the wire-escape-exit portion for the attention bus bP.

More specifically, the protection-wall generating unit 1212 updates the value of the variable RightP with the adjacent right cell pointer (rLink) until the value of the protection-wall color (flavor) in the cell data corresponding to the adjacent right cell pointer (rLink) in the cell data RightP becomes different from the value of the variable FLAVOR. The value of the variable LoopCount is also incremented. That is, the cell to be scanned is shifted rightward up to the right end of the leaf cells for the attention bus bP. When the value of the protection-wall color (flavor) in the cell data corresponding to the adjacent right cell pointer (rLink) in the cell data RightP becomes different from the value of the variable FLAVOR or when the value of the variable LoopCount reaches the value of the variable LoopMax, the process of the protection-wall generating unit 1212 leaves the processing in operation S4-9413-7.

Subsequently, in operation S4-9413-8, the protection-wall generating unit 1212 initializes the value of a flag variable indicating whether or not the leaf cells in the wire-escape-exit portion for the attention bus bP are to be expanded. More specifically, TRUE is assigned to a flag variable L_ExpandF indicating whether the leaf cells are to be expanded counterclockwise (i.e., leftward). TRUE is also assigned to a flag variable R_ExpandF indicating whether the leaf cells are to be expanded clockwise (i.e., rightward). That is, initially, both of the directions are set as candidates for the expansion directions.

In operation S4-9413-9, the protection-wall generating unit 1212 determines whether or not the value of L_ExpandF is TRUE. When the value of L_ExpandF is not TRUE (No in S4-9413-9), the process proceeds to operation S4-9413-12. When the value of L_ExpandF is TRUE (Yes in S4-9413-9), the process proceeds to operation S4-9413-10 in which the protection-wall generating unit 1212 attempts to expand the leaf cells leftward with respect to the wire-escape-exit portion for the attention bus bP. Details of the operation are described below. When the expansion succeeds, the value of the variable CAP that stores the total sum of the capacities of the leaf cells for the wire-escape-exit portion is increased by an amount corresponding to the capacity of the expanded cell and the value of the variable LeftP is updated to the pointer to the cell data of the expanded cell. When the expansion fails, the value of L_ExpandF is updated to FALSE.

In operation S4-9413-11, the protection-wall generating unit 1212 determines whether or not the value of the variable CAP is larger than or equal to the number of nets belonging to the attention bus bP. That is, a determination is made as to whether or not wire-escape exits that are sufficient to extract the nets belonging to the attention bus bP are obtained. When the value of the variable CAP is larger than or equal to the number of nets belonging to the attention bus bP (Yes in S4-9413-11), the protection-wall generating unit 1212 finishes the leaf-cell expansion and the process proceeds to operation S4-9413-15. When the value of the variable CAP is smaller than the number of nets belonging to the attention bus bP (No in S4-9413-11), the process proceeds to operation S4-9413-12 in which the protection-wall generating unit 1212 determines whether or not the value of R_ExpandF is TRUE.

When the value of R_ExpandF is not TRUE (No in S4-9413-12), the process proceeds to operation S4-9413-14. When the value of R_ExpandF is TRUE (Yes in S4-9413-12), the process proceeds to operation S4-9413-13 in which the protection-wall generating unit 1212 attempts to expand the leaf cells rightward with respect to the wire-escape-exit portion for the attention bus bP. Details of the operation are described below. When the expansion succeeds, the value of the variable CAP that stores the total sum of the capacities of the leaf cells corresponding to the wire-escape-exit portion is increased by an amount corresponding to the capacity of the expanded cell and the value of the variable RightP is updated to the pointer to the cell data of the expanded cell. When the expansion fails, the value of R_ExpandF is updated to FALSE.

In operation S4-9413-14, the protection-wall generating unit 1212 determines whether or not the value of the variable CAP is larger than or equal to the number of nets belonging to the attention bus bP or whether or not both values of L_Expand and R_Expand are FALSE. When the value of the variable CAP is smaller than the number of nets belonging to the attention bus bP and at least one of L_Expand and R_Expand is TRUE (No in S4-9413-14), the protection-wall generating unit 1212 repeats the processing in operation S4-9413-9 and the subsequent operations.

When the value of the variable CAP is larger than or equal to the number of nets belonging to the attention bus bP or when both values of L_Expand and R_Expand are FALSE (Yes in S4-9413-14), the process proceeds to operation S4-9413-15 in which the protection-wall generating unit 1212 registers, in the wire-escape-exit information storage section D10, wire-escape-exit data Gate in which information regarding the wire escape exits for the attention bus bP are registered.

Figure 63:
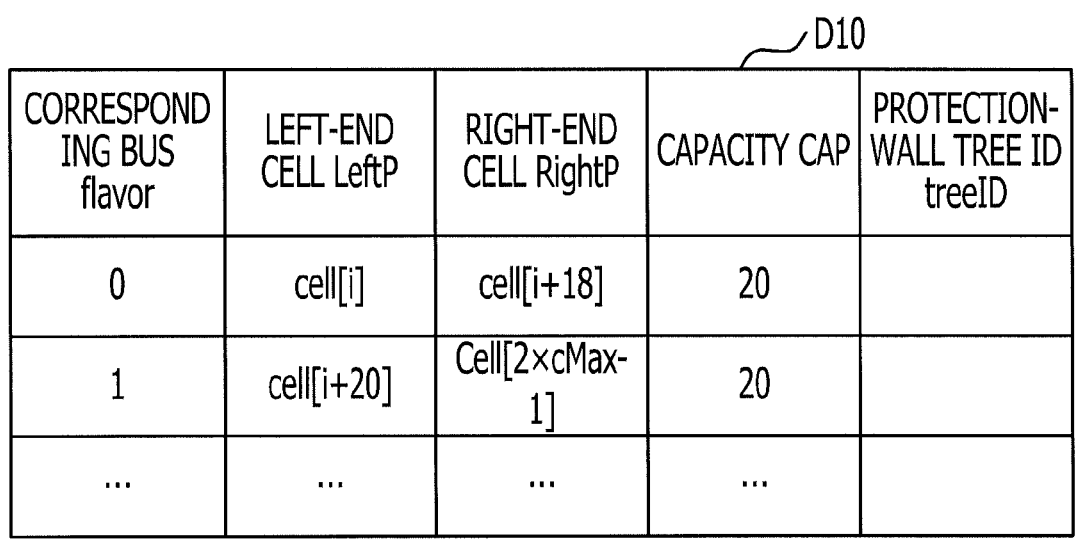
FIG. 63 illustrates one example of the structure of a wire-escape-exit information storage section.

FIG. 63 illustrates one example of the structure of the wire-escape-exit information storage section. As illustrated, the wire-escape-exit information storage section D10 has data items, such as a corresponding bus (flavor), a left-end cell (LeftP), a right-end cell (RightP), a capacity (CAP), and a protection-wall tree ID (treeID).

The corresponding bus (flavor) is the bus ID of a bus for corresponding wire escape exits. The left-end cell (LeftP) is a pointer to the cell data of a cell at the left end of the wire escape exits. The right-end cell (RightP) is a pointer to the cell data of a cell at the right end of the wire escape exits. The capacity (CAP) is the total of the capacities (cap) of cells belonging to the wire escape exits. The protection-wall tree ID (treeID) is the ID of a protection-wall tree corresponding to the wire escape exits.

In operation S4-9413-15 in FIG. 62, a new record (wire-escape-exit data Gate) is reserved in the wire-escape-exit information storage section D10 and the value of the variable FLAVOR is recorded in the protection-wall color (flavor) in the wire-escape-exit data Gate. The value of the variable LeftP is recorded in the left-end cell (LeftP) in the wire-escape-exit data Gate. The value of the variable RightP is also recorded in the right-end cell (RightP) in the wire-escape-exit data Gate. The value of the variable CAP is further recorded in the capacity (CAP) in the wire-escape-exit data Gate.

Figure 64:
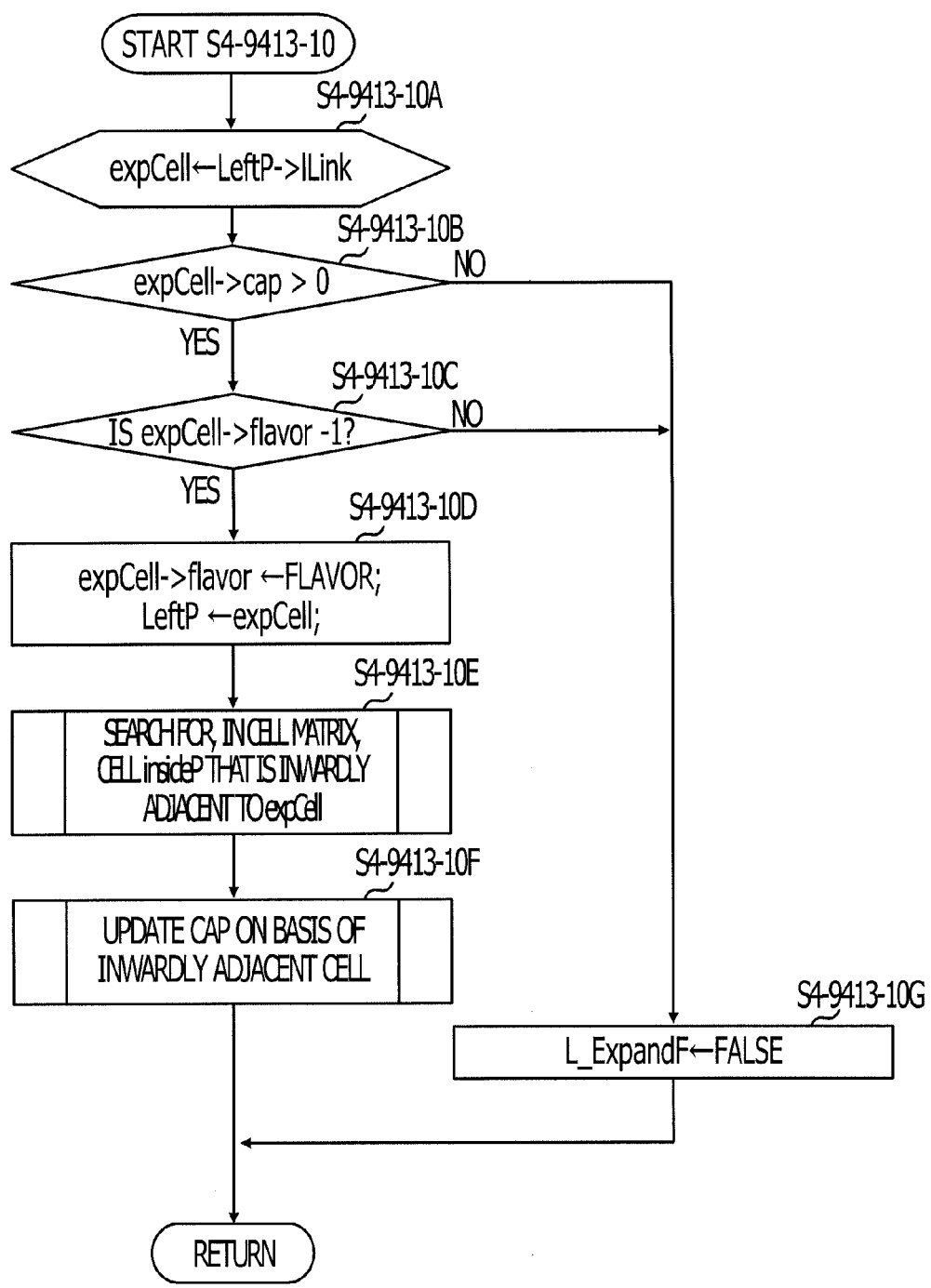
FIG. 64 is a flowchart of a procedure of processing for attempting to expand the leaf cells leftward.

Details of operation S4-9413-10 in FIG. 62 will be described next. FIG. 64 is a flowchart of a procedure of processing for attempting to expand the leaf cells leftward.

In operation S4-9413-10A, the protection-wall generating unit 1212 assigns the adjacent left cell pointer (lLink) in the cell data LeftP to a variable expCell. The variable expCell is a variable for storing the pointer to the cell data of an expansion-destination candidate cell. The variable LeftP is a variable defined in the processing in FIG. 62.

In operation S4-9413-10B, the protection-wall generating unit 1212 determines whether or not the value of the capacity (cap) in the cell data expCell is larger than 0. When the value of the capacity (cap) in the cell data expCell is larger than 0 (Yes in S4-9413-10B), the process proceeds to operation S4-9413-10C in which the protection-wall generating unit 1212 determines whether or not the value of the protection-wall color (flavor) in the cell data expCell is −1. That is, a determination is made as to whether or not the expansion-destination candidate cell is not set as a leaf cell for any bus.

When the value of the protection-wall color (flavor) in the cell data expCell is −1, i.e., when the expansion-destination candidate cell is not set as a leaf cell yet (Yes in S4-9413-10C), the process proceeds to operation. S4-9413-10D in which the protection-wall generating unit 1212 assigns the value of the variable FLAVOR to the protection-wall color (flavor) in the cell data expCell. That is, the expansion candidate cell is set as a leaf cell for the attention bus bP. Consequently, the left end of the wire-escape-exit portion for the attention bus bP is expanded leftward by one cell. The protection-wall generating unit 1212 thus assigns the value of the variable expCell to the variable LeftP.

Subsequently, in operation S4-9413-10E, the protection-wall generating unit 1212 searches for, in the cell matrix, a cell inwardly adjacent to the cell corresponding to the cell data expCell and assigns, to cell data insideP, the pointer to the cell data of the found cell. In operation S4-9413-10F, the protection-wall generating unit 1212 updates the value of the variable CAP on the basis of the cell data insideP indicating the inwardly adjacent cell.

On the other hand, when the value of the capacity (cap) in the cell data expCell is 0 or less (No in S4-9413-10B) or when the value of the protection-wall color (flavor) in the cell data expCell is a value other than −1 (No in S4-9413-10C), the process proceeds to operation S4-9413-10G in which the protection-wall generating unit 1212 sets the value of L_ExpandF to FALSE so as not to expand the leaf cells. This is because, when the capacity of the expansion-destination candidate cell is 0, the expansion is meaningless. Another reason is that, when a cell that is already set as a leaf cell is poached, extraction of wires for the nets of anther bus fails.

Figure 65:
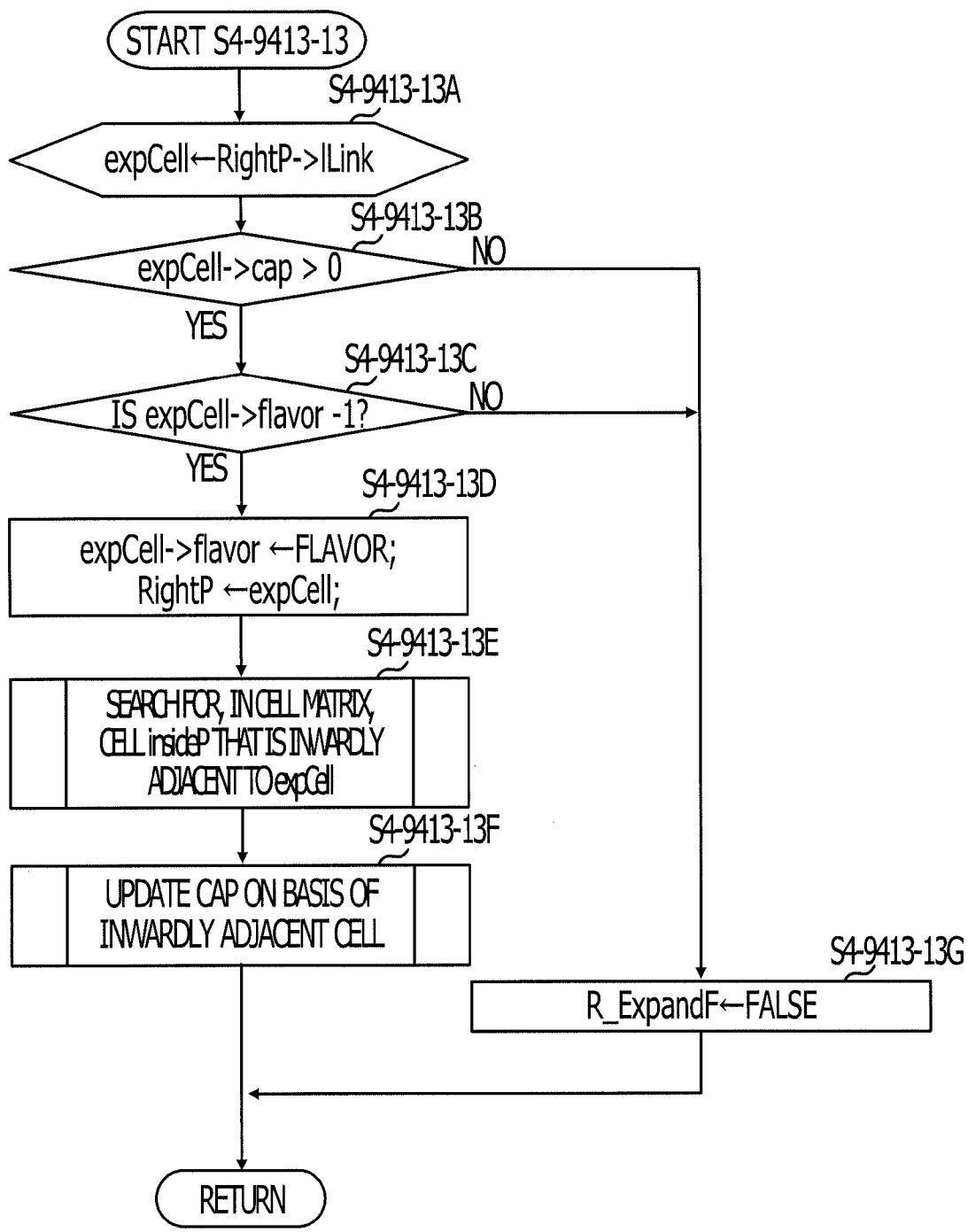
FIG. 65 is a flowchart of a procedure of processing for attempting to expand the leaf cells rightward.

Details of operation S4-9413-13 in FIG. 62 will be described next. FIG. 65 is a flowchart of a procedure of processing for attempting to expand the leaf cells rightward.

In operation S4-9413-13A, the protection-wall generating unit 1212 assigns the adjacent right cell pointer (rLink) in the cell data RightP to a variable expCell. The variable expCell is a variable for storing the pointer to the cell data of an expansion-destination candidate cell. The variable RightP is a variable defined in the processing in FIG. 62.

In operation S4-9413-13B, the protection-wall generating unit 1212 determines whether or not the value of the capacity (cap) in the cell data expCell is larger than 0. When the value of the capacity (cap) in the cell data expCell is larger than 0 (Yes in S4-9413-13B), the process proceeds to operation S4-9413-13C in which the protection-wall generating unit 1212 determines whether or not the value of the protection-wall color (flavor) in the cell data expCell is −1. That is, a determination is made as to whether or not the expansion-destination candidate cell is not set as a leaf cell for any bus.

When the value of the protection-wall color (flavor) in the cell data expCell is −1, i.e., when the expansion-destination candidate cell is not set as a leaf cell yet (Yes in S4-9413-13C), the process proceeds to operation S4-9413-13D in which the protection-wall generating unit 1212 assigns the value of the variable FLAVOR to the protection-wall color (flavor) in the cell data expCell. That is, the expansion candidate cell is set as a leaf cell for the attention bus bP. Consequently, the right end of the wire-escape-exit portion for the attention bus bP is expanded rightward by one cell. The protection-wall generating unit 1212 thus assigns the value of the variable expCell to the variable RightP.

Subsequently, in operation S4-9413-13E, the protection-wall generating unit 1212 searches for, in the cell matrix, a cell inwardly adjacent to the cell corresponding to the cell data expCell and assigns, to insideP, the pointer to the cell data of the found cell. In operation S4-9413-13F, the protection-wall generating unit 1212 updates the value of the variable CAP on the basis of the cell data insideP of the inwardly adjacent cell.

On the other hand, when the value of the capacity (cap) in the cell data expCell is 0 or less (No in S4-9413-13B) or when the value of the protection-wall color (flavor) in the cell data expCell is a value other than −1 (No in S4-9413-13C), the process proceeds to operation S4-9413-13G in which the protection-wall generating unit 1212 sets the value of R_ExpandF to FALSE so as not to expand the leaf cells.

Details of operation S4-9413-10E in FIG. 64 and operation S4-9413-13E in FIG. 65 will be described next.

Figure 66:
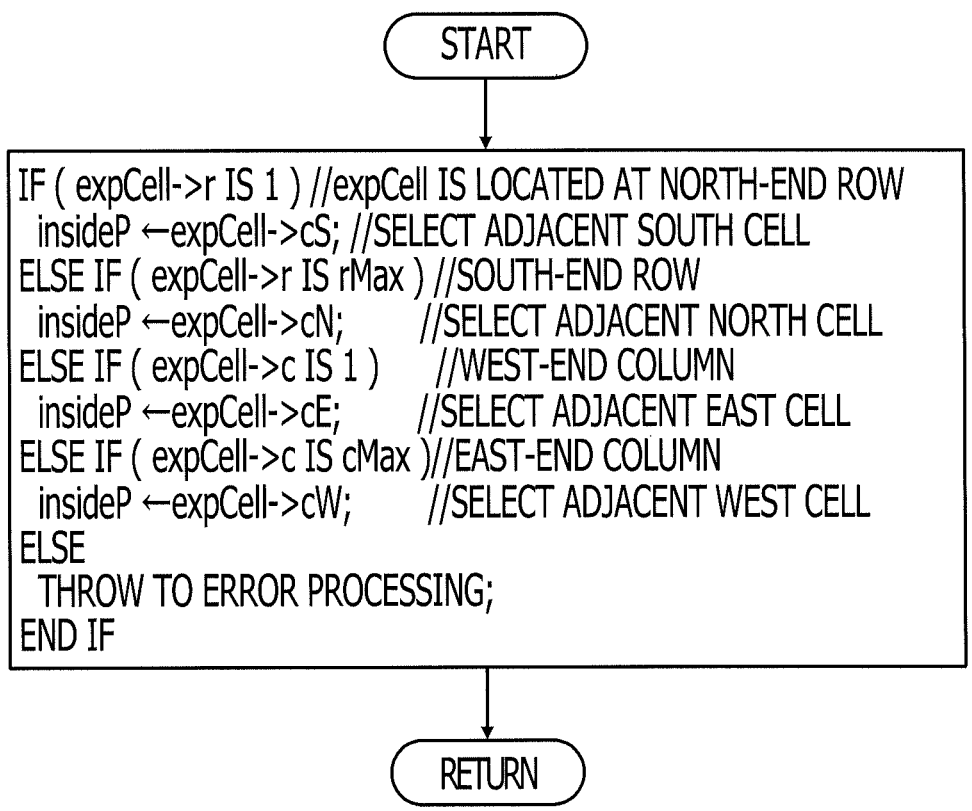
FIG. 66 is a flowchart of processing for searching for a cell inwardly adjacent to a cell at the periphery of the cell matrix.

FIG. 66 is a flowchart of processing for searching for a cell inwardly adjacent to a cell at the periphery of the cell matrix.

When the row number in the cell data expCell is 1, the cell corresponding to the cell data expCell is located in the north-end row in the cell matrix. Thus, the adjacent south cell pointer (cS) in the cell data expCell is assigned to the variable insideP.

When the row number in the cell data expCell is the maximum number (i.e., the number of rows−1), the cell corresponding to the cell data expCell is located in the south-end row in the cell matrix. Thus, the adjacent north cell pointer (cN) in the cell expCell is assigned to the variable insideP.

When the column number in the cell data expCell is 1, the cell corresponding to the cell data expCell is located in the west-end column in the cell matrix. Thus, the adjacent east cell pointer (cE) in the cell data expCell is assigned to the variable insideP.

When the column number in the cell data expCell is the maximum number (i.e., the number of columns−1), the cell corresponding to the cell data expCell is located in the east-end column in the cell matrix. Thus, the adjacent west cell pointer (cW) in the cell data expCell is assigned to the variable insideP.

Details of operation S4-9413-10F in FIG. 64 and operation S4-9413-13F in FIG. 65 will be described next.

Figure 67:
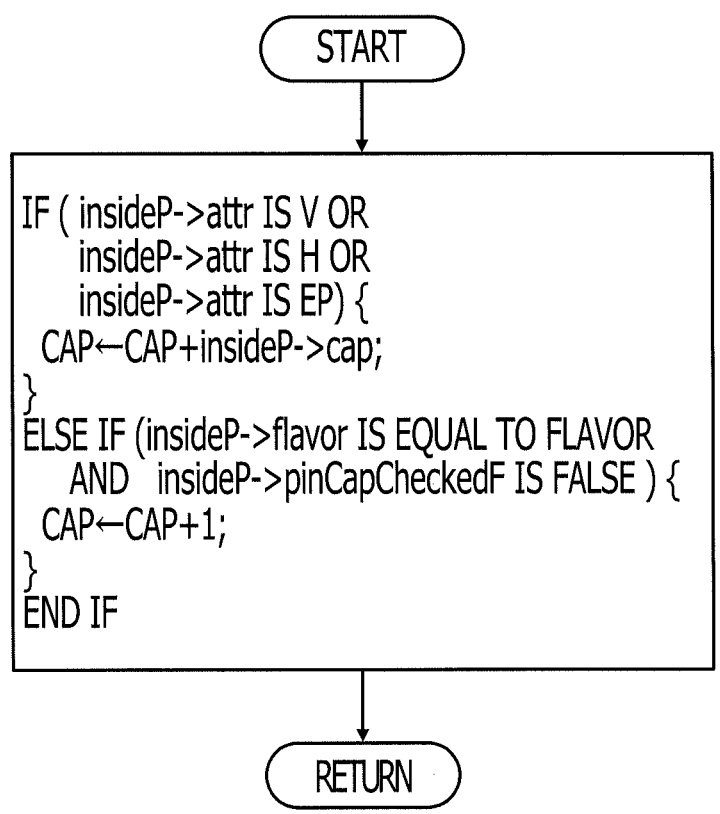
FIG. 67 is a flowchart of a procedure of processing for updating the capacity of the wire-escape-exit portion on the basis of the cells inwardly adjacent to the expansion-destination leaf cells.

FIG. 67 is a flowchart of a procedure of processing for updating the capacity of the wire-escape-exit portion on the basis of the cells inwardly adjacent to the expansion-destination leaf cells. The contents of the processing in FIG. 67 are substantially the same as the contents of the processing in operation S4-949-A8 in FIG. 61.

When the value of the cell attribute (attr) in the cell data insideP is V (inter-horizontal-pin portion), H (inter-vertical-pin portion), or EP (empty pin), the value of the capacity (cap) in the cell data insideP is added to the variable CAP. The cell data insideP is the cell data of the cell inwardly adjacent to the expansion-destination leaf cell.

On the other hand, when the value of the protection-wall color (flavor) in the cell data insideP matches the value of the variable FLAVOR and the value of the capacity-checked flag (pinCapCheckedF) in the cell data insideP is FALSE, 1 is added to the variable CAP.

The processing for expanding leaf cells at the wire-escape-exit portion for the attention bus bP is finished at this point. Details of operation S4-94-17 in FIG. 55 will be described next.

Figure 68:
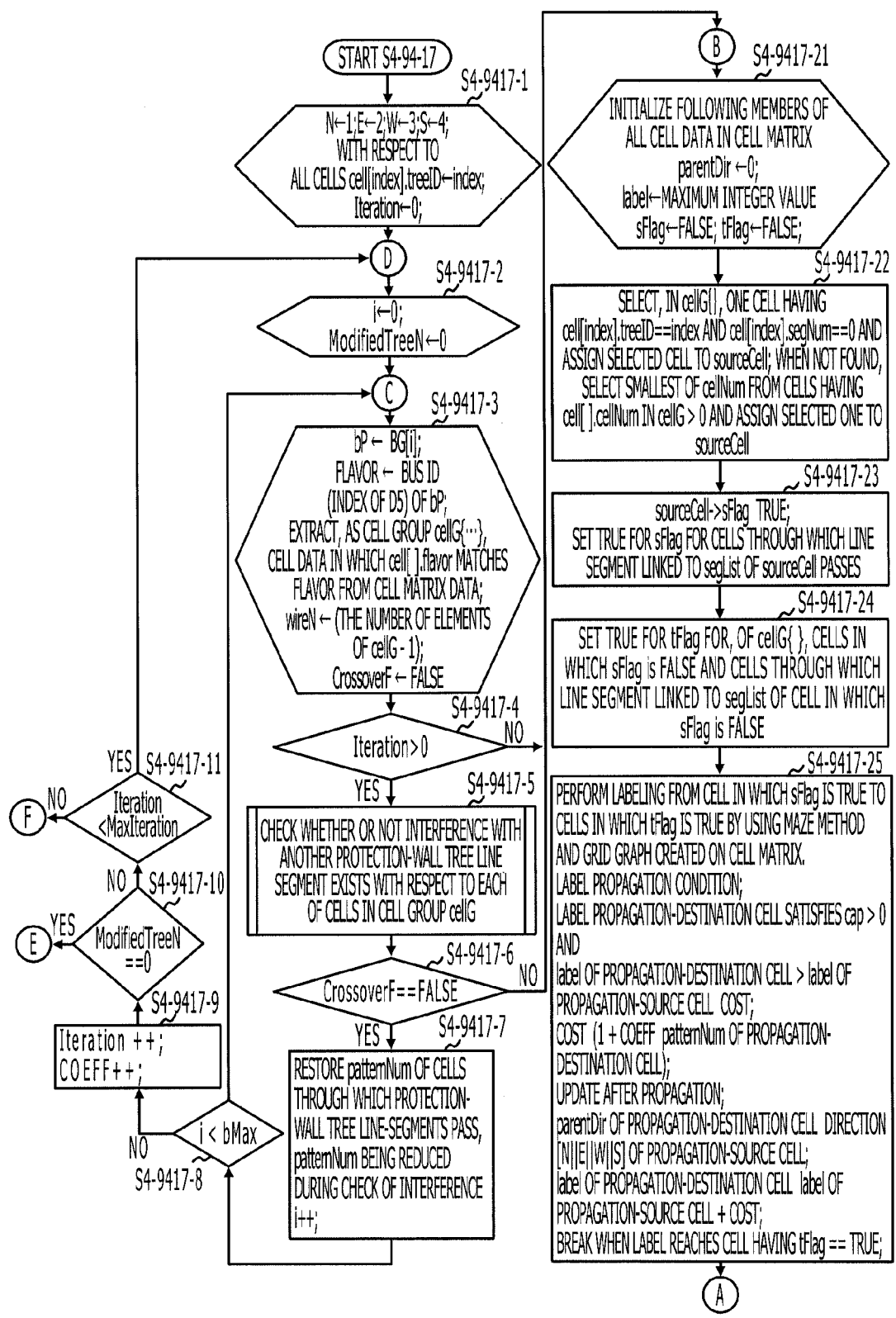
FIG. 68 is a flowchart of a procedure of processing for generating a protection wall by coupling leaf cells.
Figure 69:
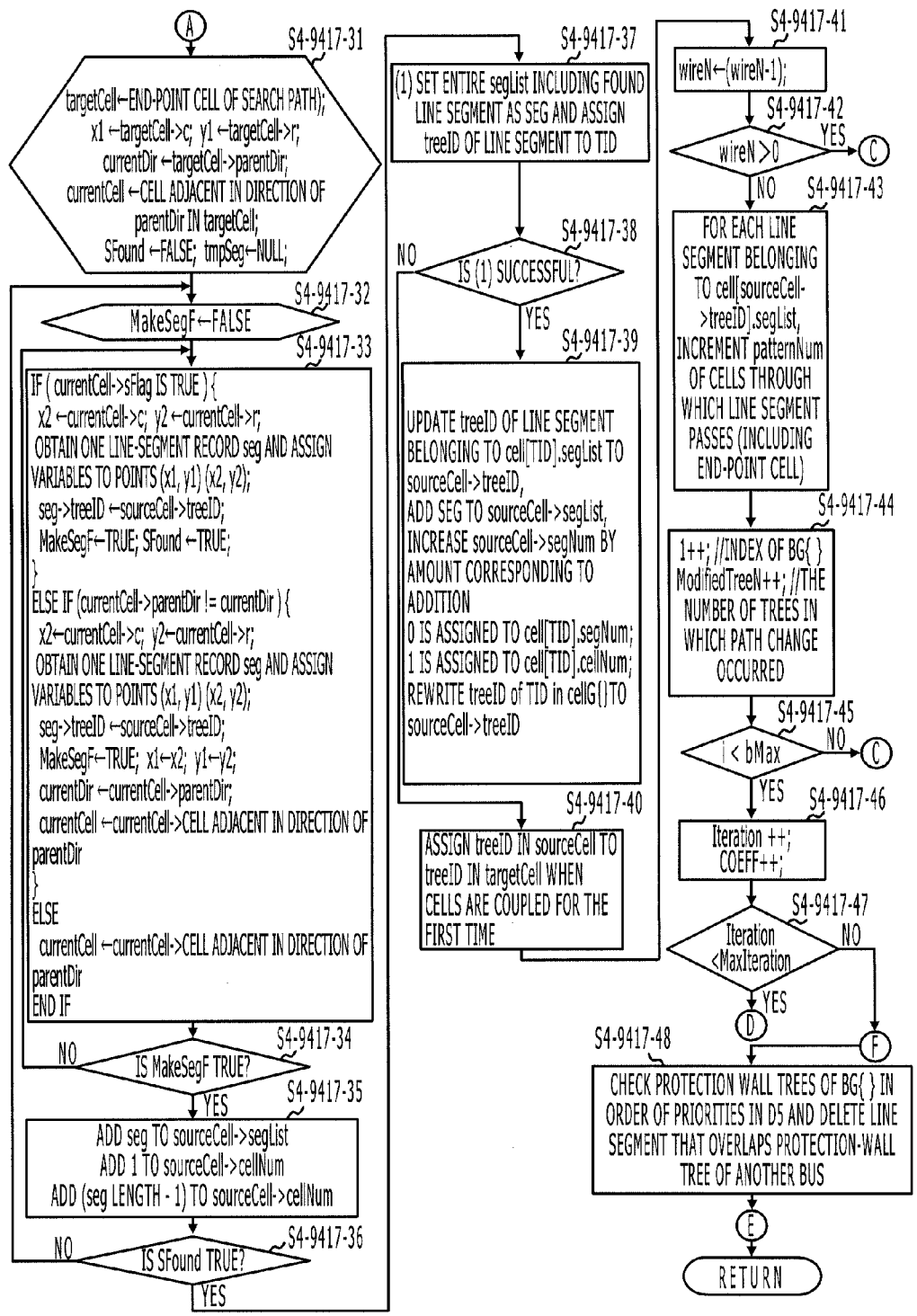
FIG. 69 is a flowchart of a procedure of processing for generating the protection wall by coupling leaf cells.

FIGS. 68 and 69 are flowcharts of a procedure of processing for generating a protection wall by coupling leaf cells. In FIGS. 68 and 69, a path that couples leaf cells having the same value of the protection-wall colors (flavor) is searched for in the cell matrix and one tree is generated using the found path. The tree expresses an intended protection wall. The tree is hereinafter referred to as a "protection-wall tree". Generation of the protection-wall tree is executed for each bus associated with an attention layer L and an attention component. After protection-wall trees for all buses are generated, whether or not there is an interference between the protection-wall trees is checked for each bus (i.e., for each protection-wall tree). With respect to a protection wall from which an interference with another protection-wall tree is detected, path searching is performed again. However, there may be cases in which the interference between the protection-wall trees cannot be avoided. Thus, in order to avoid an infinite loop, an upper limit is set for the number of times the path searching is redo. A description will be given below in conjunction with individual operations.

In operation S4-9417-1, the protection-wall generating unit 1212 initializes variables. Specifically, 1 is assigned to a variable N, 2 is assigned to a variable E, 3 is assigned to a variable W, and 4 is assigned to a variable S. The variables N, E, W, and S represent directions (north, east, west, and south) in the cell matrix. Suffixes (index numbers) in the cell-data array "cell" of all cell data are assigned to the protection-wall tree IDs (treeID) in the cell data. That is, in an initial state, the protection-wall tree ID (treeID) of each cell has a unique value. In processing described below, during formation of a protection-wall tree, the value of the protection-wall tree ID (treeID) of one of two cells to be coupled is updated (overwritten) with the value of the protection-wall tree ID (treeID) of the other of the two cells. The value of a variable Iteration is also initialized to 0. The variable Iteration is a variable for storing the number of times the path searching for the protection-wall tree is redo, when an interference is detected between protection-wall trees.

In operation S4-9417-2, the protection-wall generating unit 1212 initializes the variable i serving as an index for the bus group BG to 0. The protection-wall generating unit 1212 also initializes a variable ModifiedTreeN to 0. The variable ModifiedTreeN is a variable for storing the number of, of the buses included in the bus group BG, buses having protection-wall trees whose shapes have been changed. The changes in the protection-wall shapes include generation of a new protection-wall tree.

In operation S4-9417-3, the protection-wall generating unit 1212 sets the i-th bus (BG[i]) in the bus group BG as the attention bus bP and initializes the value of a variable whose value changes in accordance with a change of the attention bus bP. Specifically, the bus ID of the attention bus is assigned to the variable FLAVOR. Cell data in which the values of the protection-wall colors (flavor) match the value of the variable FLAVOR are extracted from the cell-data array "cell" as a cell group cellG. The cell group cellG is a collection of cell data for cells to be coupled in order to form a protection-wall tree for the attention bus bP. For example, in FIG. 58, when the attention bus is the bus B[0], 39 pieces of cell data for the respective cells c1 to c39 are extracted as a cell group cellG.

The number of elements of the cell group cellG−1 is assigned to a variable wireN. The variable wireN is a variable for storing the number of sections to be coupled in order to form a protection-wall tree. Thus, the value of the variable wireN is a value obtained by subtracting 1 from the number of elements of the cell group cellG (i.e., the number of cells to be coupled). FALSE is also assigned to a flag variable CrossoverF. The flag variable CrossoverF is set to TRUE when an interference is detected between protection-wall trees.

Subsequently, in operation S4-9417-4, the protection-wall generating unit 1212 determines whether or not the value of the variable Iteration is larger than 0. The variable Iteration has been initialized to 0 in operation S4-9417-1. Thus, when operation S4-9417-4 is executed for the first time, the determination result is No.

When the determination result in operation S4-9417-4 is No, the process proceeds to operation S4-9417-21. In this operation, with respect to all cell data included in the cell-data array "cell", the protection-wall generating unit 1212 initializes member variables used for the protection-wall-tree path searching. More specifically, 0 (undefined) is assigned to the label-propagation-source direction (parentDir) and a maximum value is assigned to the course (label). The maximum value may be a predetermined value exceeding a value that can be assumed by the course (label). FALSE is assigned to the search source flag (sFlag) and the search target flag (tFlag).

Subsequently, in operation S4-9417-22, the protection-wall generating unit 1212 searches for, in the cell data included in the cell group cellG, cell data associated with cells that are not coupled with other cells in processing described below, and assigns one piece of found cell data to a variable sourceCell. When multiple pieces of cell data are found, any one of the pieces of cell data may be randomly selected. The cell indicated by the variable sourceCell is used as a start point for the protection-wall-tree path searching in operation S4-9417-25.

The cell data for a cell that is not coupled with another cell is cell data in which the value of the protection-wall tree ID (treeID) matches the index number of the cell data and the value of the number (segNum) of protection-wall tree line-segments is 0. This is because the cell corresponding to the cell data in which the value of the protection-wall tree ID (treeID) does not match the index number of the cell data of interest is a cell coupled with another cell, as described below. Another reason is that, even for cell data in which the value of the protection-wall tree ID (treeID) matches the index number of the cell data of interest, when the number (segNum) of protection-wall tree line-segments has a value other than 0, the cell corresponding to the cell data is coupled with another cell.

On the other hand, when cell data corresponding to a cell that is not coupled with another cell is absent, the protection-wall generating unit 1212 assigns one of cells whose number of couplings with other cells is the smallest in the cell group cellG to the variable sourceCell. That is, since the cell that serves as the start point for the protection-wall tree path searching is randomly selected, a state in which multiple islands that are isolated from each other are formed can occur in the process of forming a protection-wall tree. In this case, one of cells belonging to the smallest of such islands is assigned to the variable sourceCell (i.e., is set as the start point for the path searching). Which of the cells is to be assigned to sourceCell may be determined randomly. The cell data of cells belonging to the smallest island are cell data in which the number (cellNum) of protection-wall tree cells is the smallest. This is because the number of cells belonging to the same island is recorded in the number (cellNum) of protection-wall tree cells. A list of protection-wall line-segment data indicating a path of each island is recorded in the protection-wall tree line-segment list (segList) in the cell data of one of the cells belonging to the island, as is apparent from description below. The cell in which the list of the protection-wall line-segment data is recorded is a cell lastly set as the start point in the island path searching. Details of the protection-wall line-segment data are described below.

In operation S4-9417-22 described above, the cell data stored in the variable sourceCell is the cell data of a cell that, together with another cell, does not form an island or the cell data of a cell that, together with another cell, forms a smallest island. An "island associated with sourceCell" used hereinafter means an island that is formed by a cell corresponding to the cell data stored in the variable sourceCell and a group of cells coupled with the cell. When the number of corresponding cells is 1, the island associated with sourceCell is an island formed by the single cell.

The protection-wall generating unit 1212 assigns TRUE to the search source flag (sFlag) in the cell data sourceCell. In operation S4-9417-23, the protection-wall generating unit 1212 also assigns TRUE to the search source flag (sFlag) in the cell data of cells through which a line (a straight line or a polyline) indicated by the list of the protection-wall line-segment data indicating the island associated with sourceCell passes. When sFlag is TRUE, this means that the corresponding cell is set as the start point for the path searching. For example, in FIG. 57, when the cell corresponding to the cell data sourceCell is the cell c1 and the cell c1 and the cell c2 are coupled to form one island, a cell (an inter-pin cell) between the cells c1 and c2 also belongs to the island. Thus, cells through which a line representing the island passes include not only the cells c1 and c2 but also the cell located therebetween. As described above, the list of the protection-wall line-segment data is recorded in the protection-wall tree line-segment list (segList) in the cell data of one of the cells belonging to the island associated with sourceCell.

In operation S4-9417-24, the protection-wall generating unit 1212 assigns TRUE to the search target flags (tFlag) in the cell data of all cell data belonging to the islands (including an island formed by a single cell) other than the island associated with sourceCell. That is, TRUE is substituted into the search target flags (tFlag) in, of the cell data included in the cell group cellG, the cell data in which the values of the source flags (sFlag) are FALSE and the cell data of cells through which a line indicated by the protection-wall line-segment list (segList) in any of the cell data in which the values of the source flags (sFlag) are FALSE.

Through operations S4-9417-22 to S4-9417-24, the cell belonging to one of the islands is set as the start point for the path searching and the cells belonging to all other islands are set as end points (destinations) for the path searching. For example, in the case of FIG. 58, when the operations are executed for the first time, the cell data c1 is set as a start point and the cells c2 to c39 are set as end points. When the operations are executed for the first time, any leaf cells are not coupled yet and thus the list of protection-wall line-segment data indicating a path for an island is not generated yet. Thus, the cells between the leaf cells are not included in the start point or the end points.

In operation S4-9417-25, regarding the cells in the cell matrix for the attention component as a grid, the protection-wall generating unit 1212 searches for a path from the start-point cell (a grid) to the end-point cells (a grid) by using a maze method. The start-point cell refers to the cell whose search source flag (sFlag) in the cell data is TRUE. The end-point cells refer to the cells whose search target flags (tFlag) in the cell data are TRUE. The edges in the path searching correspond to the adjacent east cell pointer (cE), the adjacent west cell pointer (cW), the adjacent north cell pointer (cN), and the adjacent south cell pointer (cS) of each piece of cell data. That is, the label (the forefront) of the path searching propagates radially in cross directions until the end-point cell is found. A condition for the label propagation is that the value of the capacity (cap) in the cell data of the propagation-destination cell is larger than 0 and the course (label) in the cell data of the label-destination cell is larger than the course of the propagation-source cell×COST. COST indicates the cost of a course to the propagation destination and is calculated by:

COST=(1+COEFF×the number (patternNum) of protection-wall tree line-segment passages which is recorded in the cell data of the propagation-destination cell).

The number (patternNum) of protection-wall tree line-segment passages is the number of protection-wall-tree line segments that pass through the cell of interest. When the value is not 0, this means that the propagation-destination cell is already set as a part of a protection-wall tree for another bus. COEFF is a penalty coefficient for a cell that is already set as a part of a protection wall tree for another bus. That is, selection of a path passing through a cell that is already set as a part of the protection-wall tree for another bus is not preferable, in order to avoid an interference between protection-wall trees. Accordingly, "COEFF×the number (patternNum) of protection-wall tree line-segment passages which is recorded in the propagation-destination cell" is added to the cost (COST) of the course up to the cell, in order to increase the cost for selecting, as a path, a cell that is already set as a part of the protection-wall tree for another bus. The initial value of COEFF may be determined as appropriate.

The label propagates to a propagation destination that satisfies the above-described propagation condition. In this case, the value (one of the values N, E, W, and S) indicating the direction of the propagation-source cell when viewed from the propagation-destination cell is assigned to the label propagation-source direction (parentDir) in the cell data of the propagation-destination cell. The course (label) in the cell data of the propagation-source cell+COST is assigned to the course (label) in the cell data of the propagation-destination cell.

For example, in FIG. 58, when only the cell c1 is the start point, the path searching (in operation S4-9417-25) is finished upon reach of the cell c2 or c4 that is the closest to the cell c1. Which of the cell c2 and c4 is first reached depends on to which direction the priority is given with respect to the label propagation direction. When the cell c2 is assumed to be first reached in this case, the above-described update of the cell data for the propagation-destination cells is performed on the cell between the cell c1 and the cell c2 and on the cell c2.

In operation S4-9417-31, the protection-wall generating unit 1212 makes preparations for generating protection-wall line-segment data indicating a found path (a search path). Specifically, the cell data of the end-point cell of the search path is assigned to the variable targetCell. In the above example, the cell data assigned is the cell data of the cell c2. The column number (c) and the row number (r) in the cell data targetCell are assigned to the variables x1 and y1, respectively. The variables x1 and y1 may be updated in the process of generation of the protection-wall line-segment data. That is, during the generation of the protection-wall line-segment data through tracing of the path from the end point of the search path back to the start point, when a bend corner of the found path is detected, the variables x1 and y1 are updated with the corresponding column number or row number of the cell located at the vertex of the bend corner. The propagation-source direction parentDir in the cell data targetCell is assigned to the variable currentDir. The cell data of the cell adjacent in the label propagation-source direction (the direction indicated by parentDir) in the cell data targetCell is assigned to a variable currentCell. The variable currentCell indicates cell data associated with a cell located at the forefront of the trace back. For the path from the cell c1 to the cell c2 in FIG. 58, that adjacent cell corresponds to the cell between the cell c1 and the cell c2. FALSE is also assigned to a flag variable SFound. The flag variable SFound stores a value indicating whether or not the start-point cell in the path searching is found. NULL is also assigned to a variable tmpSeg.

The protection-wall line-segment data has a structure, for example, as illustrated in FIG. 70. FIG. 70 illustrates one example of the structure of protection-wall line-segment data. As illustrated, the protection-wall line-segment data has member variables (data items), such as a start-point x coordinate (x1), a start-point y coordinate (y1), an end-point x coordinate (x2), an end-point y coordinate (y2), a protection-wall tree ID (treeID), and a next pointer (next).

The start-point x coordinate (x1) is, in the cell matrix, the column number of a cell that serves as the start point of a line segment indicated by the protection-wall line-segment data. The start-point y coordinate (y1) is, in the cell matrix, the row number of the cell that serves as the start point of the line segment indicated by the protection-wall line-segment data. The end-point x coordinate (x2) is, in the cell matrix, the column number of a cell that serves as an end point of the line segment indicated by the protection-wall line-segment data. The end-point y coordinate (y2) is, in the cell matrix, the row number of the cell that serves as the end point of the line segment indicated by the protection-wall line-segment data. The protection-wall tree ID (treeID) is an identifier of a protection-wall tree to which the protection-wall line-segment data corresponds. The next pointer (next) is a pointer to next protection-wall line-segment data. Thus, the next pointer (next) associates pieces of protection-wall line-segment data with each other to thereby represent a protection-wall tree based on a bending path. One piece of protection-wall line-segment data corresponds to one straight-line section of a protection-wall tree.

In operation S4-9417-32, the protection-wall generating unit 1212 assigns FALSE to a flag variable MakeSegF. The flag variable MakeSegF stores a value indicating whether or not protection-wall line-segment data has been generated. In operation S4-9417-33, the protection-wall generating unit 1212 generates part or all of protection-wall line-segment data indicating a search path, until a predetermined condition is satisfied.

More specifically, when the search source flag (sFlag) in the cell data currentCell is TRUE (hereinafter referred to as "Case 1"), i.e., when the traceback from the end point of the search path reaches the start-point cell, the column number (c) and the row number (r) in the cell data currentCell are assigned to the corresponding variables x2 and y2. Subsequently, one piece of protection-wall line-segment data "seg" (see FIG. 70) is generated in the memory device 103. The values of the variables x1, y1, x2, and y2 are assigned sequentially to the start-point x coordinate (x1), the start-point y coordinate (y1), the end-point x coordinate (x2), and the end-point y coordinate (y2) in the protection-wall line-segment data "seg". The protection-wall tree ID (treeID) in the cell data sourceCell is also assigned to the protection-wall tree ID (treeID) in the protection-wall line-segment data "seg". That is, the protection-wall tree ID in the protection-wall line-segment data is pursuant to the value of the protection-wall tree ID in the cell data of a cell belonging to an island and serving as the start point of a path indicated by the protection-wall line segment data. Since the protection-wall line-segment data "seg" is generated, TRUE is assigned to MakeSegF. In addition, since the start-point cell of the search path is found, TRUE is assigned to SFound.

When the value of the label propagation-source direction (parentDir) in the cell data currentCell is different from the value of the variable currentDir (hereinafter referred to as "Case 2"), i.e., when a bend corner is detected in the process of the trace back, the column number (c) and the row number (r) in the cell data currentCell are assigned to the corresponding variables x2 and y2. Subsequently, one piece of protection-wall line-segment data "seg" is generated in the memory device 103. The values of the variables x1, y1, x2, and y2 are assigned sequentially to the start-point x coordinate (x1), the start-point y coordinate (y1), the end-point x coordinate (x2), and the end-point y coordinate (y2) in the protection-wall line-segment data "seg". Subsequently, the protection-wall tree ID (treeID) in the cell data sourceCell is assigned to the protection-wall tree ID (treeID) in the protection-wall line-segment data "seg". Since the protection-wall line-segment data "seg" is generated, TRUE is assigned to MakeSegF. Since the bend corner is also detected, the values of the variables x1 and y1 are updated with the column number and the row number of the vertex of the bend corner. That is, the value of the variable x2 is assigned to the variable x1 and the value of the variable y2 is assigned to the variable y1. The label propagation-source direction (parentDir) in the cell data currentCell is assigned to the variable currentDir. That is, a new traceback direction is assigned to the variable currentDir. In addition, the cell data of the cell adjacent in the direction indicated by the label propagation-source direction (parentDir) in the cell data currentCell is assigned to the variable currentCell. That is, the traceback forefront is shifted by one cell.

For a case (hereinafter referred to as "Case 3") other than Case 1 and Case 2, the cell data of the cell adjacent in the label propagation-source direction (parentDir) in the cell data currentCell is assigned to the variable currentCell. That is, the traceback forefront is shifted by one cell.

In operation S4-9417-34, the protection-wall generating unit 1212 determines whether or not the value of MakeSegF is TRUE. That is, a determination is made as to whether or not line-segment data is generated. When the value of MakeSegF is not TRUE (No in S4-9417-34), i.e., when it is determined in operation S4-9417-33 that the case corresponds to Case 3, operation S4-9417-33 is repeated.

When the value of MakeSegF is TRUE (Yes in S4-9417-34), the process proceeds to operation S4-9417-35 in which the protection-wall generating unit 1212 registers the generated protection-wall line-segment data into the protection-wall tree line-segment data list (segList) in the cell data sourceCell. In addition, 1 is added to the number (segNum) of protection-wall tree line-segments which is recorded in the cell data sourceCell. A value obtained by subtracting 1 from the number of cells included in the protection-wall line-segment data "seg" is further assigned to the number (cellNum) of protection-wall tree cells which is recorded in the cell data sourceCell.

In operation S4-9417-36, the protection-wall generating unit 1212 determines whether or not the value of SFound is TRUE. When SFound is FALSE, i.e., when the traceback does not reach the start point of the search path (No in S4-9417-36), operation S4-9417-32 and the subsequent operations are repeated.

When SFound is TRUE, i.e., when the traceback reaches the start point of the search path (Yes in S4-9417-36), the process proceeds to operation S4-9417-37 in which the protection-wall generating unit 1212 obtains the list of protection-wall tree line-segment data indicating a path of an island to which the cell (targetCell) located at the end point of the search path belongs and assigns the obtained list to a variable SEG. The value of the protection-wall tree ID (treeID) of the protection-wall tree line-segment data is assigned to a variable TID. The protection-wall tree line-segment data indicating the path of the island to which the cell located at the end point of the search path belongs is held by one of cells belonging to the island. Thus, specifically, cell data including, in its protection-wall tree line-segment list (segList), protection-wall tree line-segment data that passes through the column number (c) and the row number (r) in the cell data targetCell is searched for from the cell group cellG, and the protection-wall tree line-segment list (segList) of found cell data is assigned to the variable SEG.

However, only when the island at the end-point side of the search path includes multiple cells, the list of the intended protection-wall tree line-segment data can be obtained in operation S4-9417-37. In this case (Yes in S4-9417-38), the process proceeds to operation S4-9417-39 in which the protection-wall generating unit 1212 executes processing for merging two islands coupled by the search path. That is, the list of the protection-wall tree line-segment data indicating the path of the island to which the cell located at the end point of the search path belongs is merged with the protection-wall tree line-segment data indicating the path of the island at the start-point side of the search path. The protection-wall tree IDs (treeID) in the cell data of cells belonging to the island to which the cell located at the end point of the search path belongs are updated with the protection-wall tree ID in the cell data of the cell belonging to the island at the start-point side of the search path. More specifically, the protection-wall tree IDs (treeID) of the pieces of protection-wall line-segment data included in the protection-wall tree line-segment list (segList) in the TID-th cell data (cell-data array "cell[TID]") in the cell-data array "cell" are updated with the protection-wall tree ID (treeID) in the cell data sourceCell. The protection-wall tree line-segment list assigned to the variable SEG is additionally linked to the protection-wall tree line-segment list (segList) in the cell data sourceCell. The number of protection-wall tree line-segments included in the variable SEG is added to the number (segNum) of protection-wall tree line-segments which is recorded in the cell data sourceCell. The number (cellNum) of protection-wall tree cells which is recorded in the cell data "cell[TID]" is also added to the number (cellNum) of protection-wall tree cells which is recorded in the cell data sourceCell. The value of the number (segNum) of protection-wall tree line segments which is recorded in the cell data "cell(TID)" is updated to 0 and the protection-wall tree line-segment list (segList) is emptied. In addition, 1 is assigned to the number (cellNum) of protection-wall tree cells which is recorded in the cell data "cell(TID)". Additionally, the value of the protection-wall tree ID (treeID) in the cell data sourceCell is assigned to the protection-wall tree ID (treeID) in, of the cell group cellG, the cell data in which the protection-wall tree ID (treeID) is TID. The processing described above means that the line segments coupled to the list SEG are moved to sourceCell.

On the other hand, when the island at the end-point side of the search path includes only one cell in operation S4-9417-37, the list of the intended protection-wall tree line segments is not obtained (No in S4-9417-38). In this case, in operation S4-9417-40, the protection-wall generating unit 1212 assigns the protection-wall tree ID (treeID) in the cell data sourceCell to the protection-wall tree ID (treeID) in the cell data target-Cell.

It can be understood from operations S4-9417-39 and S4-9417-40 that the value of the protection-wall tree ID (treeID) of a cell group that forms the same island is set to the cell ID of one of cells belonging to the cell group. The cell is a cell corresponding to the cell data sourceCell obtained when the island was formed.

Since one of sections to be coupled in order to form a protection-wall tree has been coupled at this point, the protection-wall generating unit 1212 subtracts 1 from the variable wireN in operation S4-9417-41. In operation S4-9417-42, the protection-wall generating unit 1212 determines whether or not the value of the variable wireN is larger than 0. That is, a determination is made as to whether or not any uncoupled leaf cell exists with respect to the protection wall for the attention bus bP. When the value of wireN is larger than 0, i.e., when an uncoupled leaf cell exists (Yes in S4-9417-42), operation S4-9417-21 and the subsequent operations are repeated. The case in which an uncoupled leaf cell exists corresponds to a case in which an isolated island exists.

On the other hand, when the value of wireN is 0 or less, i.e., when leaf cells are merged into one cell (No in S4-9417-42), like the protection wall w0 in FIG. 54, the process proceeds to operation S4-9417-43. In this operation, the protection-wall generating unit 1212 adds 1 to the number (patternNum) of protection-wall tree line-segment passages which is recorded in the cell data of cells through which the line indicated by the list of protection-wall tree line-segment data indicating the path of the island (i.e., the completed protection-wall tree) passes. The cells for which the number (patternNum) of protection-wall tree line-segment passages is to be added include the cell located at the end point of that line. The line is, specifically, a line indicated by the protection-wall tree line-segment list (segList) in the cell-data array "cell[the protection-wall tree ID (treeID) in the cell data sourceCell]".

The protection-wall generating unit 1212 adds 1 to the variable i serving as an index for the bus group BG. Consequently, the attention bus bP is updated in operation S4-9417-3. Since a path change (including path creation) has occurred with respect to one protection-wall tree, 1 is added to ModifiedTreeN in operation S4-9417-44.

In operation S4-9417-45, the protection-wall generating unit 1212 determines whether or not the value of the variable i is smaller than the variable bMax. When the value of the variable i is smaller than the variable bMax, i.e., when a bus for which a protection-wall tree has not been generated exists in all buses included in the bus group BG (i.e., buses associated with the attention layer L and the attention component) (i.e., Yes in S4-9417-45), operation S4-9417-3 and the subsequent operations are repeated.

On the other hand, when the value of the variable i is larger than or equal to the variable bMax (No in S4-9417-45), the protection-wall generating unit 1212 adds 1 to the variables Iteration and COEFF in operation S4-9417-46. The reason why the value of COEFF is varied is to reduce the possibility that, when the path searching (in operation S4-9417-25) is performed again on a protection-wall tree from which an interference with another protection-wall tree is detected, the search path for the protection-wall tree becomes the same as the previous search path. The value added to COEFF is not limited to 1. The value added depends on to what degree the penalty on a cell that is already set as a part of the protection-wall tree for another bus is to be strengthened. As the value of COEFF is increased, the possibility that an interference recurs decreases. However, the possibility that no path is found also increases. It is, therefore, necessary to vary the value COEFF, considering the balance between the two factors.

In operation S4-9417-47, the protection-wall generating unit 1212 determines whether or not the value of the variable Iteration is smaller than a predetermined maximum value MaxIteration. When the value of the variable Iteration is smaller than the maximum value MaxIteration (Yes in S4-9417-47), operation S4-9417-2 and the subsequent operations are repeated.

On the other hand, when the value of the variable Iteration reaches the maximum value MaxIteration (No in S4-9417-47), the process proceeds to operation S4-9417-48. In this operation, with respect to each of the buses included in the bus group BG, the protection-wall generating unit 1212 checks, in increasing order of the priorities prio in the bus information B, whether or not there is an interference between the protection-wall tree for the bus and the protection-wall tree for another bus. Further, the protection-wall generating unit 1212 deletes a protection-wall tree line segment at a portion where an interference occurs.

A description will now be given of a case in which operation S4-9417-2 and the subsequent operations or operation S4-9417-3 and the subsequent operations are repeated. When the value of the variable Iteration is 1 or more (Yes in S4-9417-4), operation S4-9417-5 is executed. In operation S4-9417-5, with respect to each of the cells included in the cell group cellG, the protection-wall generating unit 1212 checks whether or not an interference with a protection-wall tree line segment of a protection-wall tree for a bus other than the attention bus bP exists. Although details of this operation are described below, TRUE is assigned to CrossoverF upon detection of an interference.

In operation S4-9417-6, the protection-wall generating unit 1212 determines whether or not the value of CrossoverF is FALSE, i.e., whether or not no interference is detected. When an interference is detected (i.e., No in S4-9417-6), operation S4-9417-21 and the subsequent operations are executed. That is, regeneration of a protection-wall tree for the attention bus bP is executed.

When no interference is detected (i.e., Yes in S4-9417-6), the process proceeds to operation S4-9417-7. In this operation, with respect to each cell included in the cell group cellG, the protection-wall generating unit 1212 restores the value of the number (patternNum) of protection-wall tree line-segment passages which is reduced during the execution of operation S4-9417-5. That is, 1 is added to the value of patternNum. Also, 1 is added to the variable i.

In operation S4-9417-45, the protection-wall generating unit 1212 determines whether or not the value of the variable i is smaller than the variable bMax. When the value of the variable i is smaller than the variable bMax, i.e., when a bus for which the interference checking has not been performed exists in all buses included in the bus group BG (i.e., buses associated with the attention layer L and the attention component) (Yes in S4-9417-8), operation S4-9417-3 and the subsequent operations are repeated.

On the other hand, when the value of the variable i is larger than or equal to the variable bMax (No in S4-9417-8), the protection-wall generating unit 1212 adds 1 to the variables Iteration and COEFF in operation S4-9417-9. The significance of this operation is analogous to that of operation S4-9417-46. Thus, the value added to COEFF is not limited to 1.

In operation S4-9417-10, the protection-wall generating unit 1212 determines whether or not the value of ModifiedTreeN is 0. That is, a determination is made as to whether or not a bus for which a path change is made to a protection-wall tree while the value of the variable Iteration is not varied is absent in the buses included in the bus group BG. This determination is equivalent to the determination as to whether or not a protection-wall tree having an interference with another protection-wall tree is absent.

When the value of ModifiedTreeN is 0 (Yes in S4-9417-10), the protection-wall generation processing ends. When the value of ModifiedTreeN is not 0 (No in S4-9417-10), the process proceeds to operation S4-9417-11 in which the protection-wall generating unit 1212 determines whether or not the value of the variable Iteration is smaller than the predetermined maximum value MaxIteration. When the value of the variable Iteration is smaller than the maximum value MaxIteration (Yes in S4-9417-11), operation S4-9417-2 and the subsequent operations are repeated.

On the other hand, when the value of the variable Iteration reaches the maximum value MaxIteration (No in S4-9417-11), operation S4-9417-48 is executed and then the protection-wall generation processing ends.

Figure 71:
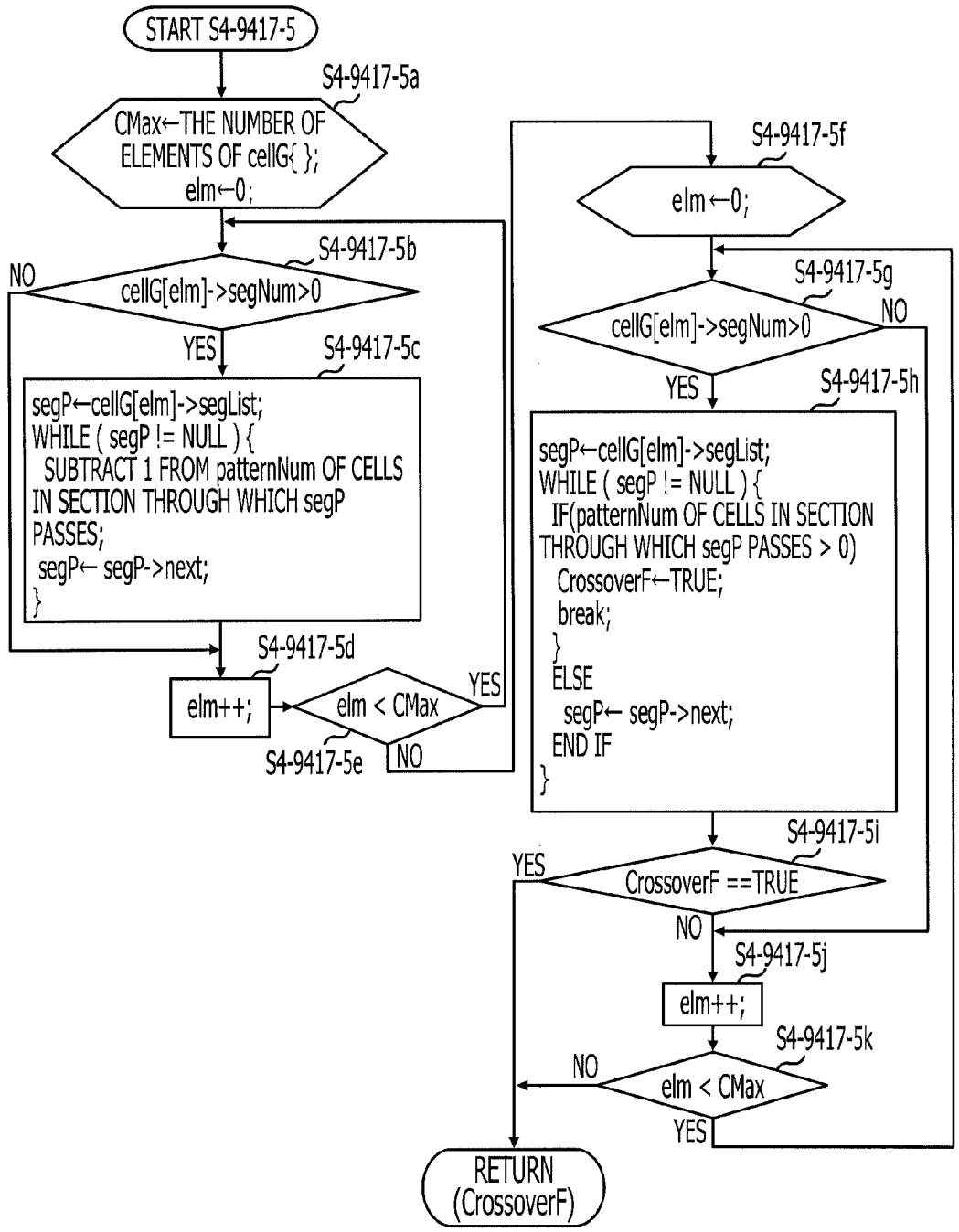
FIG. 71 is a flowchart of processing for checking the presence/absence of an interference with another protection-wall tree.

Details of operation S4-9417-5 in FIG. 68 will be described next. FIG. 71 is a flowchart of processing for checking the presence/absence of an interference with another protection-wall tree.

In operation S4-9417-5a, the protection-wall generating unit 1212 assigns the number of elements of the cell group cellG (i.e.; the total number of leaf cells for the attention bus bP) to the variable CMax. Also, 0 is assigned to a variable elm.

In operation S4-9417-5b, the protection-wall generating unit 1212 determines whether or not the number (segNum) of protection-wall tree line-segments which is recorded in the elm-th element (cell data) of the cell group cellG is larger than 0. That is, a determination is made as to whether or not the element of interest is a cell having a list of protection-wall tree line-segment data for a protection-wall tree for the attention bus bP.

When the number (segNum) of protection-wall tree line segments which is recorded in the cell data is larger than 0 (Yes in S4-9417-5b), the process proceeds to operation S4-9417-5c in which the protection-wall generating unit 1212 subtracts 1 from the value of the number (patternNum) of protection-wall tree line-segment passages which is recorded in the cell data of each of cells through which the line indicated by the protection-wall tree line segment list (segList) in the cell data passes. More specifically, 1 is subtracted from the number (patternNum) of protection-wall tree line-segment passages which is recorded in the cell data of cells located between the start point and the end point in each piece of protection-wall tree line-segment data included in the protection-wall tree line segment list (segList). However, the subtraction is not redundantly performed on the same cell. As a result of the subtraction, the value of the number (patternNum) of protection-wall tree line-segment passages which is recorded in the cell data of a cell belonging to only one protection-wall tree should be 0.

In operation S4-9417-5d, the protection-wall generating unit 1212 adds 1 to the variable elm. When the value of the variable elm is smaller than the variable CMax (Yes in S4-9417-5e), operation S4-9417-5b and the subsequent operations are repeated. When the value of the variable elm is larger than or equal to the variable CMax (No in S4-9417-5e), the protection-wall generating unit 1212 assigns 0 to the variable elm in operation S4-9417-5f.

Next, in operations S4-9417-5g to S4-9417-5k, loop processing that is similar to the processing in operations S4-9417-5b to S4-9417-5e is executed. However, when it is determined in operation S4-9417-5h that the number (patternNum) of protection-wall tree line-segment passages which is recorded in the cell data of any of cells through which the line indicated by the protection-wall tree line-segment list (segList) in the cell data that matches the condition of operation S4-9417-5g is larger than 0, the protection-wall generating unit 1212 updates the value of CrossoverF to TRUE. This is because, with respect to the cell of interest, an interference with another protection-wall tree is detected. When the value of CrossoverF is TRUE (in S4-9417-5i) or when the loop is finished (No in S4-9417-5k), the processing in FIG. 71 ends.

Description of the protection-wall generation processing is finished at this point. Details of operation S4-10 in FIG. 19 will be described next.

Figure 72:
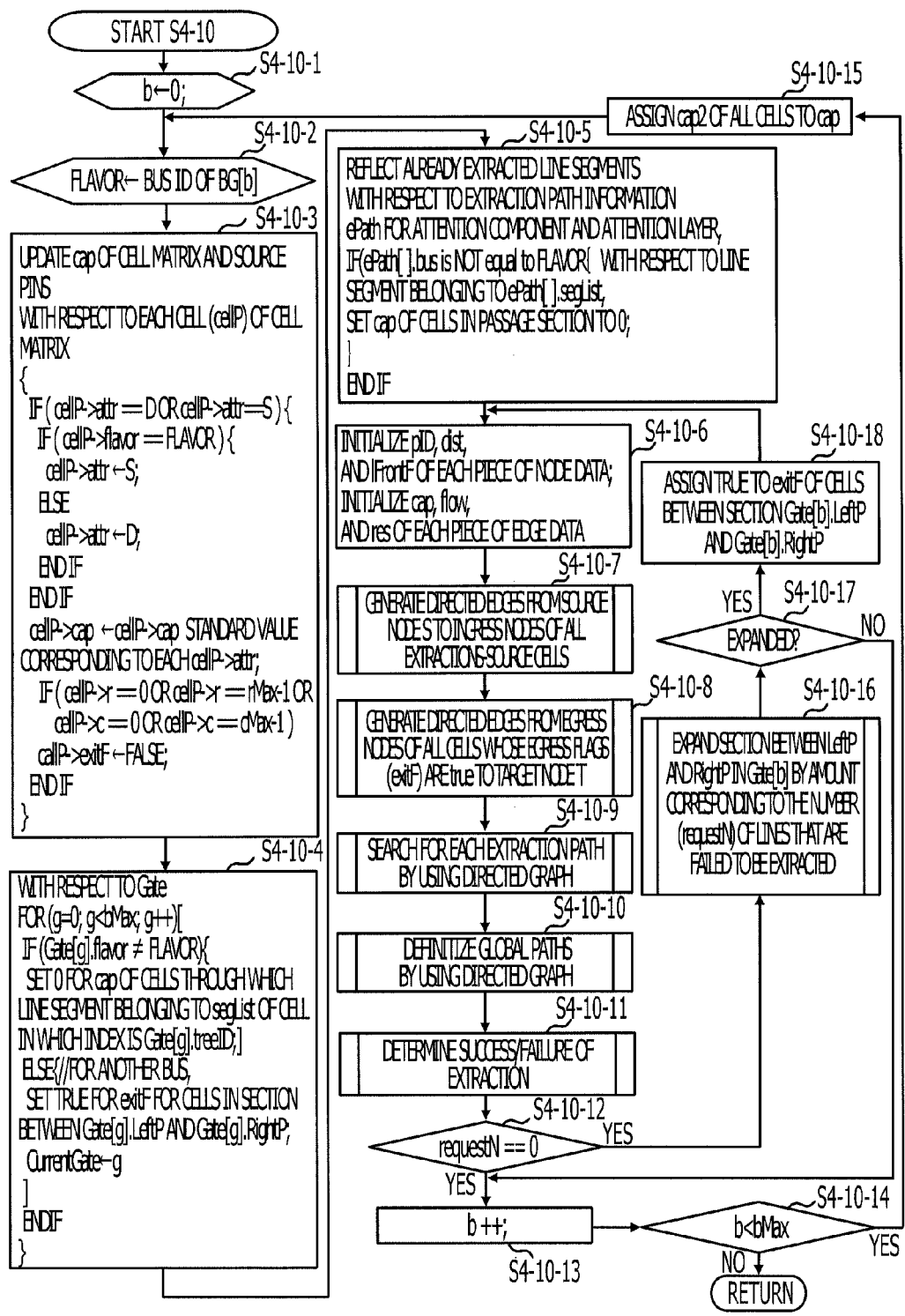
FIG. 72 is a flowchart of the processing for generating extraction paths for nets belonging to a bus associated with an attention component and an attention layer.

FIG. 72 is a flowchart of the processing for generating extraction paths for nets belonging to a bus associated with an attention component and an attention layer. The processing illustrated in FIG. 72 is executed for each bus included in the bus group BG.

In operation S4-10-1, the extraction wiring unit 122 initializes a variable b to 0. The variable b indicates a bus to be processed (i.e., an attention bus) in the bus group BG. In operation S4-10-2, the extraction wiring unit 122 assigns the bus ID of the attention bus to the variable FLAVOR.

Subsequently, in operation S4-10-3, the extraction wiring unit 122 performs processing below on all cells included in the cell-data array "cell" associated with the attention component and the attention layer L. More specifically, out of cell data in which the values of the cell attributes (attr) are "D" (normal pin) or "S" (extraction-source pin), the extraction wiring unit 122 sets "S" for the values of the cell attributes (attr) in the cell data in which the values of the protection-wall colors (flavor) are the same as the value of FLAVOR and also sets "D" for the cell attributes (attr) in the cell data in which the values of the protection-wall colors (flavor) are different from the value of FLAVOR. That is, the cell attributers (attr) of only cell data corresponding to extraction-source pins for the attention bus are set to "S". In addition, the extraction wiring unit 122 sets the values of the capacities (cap) in all cell data to values corresponding to the values of the cell attributes (attr). That is, the processing in FIG. 34 is executed. Additionally, the extraction wiring unit 122 temporarily sets FALSE for the egress flags (exitF) in the cell data of all cells located at the perimeter of the cell matrix.

Subsequently, in operation S4-10-3, the extraction wiring unit 122 reflects the protection wall into the cell data, on the basis of the records recorded in the wire-escape-exit information storage section D10 (FIG. 63). First, the extraction wiring unit 122 sets 0 for the capacities (cap) in the cell data of cells through which the line segment indicated by the protection-wall tree line-segment list (segList) in the cell data having, as its index of the cell-data array "cell", the protection-wall tree ID of a recorded in which the value of the corresponding bus (flavor) is different from FLAVOR. That is, the capacities of the cells corresponding to the protection wall for buses other than the attention bus are set to 0. The capacity being set to 0 means that the cells are set as cells through which wiring to be performed from now on with respect to the attention bus cannot be passed. The extraction wiring unit 122 also sets TRUE for the egress flags (exitF) in the cell data of cells in a section between the left-end cell (LeftP) and the right-end cell (RightP) of a record in which the value of the corresponding bus (flavor) matches the value of FLAVOR. That is, cells corresponding to the wire-escape-exit portion of the protection wall for the attention bus are set as egress cells for wiring to be performed.

In operation S4-10-5, the extraction wiring unit 122 sets 0 for the values of the capacities (cap) in the cell data of cells corresponding to the paths for wires already extracted in the attention component and the attention layer L. This is performed so that paths to be subsequently extracted do not interfere with other extraction paths. Information regarding the paths for nets already extracted is generated as extraction-path data ePath (described below with reference to FIG. 93). When operation S4-10-5 is executed for the first time, extraction path information ePath has not been generated yet and thus nothing is performed in this operation.

In operation S4-10-6, the extraction wiring unit 122 initializes the state of a directed graph used for searching for an extraction path. More specifically, the extraction wiring unit 122 records NULL ID into the label propagation-source node ID (pID), records 0 in the shortest path length (dist), and records "false" into the label front flag (lFrontF) in each piece (FIG. 26) of node data stored in the node-data array "v". Processing that is similar to the processing in operation FIG. 37 is executed on node data for a source node S or a target node T. The extraction wiring unit 122 also initializes the flow (flow) of each piece of edge data to 0 and recalculates the capacity (cap). The capacity calculation method is substantially the same as the processing for the edge-data generation (described above with reference to FIGS. 46 to 52). That is, the smaller one of the values of the capacities (cap) in the cell data of cells connected by a directed edge is set as the capacity (cap) in the edge data of the directed edge. The reason why the node data and the edge data are initialized in operation S4-10-6 is that the same directed graph (node data and edge data) is repeatedly used in the loop illustrated in FIG. 72. It is thus necessary to eliminate the values in the data which were recorded during the previous path searching.

In operation S4-10-7, the extraction wiring unit 122 generates directed edges from the source node S to the ingress nodes of cells (extraction-source cells) corresponding to all extraction-source pins. Subsequently, in operation S4-10-8, the extraction wiring unit 122 generates directed edges from the egress nodes of all cells (i.e., egress cells) whose egress flags (exitF) are "true" to the target node T.

In operation S4-10-9, the path searching unit 1221 in the extraction wiring unit 122 searches for a shortest path for, in the directed graph, each of all wires to be extracted.

Figure 73:
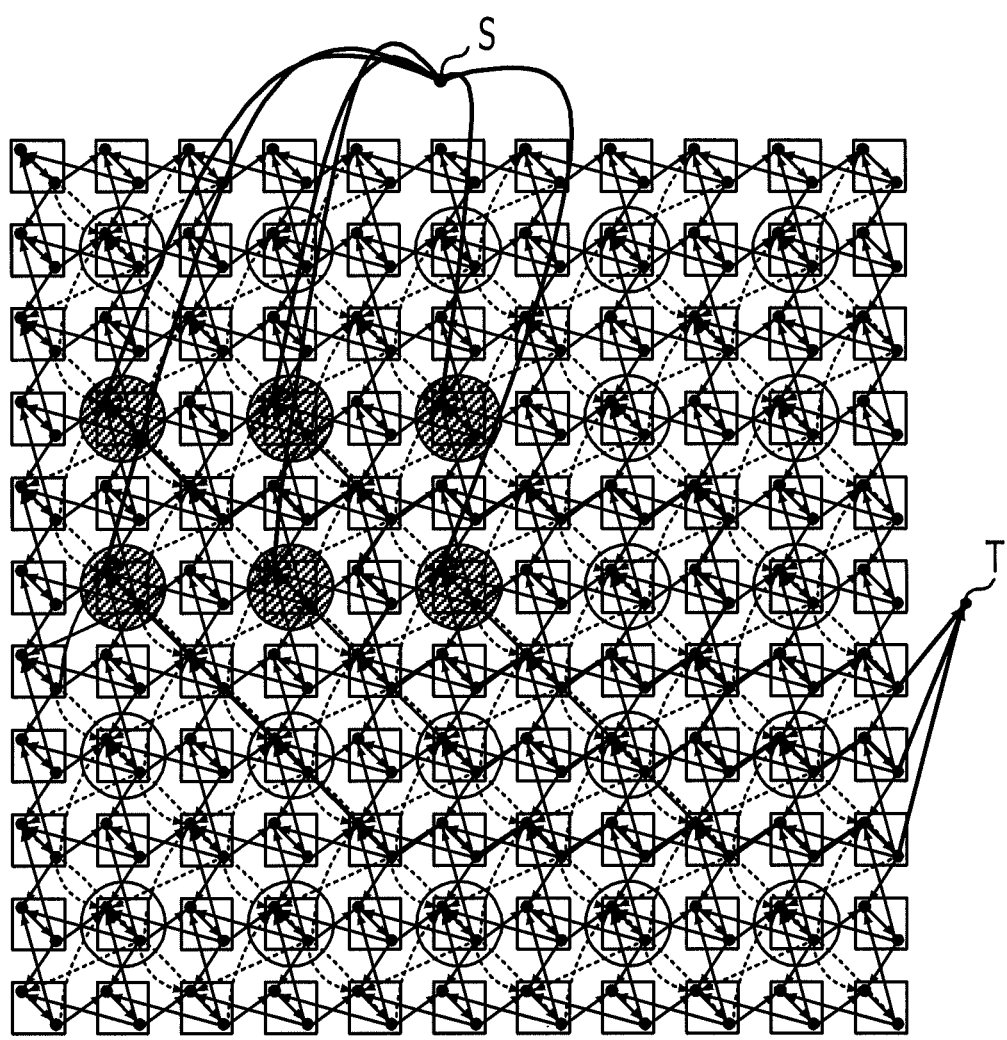
FIG. 73 illustrates an example of paths found by the path searching unit.

FIG. 73 illustrates an example of paths found by the path searching unit. That is, FIG. 73 illustrates a result of the processing in operation S4-10-9.

In FIG. 73, thick solid lines represent paths found by the path searching unit 1221. In the present embodiment, an example in which six wires are requested will be described. Thus, FIG. 73 illustrates paths for six wires. Each path reaches from the source node S to the ingress node of an extraction-source pin and further reaches to the target node T via the egress node of an egress cell. At the point when operation S4-10-9 is finished, to which wire each directed edge belonging to a path is assigned is not determined.

In operation S4-10-10, the global-path definitizing unit 1222 in the extraction wiring unit 122 assigns paths, found by the path searching unit 1221, to wires and definitizes the extraction paths (the global paths) for the global routing.

Figure 74:
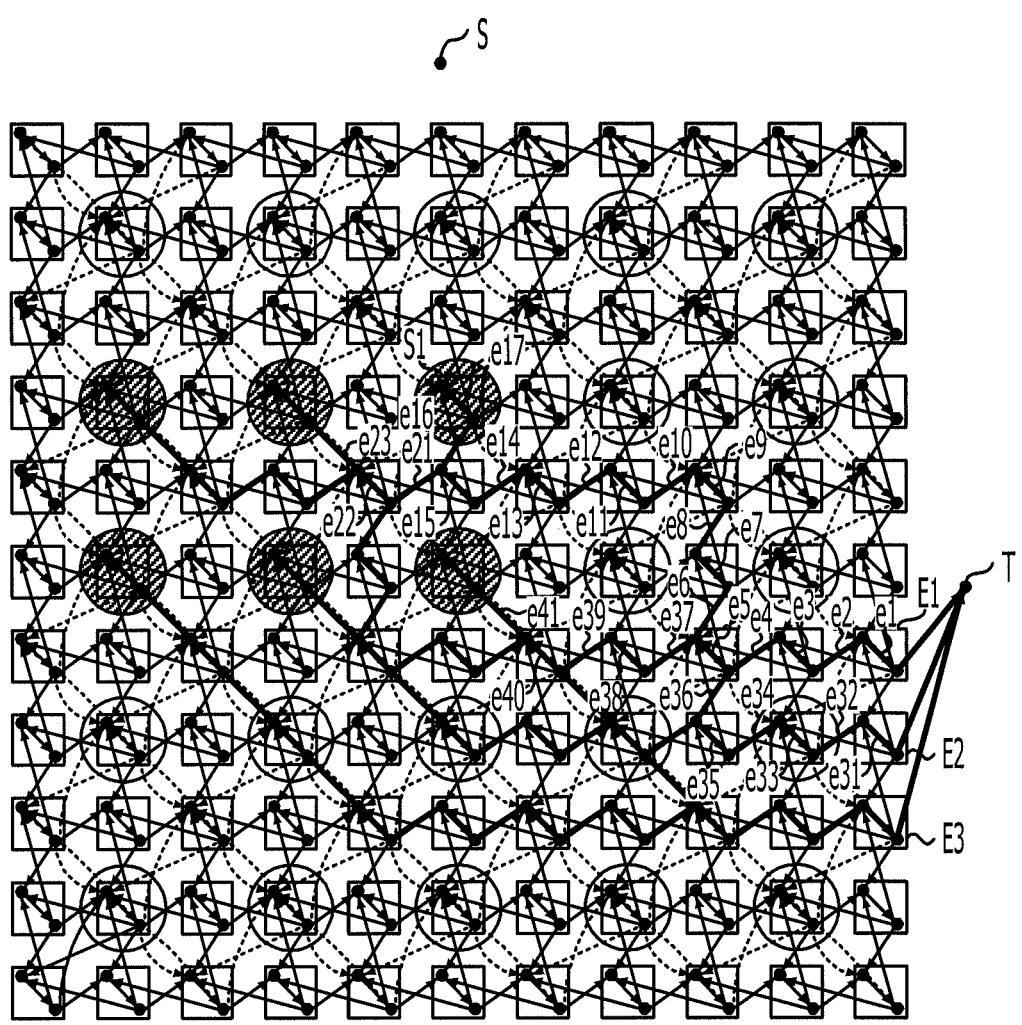
FIG. 74 illustrates an example of global paths definitized by the global-path definitizing unit.

FIG. 74 illustrates an example of global paths definitized by the global-path definitizing unit. That is, FIG. 74 illustrates a result of the processing in operation S4-10-10. In FIG. 74, directed edges given characters en (n is an integer) are directed edges through which definitized global paths pass. In FIG. 74, a state in which three global paths are definitized is depicted for convenience of description.

In operation S4-10-11, the extraction-success/failure determining unit 1223 (see FIG. 17) in the extraction wiring unit 122 determines whether or not extraction of all nets belonging to the attention bus succeeds. In this operation, extraction-path information is stored with respect to wiring nets for successfully extracted nets. When the extraction succeeds, 0 is assigned to a variable requestN. When the extraction fails, the number of nets failed to be extracted is assigned to the variable requestN.

In operation S4-10-12, the extraction wiring unit 122 splits the processing on the basis of the success/failure (the value of the variable requestN) of the extraction. When the extraction succeeds (Yes in S4-10-12), the process proceeds to operation S4-10-13 in which the extraction wiring unit 122 increments the value of the variable b to set a next bus in the bus group BG as the attention bus. When processing has not been completed on all buses (Yes in S4-10-14), the extraction wiring unit 122 assigns the values of the initial capacities (cap2) in all cell data to the capacities (cap) in operation S4-10-15. That is, the values of the capacities (cap) which were temporarily varied in operation S4-10-4 or S4-10-5 are restored to their original values. Subsequently, operation S4-10-2 and the subsequent operations are executed on the new attention bus.

On the other hand, when the extraction fails (in operation S4-10-12), the process proceeds to operation S4-10-16 in which the extraction wiring unit 122 expands the section between the left-end cell (LeftP) and the right-end cell (RightP) in the wire-escape-exit data Gate (FIG. 63) for the attention bus by an amount corresponding to the number (requestN) of lines that are failed to be extracted. That is, egress cells are added.

When the addition of egress cells succeeds (Yes in S4-10-17), the extraction wiring unit 122 assigns TRUE to the egress flags (exitF) in the cell data of the new egress cells in operation S4-10-18 and repeats operation S4-10-6 and the subsequent operations. That is, extraction of the nets belonging to the attention bus is executed again.

When the addition of egress cells fails (No in S4-10-17), the process proceeds to operation S4-10-13 in which the extraction wiring unit 122 sets a next bus in the bus group BG as the attention bus. Thereafter, the extraction wiring unit 122 executes operation S4-10-14 and the subsequent operations.

Details of operation S4-10-7 will be described next.

Figure 75:
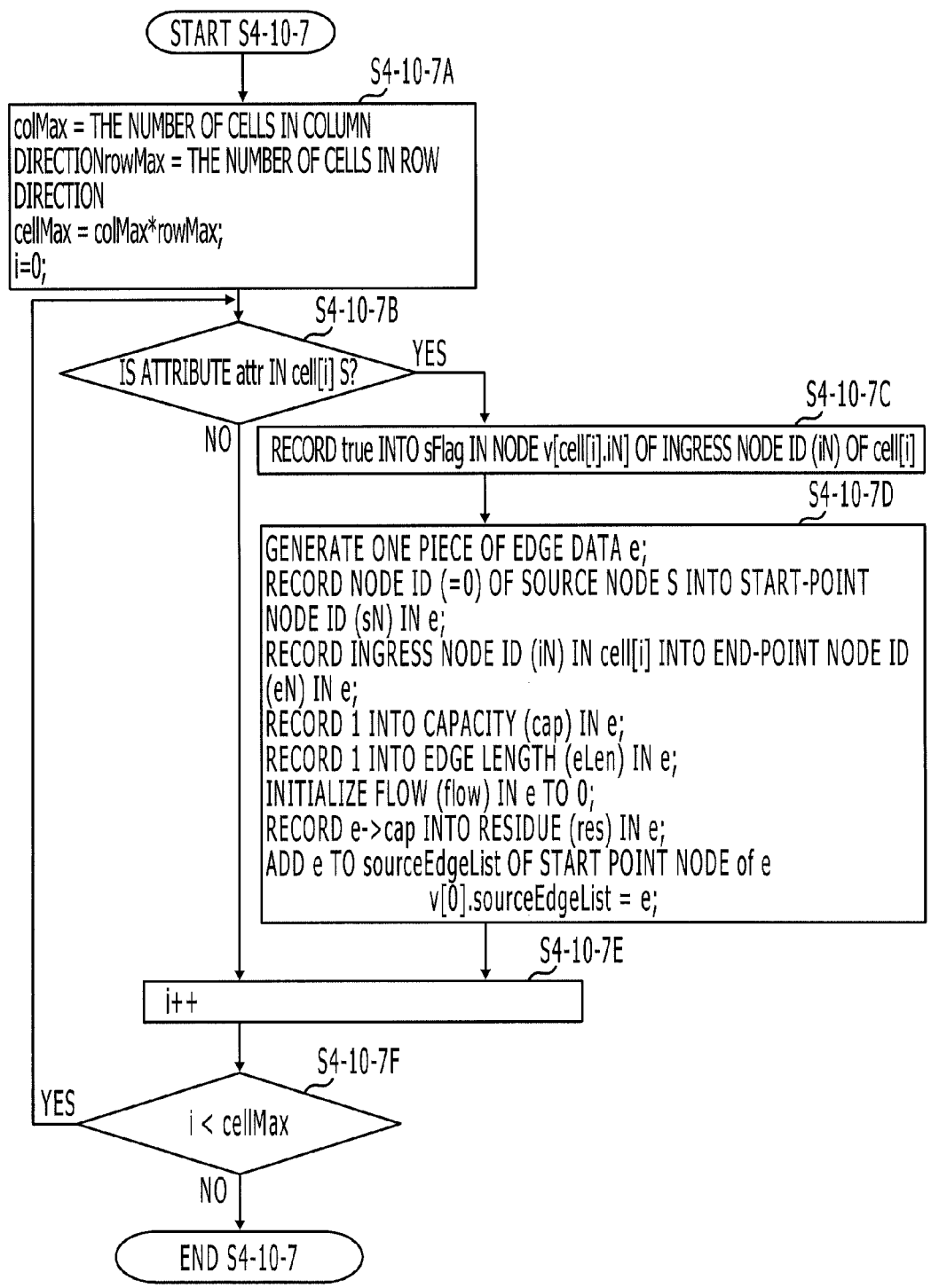
FIG. 75 is a flowchart of a procedure of processing for generating directed edges from a source node to extraction-source cells.

FIG. 75 is a flowchart of a procedure of processing for generating directed edges from a source node to extraction-source cells.

In operation S4-10-7A, the extraction wiring unit 122 assigns the number of cells in the column direction to the variable colMax, assigns the number of cells in the row direction to the variable rowMax, and assigns the total number of cells (colMax×rowMax) to the variable cellMax. The extraction wiring unit 122 also assigns an initial value "0" to a variable i. The variable i is used as a suffix for, in the cell-data array "cell", an element (cell data) to be processed.

In operation S4-10-7B, the extraction wiring unit 122 determines whether or not the value of the cell attribute (attr) in the cell data (cell-data array "cell[i]") to be processed is "S" (extraction-source pin)". When the value of the cell attribute in the cell data to be processed is "S" (Yes in S4-10-7B), the process proceeds to operation S4-10-7C in which the extraction wiring unit 122 records "true" into the search source flag (sFlag) in the node data (node-data array "v[cell[i]. iN]") of the ingress node of the cell corresponding to the cell data to be processed.

In operation S4-10-7D, the extraction wiring unit 122 generates, in the memory device 103, one piece of edge data e to be associated with the directed edge from the source node S to the cell to be processed and records values into the member variables in the edge data e. Specifically, the node ID (0) of the source node S is recorded in the start-point node ID (sN) in the edge data e. The ingress node ID (iN) in the cell data (cell-data array "cell[i]") of the cell to be processed is also recorded in the end-point node ID (eN) in the edge data e. As a result, the edge data e becomes edge data associated with the directed edge from the source node S to be processed to the ingress node of the cell to be processed. Also, 1 is recorded in the capacity (cap) in the edge data e. That is, the capacity of the directed edge from the source node S to the ingress node of the extraction-source cell is set to 1. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The extraction wiring unit 122 adds the edge data e to the source-node-S directed-edge list (sourceEdgeList) in the node data (node-data array "v[0]") of the start-point node (i.e., the source node S) of the directed edge associated with the edge data e.

When operation S4-10-7D is finished or the result in operation S4-10-7B is No, the extraction wiring unit 122 increments the variable i in operation S4-10-7E. That is, next cell data in the cell-data array "cell" is set as cell data to be processed. Subsequently, in operation S4-10-7F, the extraction wiring unit 122 determines whether or not the value of the variable i is smaller than cellMax (the total number of cells), to thereby determine whether or not unprocessed cell data exists. When unprocessed cell data exists (Yes in S4-10-7F), the extraction wiring unit 122 repeatedly performs the processing in operation S4-10-7B and the subsequent operations. When no unprocessed cell data exists (No in S4-10-1F), the extraction wiring unit 122 ends the processing in FIG. 75.

Figure 76:
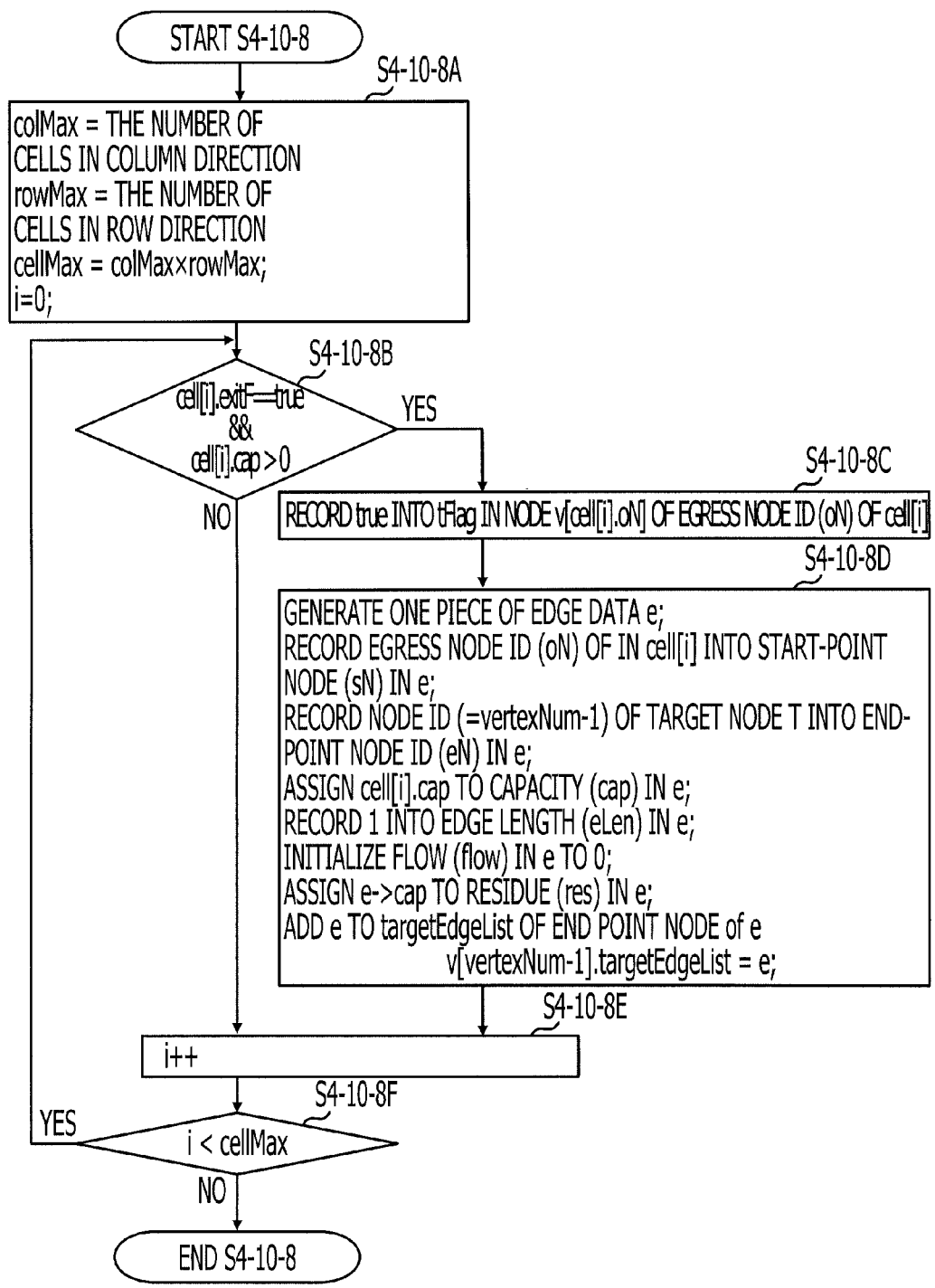
FIG. 76 is a flowchart of a procedure of processing for generating directed edges from egress cells to a target node.

Details of operation S4-10-8 in FIG. 72 will be described next. FIG. 76 is a flowchart of a procedure of processing for generating directed edges from egress cells to a target node.

In operation S4-10-8A, the extraction wiring unit 122 assigns the number of cells in the column direction to the variable colMax, assigns the number of cells in the row direction to the variable rowMax, and assigns the total number of cells (colMax×rowMax) to the variable cellMax. The extraction wiring unit 122 also assigns an initial value "0" to a variable i. The variable i is used as a suffix for, in the cell-data array "cell", an element (cell data) to be processed.

In operation S4-10-8B, the extraction wiring unit 122 determines whether or not the value of the egress flag (exitF) in the cell data (cell-data array "cell[i]") to be processed is "true" and the capacity (cap) in the cell data to be processed is larger than 0. This determination corresponds to a determination as to whether or not the cell data to be processed is cell data of an egress cell. That is, cell data in which the value of the egress flag is "true" is cell data of a cell located at the perimeter of the cell matrix (refer to operation S4-921-4 in FIG. 27). Of the cell data of cells located at the perimeter, only the cell data of an egress cell has a capacity that is larger than 0 (refer to operation S4-922-6 in FIG. 30).

When the result in operation S4-10-8B is Yes, i.e., when the cell data to be processed is cell data of an egress cell, the process proceeds to operation S4-10-8C in which the extraction wiring unit 122 records "true" into the search target flag (tFlag) in the node data (node-data array "v[cell[i]. oN]") of the egress node of the cell corresponding to the cell data to be processed.

In operation S4-10-8D, the extraction wiring unit 122 generates, in the memory device 103, one piece of edge data e to be associated with the directed edge from the cell to be processed to the target node T and records values into the member variables in the edge data e. Specifically, the egress node ID (oN) in the cell data (cell-data array "cell[i]") of the cell to be processed is recorded in the start-point node ID (sN) in the edge data e. The node ID (vertexNum−1) of the target node T is also recorded in the end-point node ID (eN) in the edge data e. As a result, the edge data e becomes edge data associated with the directed edge from the egress node of the cell to be processed to the target node T. The capacity (cap) in the cell data to be processed is recorded in the capacity (cap) in the edge data e. Thus, the capacity of the directed edge from the egress node of the egress cell to the sink node T is made equal to the capacity of the egress cell. Also, 1 is recorded in the edge length (eLen) in the edge data e. An initial value 0 is also recorded in the flow (flow) in the edge data e. The value of the capacity (cap) in the edge data e is recorded in the residue (res) in the edge data e.

The extraction wiring unit 122 adds the edge data e to the target-node-T directed-edge list (targetEdgeList) in the node data (node-data array "v[vertexNum−1]") of the end-point node (i.e., the target node T) of the directed edge associated with the edge data e.

When operation S4-10-8D is finished or the result in operation S4-10-8B is No, the extraction wiring unit 122 increments the variable i in operation S4-10-8E. That is, next cell data in the cell-data array "cell" is set as the cell data to be processed. Subsequently, in operation S4-10-8F, the extraction wiring unit 122 determines whether or not the value of the variable i is smaller than cellMax (the total number of cells), to thereby determine whether or not unprocessed cell data exists. When unprocessed cell data exists (Yes in S4-10-8F), the extraction wiring unit 122 repeatedly performs the processing in operation S4-10-8B and the subsequent operations. When no unprocessed cell data exists (No in S4-10-8F), the extraction wiring unit 122 ends the processing in FIG. 76.

Figure 77:
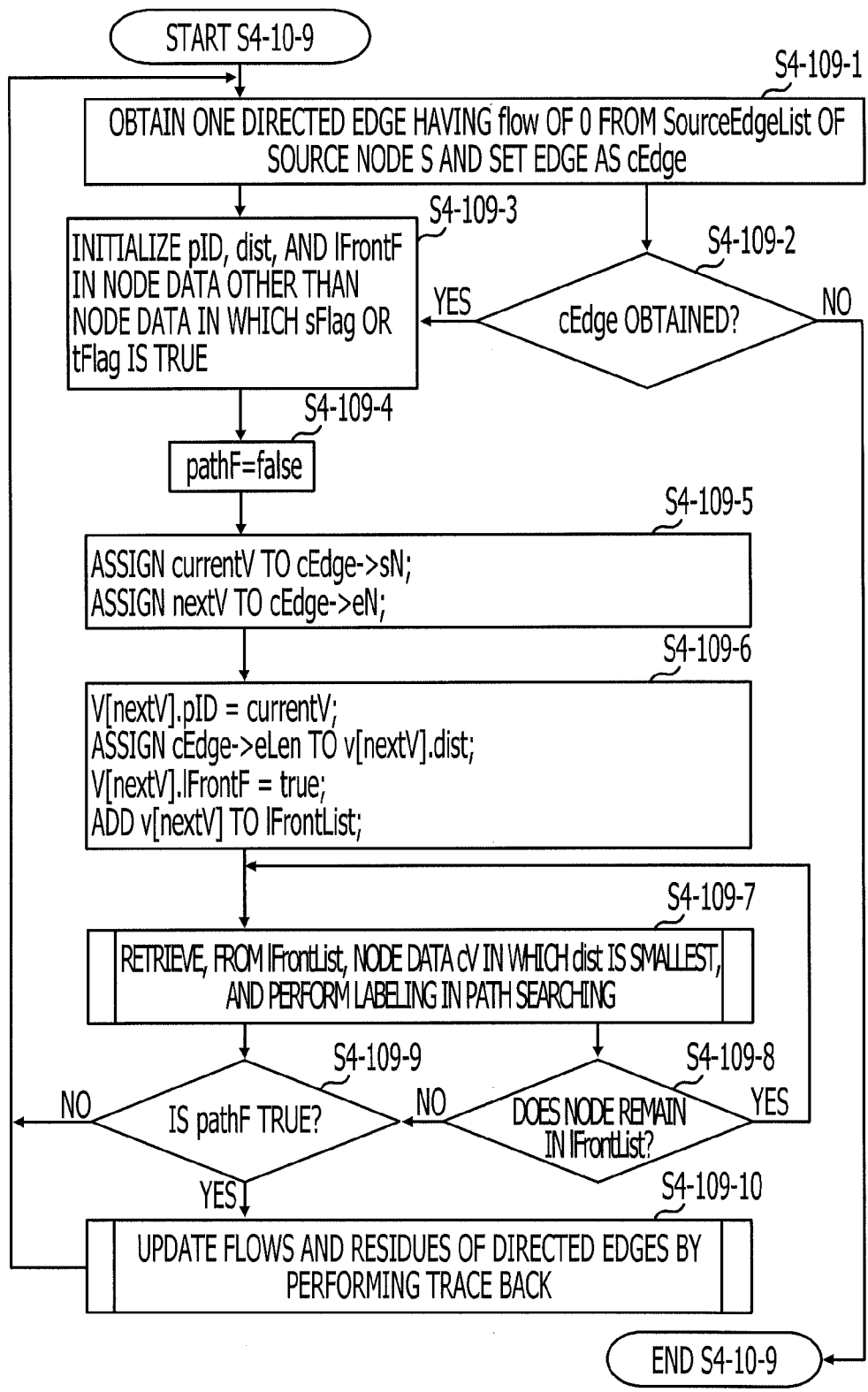
FIG. 77 is a flowchart of a procedure of processing for searching for a shortest path in a directed graph.

Details of operation S4-10-9 in FIG. 72 will be described next. FIG. 77 is a flowchart of a procedure of processing for searching for a shortest path in a directed graph. In the present embodiment, a Dijkstra's algorithm is used to determine a shortest path. Another known algorithm may also be used.

In operation S4-109-1, the shortest-path searching unit 1221a obtains, from the source-node-S directed-edge list (sourceEdgeList) in the node data of the source node S, one piece of edge data in which the value of the flow (flow) is 0, and further assigns the obtained edge data to a variable cEdge. As a result of the processing in FIG. 75, the edge data for directed edges from the source node S to the ingress nodes of all extraction-source cells are recorded in the source-node-S directed-edge list (sourceEdgeList). As the directed edges, six directed edges are depicted in the example of FIG. 21. In operation S4-109-1, one piece of edge data in which the value of the flow (flow) is 0 is obtained from the pieces of edge data of the six directed edges. Initially, the values of the flows (flow) in all the edge data are 0 and the values of the flows (flow) vary in processing described below. The variable cEdge is an edge-data-type variable that stores edge data to be processed. The edge data assigned to cEdge is hereinafter referred to as "edge data cEdge".

When the edge data cEdge is successfully obtained, i.e., when edge data corresponding to sourceEdgeList in the node data of the source node S exists (in operation S4-109-2), the process proceeds to operation S4-109-3. In this operation, the shortest-path searching unit 1221a initializes values of the label propagation-source node ID (pID), the shortest path length (dist), and the label front flag (lFrontF) in, of all node data (i.e., all elements of the node-data array "v"), node data in which the search source flag (sFlag) or the search target flag (tFlag) is not "true". Specifically, NULL ID is assigned to pID, distMax is assigned to dist, and "false" is assigned to lFrontF. The node data in which the search source flag (sFlag) is "true" refers to the node data of a source node S or the ingress node of an extraction-source cell. The node data in which the search target flag (tFlag) is "true" refers to the node data of a target node T or the egress node of an egress cell. Thus, the processing in operation S4-109-3 is executed on the node data of all nodes except the source node S, the ingress nodes of extraction-source cells, the target node T, and the egress nodes of egress cells.

Subsequently, in operation S4-109-4, the shortest-path searching unit 1221a initializes the value of a variable pathF to "false".

In operation S4-109-5, the shortest-path searching unit 1221a assigns currentV to the start-point node ID (sN) in the edge data cEdge and assigns nextV to the end-point node ID (eN) in the edge data cEdge. The directed edge cEdge is the edge data of a directed edge from the source node S to the ingress node of the extraction-source cell. Thus, currentV denotes the node ID of the source node S. Also, nextV denotes the node ID of the ingress node of the extraction-source cell.

In operation S4-109-6, the shortest-path searching unit 1221a updates the values of the member variables in the node data (node-data array "v[nextV]") of the ingress node of the extraction-source cell. Specifically, the value of currentV is assigned to the label-propagation-source node ID (pID). The edge length (eLen=1) in the edge data cEdge is assigned to the shortest path length (dist). Also "true" is assigned to the label front flag (lFrontF). Thus, lFrontF being set to "true" indicates that the node data is located at the label front (forefront) in the path searching. The shortest-path searching unit 1221a further adds the node data to a variable lFrontList. The variable lFrontList is a variable for storing a list of node data of nodes located at the forefront in the path searching.

In operation S4-109-7, the shortest-path searching unit 1221a retrieves, from the variable lFrontList, node data "cv" in which the value of the shortest path length (dist) is the smallest, and performs labeling in the path searching. The node data "cv" retrieved from the variable lFrontList is deleted from the variable lFrontList. In operation S4-109-8, the shortest-path searching unit 1221a determines whether or not any node data remains in the variable lFrontList. When node data remains (Yes in S4-109-8), the shortest-path searching unit 1221a repeatedly executes operation S4-109-7 until no node data remains in the variable lFrontList.

When no node data remains in the variable lFrontList (No in S4-109-8), the process proceeds to operation S4-109-9 in which the shortest-path searching unit 1221a determines whether or not the value of the variable pathF is "true". The value of the variable pathF is set to "true" when the node at a destination point, i.e., the egress node of an egress cell, is reached in the path searching in operation S4-109-7.

When the value of the variable pathF is "true" (Yes in S4-109-9), the process proceeds to operation S4-109-10 in which the traceback unit 1221b traces back the result of the path searching and updates the flows (flow) and the residues (res) of the directed edges used for the found path. When the result in operation S4-109-10 is finished or the result in operation S4-109-9 is No, the processing in operation S4-109-1 and the subsequent operations is repeatedly executed. When edge data cEdge having a flow (flow) of 0 cannot be obtained in operation S4-109-1 (i.e., No in S4-109-2), the processing in FIG. 77 ends.

Figure 78:
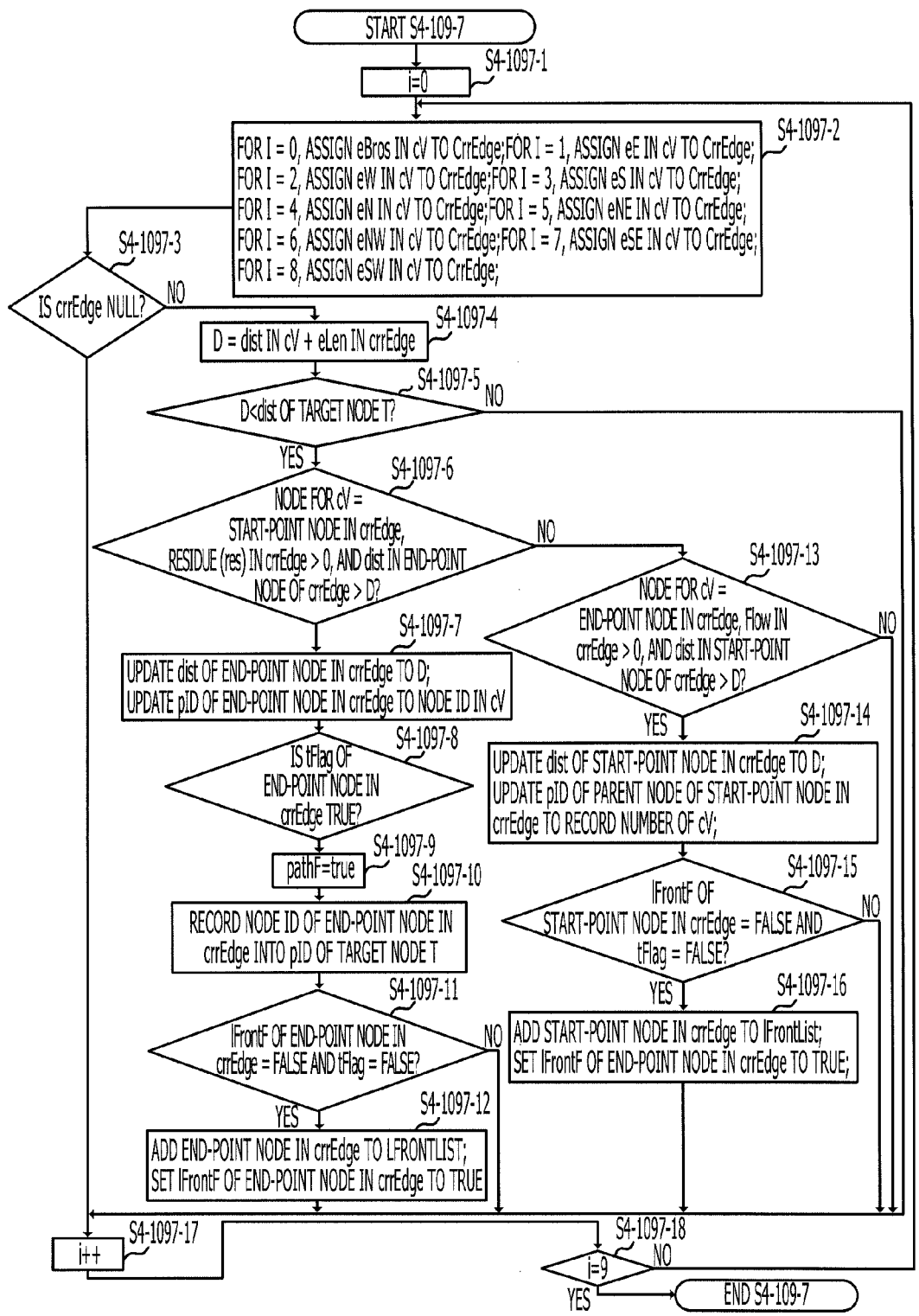
FIG. 78 is a flowchart of a procedure of labeling processing in the path searching;8

Details of operation S4-109-7 in FIG. 77 will be described next. FIG. 78 is a flowchart of a procedure of labeling processing in the path searching.

In operation S4-1097-1, the shortest-path searching unit 1221a initializes the variable i to 0. Subsequently, the shortest-path searching unit 1221a assigns any of edge data connected to node data "cv" (i.e., one of pieces of node data that are present at the forefront in the path searching) to edge data crrEdge. The edge data crrEdge is edge data to be processed in FIG. 78. The edge data assigned to the edge data crrEdge varies depending on the value of the variable i. That is, when the value of the variable i is 0, the brother-node directed edge (eBros) in the node data "cv" is assigned to the edge data crrEdge. When the value of the variable i is 1, the adjacent-east-cell node directed edge (eE) in the node data "cv" is assigned to the edge data crrEdge. When the value of the variable i is 2, the adjacent-west-cell node directed edge (eW) in the node data "cv" is assigned to the edge data crrEdge. When the value of the variable i is 3, the adjacent-south-cell node directed edge (eS) in the node data "cv" is assigned to the edge data crrEdge. When the value of the variable i is 4, the adjacent-north-cell node directed edge (eN) in the node data "cv" is assigned to the edge data crrEdge. When the value of the variable i is 5, the adjacent-northeast-cell node directed edge (eNE) in the node data "cv" is assigned to the edge data crrEdge. When the value of the variable i is 6, the adjacent-northwest-cell node directed edge (eNW) in the node data "cv" is assigned to the edge data crrEdge. When the value of the variable i is 7, the adjacent-southeast-cell node directed edge (eSE) in the node data "cv" is assigned to the edge data crrEdge. When the value of the variable i is 7, the adjacent-southwest-cell node directed edge (eSW) in the node data "cv" is assigned to the edge data crrEdge.

Each time the loop of operation S4-1097-2 and the subsequent operations is executed, the value of the variable i is incremented. Thus, in operation S4-1097-2 and the subsequent operations, the edge data crrEdge to be processed changes sequentially in accordance with the number of loops.

In operation S4-1097-3, the shortest-path searching unit 1221a determines whether or not the value of the edge data crrEdge is null. When the edge data crrEdge is not null (No in S4-1097-3), the process proceeds to operation S4-1097-4 in which the shortest-path searching unit 1221a assigns a value, obtained by adding the edge length (eLen) in the edge data crrEdge to the shortest path length (dist) in the node data cV, to a variable D. The value of the variable D indicates the path length in the node data located at the other side of the node data "cv" in the edge data crrEdge. However, it is not definitized that the path length is the shortest path length.

In operation S4-1097-5, the shortest-path searching unit 1221a determines whether or not the value of the variable D is smaller than the shortest path length (dist) of the target node T. The value of the shortest path length (dist) of the target node T is distMax (maximum value) until a path to the target node T is found.

In operation S4-1097-6, the shortest-path searching unit 1221a determines whether or not the node corresponding to the node data "cv" is the start-point node in the edge data crrEdge, the value of the residue (res) in the edge data crrEdge is larger than 0, and the shortest path length (dist) in the node data of the end-point node of a directed edge associated with the edge data crrEdge is larger than the variable D.

This determination is equivalent to a determination as to whether or not the directed edge associated with the edge data crrEdge can be a directed edge to be included in a shortest path to a destination point (i.e., whether or not searching beyond the directed edge is worthwhile) when the node associated with the node data "cv" is the start-point node in the edge data crrEdge. This is because, when the residue in the edge data crrEdge is 0, the edge data crrEdge cannot be used as a path. Another reason is that, when the value of the shortest path length (dist) of the end-point node in the edge data crrEdge is smaller than or equal to the value of the variable D, a path to the end-point node to be searched for from now on is not the shortest path. The shortest path lengths (dist) in the node data other than the node data of the specific nodes are initialized to distMax in operation S4-109-3 in FIG. 77. Thus, during at least first searching, when the node associated with the node data "cv" is the start-point node in the edge data crrEdge, the result of the determination in operation S4-1097-6 is Yes.

When the result in operation S4-1097-6 is Yes, the process proceeds to operation S4-1097-7 in which the shortest-path searching unit 1221a updates the value of the shortest path length (dist) in the node data of the end-point node in the edge data crrEdge to the value of the variable D. The shortest-path searching unit 1221a also updates the value of the label-propagation-source node ID (pID) in the node data of the end-point node in the edge data crrEdge to the value of the node ID in the node data cV.

Subsequently, in operation S4-1097-8, the shortest-path searching unit 1221a determines whether or not the search target flag (tFlag) in the node data of the end-point node in the edge data crrEdge is "true", i.e., whether or not the end-point node is the egress node (the node at the destination point) of the egress cell. When the search target flag (tFlag) in the node data of the end-point node in the edge data crrEdge is "true" (Yes in S4-1097-8), the process proceeds to operation S4-1097-9. In this operation, the shortest-path searching unit 1221a sets the value of the variable pathF to "true", regarding that the destination point is reached. In operation S4-1097-10, the shortest-path searching unit 1221a records the node ID of the end-point node in the edge data crrEdge into the propagation-source node ID in the node data of the target node T.

When operation S4-1097-10 is finished or the result in operation S4-1097-8 is No, the process proceeds to operation S4-1097-11 in which the shortest-path searching unit 1221a determines whether or not the value of the label front flag (lFrontF) in the node data of the end-point node in the edge data crrEdge is "false" and the search target flag (tFlag) in the node data of the end-point node is "false". That is, a determination is made as to whether the end-point node in the edge data crrEdge is not set as the forefront of the path searching and whether the end-point node is not the egress node of an egress cell (i.e., is not the node at a destination point).

When the result in operation S4-1097-11 is Yes, the process proceeds to operation S4-1097-12 in which the shortest-path searching unit 1221a adds the node data of the end-point node in the edge data crrEdge to the variable lFrontList and sets the label front flag (lFrontF) in the node data to "true". Consequently, the end-point node is set as one of nodes at the forefront of the path searching.

When the result in operation S4-1097-6 is No, the process proceeds to operation S4-1097-13. In this operation, the shortest-path searching unit 1221a determines whether or not the node associated with the node data "cv" is the end-point node of the edge data crrEdge, the value of the flow (flow) in the edge data crrEdge is larger than 0, and the shortest path length (dist) in the node data of the start-point node of a directed edge associated with the edge data crrEdge is larger than the variable D.

This determination is equivalent to a determination as to whether or not the directed edge associated with the edge data crrEdge can be a directed edge to be included in a shortest path to a destination point (i.e., whether or not searching beyond the directed edge is worthwhile) when the direction from the node associated with the node data "cV" to the end-point node of the edge data crrEdge is opposite to (is reversal of) the direction of the edge data crrEdge. In this case, the traceback is permitted only when the directed edge associated with the edge data crrEdge is already used for the shortest path, i.e., only when the flow (flow) in the edge data crrEdge is larger than 0. The significance of the traceback and the reason why the traceback is permitted for only a directed edge already used for the shortest path are described below.

When the result in operation S4-1097-13 is Yes, the shortest-path searching unit 1221a updates the value of the shortest path length (dist) in the node data of the start-point node in the edge data crrEdge to the value of the variable D. In operation S4-1097-14, the shortest-path searching unit 1221a updates the value of the label-propagation-source node ID (pID) in the node data of the start-point node in the edge data crrEdge to the value of the node ID of the node data cV.

In operation S4-1097-15, the shortest-path searching unit 1221a determines whether or not the value of the label front flag (lFrontF) in the node data of the start-point node in the edge data crrEdge is "false" and the search target flag (tFlag) in the node data of the start-point node is "false". That is, a determination is made as to whether or not the start-point node in the edge data crrEdge is not set as the forefront of the path searching and whether or not the start-point node is not the egress node of an egress cell (i.e., is not the node at an intended point).

When the result in operation S4-1097-15 is Yes, the process proceeds to operation S4-1097-16 in which the shortest-path searching unit 1221a adds the node data of the start-point node in the edge data crrEdge to the variable lFrontList and sets the label front flag (lFrontF) in the node data to "true". Consequently, the start-point node is set as one of the nodes at the forefront of the path searching.

When operation S4-1097-16 is finished, the result in operation S4-1097-15 is No, the result in operation S4-1097-13 is No, operation S4-1097-12 is finished, the result in operation S4-1097-11 is No, or the result in operation S4-1097-5 is No, the process proceeds to operation S4-1097-17 in which the shortest-path searching unit 1221a increments the variable i. In operation S4-1097-18, the shortest-path searching unit 1221a determines whether or not the value of the variable i reaches 9. The reason why the variable i is compared with 9 is that the maximum number of directed edges that can be connected to one node is 9. The reason is that, more specifically, when the processing on all edge data included as member variables of the edge data cV has been completed via operation S4-1097-2, the value of the variable i is 9.

When the value of the variable i is not 9 (No in S4-1097-18), the shortest-path searching unit 1221a repeats operation S4-1097-2 and the subsequent operations. When the value of the variable i is 9 (Yes in S4-1097-18), the shortest-path searching unit 1221a ends the processing in FIG. 78.

As a result of the execution of the processing in FIG. 78, the forefront of the path searching moves to, of the nodes connected to the node data cV via the directed edges, a next node (or next nodes) that is likely to be the shortest path. The processing in FIG. 78 is recursively executed on the next node(s). As a result of the recursive execution of the processing in FIG. 78, the directed edges connected to the nodes at the forefront are traced back one after another, so that the shortest path is found. The values of the label propagation-source node ID (pID) and the shortest distance length (dist) are recorded in the node data associated with the found path.

Through operation S4-109-3, values of the member variables (pID, dist, and lFrontF) in each of the pieces of the node data are initialized each time the edge data cEdge to be processed is varied in operation S4-109-1 in FIG. 77. Thus, pID, dist, and lFrontF in each piece of the node data can vary for each of the directed edges from the source node S to the extraction-source cell.

Figure 79:
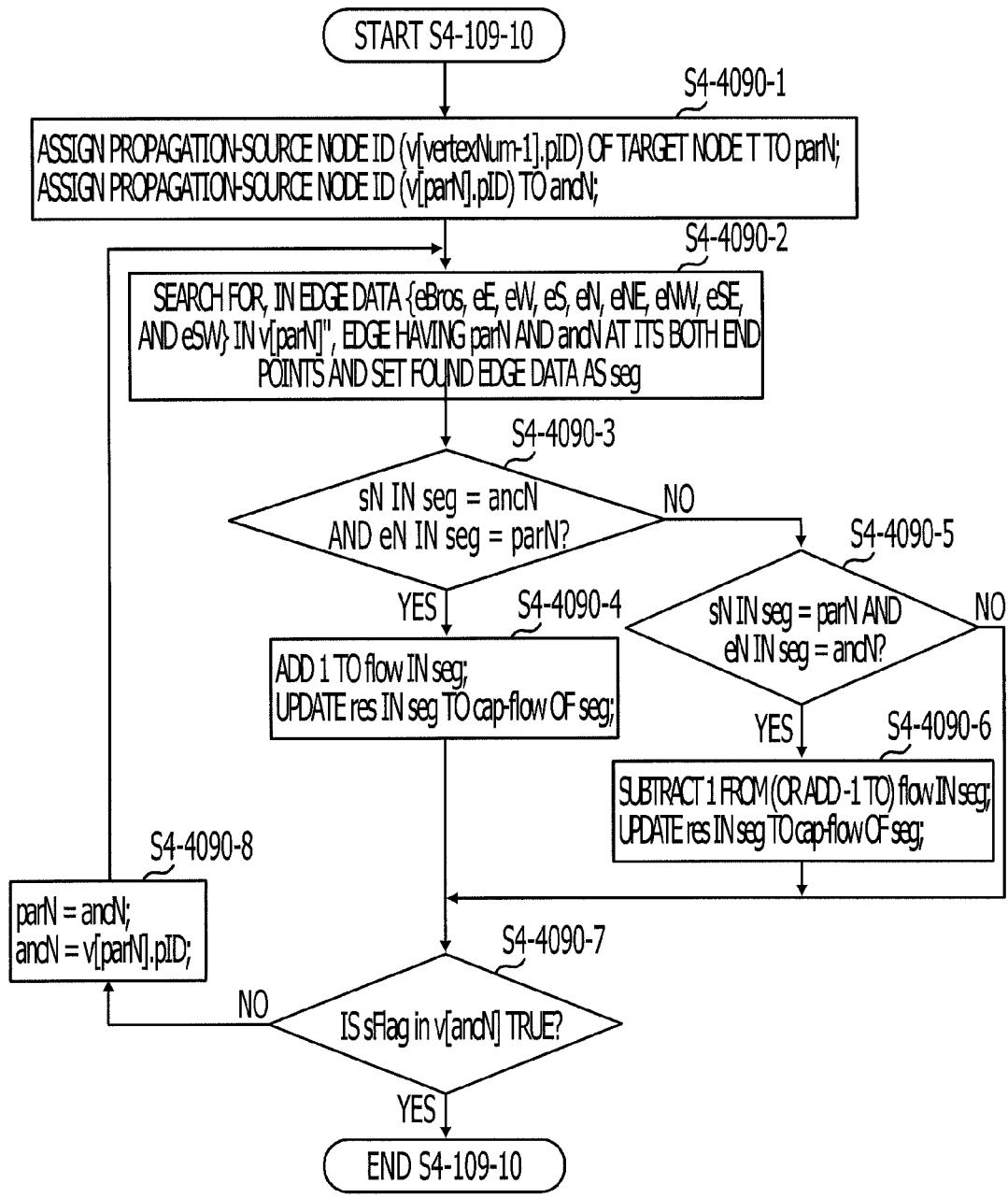
FIG. 79 is a sequence diagram illustrating a procedure of traceback processing.

Details of operation S4-109-10 in FIG. 77 will be described next. FIG. 79 is a sequence diagram illustrating a procedure of traceback processing. Operation S4-109-10 (processing in FIG. 79) is executed when no data is present in the variable lFrontList (No in S4-109-8) and the value of the variable pathF is "true" (Yes in S4-109-9). That is, operation S4-109-10 is executed when the searching for the shortest path from the ingress node (the extraction-source node) of one extraction-source cell to the egress node of an egress cell is completed. In the processing in FIG. 79, the found shortest path is traced back from the target node T, so that the flows (flow) and the residues (res) of the directed edges used for the shortest path are updated.

In operation S4-1090-1, the traceback unit 1221b assigns the label propagation-source node ID (pID) in the node data (node-data array "v[vertexNum−1]") of the target node T to a variable parN. A node whose node ID is the variable parN is referred to as a "parent node" in FIG. 79. The traceback unit 1221b assigns the label propagation-source node ID (pID) in the node data (node-data array "v[parN]") of the parent node to a variable ancN. A node whose node ID is the variable ancN is referred to as an "ancestor node" in FIG. 79.

Subsequently, in operation S4-1090-2, the traceback unit 1221b searches for, in edge data (eBros, eE, eW, eS, eN, eNE, eNW, eSE, and eSW) registered in the node data (node-data array "v[parN]") of the parent node, edge data having, at its both end points, a node whose node ID is the variable parN and a node whose node ID is the variable ancN. The traceback unit 1221b then sets found edge data as edge data "seg".

In operation S4-1090-3, the traceback unit 1221b determines whether or not the value of the start-point node ID (sN) in the edge data "seg" matches the value of the variable ancN and the value of the end-point node ID (eN) in the edge data "seg" matches the value of the variable parN. That is, a determination is made as to whether or not the direction of the edge data "seg" matches the direction of the label propagation match each other.

When the result in operation S4-1090-3 is Yes, the process proceeds to operation S4-1090-4 in which the traceback unit 1221b adds 1 to the flow (flow) in the edge data "seg". The traceback unit 1221b also updates the value of the residue (res) in the edge data "seg" with a result of calculation "capacity (cap)−flow (flow)". That is, the value indicating that the directed edge associated with the edge data "seg" was used for the shortest path is recorded.

On the other hand, when the result in operation S4-1090-3 is No, the process proceeds to operation S4-1090-5 in which the traceback unit 1221b determines whether or not the value of the start-point node ID (sN) in the edge data "seg" matches the value of the variable parN and the value of the end-point node ID (eN) in the edge data "seg" matches the value of the variable ancN. That is, a determination is made as to whether or not the direction of the label propagation is opposite to the direction of the edge data "seg". Such a situation (i.e., a situation in which the direction of the label propagation is opposite to the direction of the edge data "seg") occurs when operation S4-1097-14 in FIG. 78 is executed.

When the result in operation S4-1090-5 is Yes, the process proceeds to operation S4-1090-6 in which the traceback unit 1221b subtracts 1 from the flow (flow) in the edge data "seg". The traceback unit 1221b also updates the value of the residue (res) in the edge data "seg" with the result of the calculation "capacity (cap)−flow (flow)". As a result, the value of the residue (res) increases. That is, one record indicating that the directed edge associated with the edge data "seg" was used for the shortest path is eliminated.

When operation S4-1090-4 is finished, operation S4-1090-6 is finished, or the result in operation S4-1090-5 is No, the process proceeds to operation S4-1090-7. In this operation, the traceback unit 1221b determines whether or not the search source flag (sFlag) in the node data (node-data array "v[ancN]") of the ancestor node is "true", i.e., whether or not the traceback is completed up to the ingress node of the extraction-source cell. When the traceback is not completed (No in S4-1090-7), the process proceeds to operation S4-1090-8 in which the traceback unit 1221b advances the traceback by one edge. Specifically, the value of the variable ancN is assigned to the variable parN. The label propagation-source node ID (pID) in the node data (v[parN]) of the node that has served as the ancestor node up to this point is assigned to the variable ancN. Subsequently, the traceback unit 1221b repeatedly executes operation S4-1090-2.

When the traceback is completed (Yes in S4-1090-7), the traceback unit 1221b ends the processing in FIG. 79.

A significance of operation S4-1090-6 will now be described. Operation S4-1090-6 is executed when the path searching is performed in a direction opposite to the direction of the directed edge (i.e., when operation S4-1097-14 in FIG. 78 is executed).

Figure 80:
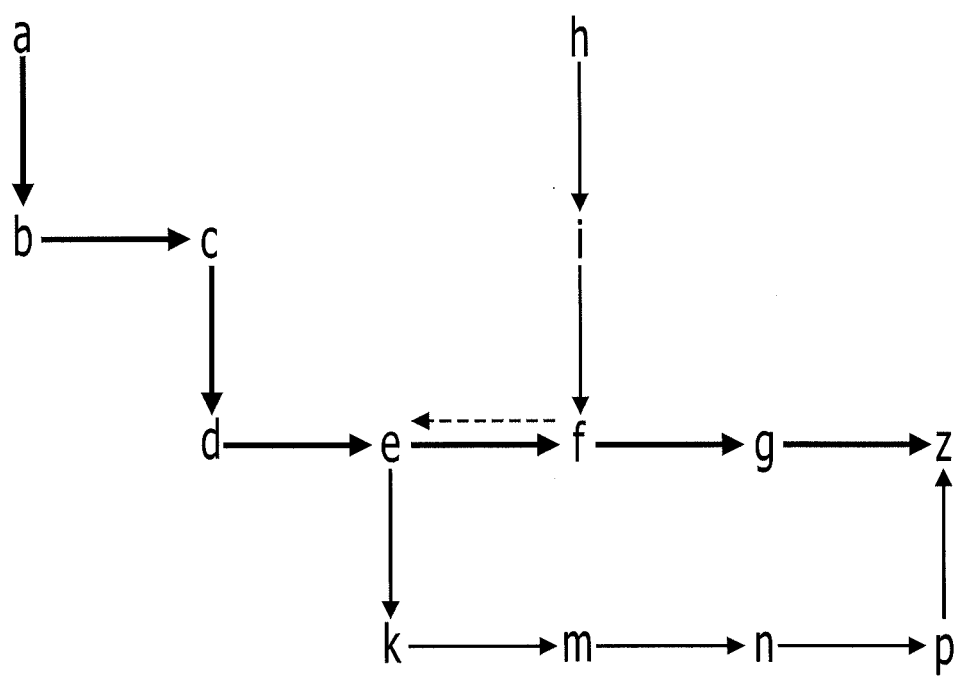
FIG. 80 is a schematic diagram illustrating a state in which the path searching is performed in a direction opposite to the direction of a directed edge.

FIG. 80 is a schematic diagram illustrating a state in which the path searching is performed in a direction opposite to the direction of a directed edge. In FIG. 80, solid-line arrows represent directed edges. Lower-case alphabets represents nodes. The node a and the node h are extraction-source nodes. The node z is a node at a destination point. In FIG. 80, the inclination of each directed edge is horizontal or vertical, for convenience of description.

A path a→b→c→d→e→f→g→z (hereinafter referred to as "path a") constituted by the directed edges represented by the thick lines is a path for which the traceback is already completed. Thus, 1 is recorded in the flows (flow) of the directed edges used for the path a.

Another path h→i→f→e→k→m→n→p→z (hereinafter referred to as "path h") is a path found in the processing in FIGS. 77 and 78 after the path a is traced back. The direction of a portion (a section f→e, indicated by a dotted-line arrow) of the path h is opposite to the direction of the directed edge ef.

During the traceback processing (FIG. 79) on the path h, when the parent node is f and the ancestor node is e, operation S4-4090-6 is executed. In the operation, the value of the flow (flow) of the directed edge ef is decremented by 1 to be become 0. As a result, the directed edge ef is used by neither the path a nor the path h. After operation S4-4090-6, the traceback is performed in order of f→i→h, and the flows (flow) of the directed edge hi and the directed edge if are set to 1. The directed edges used for one of the paths (i.e., the directed edges whose values of the flows are 1 or greater) at this point are illustrated in FIG. 81.

Figure 81:
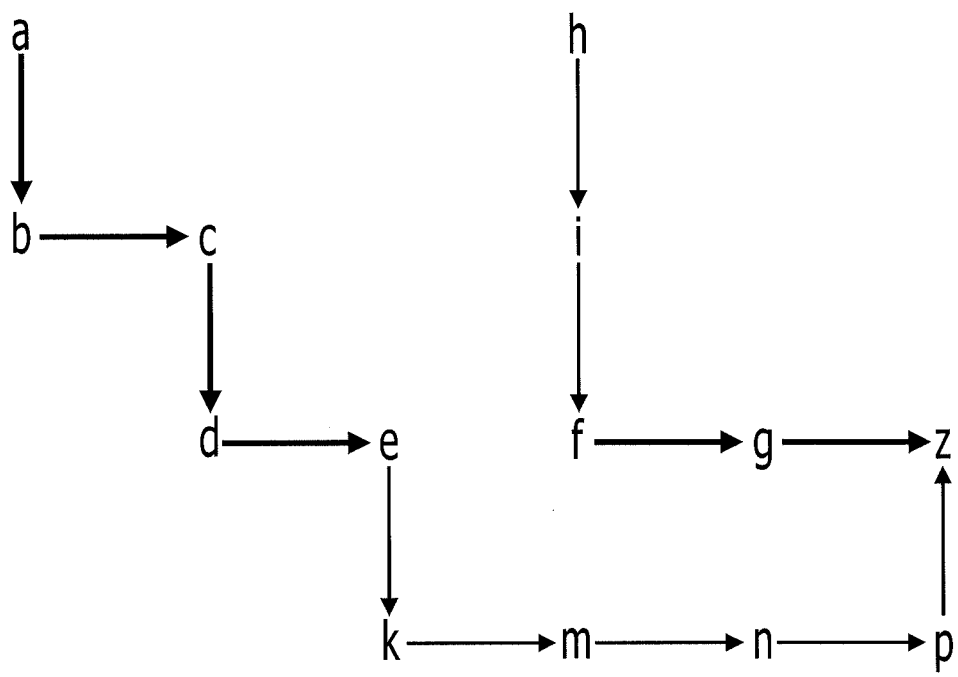
FIG. 81 is a schematic diagram illustrating an example of a result obtained by execution of the traceback when the path searching is performed in a direction opposite to the directions of the directed edges.

FIG. 81 is a schematic diagram illustrating an example of a result obtained by execution of the traceback when the path searching is performed in a direction opposite to the directions of the directed edges.

In FIG. 81, the path from the extraction-source node a is a path a→b→c→d→e→k→m→n→p→z (hereinafter referred to as "path a2"). The path from the extraction-source node h is h→i→f→g→z (hereinafter referred to as "path h2"). In other words, as a result of elimination of the directed edge of from the available directed edges in the process of the traceback of the path h, the path subsequent to the node f of the path a is used by the path h, so that the path h2 is formed. Also, the path subsequent to the node e of the path h is used by the path a, so that the path a2 is formed.

When the path searching is performed in a direction opposite to the direction of a directed edge, as described above, replacement of a portion of paths is performed to obtain a number of paths which is the same as the number of paths before the replacement (two paths in the example of FIGS. 80 and 81). However, the value of the flow (flow) of a directed edge on which the opposite-direction path searching is to be performed needs to be 1 or more (i.e., needs to be already used by another path). Otherwise, a portion of the paths cannot be replaced.

Description of operation S4-10-9 in FIG. 72 is finished at this point. One example of a processing result at this point is illustrated FIG. 73. In FIG. 73, six paths are obtained in the directed graph. More specifically, the value (the number of uses) of the flow (flow), the value being within the range of the capacity (cap), is recorded in the edge data of each directed edge used for the six paths. At this point, however, to which wires the flows of the directed edges are to be assigned is not specified. That is, global paths for extraction wires are not definitized. Thus, in operation S3 that follows, the flows of the directed edges are assigned to wires, so that the global paths are definitized.

Figure 82:
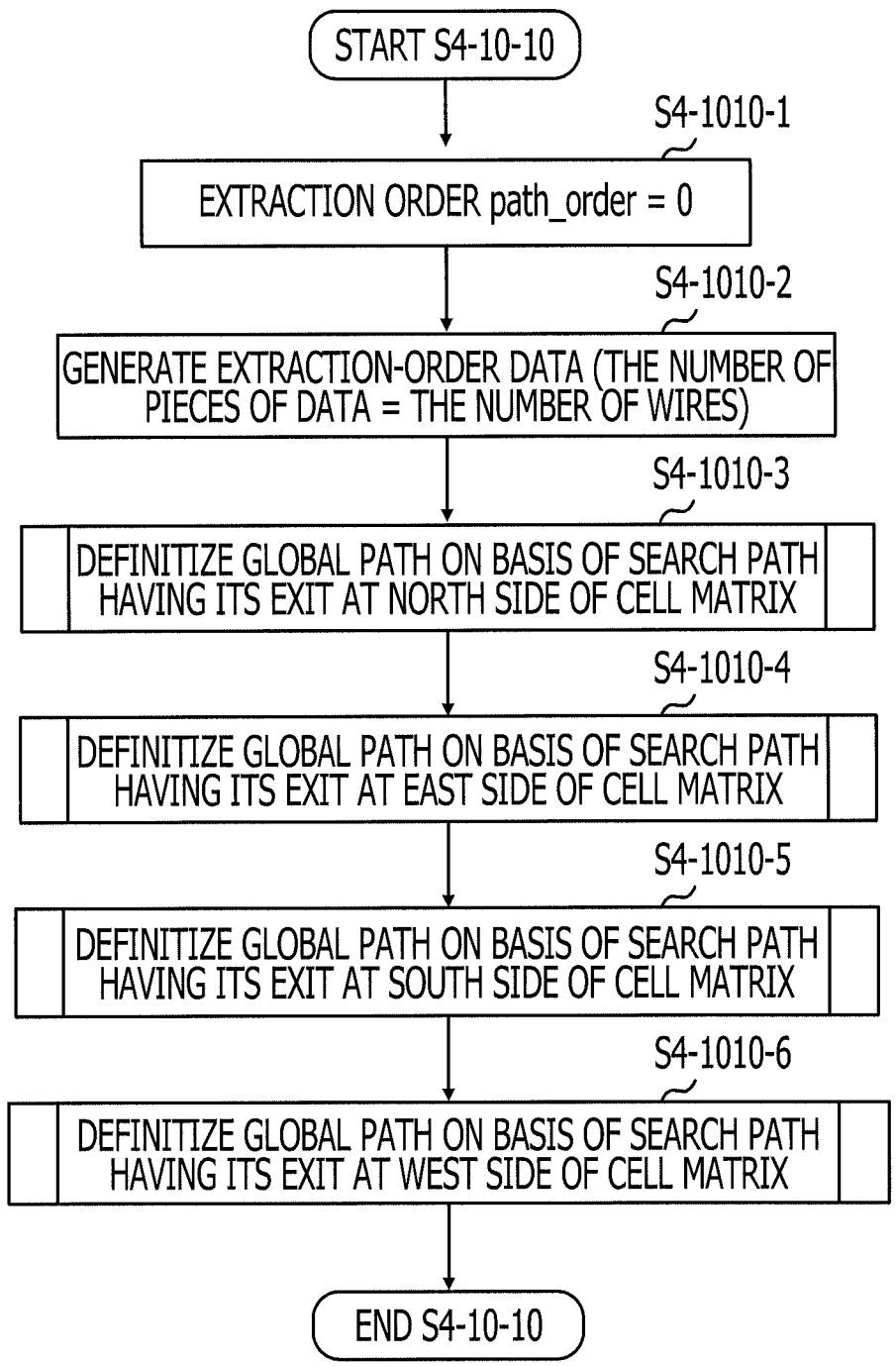
FIG. 82 is a flowchart of processing for definitizing a global path.

Details of operation S4-10-10 in FIG. 72 will be described next. FIG. 82 is a flowchart of processing for definitizing global paths.

In operation S4-1010-1, the global-path definitizing unit 1222 initializes an extraction order path_order to 0. The extraction order path_order is a variable for managing the order of extracting wires. In operation S4-1010-2, the global-path definitizing unit 1222 generates, in the auxiliary storage device 102, pieces of extraction-order data corresponding to the number of wires. The number of wires is determined based on a netlist 141. The netlist 141 includes pin IDs of extraction-source pins. Thus, the number of pin IDs can be used as the number of wires.

FIG. 83 illustrates one example of the structure of extraction-order data. As illustrated in FIG. 83, one piece of extraction-order data has member variables (data items), such as a net ID (netID) and an extraction order (order). The net ID (netID) is the net ID of a wire. The extraction order (order) is an extraction order (sequence) of the wire identified by the net ID. Thus, one piece of extraction-order data can manage the order of extracting one wire. Accordingly, pieces of extraction-order data corresponding to the number of wires are generated, so that each of the pieces of extraction-order data manages the order of extracting a corresponding wire.

In operation S4-1010-3, the global-path definitizing unit 1222 assigns the flows (flow) of the directed edges of each search path (the path found in operation S4-10-9) having its exit at the north side of the cell matrix to a wire, to thereby definitize a global path for the wire.

In operation S4-1010-4, the global-path definitizing unit 1222 assigns the flows (flow) of the directed edges of each search path having its exit at the east side of the cell matrix to a wire, to thereby definitize a global path for the wire.

In operation S4-1010-5, the global-path definitizing unit 1222 assigns the flows (flow) of the directed edges of each search path having its exit at the south side of the cell matrix to a wire, to thereby definitize a global path for the wire.

In operation S4-1010-6, the global-path definitizing unit 1222 assigns the flows (flow) of the directed edges of each search path having its exit at the west side of the cell matrix to a wire, to thereby definitize a global path for the wire.

Details of operations S4-1010-3 to S4-1010-6 will be described next. Now, details of operation S4-1010-4 will be described as a representative example of the operations.

Figure 84:
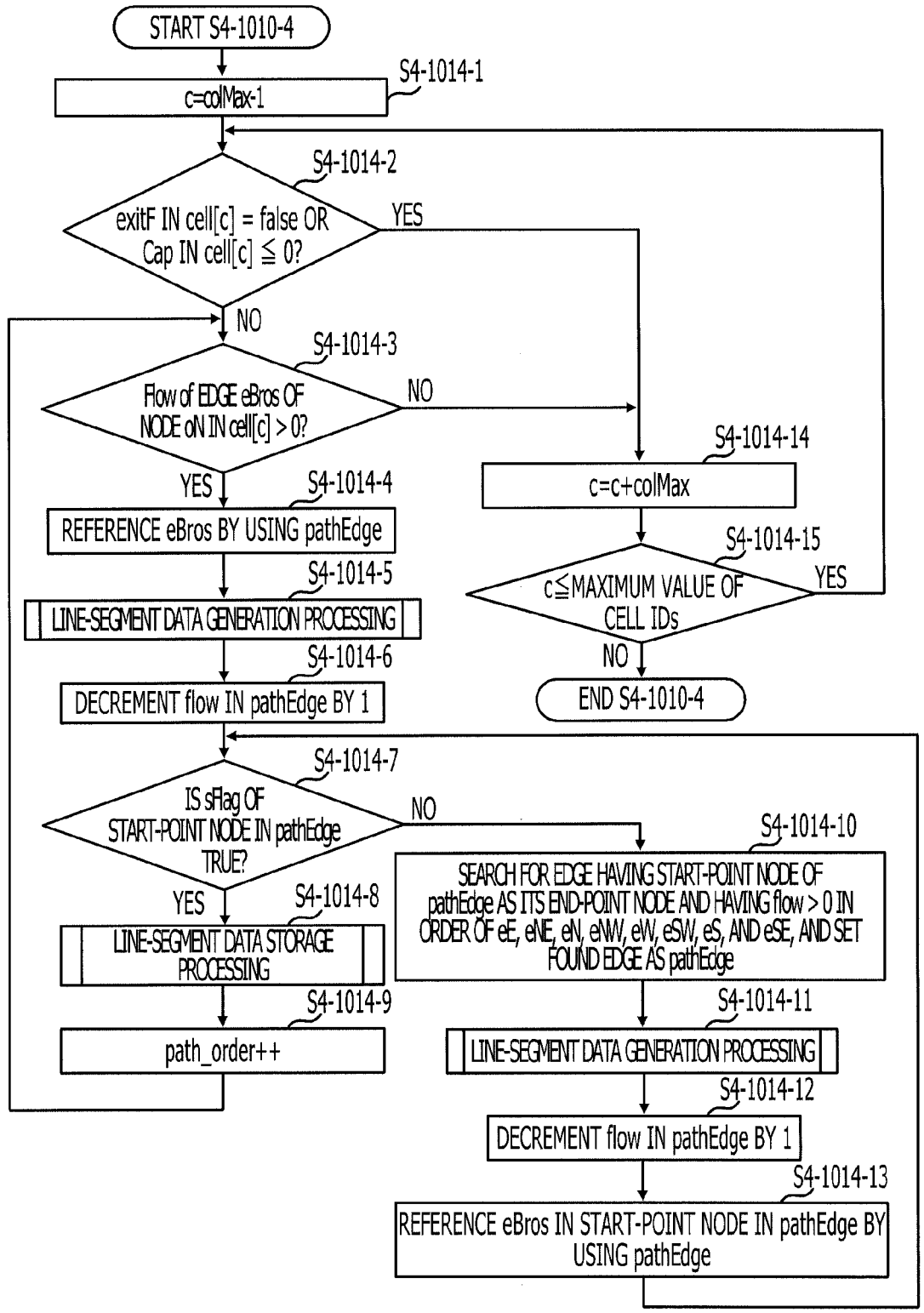
FIG. 84 is a flowchart of a procedure of processing for definitizing a global path based on a search path having its exit at the east side of a cell matrix.

FIG. 84 is a flowchart of a procedure of processing for definitizing a global path based on a search path having its exit at the east side of a cell matrix. The procedure in FIG. 84 will now be described in connection with FIG. 74. In the present embodiment, the exit of a search path is searched for clockwise along the perimeter of the cell matrix. Thus, for the east side, with respect to cells belonging to the east-end column of the cell matrix, the exit of a search path is searched for from the north-end row toward the south-end row.

In operation S4-1014-1, the global-path definitizing unit 1222 initializes the value of a variable c to colMax−1. The variable c is a suffix for, in the cell-data array "cell", an element (cell data) to be processed. Also, colMax denotes the number of cell columns. Thus, in the cell-data array "cell", the cell data (cell[c]) whose suffix is the initial value (colMax−1) of the variable c is the cell data of, in the east-end column, the cell in the north-end row.

In operations S4-1014-2, S4-1014-3, S4-1014-14, and S4-1014-15, a cell serving as the exit of the search path is searched for.

More specifically, in operation S4-1014-2, the global-path definitizing unit 1222 determines whether or not the egress flag (exitF) in the cell data to be processed is "false" (i.e., whether or not the cell data corresponds to a cell other than a cell at the perimeter) or whether or not the value of the capacity (cap) in the cell data is 0 or less.

When the result in operation S4-1014-2 is No, the process proceeds to operation S4-1014-3 in which the global-path definitizing unit 1222 determines whether or not the flow (flow) of the brother-node directed edge (eBros) in the node data of the egress node of the cell data to be processed is larger than 0.

When the result in operation S4-1014-2 is Yes or when the result in operation S4-1014-3 is No, this means that the cell data to be processed is the cell data of a cell that does not serve as the exit of the search path. Thus, in operation S4-1014-14, the global-path definitizing unit 1222 adds colMax to the value of the variable c and sets, as cell data to be processed, the cell data of the cell in a next row in the east-end column. In operation S4-1014-15, the global-path definitizing unit 1222 determines whether or not the value of the variable c is smaller than or equal to the maximum value of the cell IDs, i.e., whether or not an unprocessed row remains in the east-end column. When an unprocessed cell remains (Yes in S4-1014-15), the global-path definitizing unit 1222 repeats operation S4-1014-2 and the subsequent operations.

When the result in operation S4-1014-3 is Yes, this means that the cell data to be processed is the cell data of a cell serving as the exit of the search path. Accordingly, in S4-1014-4, by using a variable pathEdge, the global-path definitizing unit 1222 references the brother-node directed edge (eBros) in the node data of the egress node in the cell data to be processed. In the example of FIG. 74, the edge data of a directed edge e1 in a cell E1 in the seventh row is first referenced by pathEdge. The edge data referenced by pathEdge is hereinafter referred to as "edge data pathEdge". A change to the edge data pathEdge means a change to the edge data referenced by pathEdge (in this case, a change to the brother-node directed edge (eBros) in the node data of the egress node in the cell data to be processed).

In operation S4-1014-5, the global-path definitizing unit 1222 generates line-segment data corresponding to the flow (flow) in the edge data pathEdge.

Figure 85:
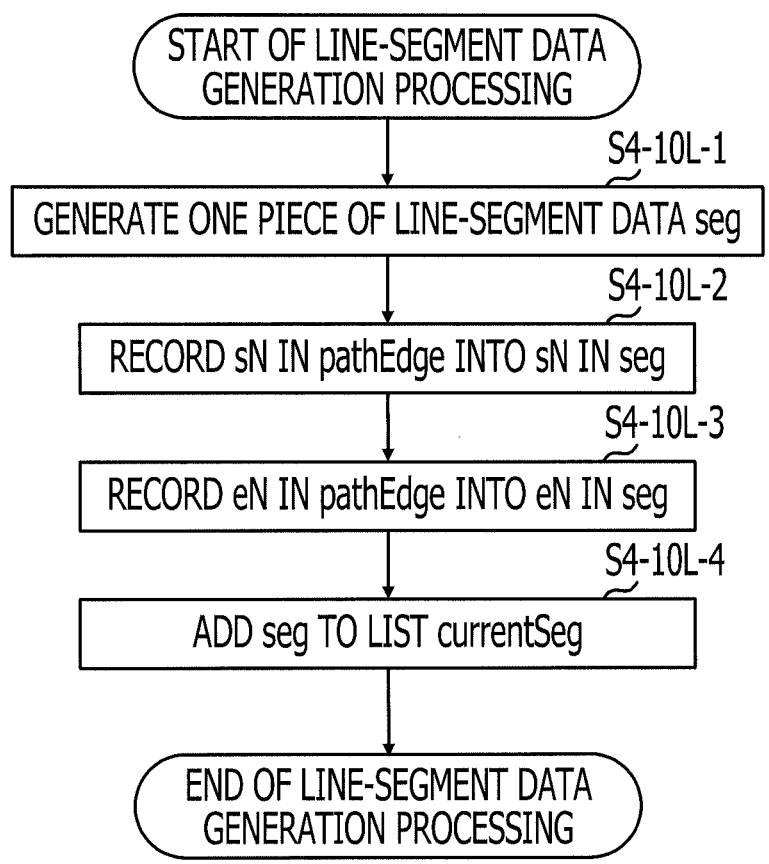
FIG. 85 is a flowchart of a procedure of generating line-segment data.

FIG. 85 is a flowchart of a procedure of generating line-segment data.

In operation S4-10L-1, the global-path definitizing unit 1222 generates one piece of line-segment data "seg" in the memory device 103.

FIG. 86 illustrates one example of the structure of the line-segment data. As illustrated, one piece of line-segment data is data representing a line segment included in a global path, and has member variables (data items), such as a start-point node ID (sN), an end-point node ID (eN), a net ID (netID), and an extraction order (order).

The start-point node ID (sN) is the node ID of the start-point node of the line-segment data. The end-point node ID (eN) is the node ID of the end-point node of the line-segment data. The net ID (netID) is the net ID of a wire to which the global path to which the line-segment data belongs corresponds. The extraction order (order) is an extraction order of the wire to which the global path to which the line-segment data belongs corresponds.

In operation S4-10L-2, the global-path definitizing unit 1222 records the value of the start-point node ID (sN) in the edge data pathEdge into the start-point node ID (sN) in the line segment data "seg". In operation S4-10L-3, the global-path definitizing unit 1222 records the value of the end-point node ID (eN) in the edge data pathEdge into the end-point node ID (eN) in the line segment data "seg". In operation S4-10L-4, the global-path definitizing unit 1222 adds the line-segment data "seg" to a list currentSeg. The list currentSeg has data or records for containing a collection (a list) of line-segment data that constitute one global path, and is generated in, for example, the memory device 103.

Referring back to FIG. 84, subsequent to operation S4-1014-5, the process proceeds to operation S4-1014-6 in which the global-path definitizing unit 1222 decrements the value of the flow (flow) in the edge data pathEdge by 1. As a result of operations S4-1014-5 and S4-1014-6, the edge data pathEdge is separated from the directed edge to serve as a line segment of the global path.

In operation S4-1014-7, the global-path definitizing unit 1222 determines whether or not the search source flag (sFlag) in the node data of the start-point node in the edge data pathEdge is "true". That is, a determination is made as to whether or not the processing has traced back to the ingress node (the origin of the wire) of the extraction-source cell. In the present embodiment, at a stage when operation S4-1014-7 is executed for the first time, the result of the determination is No, since the processing has traced back to only the start-point node of the directed edge e1.

When the result in operation S4-1014-7 is No, the process proceeds to operation S4-1014-10. In this operation, the global-path definitizing unit 1222 searches for the edge data of, of directed edges connected to the start point node of the edge data pathEdge, one piece of edge data having the start point node of the edge data pathEdge as its end point node and having a value of flow (flow) that is larger than 0, and then, newly references the found directed edge by using pathEdge. During the search of the directed edge, when multiple directed edges exist as candidates, one that lies at the right side in a direction in which the directed-edge traceback progresses is selected with priority. More specifically, the searching is performed in the order of the adjacent-east-cell node directed edge (eE), the adjacent-northeast-cell node directed edge (eNE), the adjacent-north-cell node directed edge (eN), the adjacent-northwest-cell node directed edge (eNW), the adjacent-west-cell node directed edge (eW), the adjacent-southwest-cell node directed edge (eSW), the adjacent-south-cell node directed edge (eS), and the adjacent-southeast-cell node directed edge (eSE).

The reason why the directed edges at the right side in the traceback progress direction are selected with priority is to ensure that the wire does not intersect another wire. That is, in the present embodiment, the searching for the exit of the search path is performed clockwise along the perimeter of the cell matrix. When the directed edges at the right side in the traceback progress direction are selected with priority on the basis of the premise described above, a global path that lies at the right side of the global path of interest is not generated. Thus, for example, when the searching for the exit of the search path is performed counterclockwise along the perimeter of the cell matrix, directed edges at the left side in the traceback progress direction may be selected with priority.

In the example of FIG. 74, at a stage when operation S4-1014-10 is executed for the first time, a directed edge e2 is found and is referenced by pathEdge.

In operation S4-1014-11, the global-path definitizing unit 1222 generates line-segment data for the flow (flow) of the new edge data pathEdge. Processing in this operation is performed as illustrated in FIG. 85. In operation S4-1014-12, the global-path definitizing unit 1222 decrements the value of the flow (flow) in the edge data pathEdge by 1. Subsequently, in operation S4-1014-13, by using the edge data pathEdge, the global-path definitizing unit 1222 newly references the brother-node directed edge (eBros) of the start-point node in the edge data pathEdge. In the example of FIG. 74, at a stage when operation S4-1014-13 is executed for the first time, a directed edge e3 is referenced by pathEdge.

Thereafter, the processing in operations S4-1014-10 to S4-1014-13 is repeated until the start-point node in the edge data pathEdge reaches the ingress node of the extraction-source cell. Consequently, in the example of FIG. 74, line-segment data are generated based on the flows (flow) of e3, e4, e5, e6, e7, e8, e9, e10, e11, e12, e13, e14, e15, and e16, subsequent to the directed edges e1 and e2 whose line-segment data have already been generated, and are then registered in the list currentSeg.

When the directed edge e17 is referenced by the edge data pathEdge, the determination in operation S4-1014-7 indicates Yes. When the result in operation S4-1014-7 is Yes, the global-path definitizing unit 1222 executes processing for storing the line-segment data in operation S4-1014-8.

Figure 87:
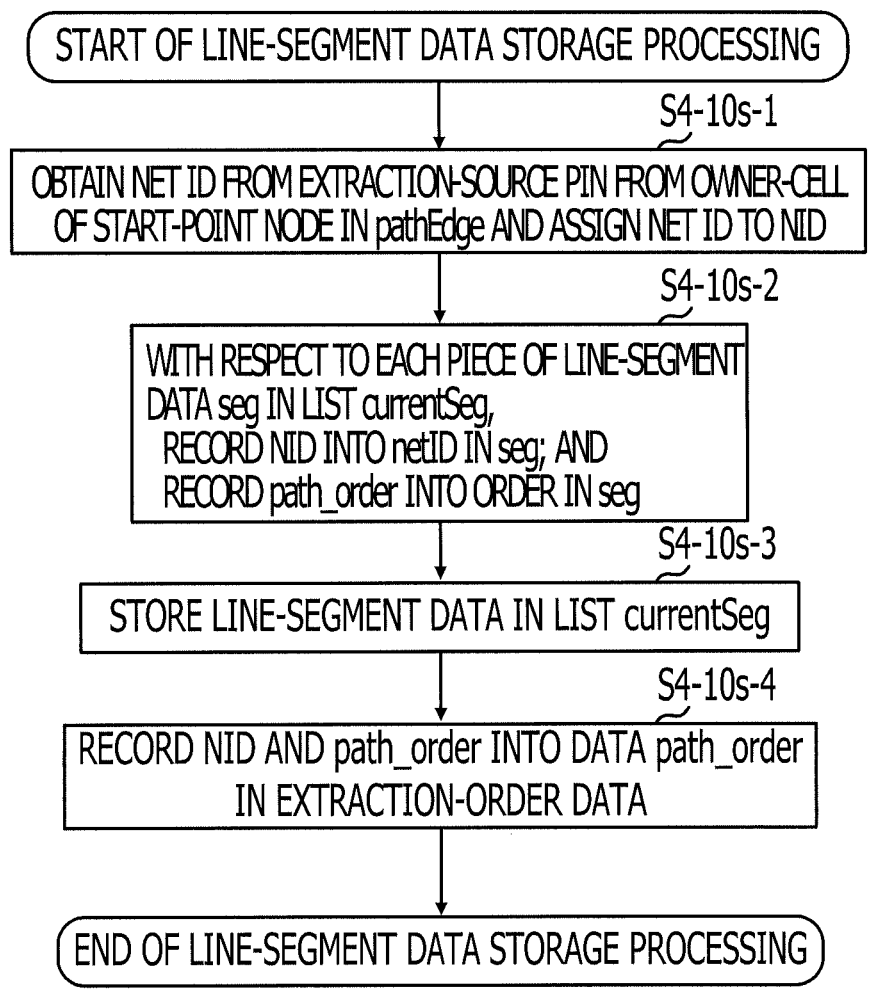
FIG. 87 is a flowchart of a procedure of processing for storing line-segment data.

FIG. 87 is a flowchart of a procedure of processing for storing line-segment data.

In operation S4-10s-1, the global-path definitizing unit 1222 obtains the value of the net ID (netID) in the cell data of the owner cell in the node data of the start-point node in the edge data pathEdge and assigns the obtained value to a variable NID. In the example of FIG. 74, at a stage when operation S4-10s-1 is executed for the first time, the net ID (netID) in the cell data of a cell S1 is assigned to the variable NID.

In operation S4-10s-2, the global-path definitizing unit 1222 records the value of NID into the net ID (netID) in each of the pieces of line-segment data "seg" registered in the list currentSeg and records the value (the initial value thereof is 0) of path_order into the extraction order (order).

In operation S4-10s-3, the global-path definitizing unit 1222 generates, in the auxiliary storage device 102, the pieces of line-segment data registered in the list currentSeg.

Subsequently, in operation S4-10s-4, the global-path definitizing unit 1222 records the value of NID into the net ID (netID) in the data indicated by the extraction order or path_order and records the value of path_order into the extraction order (order).

In the processing in FIG. 87, the line-segment data and the extraction order with respect to one global path are stored in the auxiliary storage device 102. The line-segment data is information indicating between which pins the wire passes through and indicating relative positional relationships of wires.

Referring back to FIG. 84, subsequent to operation S4-1014-8, the process proceeds to operation S4-1014-9 in which the global-path definitizing unit 1222 increments the value of path_order. The global-path definitizing unit 1222 then executes operation S4-1014-3. The reason why operation S4-1014-3 is executed again on the currently processed cell data without searching for a next cell serving as the exit of the search path is that there is a possibility that a flow (flow) remains in the directed edge (e.g., the directed edge e1 in the case of FIG. 74) in the cell corresponding to the currently processed cell data. When a flow remains in the directed edge (Yes in S4-1014-3), operation S4-1014-4 and the subsequent operations are executed. Consequently, in the example of FIG. 74, on the basis of the flows of the directed edges e1, e2, e3, e4, e5, e6, e7, e8, e9, e10, e11, e12, e13, e14, e15, e21, e22, and e23, line-segment data are generated and are stored. That is, a global path for a second wire to be extracted is definitized.

When no flow (flow) remains in the directed edge e1 of the cell E1 (No in S4-1014-3), the process proceeds to operation S4-1014-14 in which a cell E2 in the next row is selected as a cell to be processed. Operation S4-1014-4 and the subsequent operations are executed on the cell E2, so that, on the basis of the flows of directed edges e31, e32, e33, e34, e35, e36, e37, e38, e39, e40, and e41, line-segment data are generated and stored. That is, a global path for a third wire to be extracted is definitized.

Thereafter, operation S4-1014-2 and the subsequent operations are repeated, so that a total of six global paths are generated in the example (FIG. 74) in the present embodiment. That is, global routing in the present embodiment is completed. At a stage of detailed routing, the physical position of each wire may be determined based on the line-segment data and the extraction order.

Since the procedure of processing in operations S4-1010-3, S4-1010-5, and S4-1010-6 in FIG. 82 is apparent from the processing in FIG. 84, only a flowchart is illustrated and a detailed description thereof is not given hereinafter.

Figure 88:
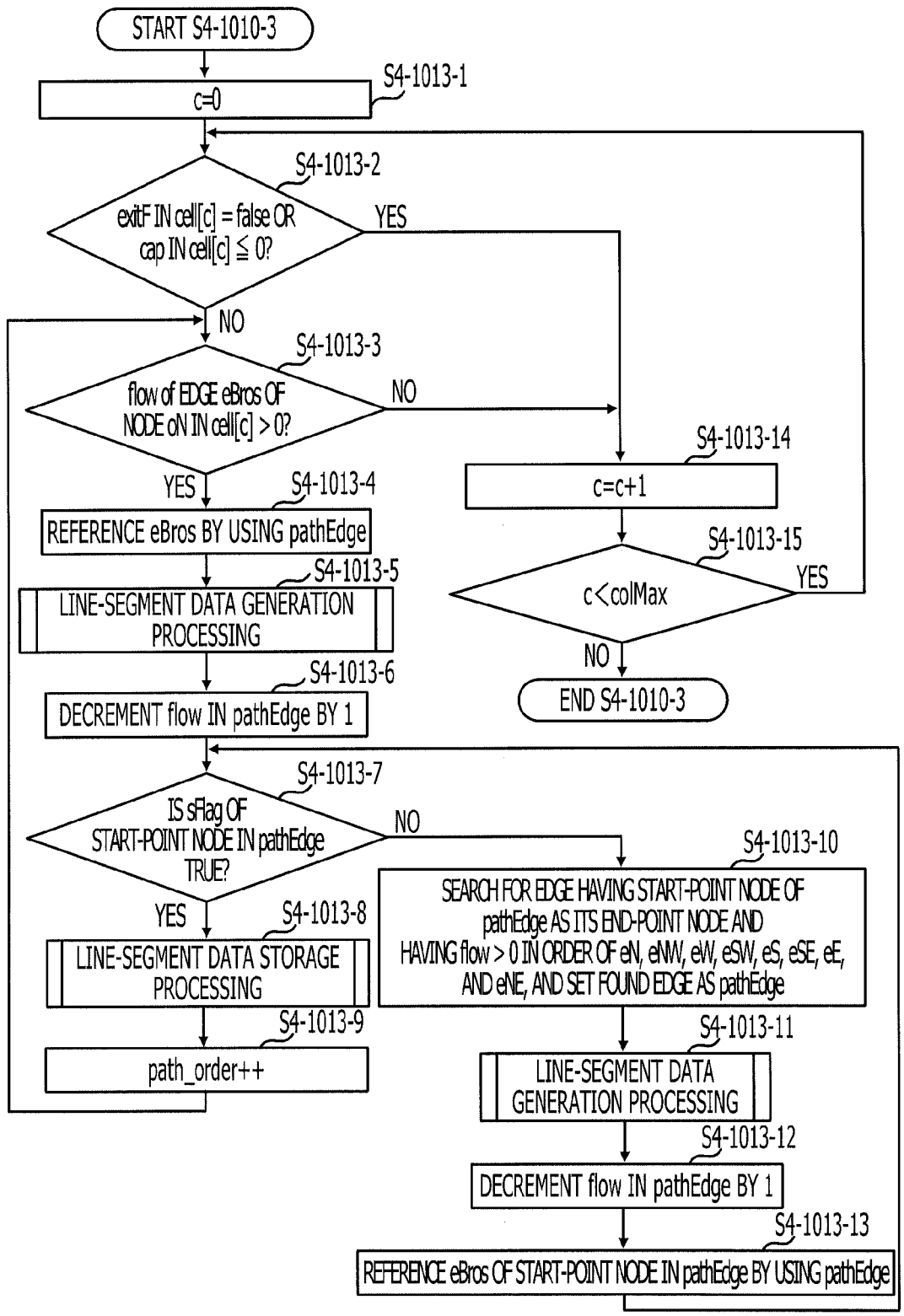
FIG. 88 is a flowchart of a procedure of processing for definitizing a global path based on a search path having its exit at the north side of a cell matrix.

FIG. 88 is a flowchart of a procedure of processing for definitizing a global path based on a search path having its exit at the north side of the cell matrix. That is, FIG. 88 is a flowchart illustrating details of operation S4-1010-3. In FIG. 88, with respect to cells belonging to the north-end row in the cell matrix, the exit of a search path is searched for from the west-end column toward the east-end column (i.e., clockwise) (refer to S4-1013-1, S4-1013-14, and S4-1013-15).

In operation S4-1013-10, in order to ensure that directed edges at the right side in the traceback progress direction are selected with priority, the searching is performed in the order of the adjacent-north-cell node directed edge (eN), the adjacent-northwest-cell node directed edge (eNW), the adjacent-west-cell node directed edge (eW), the adjacent-southwest-cell node directed edge (eSW), the adjacent-south-cell node directed edge (eS), the adjacent-southeast-cell node directed edge (eSE), the adjacent-east-cell node directed edge (eE), and the adjacent-northeast-cell node directed edge (eNE).

Figure 89:
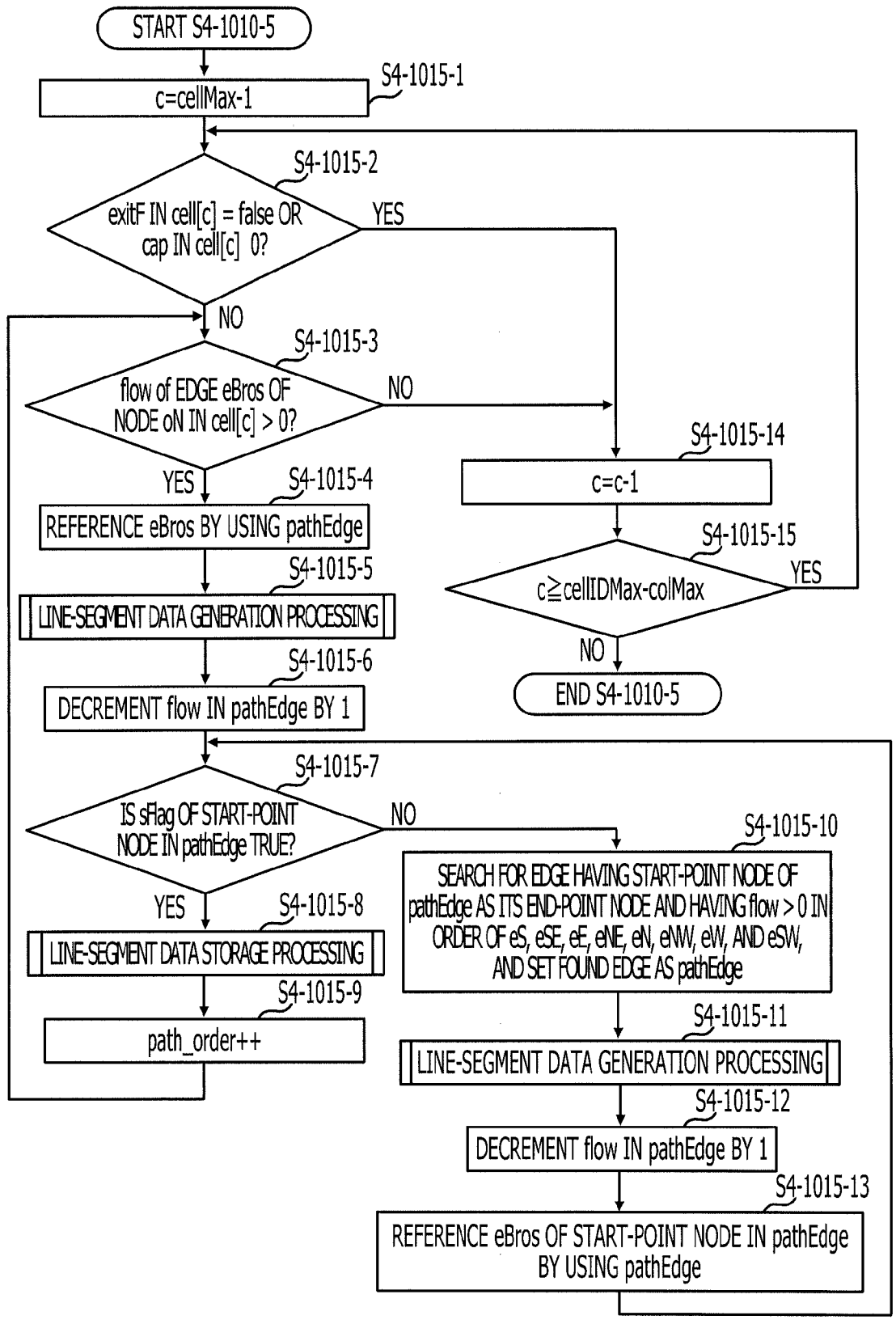
FIG. 89 is a flowchart of a procedure of processing for definitizing a global path based on a search path having its exit at the south side of a cell matrix.

FIG. 89 is a flowchart of a procedure of processing for definitizing a global path based on a search path having its exit at the south side of the cell matrix. That is, FIG. 89 is a flowchart illustrating details of operation S4-1010-5. In FIG. 89, with respect to cells belonging to the south-end row in the cell matrix, the exit of a search path is searched for from the east-end column toward the west-end column (i.e., clockwise) (refer to S4-1015-1, S4-1015-14, and S4-1015-15).

In operation S4-1015-10, in order to ensure that directed edges at the right side in the traceback progress direction are selected with priority, the searching is performed in the order of the adjacent-south-cell node directed edge (eS), the adjacent-southeast-cell node directed edge (eSE), the adjacent-east-cell node directed edge (eE), the adjacent-northeast-cell node directed edge (eNE), the adjacent-north-cell node directed edge (eN), the adjacent-northwest-cell node directed edge (eNW), the adjacent-west-cell node directed edge (eW), and the adjacent-southwest-cell node directed edge (eSW).

Figure 90:
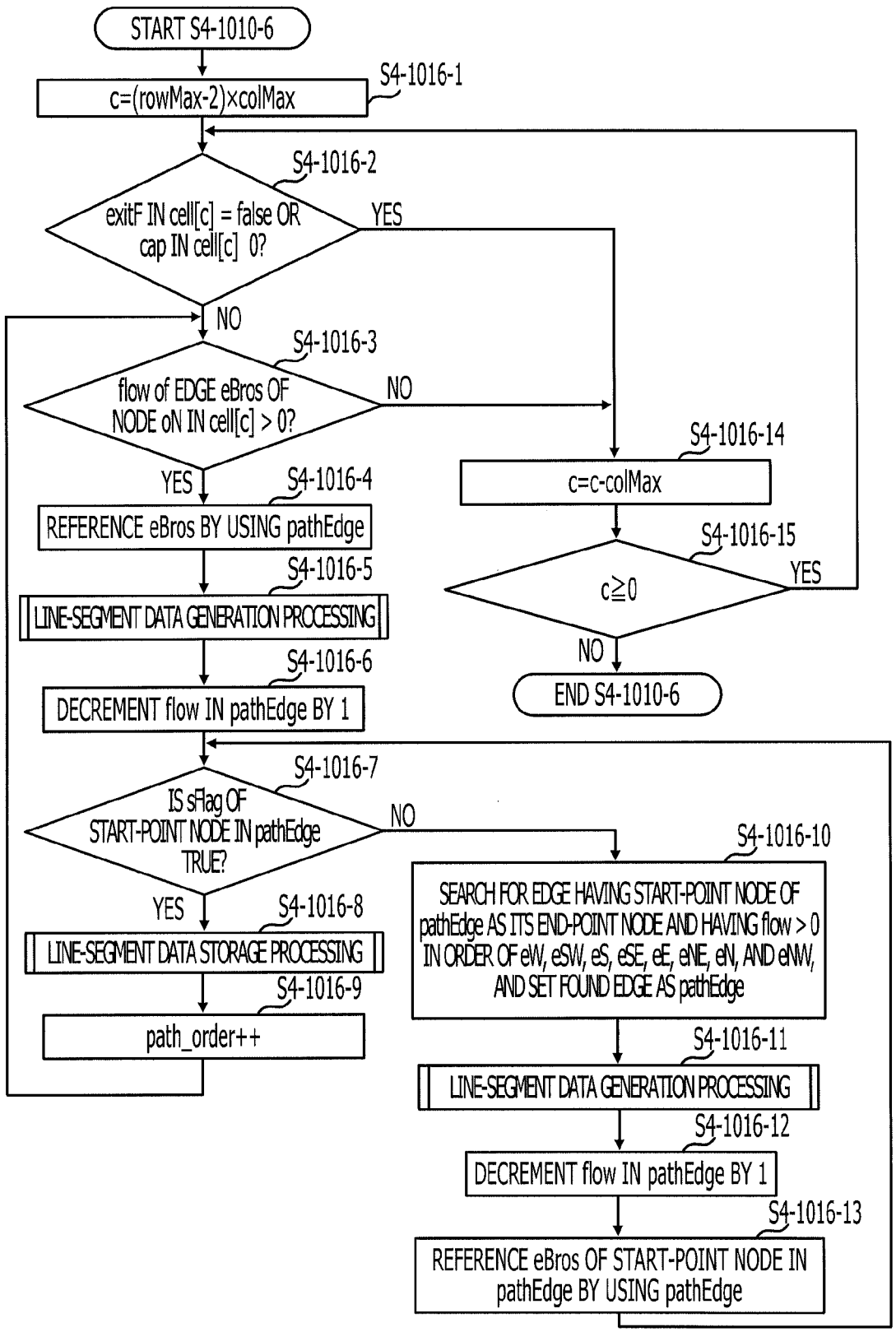
FIG. 90 is a flowchart of a procedure of processing for definitizing a global path based on a search path having its exit at the west side of a cell matrix.

FIG. 90 is a flowchart of a procedure of processing for definitizing a global path based on a search path having its exit at the west side of the cell matrix. That is, FIG. 90 is a flowchart illustrating details of operation S4-1010-6. In FIG. 90, with respect to cells belonging to the west-end column in the cell matrix, the exit of a search path is searched for from the south-end row toward the north-end row (i.e., clockwise) (refer to S4-1016-1, S4-1016-14, and S4-1016-15).

In operation S4-1016-10, in order to ensure that directed edges at the right side in the traceback progress direction are selected with priority, the searching is performed in the order of the adjacent-west-cell node directed edge (eW), the adjacent-southwest-cell node directed edge (eSW), the adjacent-south-cell node directed edge (eS), the adjacent-southeast-cell node directed edge (eSE), the adjacent-east-cell node directed edge (eE), the adjacent-northeast-cell node directed edge (eNE), the adjacent-north-cell node directed edge (eN), and the adjacent-northwest-cell node directed edge (eNW).

The above description has been given of an example in which the exit of a search path is searched for through scanning of all cells at the perimeter of the cell matrix. The arrangement, however, may also be such that a node connected to a target node T via directed edges is set as the exit of the search path and the directed edges are traced back from the node. The node may be specified based on the edge data registered in targetEdgeList in the node data of the target node T. When the number of nodes connected to the target node T via directed edges is plural, nodes to be traced back may be sequentially selected in a certain direction (clockwise in the present embodiment) along the perimeter of the cell matrix.

Details of operation S4-10-11 in FIG. 72 will be described next.

Figure 91:
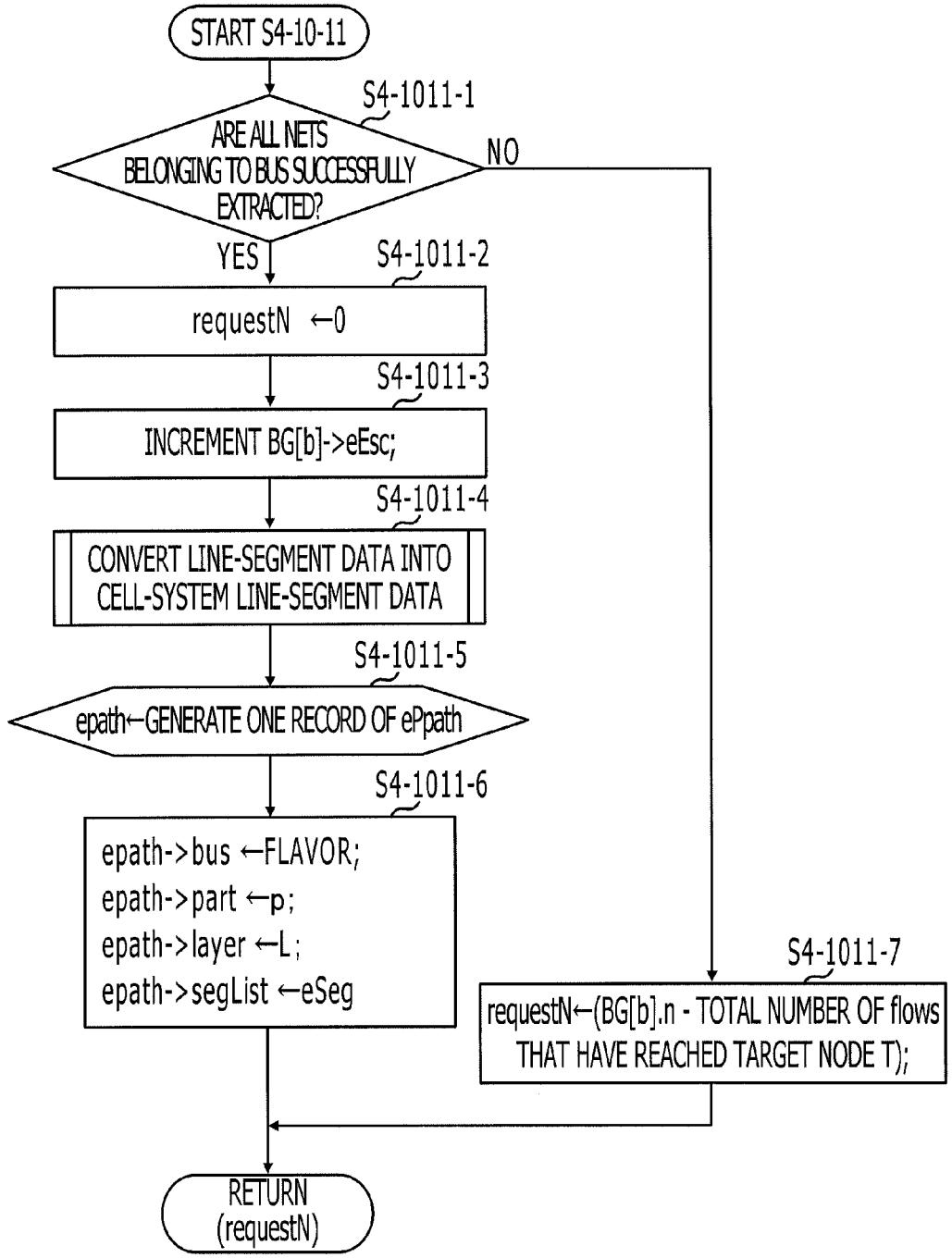
FIG. 91 is a flowchart of a procedure of processing for determining success/failure of wire extraction for an attention bus and processing for storing extraction-path information.

FIG. 91 is a flowchart of a procedure of processing for determining success/failure of wire extraction for an attention bus and processing for storing extraction-path information.

In operation S4-1011-1, the extraction-success/failure determining unit 1223 determines whether or not wires for all nets belonging to the attention bus are successfully extracted. This determination may be made based on whether or not wires corresponding to the number "n" of nets which is indicated by the bus information B of the attention bus have reached the target node T. The number of wires that have reached the target node T is equal to the total number of flows (flow) in the edge data in which the end-point nodes are the target node T.

When wires for all nets belonging to the attention bus are successfully extracted (Yes in S4-1011-1), the extraction-success/failure determining unit 1223 assigns 0 to a variable requestN in operation S4-1011-2. This variable requestN is substantially identical to the variable requestN used in operation S4-10-12 in FIG. 72. In operation S4-1011-3, the extraction-success/failure determining unit 1223 adds 1 to the number "nEsc" of extraction successes which is indicated by the bus information B of the attention bus. The addition is performed because all nets belonging to the attention bus have been successfully extracted from one component (the attention component).

In operation S4-1011-4, the extraction-success/failure determining unit 1223 converts all of the line-segment data (FIG. 86), stored in the auxiliary storage device 102, into cell-system line-segment data.

FIG. 92 illustrates one example of the structure of the cell-system line-segment data. As illustrated, the cell-system line-segment data has member variables (data items), such as a start-point column number (x1), a start-point row number (y1), an end-point column number (x2), an end-point row number (y2), a layer number (layer), a net ID (netID), and next data (next).

The start-point column number (x1) denotes, in a cell matrix, the column number of the start point of a line segment. The start-point row number (y1) denotes, in the cell matrix, the row number of the start point of the line segment. The end-point column number (x2) denotes, in the cell matrix, the column number of the end point of the line segment. The end-point row number (y2) denotes, in the cell matrix, the row number of the end point of the line segment. The layer number (layer) denotes the layer number of a layer to which a net (a wire) to which the line segment corresponds belongs. The next data (next) denotes a pointer to next cell-system line-segment data, the pointer being used in order to form a list structure of the cell-system line-segment data.

Thus, the cell-system line-segment data is data that specifies a line segment by expressing the start point and the end point of the line segment by using the row number and the column number of the cells. The line-segment data (FIG. 86) is data that specifies a line segment by using nodes in a directed graph. In operation S4-1011-4, the line-segment data is converted from the node-based coordinate system into a cell-matrix coordinate system.

In operation S4-1011-5, the extraction-success/failure determining unit 1223 generates one piece of extraction-path data ePath in the memory device 103.

FIG. 93 illustrates one example of the structure of the extraction-path data. As illustrated, the extraction-path data ePath is data indicating wire extraction paths for nets belonging to a bus, and has member variables (data items), such as a bus ID (bus), a component ID (part), a layer number (layer), and a path line-segment list (segList).

The bus ID (bus) is the bus ID of a bus corresponding to an extraction path. The component ID (part) is the component ID of a component corresponding to the extraction path. The layer number (layer) is the layer number of a layer associated with the extraction path. The path line-segment list (segList) indicates a pointer to a first piece of cell-system line-segment data in a list of cell-system line-segment data indicating wire extraction paths.

In operation S4-1011-6, the extraction-success/failure determining unit 1223 assigns values to the member variables of the generated extraction-path data ePath. More specifically, the value (the bus ID of the attention bus) of the variable FLAVOR is assigned to the bus ID (bus), the component ID of the attention component is assigned to the component part ID (part), the layer number of the attention layer L is assigned to the layer number (layer), and the pointer to the list of cell-system line-segment data generated by the conversion performed in operation S4-1011-4 is assigned to the path line-segment list (segList).

On the other hand, when a wire or wires for at least one of the nets belonging to the attention bus is not successfully extracted (No in S4-1011-1), the process proceeds to operation S4-1011-7. In this operation, the extraction-success/failure determining unit 1223 assigns a value, obtained by subtracting the number of wires that have reached the target node T from the number "n" of nets which is indicated by the bus information B of the attention bus, to the variable requestN.

Figure 94:
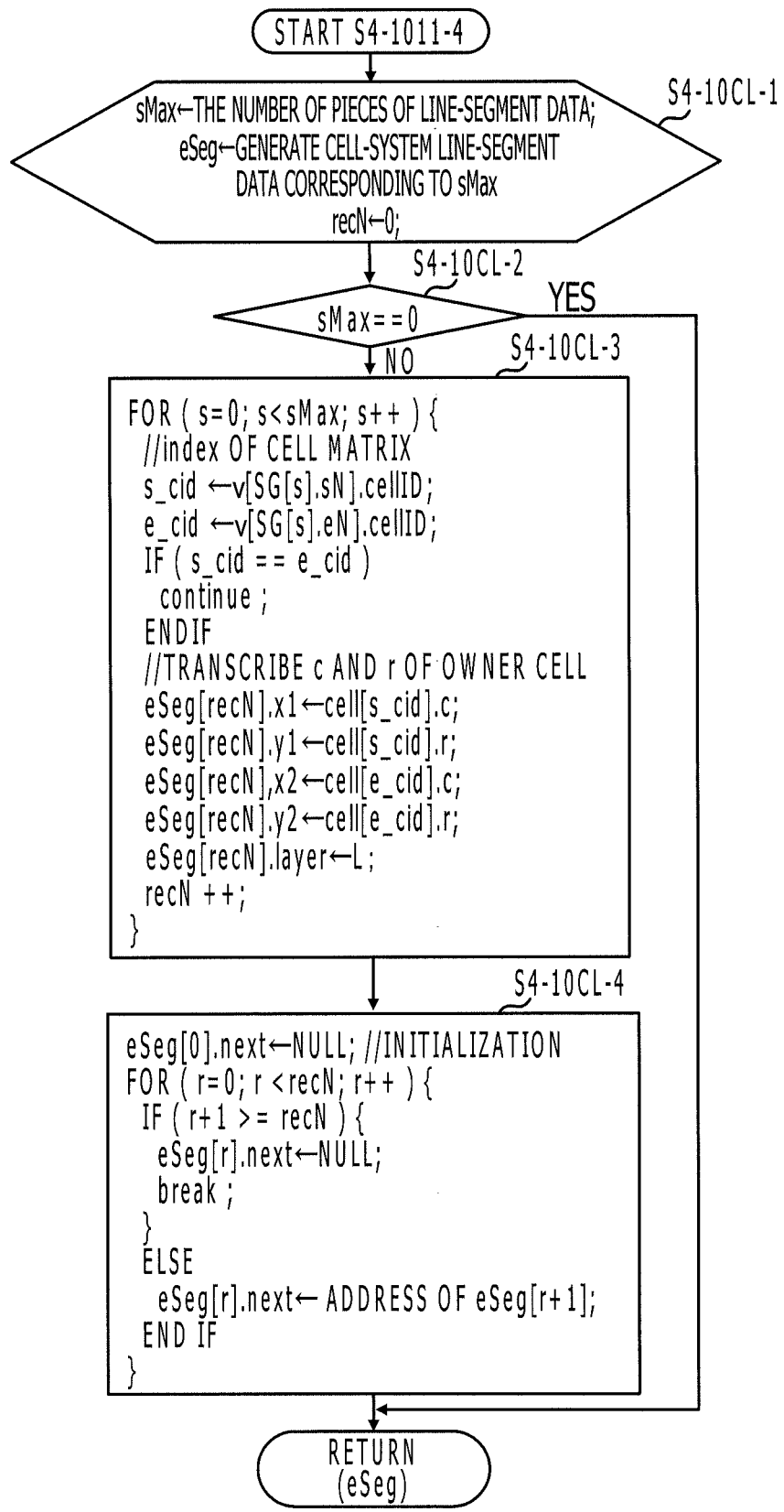
FIG. 94 is a flowchart of a procedure of processing for converting line-segment data into cell-system line-segment data.

Details of operation S4-1011-4 will be described next. FIG. 94 is a flowchart of a procedure of processing for converting line-segment data into cell-system line-segment data.

In operation S4-10CL-1, the extraction-success/failure determining unit 1223 generates pieces of cell-system line-segment data corresponding to the total number of pieces of line-segment data. Subsequently, when the total number of pieces of line-segment data is not 0 (No in S4-10CL-2), the extraction-success/failure determining unit 1223 executes operations S4-10CL-3 and S4-10CL-4.

More specifically, in operation S4-10CL-3, the extraction-success/failure determining unit 1223 executes processing below for each piece of line-segment data. First, a determination is made as to whether or not the cell ID of the owner cell of the start-point node in the line segment data and the cell ID of the owner cell of the end-point node in the line-segment data are the same. When the cell IDs are the same, next line-segment data is selected as data to be processed. When the cell IDs are different from each other, i.e., when the owner cell of the start-point node and the owner cell of the end-point node are different from each other, values are assigned to the member variables of the cell-system line-segment data corresponding to the line-segment data of interest. That is, the column number of the owner cell of the start-point node in the line-segment data is assigned to the start-point column number (x1). The row number of the owner cell of the start-point node in the line-segment data is assigned to the start-point row number (y1). The column number of the owner cell of the end-point node in the line-segment data is assigned to the end-point column number (x2). The row number of the owner cell of the end-point node in the line-segment data is assigned to the end-point row number (y2). The layer number of the attention layer L is assigned to the layer number (L). The net ID of the line segment data is assigned to the net ID (netID).

In operation S4-10CL-4, the extraction-success/failure determining unit 1223 couples valid cell-system line-segment data to a list structure. That is, the pointer in the next piece of cell-system line-segment data is assigned to the next data (next) in each piece of cell-system line-segment data. NULL is assigned to the next data (next) in the last piece of the cell-system line-segment data. The valid cell-system line-segment data refers to cell-system line-segment data in which the values are assigned to the member variables in operation S4-10CL-3.

Figure 95:
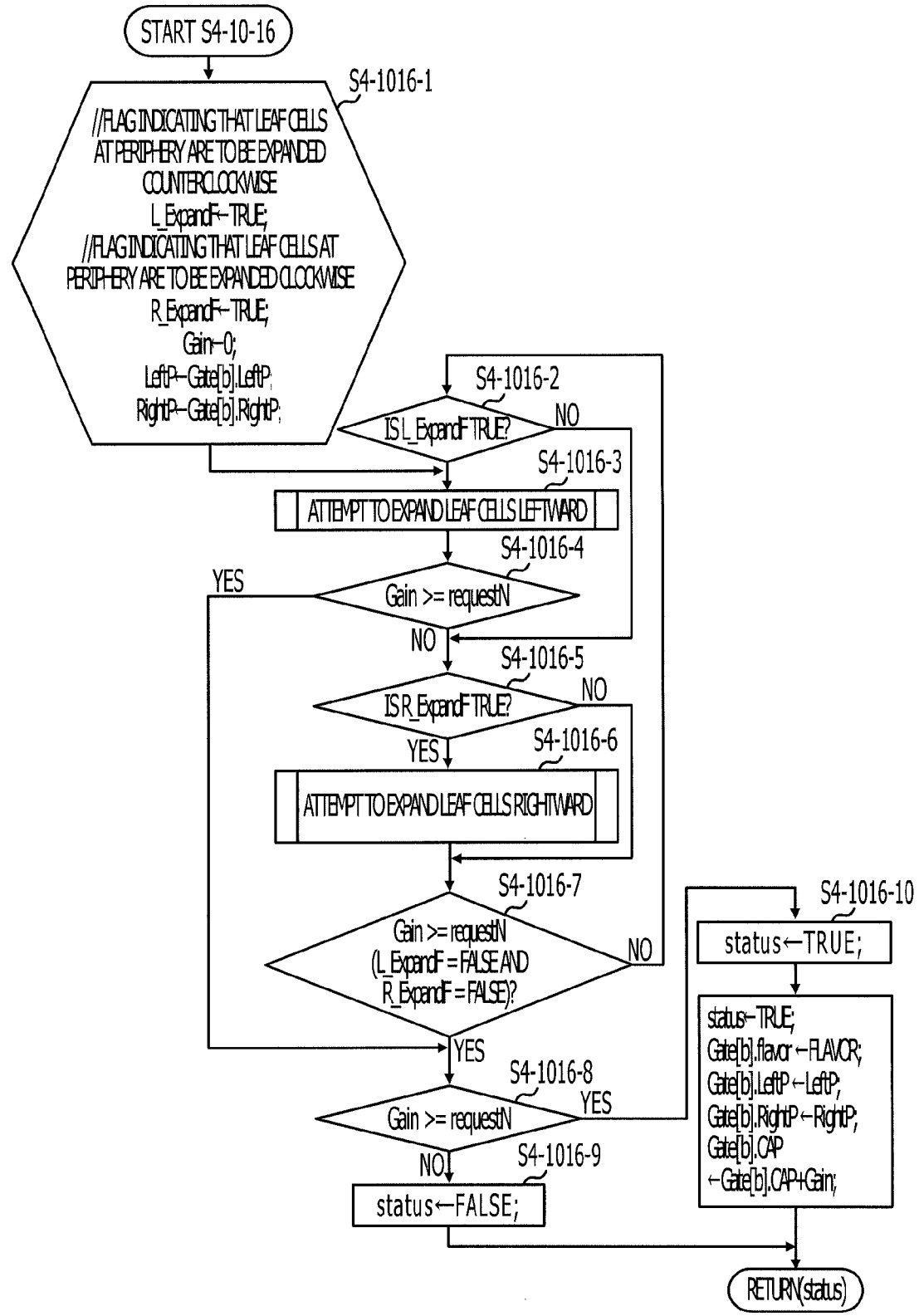
FIG. 95 is a flowchart of a procedure of processing for adding an egress cell.

Details of operation S4-10-16 in FIG. 72 will be described next. FIG. 95 is a flowchart of a procedure of processing for adding an egress cell. The processing in FIG. 72 is analogous to the processing in operation S4-9413-9 and the subsequent operations in FIG. 62.

In operation S4-1016-1, the extraction wiring unit 122 initializes the value of a flag variable indicating whether or not the leaf cells in the wire-escape-exit portion for the attention bus are to be expanded. More specifically, TRUE is assigned to a flag variable L_ExpandF indicating whether the leaf cells are to be expanded counterclockwise (i.e., leftward). TRUE is also assigned to a flag variable R_ExpandF indicating whether the leaf cells are to be expanded clockwise (i.e., rightward). That is, initially, both of the directions are set as candidates for the expansion directions. A variable Gain for storing the number of cells successfully acquired as cells to be added as egress cells is initialized to 0. The value of the left-end cell (LeftP) in the wire-escape-exit data Gate (FIG. 63) for the attention bus is assigned to the variable LeftP for storing the left end of the egress cells. The value of the right-end cell (RightP) in the wire-escape-exit data Gate (FIG. 63) for the attention bus is assigned to the variable RightP for storing the right end of the egress cells.

In operation S4-1016-2, the extraction wiring unit 122 determines whether or not the value of L_ExpandF is TRUE. When the value of L_ExpandF is not TRUE (No in S4-1016-2), the process proceeds to operation S4-1016-5. When the value of L_ExpandF is TRUE (Yes in S4-1016-2), the process proceeds to operation S4-1016-3 in which the extraction wiring unit 122 attempts to expand the leaf cells leftward with respect to the wire-escape-exit portion for the attention bus. When the expansion succeeds, the value of the variable Gain is increased by an amount corresponding to the capacity of the expanded cell(s), and the value of the variable LeftP is updated to the pointer to the cell data of the expanded cell. When the expansion fails, the value of L_ExpandF is updated to FALSE.

In operation S4-1016-4, the extraction wiring unit 122 determines whether or not the value of the variable Gain is larger than or equal to the variable requestN. That is, a determination is made as to whether or not wire escape exits corresponding to the number of wires that were not successfully extracted have been added. When the value of the variable Gain is larger than or equal to the value of the variable requestN (Yes in S4-1016-4), the extraction wiring unit 122 ends the leaf-cell expansion and the process proceeds to operation S4-1016-8. When the value of the variable Gain is smaller than the value of the variable requestN (No in S4-1016-4), the process proceeds to operation S4-1016-5 in which the extraction wiring unit 122 determines whether or not the value of R_ExpandF is TRUE.

When the value of R_ExpandF is not TRUE (No in S4-1016-5), the process proceeds to operation S4-1016-7. When the value of R_ExpandF is TRUE (Yes in S4-1016-5), the process proceeds to operation S4-1016-6 in which the extraction wiring unit 122 attempts to expand the leaf cells rightward with respect to the wire-escape-exit portion for the attention bus. When the expansion succeeds, the value of the variable Gain is increased by an amount corresponding to the capacity of the expanded cell(s), and the value of the variable RightP is updated to the pointer to the cell data of the expanded cell. When the expansion fails, the value of R_ExpandF is updated to FALSE.

In operation S4-1016-7, the extraction wiring unit 122 determines whether or not the value of the variable Gain is larger than or equal to the value of the variable requestN or whether or not both of the values of L_Expand and R_Expand are FALSE. When the value of the variable Gain is smaller than the value of the variable requestN and at least one of the values of L_Expand and R_Expand is TRUE (No in S4-1016-7), the extraction wiring unit 122 repeats the processing in operation S4-1016-2 and the subsequent operations.

When the value of the variable Gain is larger than or equal to the value of the variable requestN or both of the values of L_Expand and R_Expand are FALSE (Yes in S4-1016-7) and when the value of the variable Gain is smaller than or equal to the value of the variable requestN (No in S4-1016-8), the extraction wiring unit 122 assigns FALSE to a variable Status in operation S4-1016-9. When the value of the variable Gain is larger than or equal to the value of the variable requestN (Yes in S4-1016-8), the extraction wiring unit 122 assigns TRUE to the variable Status in operation S4-1016-10. Subsequently, in operation S4-1016-11, the extraction wiring unit 122 updates the wire-escape-exit data Gate for the attention bus. That is, the value of the variable FLAVOR is recorded in the protection-wall color (flavor) in the wire-escape-exit data Gate. The value of the variable LeftP is recorded in the left-end cell (LeftP) in the wire-escape-exit data Gate. The value of the variable RightP is also recorded in the right-end cell (RightP) in the wire-escape-exit data Gate. The value of the variable Gain is further added to the capacity (CAP) in the wire-escape-exit data Gate.

In the processing in operation S4-1016-3, the variable CAP in the processing described with reference to FIG. 64 may be replaced with the variable Gain. Similarly, in the processing in operation S4-1016-6, the variable CAP in the processing described with reference to FIG. 65 may be replaced with the variable Gain.

Detailed description of operation S4 is finished at this point. Next, a description will be given of details of the processing, performed by the wiring-plan generating unit 11, in operation S5 in FIG. 3.

Figure 96:
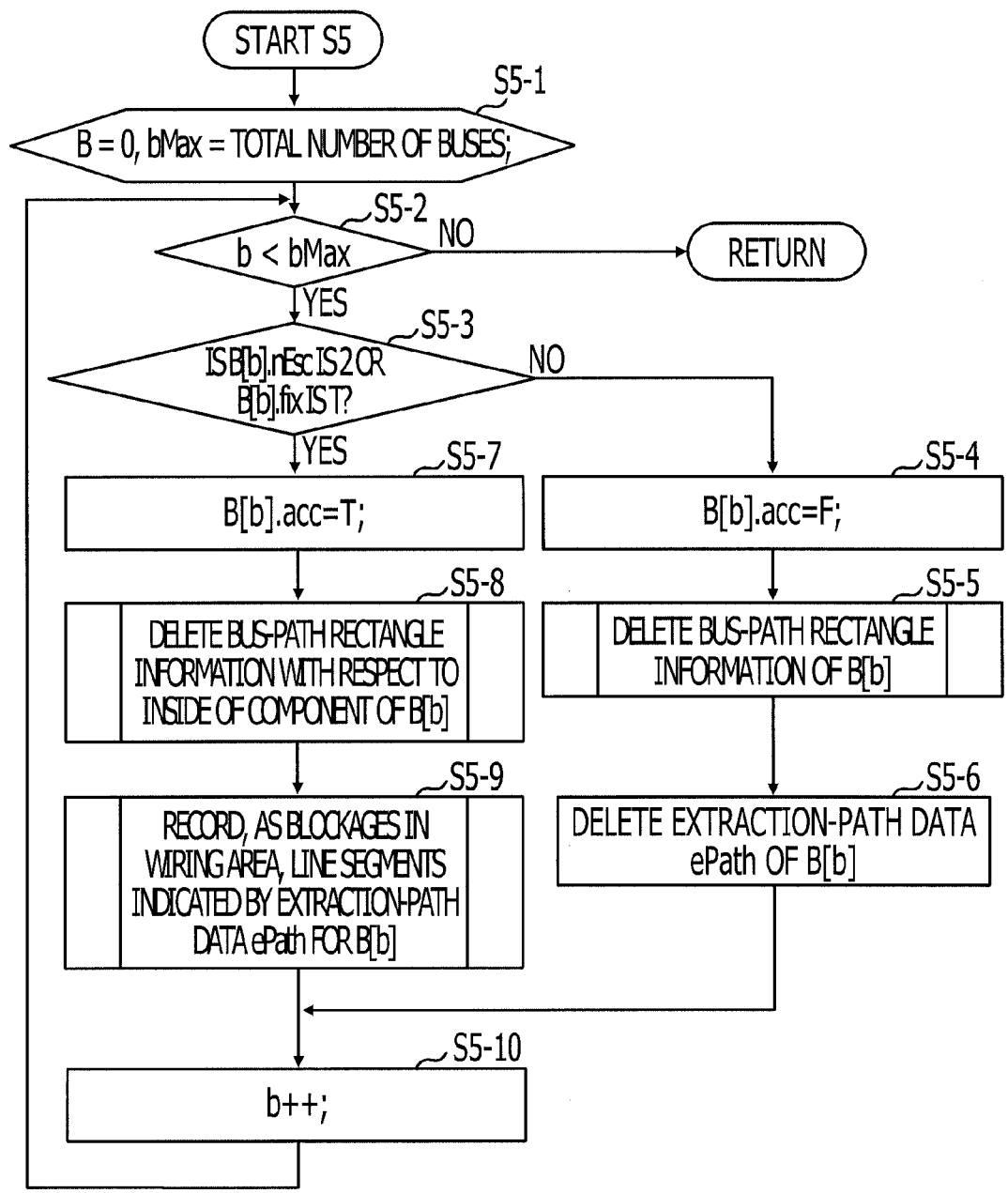
FIG. 96 is a flowchart of a procedure of processing for definitizing a wiring plan affirmed to be adequate.

FIG. 96 is a flowchart of a procedure of processing for definitizing a wiring plan affirmed to be adequate. In FIG. 96, operations S5-3 to S5-9 are executed for each of the buses (i.e., for each piece of the bus information B) registered in the bus-information storage section D5.

In operation S5-3, the wiring-plan generating unit 11 determines whether or not the value of the number "nEsc" of the extraction successes which is registered in the bus information B (see FIG. 8) of the attention bus (i.e., the bus to be processed) is 2 or whether or not the value of the path fix flag "fix" is "T". That is, a determination is made as to whether or not extraction of wires for all nets belonging to both ends of the attention bus is successful or whether or not the bus path is fixed.

When extraction of a wire for at least one of nets belonging to the both ends of the attention bus is not successful and the bus path of the attention bus is not fixed (No in S5-3), the process proceeds to operation S5-4 in which the wiring-plan generating unit 11 sets "F" for the value of the path definite flag "acc" in the bus information B of the attention bus. In operation S5-5, the wiring-plan generating unit 11 deletes the bus-path rectangle information BR of the attention bus from the bus-path rectangle-information storage section D9. Subsequently, in operation S5-6, the wiring-plan generating unit 11 deletes all extraction-path data ePath in which the bus IDs (bus) match the bus ID of the attention bus.

That is, the bus-path rectangle information, the extraction-path data ePath, and so on generated for the attention bus this time are deleted in order to re-execute wiring planning for the attention bus.

When extraction of wires for all nets belonging to the both ends of the attention bus is successful and the bus path of the attention bus is fixed (Yes in S5-3), the process proceeds to operation S5-7 in which the wiring-plan generating unit 11 sets "T" for the value of the path definite flag "acc" in the bus information B of the attention bus. In operation S5-8, the wiring-plan generating unit 11 deletes, from the bus-path rectangle-information storage section D9, a portion that is included in the bus-path rectangle information BR for the attention bus B and that is included in the component (i.e., a portion that overlaps that component) at the target side or the source side. Subsequently, in operation S5-9, the wiring-plan generating unit 11 records, as blockages in the wiring area, line segments indicated by the path line-segment list (segList) in all extraction-path data ePath in which the bus IDs (bus) match the bus ID of the attention bus.

That is, in operations S5-5 and S5-6, simple rectangle information regarding a portion in which the component and the attention bus overlap is replaced with the line-segment information indicating detailed wire paths for respective bus nets. With this arrangement, while operation S2 and the subsequent operations are re-executed on a bus for which a wiring plan is not definitized, a path for the bus can be generated based on more accurately determined blockages.

Figure 97:
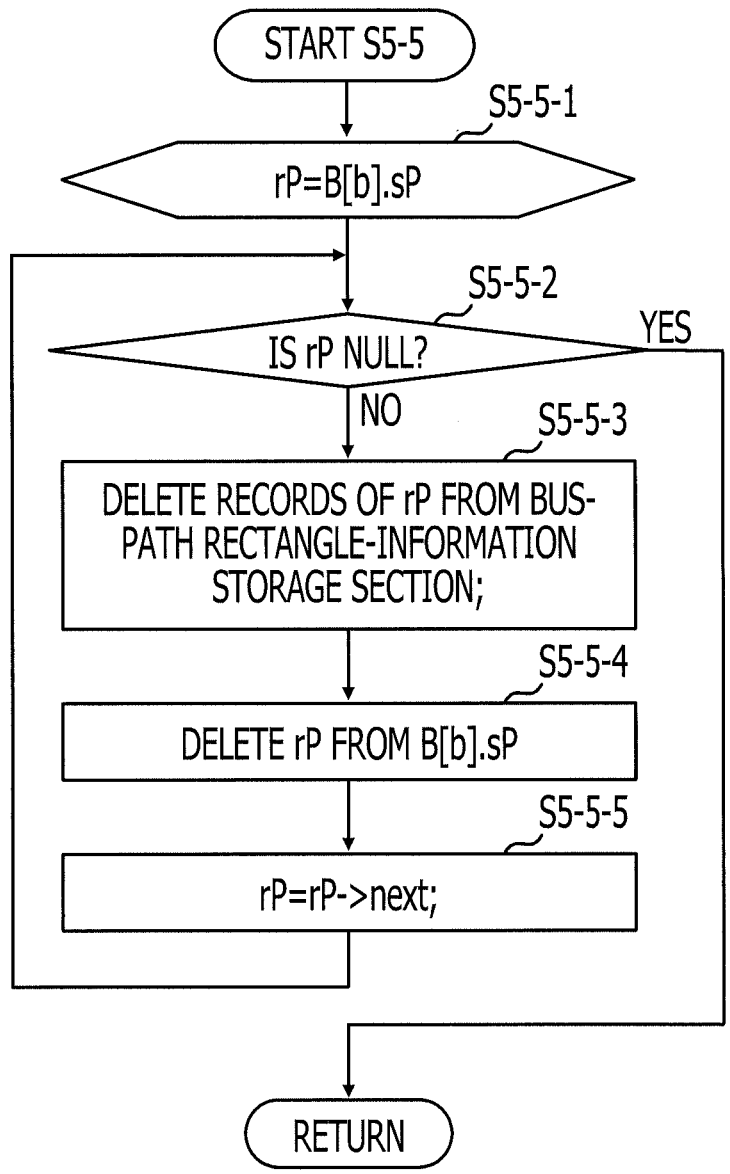
FIG. 97 is a flowchart of a procedure of processing for deleting the bus-path rectangle information.

Details of operation S5-5 will be described next. FIG. 97 is a flowchart of a procedure of processing for deleting the bus-path rectangle information. Through operations S5-5-1, S5-5-2, and S5-5-5, the wiring-plan generating unit 11 executes operations S5-5-3, and S5-5-4 on each of the pieces of bus-path rectangle information BR (FIG. 12) linked to a path rectangle list sP in the bus information B of the attention bus.

In operation S5-5-3, the wiring-plan generating unit 11 deletes the bus-path rectangle information BR to be processed from the bus-path rectangle-information storage section D9. Subsequently, in operation S5-5-4, the wiring-plan generating unit 11 deletes, from the bus-path rectangle list sP in the bus information B of the attention bus, the link to the bus-path rectangle information BR.

Figure 98:
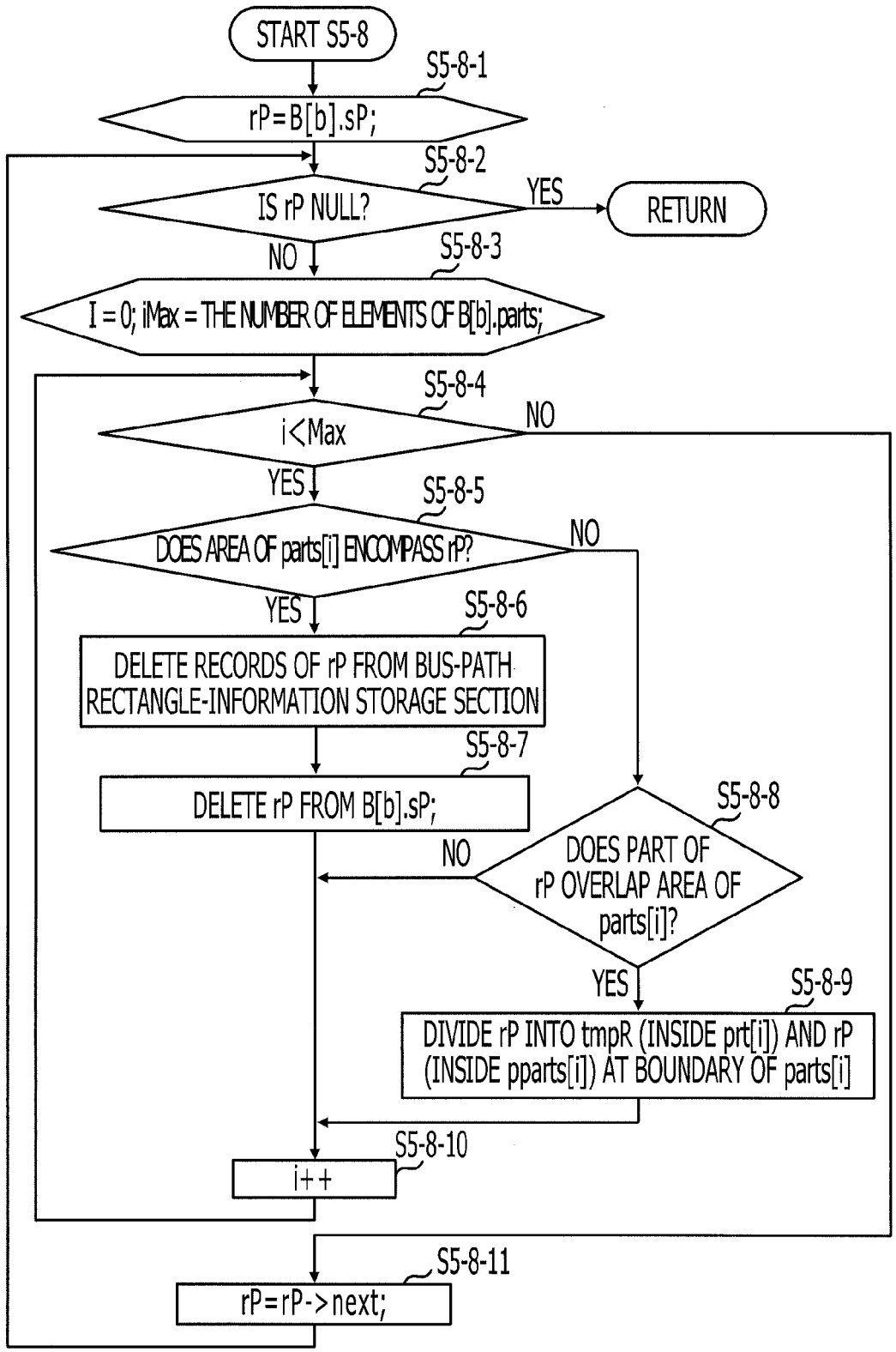
FIG. 98 is a flowchart of a procedure of processing for deleting the information of bus-path rectangles included in a component.

Details of operation S5-8 in FIG. 96 will be described next. FIG. 98 is a flowchart of a procedure of processing for deleting the information of bus-path rectangles included in a component. Through operations S5-8-1 to S5-8-4, S5-8-10, and S5-8-11, the wiring-plan generating unit 11 executes, for each element of the connection-target component group "parts" in the bus information B of the attention bus, operations S5-8-5 to S5-8-11 on the pieces of bus-path rectangle information BR linked to the path rectangle list sP in the bus information B of the attention bus. The expression "each element of the connection-target component group "parts" in the bus information B of the attention bus" refers to "each pair of two components connected by the attention bus".

In operation S5-8-5, the wiring-plan generating unit 11 determines whether or not the area of the component to be processed encompasses a rectangle associated with the bus-path rectangle information BR to be processed. This determination is made based on whether or not the rectangle specified based on the component location coordinates "loc" and the component size in the component information PInfo (FIG. 7) for the component includes the rectangle specified based on the start-point coordinates and the end-point coordinates in the bus-path rectangle information BR.

When the area of the component encompasses the rectangle associated with the bus-path rectangle information BR (Yes in S5-8-5), the wiring-plan generating unit 11 deletes the bus-path rectangle information BR from the bus-path rectangle-information storage section D9 in operation S5-8-6. Subsequently, in operation S5-8-7, the wiring-plan generating unit 11 deletes, from the bus-path rectangle list sP in the bus information B of the attention bus, the link to the bus-path rectangle information BR.

When the area of the component does not encompass the rectangle associated with the bus-path rectangle information BR (No in S5-8-5), the process proceeds to operation S5-8-8 in which the wiring-plan generating unit 11 determines whether or not part of the rectangle associated with the bus-path rectangle information BR overlaps the area of the component. Since this determination is apparent from the method of the determination performed in operation S5-8-5, a detailed description thereof is not given.

When part of the rectangle associated with the bus-path rectangle information BR overlaps the area of the component (Yes in S5-8-8), the process proceeds to operation S5-8-9. In this operation, the wiring-plan generating unit 11 divides the rectangle associated with the bus-path rectangle information BR into a portion regarding the inside of the component and a portion regarding the outside thereof and sets the portion regarding the outside as the bus-path rectangle information BR. That is, the start-point coordinates or the end-point coordinates in the bus-path rectangle information BR are updated to values indicating the portion regarding the outside.

On the other hand, when part of the rectangle associated with the bus-path rectangle information BR does not overlap the area of the component (No in S5-8-8), the wiring-plan generating unit 11 does not update the bus-path rectangle information BR with respect to the component. In this case, the rectangle associated with the bus-path rectangle information BR lies outside the component.

Figure 99:
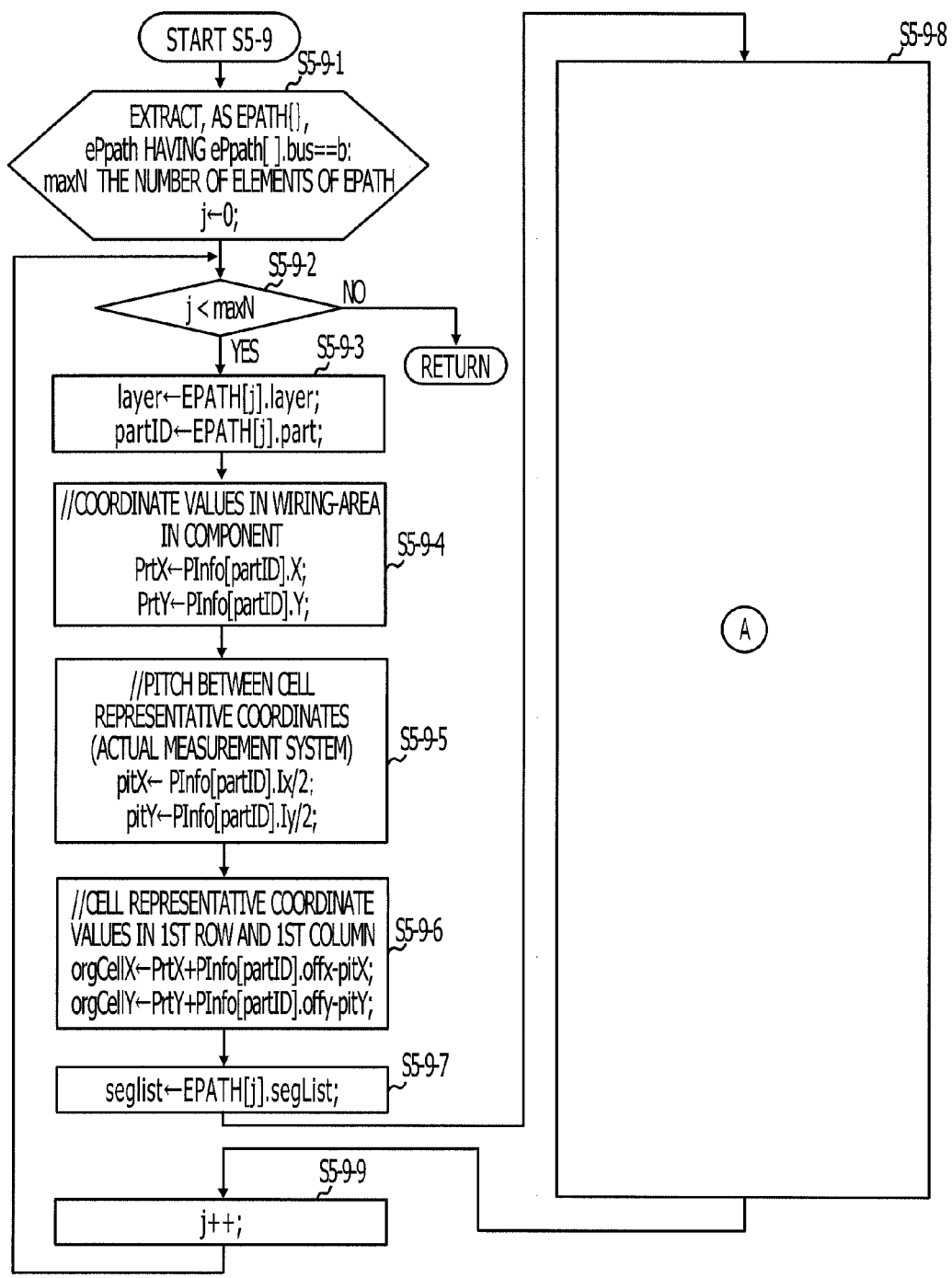
FIG. 99 is a flowchart of a procedure of processing for registering blockages for extraction lines.

Details of operation S5-9 in FIG. 96 will be described next. FIG. 99 is a flowchart of a procedure of processing for registering blockages for extraction lines and FIGS. 100A and 100B illustrate processing of operation S5-9-8 in FIG. 99.

In operation S5-9-1, the wiring-plan generating unit 11 extracts the extraction-path data ePath (FIG. 93) in which the values of the bus IDs (bus) match the bus ID of the attention bus. Subsequently, through operations S5-9-1, S5-9-2, and S5-9-9, the wiring-plan generating unit 11 executes operations S5-9-3 to S5-9-8 for each piece of the extracted extraction-path data ePath.

In operation S5-9-3, the wiring-plan generating unit 11 assigns the layer number (layer) in the extraction-path data ePath to be processed (i.e., the attention extraction-path data ePath) to the variable Layer and assigns the component ID (part) to the variable partID. The layer associated with the variable Layer is referred to as an "attention layer Layer" and the component associated with the variable partID is referred to as an "attention component partID".

In operation S5-9-4, the wiring-plan generating unit 11 assigns the x coordinate value and the y coordinate value of the component location coordinates "loc" in the component information PInfo (FIG. 7) of the attention component partID to a variable PrtX and a variable PrtY, respectively.

Subsequently, in operation S5-9-5, the wiring-plan generating unit 11 assigns a value, obtained by dividing the x-direction pin pitch Ix in the component information PInfo of the attention component partID by 2, to a variable pitX and assigns a value, obtained by dividing the y-direction pin pitch Iy by 2, to a variable pitY.

In operation S5-9-6, the wiring-plan generating unit 11 assigns a value, obtained by adding the upper-left pin coordinate (offx) in the component information PInfo of the attention component partID to PrtX and subtracting pitX from the value resulting from the addition, to a variable orgCellX. The wiring-plan generating unit 11 also assigns a value, obtained by adding the upper-left pin coordinate (offy) in the component information PInfo of the attention component partID to PrtY and subtracting pitY from the value resulting from the addition, to a variable orgCellY. That is, coordinate values indicated by orgCellX and orgCellY correspond to, in the actual-measurement system, the coordinate values of a position shifted eastward and southward from the west end and the north end of the attention component by an amount corresponding to half the distance between the pins. The coordinate values are used as, in the actual-measurement system, representative coordinate values of the cell in the first row and the first column in the cell matrix.

In operation S5-9-7, the wiring-plan generating unit 11 assigns the path line-segment list (segList) in the attention extraction-path data ePath to the variable segList. The list of the cell-system line-segment data (FIG. 92) associated with the variable segList is hereinafter referred to as "an attention-path line-segment list segList".

In operation S5-9-8, for each piece of the cell-system line segment data included in the attention-path line-segment list segList, the wiring-plan generating unit 11 converts the coordinates of the line segment, indicated by the cell-system line segment data, from the cell coordinate system into the actual measurement system, and records (registers) the resulting coordinates into the blockage-information storage section D2.

More specifically, by referring to the net ID (segP–>netID) and the existence layer (segP–>layer) in cell-system line-segment data segP to be processed, the wiring-plan generating unit 11 obtains, in accordance with WRule, a line width W to be used for wiring segP and then sets half the line width W as W2. When segP represents a vertical line, the value obtained by multiplying a value, obtained by subtracting 1 from the start-point column number in the cell-system line-segment data segP to be processed, by pitX (between pins in the x direction) is added to orgCellX, so that an x coordinate value of, in the actual-measurement system, the start point of the line segment associated with the cell-system line-segment data is calculated and is assigned to the variable x.

Subsequently, one new record is generated in the blockage-information storage section D2 (FIG. 6). A value obtained by subtracting the half (W2) of the line width from x is assigned to the x coordinate value of the start coordinates S in the record. Also, a value obtained by adding the half (W2) of the line width to x is assigned to the x coordinate value of the end coordinates E in the record. In addition, a value obtained by multiplying a value, obtained by subtracting 1 from the value of the smaller one of segP–>y1 and segP–>y2, by pitY (between pins in the y direction) is added to orgCellY and W2 is subtracted from the value resulting from the addition, so that the y coordinate value of the start coordinates S in the record is calculated and the value of y is assigned. In addition, a value obtained by multiplying a value, obtained by subtracting 1 from the value of the larger of segP–>y1 and segP–>y2, by pitY (between pins in the y direction) is added to orgCellY and W2 is added to the value resulting from the addition, so that the y coordinate value of the end coordinates E in the record is calculated and the value of y is assigned. In addition, the value of Layer is assigned to the layer L in the record. Similar operations are also performed with respect to blockage-information generation processing for a case in which segP represents a horizontal line. For blockage-information generation processing for a case in which segP represents an oblique line, one segP is divided into multiple pieces of blockage information corresponding to respective scales in the cell-system coordinate. The method for converting the coordinates is analogous to the method for the vertical line and the horizontal line.

As a result of the above-described processing, the line segment is registered as a blockage in the wiring area.

Detailed description of operation S5 is finished at this point. Next, a description will be given of a procedure of the processing, performed by the wiring-plan output unit 13, in operation S7 in FIG. 3.

Figure 101:
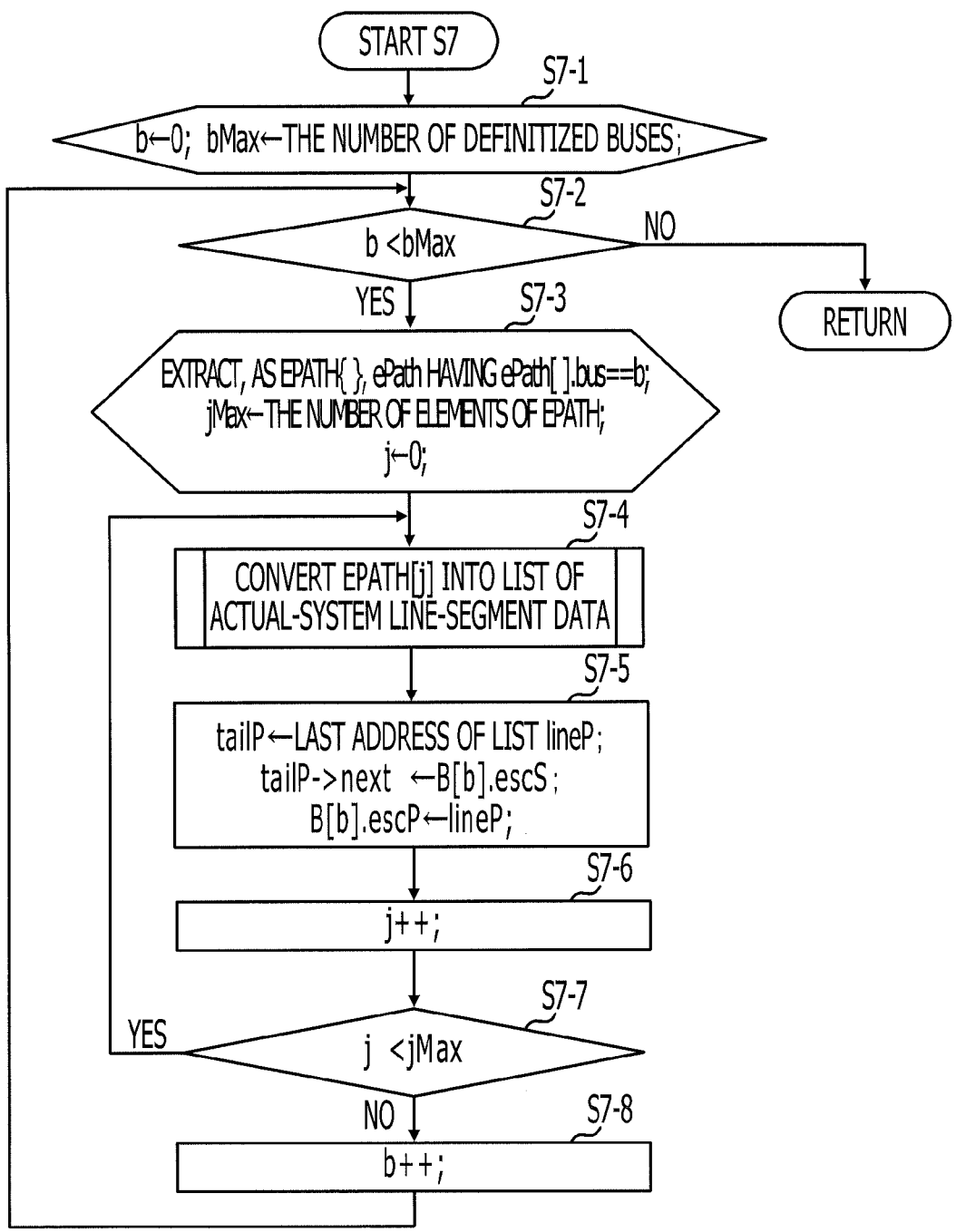
FIG. 101 is a flowchart of a procedure of processing for outputting a definitized wiring plan.

FIG. 101 is a flowcharts of a procedure of processing for outputting a definitized wiring plan. The term "outputting" as used herein refers to registering a wiring plan into the extraction-line-segment list "escS" in the bus-information storage section D5. Through operations S7-1, S7-2, and S7-8, the wiring-plan output unit 13 executes operations S7-3 to S7-7 for each bus for which a bus path has been definitized.

In operation S7-3, the wiring-plan output unit 13 extracts the extraction-path data ePath (FIG. 93) in which the values of the bus IDs (bus) match the bus ID of the bus to be processed (the attention bus). Subsequently, through operations S7-3, S7-6, and S7-7, the wiring-plan output unit 13 executes operations S7-4 and S7-5 for each piece of the extracted extraction-path data ePath.

In operation S7-4, the wiring-plan output unit 13 converts the extraction-path data ePath to be processed into a list of actual-measurement-system line-segment data.

FIG. 102 illustrates one example of the structure of the actual-measurement-system line-segment data. As illustrated, the actual-measurement-system line-segment data has member variables (data items), such as a start-point x coordinate (x1), a start-point y coordinate (y1), an end-point x coordinate (x2), an end-point y coordinate (y2), a layer number (layer), a bus ID (bus), a component ID (part), a net ID (netID), and next data (next).

The start-point x coordinate (x1) denotes, in the actual-measurement system, the x coordinate value of the start point of a line segment. The start-point y coordinate (y1) denotes, in the actual-measurement system, the y coordinate value of the start point of the line segment. The end-point x coordinate (x2) denotes, in the actual-measurement system, the x coordinate value of the end point of the line segment. The end-point y coordinate (y2) denotes, in the actual-measurement system, the y coordinate value of the end point of the line segment. The layer number (layer) is the layer number of a layer to which a wire to which the line segment corresponds belongs. The bus ID (bus) is the bus ID of a bus to which the wire to which the line segment corresponds belongs. The component ID (part) is the component ID of a component to which the wire to which the line segment corresponds belongs. The net ID (netID) is the net ID of a net to which the wire to which the line segment corresponds belongs. The next data (next) indicates a pointer to next actual-measurement-system line-segment data, the pointer being used in order to form a list structure of the actual-measurement-system line-segment data.

In the manner described above, the actual-measurement-system line-segment data represents a line segment by using coordinate values in the actual-measurement system. Thus, in operation S7-4, the coordinates of a line segment representing a wire extraction path are converted from the cell-matrix-coordinate system into the actual-measurement system.

Subsequently, the wiring-plan output unit 13 assigns, to the next data (next) in the last piece included in the list of actual-measurement-system line-segment data generated in operation S7-4, the first point in the list of actual-measurement-system line-segment data already registered in the extraction-line-segment list "escS" in the bus information B of the attention bus. In operation S7-6, the wiring-plan output unit 13 registers, in the extraction-line-segment list "escS" in the bus information B of the attention bus, the first pointer in the list of the actual-measurement-system line-segment data generated in operation S7-4.

Figure 103:
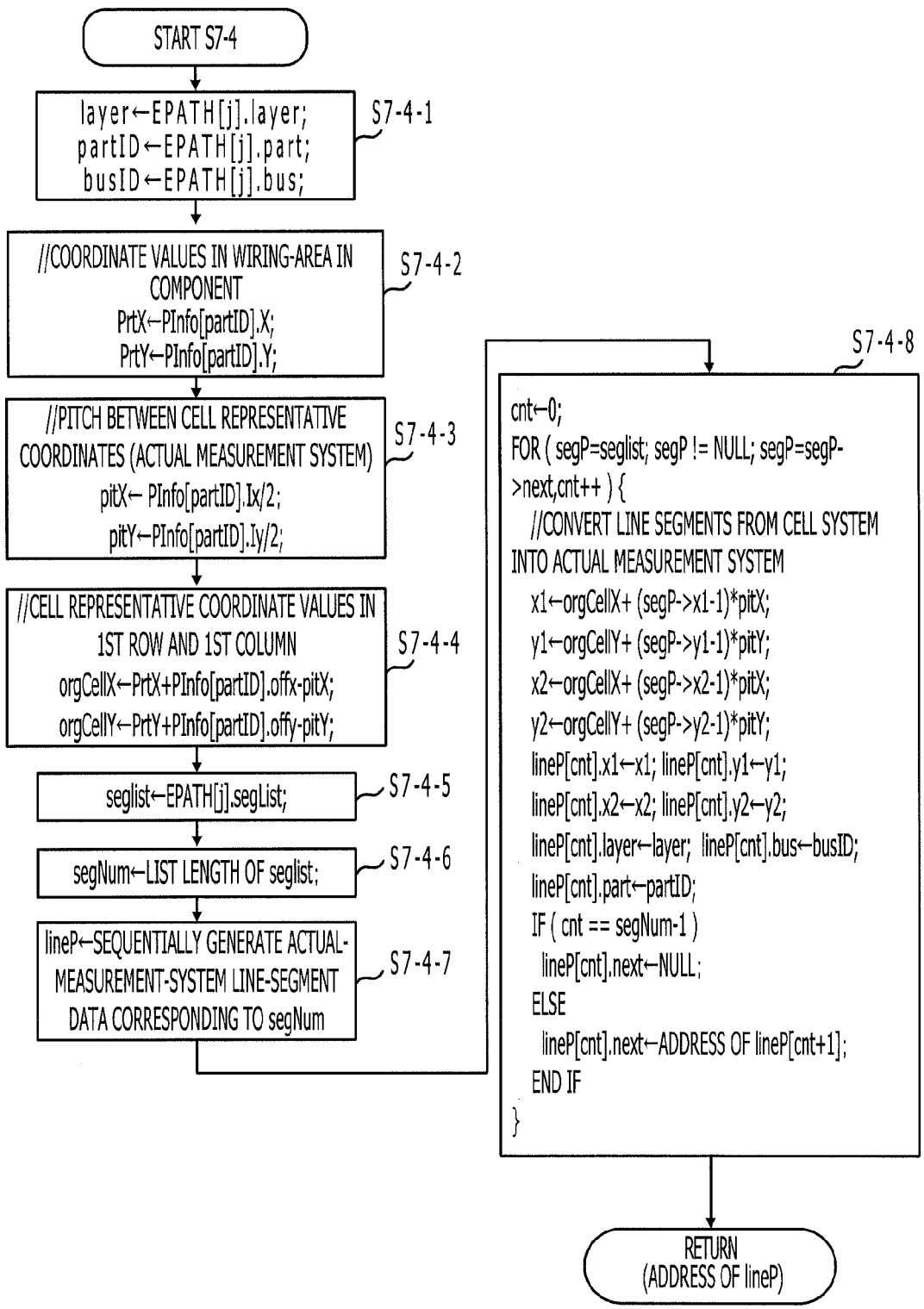
FIG. 103 is a flowchart of a procedure of processing for converting extraction-path data into a list of actual-measurement-system line-segment data.

Details of operation S7-4 will be described next. FIG. 103 is a flowchart of a procedure of processing for converting extraction-path data into a list of actual-measurement-system line-segment data.

In FIG. 103, operations S7-4-1 to S7-4-5 are substantially the same as operations S5-9-3 to S5-9-7 in FIG. 99. For convenience of understanding, the same variable names are also used. However, in operation S7-4-1, the value of the bus ID (bus) in the extraction-path line-segment data ePath to be processed (i.e., the attention extraction-path line-segment data ePath) is assigned to the variable busID.

Subsequent to S7-4-5, in operation S7-4-6, the wiring-plan output unit 13 assigns the list length of the attention path line-segment list segList (i.e., the number of pieces of the cell-system line-segment data) to a variable segNum. In operation S7-4-7, the wiring-plan output unit 13 sequentially generates (an array of) pieces of actual-measurement-system line-segment data corresponding to the value of segNum.

Subsequently, in operation S7-4-8, the wiring-plan output unit 13 performs processing for converting each piece of the cell-system line-segment data included in the attention-path line-segment list segList into actual-measurement-system line-segment data.

Conversion of the start point and the end point in the cell-system line-segment data to be processed into the start point and the end point in the actual-measurement-system line-segment data is performed as described above with reference to operation S5-9-8 in FIG. 99. The values of the variables Layer, busID, part ID, and netID are assigned to the layer number (layer), the bus ID (bus), the component ID (part), and the net ID (netID), respectively, in the actual-measurement-system line-segment data. In addition, the pointer to the next piece of the sequentially generated actual-measurement-system line-segment data is assigned to the next data (next) in the actual-measurement-system line-segment data. NULL Is assigned to the next data (next) in the last piece of the actual-measurement-system line-segment data.

Detailed description of operation S7 is finished at this point. That is, description of all the operations in FIG. 3 is finished.

As described above, according to the present embodiment, with respect to paths for wires for a bus, the possibility of extraction is verified for each of nets belonging to the bus and the adequateness of the path for the wire is determined. Accordingly, a bus wiring path can be generated based on a shape that is close to the shape of an extraction area used for actual detailed routing.

Hence, it is possible to reduce the possibility that the bus wiring path is definitized with an area occupied by a bus being overestimated or underestimated relative to an area occupied by a wire extraction portion required for actual detailed routing. As a result, it is possible to increase the possibility that high-density wiring is achieved using fewer wiring layers.

In addition, a bus wiring path that could not be extracted at an actual wiring stage can be detected at a stage when modifications can be easily made, and a bus wiring path can be re-generated. It is, therefore, possible to avoid rework, such as modifying a bus wiring path after detailed routing has progresses, and it can be expected that the wiring design time is reduced.

Additionally, the wiring-design aiding apparatus 10 of the present embodiment generates a directed graph constituted by directed edges having a capacity that ensures accommodation of extraction wiring paths, performs path searching on the basis of the directed graph, and further definitizes global paths. This arrangement, therefore, makes it possible to correctly represent the upper limit of the number of wires accommodated between pins. Thus, it is possible to prevent a larger number of global paths than an allowable number of global paths from being created during global routing and it is also possible to prevent occurrence of an event that the wiring cannot be performed owing to rule violations when the global path is embodied into a detailed path. In particular, since the wiring-design aiding apparatus 10 is adapted to place bottlenecks not only between horizontal or vertical pins but also between diagonal pins, accommodation of a wiring path between the diagonal pins is ensured appropriately. Similarly, since the wiring-design aiding apparatus 10 is adapted to place bottlenecks on empty pins, accommodation of a wiring path at empty-pin portions is also ensured appropriately.

In addition, the order of extraction is given to global paths as information indicating relative positional relationships of wires. That is, determining positions of wires between pins and so on in accordance with the order of extraction makes it possible to prevent crossing (short circuiting) of wires between the pins and so on. For example, in the case of the present embodiment, wires whose priorities in the order of extraction are higher may be laid down at the north or east side. Such an arrangement prevents crossing of the wires.

According to an aspect of the embodiments of the invention, any combinations of one or more of the described features, functions, operations, and/or benefits can be provided. A combination can be one or a plurality. The embodiments can be implemented as an apparatus (a machine) that includes computing hardware (i.e., computing apparatus), such as (in a non-limiting example) any computer that can store, retrieve, process and/or output data and/or communicate (network) with other computers. According to an aspect of an embodiment, the described features, functions, operations, and/or benefits can be implemented by and/or use computing hardware in form of software that is executed by computing hardware (machine). The apparatus (e.g., the wiring design apparatus 10, . . . , etc.) can comprise a controller (CPU) (e.g., a hardware logic circuitry based computer processor that processes or executes instructions, namely software/program), computer readable media, transmission communication interface (network interface), and/or an output device, for example, a display device, all in communication through a data communication bus. In addition, an apparatus can include one or more apparatuses in computer network communication with each other or other apparatuses. In addition, a computer processor can include one or more computer processors in one or more apparatuses or any combinations of one or more computer processors and/or apparatuses. An aspect of an embodiment relates to causing one or more apparatuses and/or computer processors to execute the described operations. The results produced can be output to an output device, for example, displayed on the display.

A program/software implementing the embodiments may be recorded on a computer-readable media, e.g., a non-transitory or persistent computer-readable medium. Examples of the non-transitory computer-readable media include a magnetic recording apparatus, an optical disk, a magneto-optical disk, and/or volatile and/or non-volatile semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), DVD-ROM, DVD-RAM (DVD-Random Access Memory), BD (Blue-ray Disk), a CD-ROM (Compact Disc-Read Only Memory), and a CD-R (Recordable)/RW. The program/software implementing the embodiments may be transmitted over a transmission communication path, e.g., a wire and/or a wireless network implemented via hardware. An example of communication media via which the program/software may be sent includes, for example, a carrier-wave signal.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

What is claimed is:

1. A wiring-design aiding method for causing a computer to execute:
   generating, by using the computer, wiring paths for buses for wiring layers of a circuit, where a bus includes wires as nets, according to wiring rules including a wiring rule so that the buses do not cross each other with respect to a wiring area including at least one wiring layer; and
   generating a directed graph of wiring cells for components, a wiring cell representing a number of wiring paths as wiring capacity for the buses of the components and a set wiring path bottleneck that limits a wiring capacity corresponding to component pin information in the wiring cell, and of directed edges interconnecting the wiring cells, a directed edge assigned a wire capacity corresponding to the component pin information, thereby modeling a network flow of usable wiring paths searchable for wiring paths of the buses with the set wiring path bottlenecks to verify successful extraction of a bus from a component to which the bus is connected according to the wiring rules,
   the bus-wire-path generation and verification are re-executed with respect to a bus for which it is determined in the verification that at least one of the buses is not successfully extracted.

2. The wiring-design aiding method according to claim 1, wherein the component pin information for setting a wiring path bottleneck comprises a pin, an inter-horizontal-pin portion, an inter-vertical-pin portion, an inter-diagonal-pin portion, or any combinations thereof for which a wiring path bottleneck is set, and the verification comprises:
   assigning to each wiring path bottleneck a wire capacity corresponding to the pin, the inter-horizontal-pin portion, the inter-vertical-pin portion, or the inter-diagonal-pin portion, or any combinations thereof;
   generating, for each wiring path bottleneck, two nodes including an ingress node and an egress node;
   executing one or more generations of:
      generating, for each wiring path bottleneck, a directed edge from the ingress node to the egress node, the ingress node and the ingress node being included in the same wiring path bottleneck,
      bi-directionally generating a directed edge from the egress node of a wiring path bottleneck to the ingress node of another wiring path bottleneck, the wiring path bottlenecks being adjacent in a vertical or horizontal direction, or
      bi-directionally generating a directed edge from the egress node of a wiring path bottleneck to the ingress nodes of one or more other wiring path bottlenecks, one of the wiring path bottlenecks being a wiring path bottleneck for an inter-diagonal pin portion and the other wiring path bottlenecks each being a wiring path bottleneck obliquely adjacent to the inter-diagonal pin portion;
   assigning, to the generated directed edges, edge capacities having a minimum value of the wire capacities given to the wiring path bottlenecks to which the nodes connected by the generated directed edges belong;
   searching, for each of the nets belonging to the bus, a shortest wiring path between the ingress node of the wiring path bottleneck corresponding to the pin from which the wire is to be extracted and the egress node of the wiring path bottleneck corresponding to an exit for the wire, by using the directed edges to which the edge capacities larger than or equal to 1 are given;
   giving, to each directed edge used for found wiring paths, a number of uses of the directed edge for the wiring paths; and
   determining the bus-wiring success/failure on-based upon the number of nets for which the shortest wiring paths are found in the wiring path searching;
   wherein, in the wiring path searching, the shortest wiring paths are searched for so that the number of uses does not exceed the generated directed edge capacities.

3. The wiring-design aiding method according to claim 2, wherein the verification further comprises:
   definitizing, as a global path for the wire, a path formed by tracing back the directed edges whose number of uses is 1 or more from the egress node of the wiring path bottleneck that lies at a perimeter in a relative positional relationship of the wiring path bottlenecks and that has, as the directed edge from the ingress node to the egress node, the directed edge whose number of uses is 1 or more to the egress node of the wiring path bottleneck corresponding to the pin from which the wire is to be extracted, and
   wherein, in the path definitizing, the number of uses of each traced-back directed edge is reduced in accordance with the number of tracebacks of the directed edge.

4. The wiring-design aiding method according to claim 3, wherein, in the path definitizing, when a number of wiring path bottlenecks that lie at the perimeter and that have, as the directed edge from the ingress node to the egress node, a directed edge whose number of uses is 1 or more, a wiring path bottleneck at which the traceback is started is sequentially selected in accordance with a certain direction along the perimeter and the directed edge to be given priority during the traceback is selected in accordance with the certain direction.

5. The wiring-design aiding method according to claim 2, wherein the verification further comprises temporarily setting, prior to the shortest-path searching performed in the path searching, zero for the wire capacities of first wiring path bottlenecks between the pins from which the nets belonging to a second bus other than a first bus subjected to the wire extraction success/failure verification are to be extracted, second wiring path bottlenecks located at exits of the wires of the second bus, and the wiring path bottlenecks coupling the first wiring path bottlenecks and the second wiring path bottlenecks.

6. The wiring-design aiding method according to claim 5, wherein, in the zero setting, when a total of the capacities given to the second wiring path bottlenecks is insufficient for a number of nets belonging to the bus having the second wiring path bottlenecks as the exits of the wires, a second wiring path bottleneck is added.

7. A non-transitory computer readable recording medium that stores a wiring-design aiding program for causing a computer to execute:
   generating wiring paths for buses for wiring layers of a circuit, where a bus includes wires as nets, according to wiring rules including a wiring rule so that the buses do not cross each other with respect to a wiring area including at least one wiring layer; and
   generating a directed graph of wiring cells for components, a wiring cell representing a number of wiring paths as wiring capacity for the buses of the components and a set wiring path bottleneck that limits a wiring capacity corresponding to component pin information in the wiring cell, and of directed edges interconnecting the wiring cells, thereby modeling a network flow of usable wiring paths searchable for wiring paths of the buses with the set wiring path bottlenecks to verify successful extraction of a bus from a component to which the bus is connected according to the wiring rules, the bus-path generation and verification are re-executed with respect to a bus for which it is determined in the verification that at least one of the buses is not successfully extracted.

8. The non-transitory computer readable recording medium according to claim 7, wherein the:

component pin information for setting a wiring path bottleneck comprises a pin, an inter-horizontal-pin portion, an inter-vertical-pin portion, an inter-diagonal-pin portion, or any combinations thereof for which a wiring path bottleneck is set, and the verification comprises:

assigning to each wiring path bottleneck, a wire capacity corresponding to the pin, the inter-horizontal-pin portion, the inter-vertical-pin portion, or the inter-diagonal-pin portion, or any combinations thereof;

generating, for each wiring path bottleneck, two nodes including an ingress node and an egress node;

executing one or more generations of:

generating, for each wiring path bottleneck, a directed edge from the ingress node to the egress node, the ingress node and the ingress node being included in the same wiring path bottleneck, bi-directionally generating a directed edge from the egress node of a wiring path bottleneck to the ingress node of another wiring path bottleneck, the wiring path bottlenecks being adjacent in a vertical or horizontal direction, or bi-directionally generating a directed edge from the egress node of a wiring path bottleneck to the ingress nodes of one or more other wiring path bottlenecks, one of the wiring path bottlenecks being a wiring path bottleneck for the inter-diagonal pin portion and the other wiring path bottlenecks each being a wiring path bottleneck obliquely adjacent to the inter-diagonal pin portion;

assigning, to the generated directed edges, edge capacities having a minimum value of the wire capacities given to the wiring path bottlenecks to which the nodes connected by the directed edges belong;

searching, for each of the nets belonging to the bus, a shortest path between the ingress node of the wiring path bottleneck corresponding to the pin from which the wire is to be extracted and the egress node of the wiring path bottleneck corresponding to an exit for the wire, by using the directed edges to which the edge capacities larger than or equal to 1 are given;

giving, to each directed edge used for found paths, the number of uses of the directed edge for the paths; and determining the bus-wiring success/failure on basis of the number of nets for which the shortest paths are found in the path searching;

wherein, in the path searching, the shortest paths are searched for so that the number of uses does not exceed the edge capacities.

9. The non-transitory computer readable recording medium according to claim 8, wherein the verification further comprises:

definitizing, as a global path for the wire, a path formed by tracing back the directed edges whose number of uses is 1 or more from the egress node of the wiring path bottleneck that lies at a perimeter in a relative positional relationship of the wiring path bottlenecks and that has, as the directed edge from the ingress node to the egress node, the directed edge whose number of uses is 1 or more to the egress node of the wiring path bottleneck corresponding to the pin from which the wire is to be extracted, and wherein, in the path definitizing, the number of uses of each traced-back directed edge is reduced in accordance with the number of tracebacks of the directed edge.

10. The non-transitory computer readable recording medium according to claim 9, wherein, in the global-path definitizing, when a number of wiring path bottlenecks that lie at the perimeter and that have, as the directed edge from the ingress node to the egress node, a directed edge whose number of uses is 1 or more, a wiring path bottleneck at which the traceback is started is sequentially selected in accordance with a certain direction along the perimeter and the directed edge to be given priority during the traceback is selected in accordance with the certain direction.

11. The non-transitory computer readable recording medium according to claim 8, wherein the verification further comprises temporarily setting, prior to the shortest-path searching performed in the path searching, zero for the wire capacities of first wiring path bottlenecks between the pins from which the nets belonging to a second bus other than a first bus subjected to the wire extraction success/failure verification are to be extracted, second wiring path bottlenecks located at exits of the wires of the second bus, and the wiring path bottlenecks coupling the first wiring path bottlenecks and the second wiring path bottlenecks.

12. The non-transitory computer readable recording medium according to claim 11, wherein, in the zero setting, when a total of the capacities given to the second wiring path bottlenecks is insufficient for a number of nets belonging to the bus having the second wiring path bottlenecks as the exits of the wires, a second wiring path bottleneck is added.

13. A wiring-design aiding apparatus, comprising:

a computer processor to execute:

generating wiring paths for buses for wiring layers of a circuit, where a bus includes wires as nets, according to wiring rules including a wiring rule so that the buses do not cross each other with respect to a wiring area including at least one wiring layer; and generating a directed graph of wiring cells for components, a wiring cell representing a number of wiring paths as wiring capacity for the buses of the components and a set wiring path bottleneck that limits a wiring capacity corresponding to component pin information in the wiring cell, and of directed edges interconnecting the wiring cells, a directed edge assigned a wire capacity corresponding to the component pin information, thereby modeling a network flow of usable wiring paths searchable for wiring paths of the buses with the set wiring path bottlenecks to verify successful extraction of a bus from a component to which the bus is connected according to the wiring rules, the bus-path generation and verification are re-executed with respect to a bus for which at least one of the buses is not successfully extracted.

14. The wiring-design aiding apparatus according to claim 13, wherein the component pin information for setting a wiring path bottleneck comprises a pin, an inter-horizontal-pin portion, an inter-vertical-pin portion, an inter-diagonal-pin portion, or any combinations thereof for which a wiring path bottleneck is set, and the verification comprises:

assigning, to each wiring path bottleneck, a wire capacity corresponding to the pin, the inter-horizontal-pin portion, the inter-vertical-pin portion, or the inter-diagonal-pin portion, or any combinations thereof;

generating, for each wiring path bottleneck, two nodes including an ingress node and an egress node;

executing one or more generations of:
- generating, for each wiring path bottleneck, a directed edge from the ingress node to the egress node, the ingress node and the ingress node being included in the same wiring path bottleneck,
- bi-directionally generating a directed edge from the egress node of a wiring path bottleneck to the ingress node of another wiring path bottleneck, the wiring path bottlenecks being adjacent in a vertical or horizontal direction, or
- bi-directionally generating a directed edge from the egress node of a wiring path bottleneck to the ingress nodes of one or more other wiring path bottlenecks, one of the wiring path bottlenecks being a wiring path bottleneck for the inter-diagonal pin portion and the other wiring path bottlenecks each being a wiring path bottleneck obliquely adjacent to the inter-diagonal pin portion;

assigning, to the generated directed edges, edge capacities having a minimum value of the wire capacities given to the wring path bottlenecks to which the nodes connected by the directed edges belong;

searching, for each of the nets belonging to the bus, a shortest path between the ingress node of the wiring path bottleneck corresponding to the pin from which the wire is to be extracted and the egress node of the wiring path bottleneck corresponding to an exit for the wire, by using the directed edges to which the edge capacities larger than or equal to 1 are given;

giving, to each directed edge used for found paths, the number of uses of the directed edge for the paths; and determining the bus-wiring success/failure on basis of the number of nets for which the shortest paths are found by the path searching;

wherein the path searching searches for the shortest paths so that the number of uses does not exceed the edge capacities.

15. The wiring-design aiding apparatus according to claim 14, wherein the verification further comprises:
- definitizing, as a global path for the wire, a path formed by tracing back the directed edges whose number of uses is 1 or more from the egress node of the wiring path bottleneck that lies at a perimeter in a relative positional relationship of the wiring path bottlenecks and that has, as the directed edge from the ingress node to the egress node, the directed edge whose number of uses is 1 or more to the egress node of the wiring path bottleneck corresponding to the pin from which the wire is to be extracted, and
- wherein the global-path definitizing reduces the number of uses of each traced-back directed edge in accordance with the number of tracebacks of the directed edge.

16. The wiring-design aiding apparatus according to claim 15, wherein, in the global-path definitizing, when a number of wiring path bottlenecks that lie at the perimeter and that have, as the directed edge from the ingress node to the egress node, a directed edge whose number of uses is 1 or more, a wiring path bottleneck at which the traceback is started is sequentially selected in accordance with a certain direction along the perimeter and the directed edge to be given priority during the traceback is selected in accordance with the certain direction.

17. The wiring-design aiding apparatus according to claim 14, wherein the verification further comprises temporarily setting, prior to the shortest-path searching, zero for wire capacities of first wiring path bottlenecks between the pins from which the nets belonging to a second bus other than a first bus subjected to the wire extraction success/failure verification are to be extracted, second wiring path bottlenecks located at exits of the wires of the second bus, and the wiring path bottlenecks coupling the first wiring path bottlenecks and the second wiring path bottlenecks.

18. The wiring-design aiding apparatus according to claim 17, wherein, when a total of the capacities given to the second wiring path bottlenecks is insufficient for a number of nets belonging to the bus having the second wiring path bottlenecks as the exits of the wires, a second wiring path bottleneck is added.

* * * * *

UNITED STATES PATENT AND TRADEMARK OFFICE
CERTIFICATE OF CORRECTION

PATENT NO. : 8,930,869 B2
APPLICATION NO. : 13/075632
DATED : January 6, 2015
INVENTOR(S) : Ikuo Ohtsuka et al.

It is certified that error appears in the above-identified patent and that said Letters Patent is hereby corrected as shown below:

On the Title Page

Column 2, Item [57] (Abstract), line 5, after "graphics" insert -- . --.

In the Claims

Column 90, line 8, in Claim 2, delete "on-based" and insert -- based --, therefor.
Column 91, line 12, in Claim 8, delete "the:" and insert -- the --, therefor.

Signed and Sealed this
Fifth Day of May, 2015

Michelle K. Lee
*Director of the United States Patent and Trademark Office*